(12) United States Patent
Young

(10) Patent No.: US 7,276,934 B1
(45) Date of Patent: Oct. 2, 2007

(54) INTEGRATED CIRCUIT WITH PROGRAMMABLE ROUTING STRUCTURE INCLUDING DIAGONAL INTERCONNECT LINES

(75) Inventor: Steven P. Young, Boulder, CO (US)

(73) Assignee: Xilinx, Inc., San Jose, CA (US)

(*) Notice: Subject to any disclaimer, the term of this patent is extended or adjusted under 35 U.S.C. 154(b) by 156 days.

(21) Appl. No.: 11/152,637

(22) Filed: Jun. 14, 2005

(51) Int. Cl.
*H03K 19/173* (2006.01)

(52) U.S. Cl. .......................... 326/38; 326/41
(58) Field of Classification Search ............ 326/37–41
See application file for complete search history.

(56) References Cited

U.S. PATENT DOCUMENTS

| | | | |
|---|---|---|---|
| 5,003,200 A * | 3/1991 | Sakamoto | 326/38 |
| 5,296,759 A | 3/1994 | Sutherland et al. | |
| 5,381,058 A | 1/1995 | Britton et al. | |
| 5,546,018 A | 8/1996 | New et al. | |
| 5,581,199 A | 12/1996 | Pierce et al. | |
| 5,598,109 A * | 1/1997 | Leong et al. | 326/41 |
| 5,629,886 A | 5/1997 | New | |
| 5,682,107 A | 10/1997 | Tavana et al. | |
| 5,698,992 A | 12/1997 | El Ayat et al. | |
| 5,701,091 A | 12/1997 | Kean | |
| 5,761,099 A | 6/1998 | Pedersen | |
| 5,801,546 A | 9/1998 | Pierce et al. | |
| 5,850,152 A | 12/1998 | Cliff et al. | |
| 5,889,411 A | 3/1999 | Chaudhary | |
| 5,889,413 A | 3/1999 | Bauer | |
| 5,907,248 A | 5/1999 | Bauer et al. | |
| 5,914,616 A | 6/1999 | Young et al. | |
| 5,920,202 A | 7/1999 | Young et al. | |
| 5,942,913 A | 8/1999 | Young et al. | |
| 5,963,050 A | 10/1999 | Young et al. | |
| 5,986,468 A | 11/1999 | Chan et al. | |
| 6,051,992 A | 4/2000 | Young et al. | |
| 6,069,490 A * | 5/2000 | Ochotta et al. | 326/41 |
| 6,081,914 A | 6/2000 | Chaudhary | |
| 6,086,629 A | 7/2000 | McGettigan et al. | |
| 6,107,822 A | 8/2000 | Mendel et al. | |

(Continued)

OTHER PUBLICATIONS

U.S. Appl. No. 11/151,796, filed Jun. 14, 2005, Young et al.

(Continued)

*Primary Examiner*—Don Le
(74) *Attorney, Agent, or Firm*—Lois D. Cartier

(57) ABSTRACT

A programmable integrated circuit (IC) includes rows and columns of tiles, each tile including logic blocks, segments of interconnect lines, and programmable structures (e.g., routing multiplexers driving the interconnect lines, input multiplexers driving the logic blocks). The interconnect lines can be used, for example, to interconnect two programmable structures included in tiles located in different rows and different columns. Thus, these "diagonal" interconnect lines also have programmable access to other diagonal interconnect lines in the general interconnect structure. In some embodiments, the diagonal interconnect lines include "doubles", which interconnect programmable structures in tiles diagonally adjacent to one another, and "pents", which interconnect programmable structures in tiles separated by two intervening rows (or columns) and one intervening column (or row). In some embodiments, a diagonal interconnect line coupled between first and second tiles include an interconnection to a programmable structure in a tile at the "corner" of the diagonal interconnect line.

19 Claims, 43 Drawing Sheets

U.S. PATENT DOCUMENTS

| | | | |
|---|---|---|---|
| 6,107,827 | A | 8/2000 | Young et al. |
| 6,122,720 | A | 9/2000 | Cliff |
| 6,124,731 | A | 9/2000 | Young et al. |
| 6,154,053 | A | 11/2000 | New |
| 6,157,209 | A | 12/2000 | McGettigan |
| 6,184,709 | B1 | 2/2001 | New |
| 6,184,712 | B1 | 2/2001 | Wittig et al. |
| 6,201,409 | B1 | 3/2001 | Jones et al. |
| 6,201,410 | B1 | 3/2001 | New et al. |
| 6,204,689 | B1 | 3/2001 | Percey et al. |
| 6,204,690 | B1 | 3/2001 | Young et al. |
| 6,288,570 | B1 | 9/2001 | New |
| 6,292,022 | B2 | 9/2001 | Young et al. |
| 6,362,648 | B1 | 3/2002 | New et al. |
| 6,380,759 | B1 | 4/2002 | Agrawal et al. |
| 6,396,302 | B2 | 5/2002 | New et al. |
| 6,396,303 | B1 | 5/2002 | Young |
| 6,427,156 | B1 | 7/2002 | Chapman et al. |
| 6,448,808 | B2 | 9/2002 | Young et al. |
| 6,452,834 | B1 | 9/2002 | Kengeri |
| 6,466,052 | B1 | 10/2002 | Kaviani |
| 6,496,918 | B1 * | 12/2002 | DeHon et al. ................. 712/15 |
| 6,515,506 | B1 | 2/2003 | Lo |
| 6,605,959 | B1 | 8/2003 | Morse et al. |
| 6,621,296 | B2 | 9/2003 | Carberry et al. |
| 6,630,841 | B2 | 10/2003 | New et al. |
| 6,646,467 | B1 | 11/2003 | Cliff et al. |
| 6,708,191 | B2 | 3/2004 | Chapman et al. |
| 6,747,480 | B1 | 6/2004 | Kaptanoglu et al. |
| 6,828,824 | B2 | 12/2004 | Betz et al. |
| 6,829,756 | B1 | 12/2004 | Trimberger |
| 6,836,147 | B2 | 12/2004 | Nakaya |
| 6,847,228 | B1 | 1/2005 | Crotty et al. |
| 6,847,229 | B2 | 1/2005 | New et al. |
| 6,873,181 | B1 | 3/2005 | Pedersen |
| 6,937,064 | B1 | 8/2005 | Lewis et al. |
| 6,943,580 | B2 | 9/2005 | Lewis et al. |
| 7,030,652 | B1 | 4/2006 | Lewis et al. |
| 7,061,268 | B1 | 6/2006 | Lee et al. |
| 7,111,214 | B1 | 9/2006 | Chaudhary et al. |
| 7,138,820 | B2 | 11/2006 | Goetting et al. |
| 7,193,438 | B1 * | 3/2007 | Rohe et al. ..................... 326/41 |
| 2001/0006347 | A1 | 7/2001 | Jefferson et al. |
| 2001/0048320 | A1 | 12/2001 | Lee et al. |
| 2001/0052793 | A1 | 12/2001 | Nakaya |
| 2002/0057103 | A1 | 5/2002 | Nagi et al. |
| 2003/0210073 | A1 | 11/2003 | Ngai et al. |
| 2004/0178821 | A1 | 9/2004 | Bal et al. |
| 2005/0038844 | A1 | 2/2005 | Langhammer et al. |
| 2005/0093577 | A1 | 5/2005 | Nguyen et al. |
| 2005/0127944 | A1 | 6/2005 | Lewis et al. |
| 2005/0218929 | A1 | 10/2005 | Wang et al. |
| 2005/0275428 | A1 | 12/2005 | Schlacter |
| 2006/0164119 | A1 | 7/2006 | Nowak-Leijten |
| 2006/0164120 | A1 | 7/2006 | Verma et al. |

OTHER PUBLICATIONS

U.S. Appl. No. 11/151,819, filed Jun. 14, 2005, Young et al.
U.S. Appl. No. 11/151,892, filed Jun. 14, 2005, Young et al.
U.S. Appl. No. 11/151,915, filed Jun. 14, 2005, Young et al.
U.S. Appl. No. 11/151,938, filed Jun. 14, 2005, Young.
U.S. Appl. No. 11/151,939, filed Jun. 14, 2005, Chirania et al.
U.S. Appl. No. 11/151,986, filed Jun. 14, 2005, Simkins.
U.S. Appl. No. 11/151,987, filed Jun. 14, 2005, Young.
U.S. Appl. No. 11/151,988, filed Jun. 14, 2005, Young.
U.S. Appl. No. 11/152,010, filed Jun. 14, 2005, Young.
U.S. Appl. No. 11/152,012, filed Jun. 14, 2005, Pham et al.
U.S. Appl. No. 11/152,358, filed Jun. 14, 2005, Bauer et al.
U.S. Appl. No. 11/152,359, filed Jun. 14, 2005, Young.
U.S. Appl. No. 11/152,360, filed Jun. 14, 2005, Young.
U.S. Appl. No. 11/152,439, filed Jun. 14, 2005, Young.
U.S. Appl. No. 11/152,572, filed Jun. 14, 2005, Young.
U.S. Appl. No. 11/152,590, filed Jun. 14, 2005, Kondapalli et al.
U.S. Appl. No. 11/152,736, filed Jun. 14, 2005, Kondapalli et al.
U.S. Appl. No. 11/152,737, filed Jun. 14, 2005, Kondapalli et al.
U.S. Appl. No. 11/152,763, filed Jun. 14, 2005, Young.
Lucent Technologies; "Field Programmable Gate Arrays Data Book"; published Oct. 1996; pp. 2-9 through 2-28.
Altera Corporation; "Stratix Device Handbook; vol. 1"; "2. Stratix Architecture"; published Sep. 2004; pp. 2-1 through 2-20.
Xilinx, Inc.; "Virtex-II Platform FPGA Handbook"; published Dec. 2000; available from Xilinx, Inc. 2100 Logic Drive, San Jose, California 95124; pp. 33-75.
Xilinx, Inc.; "Programmable Logic Data Book 2000"; Published Apr. 2000; available from Xilinx, Inc. 2100 Logic Drive, San Jose, California 95124; pp. 3-75 through 3-96.
Xilinx, Inc.; "Virtex-II Pro Platform FPGA Handbook"; published Oct. 14, 2002; available from Xilinx, Inc. 2100 Logic Drive, San Jose, California 95124; pp. 19-71.
Altera Corporation; "FLEX 10K Embedded Programmable Logic Family Data Sheet"; Digital Library 1996; pp. 31-53, no month.
Xilinx, Inc.; "Programmable Logic Data Book 1996"; published Sep. 1996; available from Xilinx, Inc. 2100 Logic Drive, San Jose, California 95124; pp. 4-5 through 4-45, 4-181 through 4-196, 4-253 through 4-264, and 4-289 through 4-302.
Xilinx, Inc.; "The Programmable Logic Data Book 1994"; published 1994; available from Xilinx, Inc. 2100 Logic Drive, San Jose, California 95124; pp. 2-187 through 2-195, no month.
Altera Corporation; "Stratix-II Device Handbook"; vol. I; published Mar. 2005; pp. 2-1 through 2-28.
Steven Elzinga et al.; "Design Tips for HDL Implementation of Arithmetic Functions"; XAPP 215 (v1.0); Jun. 28, 2000; available from Xilinx, Inc., 2100 Logic Drive, San Jose, California 95124; pp. 1-13.

* cited by examiner

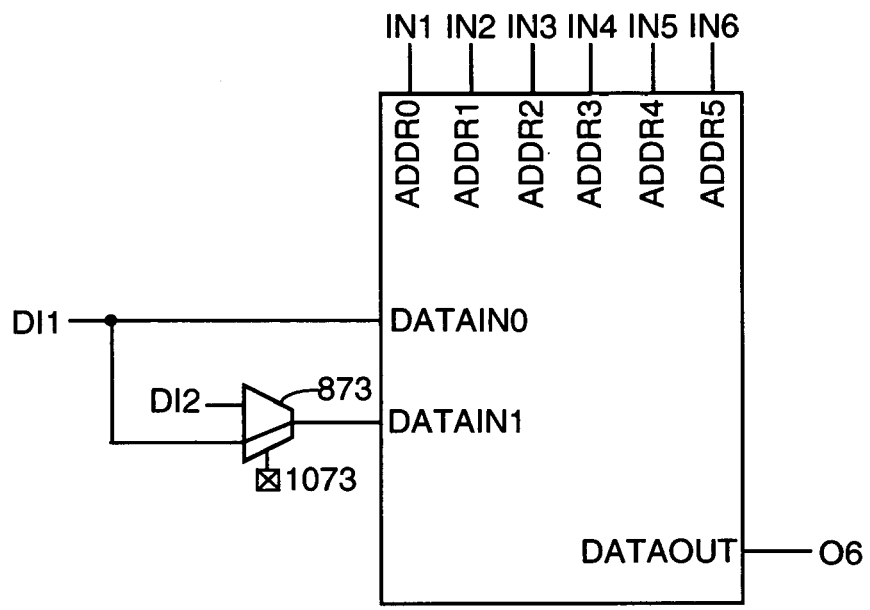
FIG. 10 (64x1 RAM)
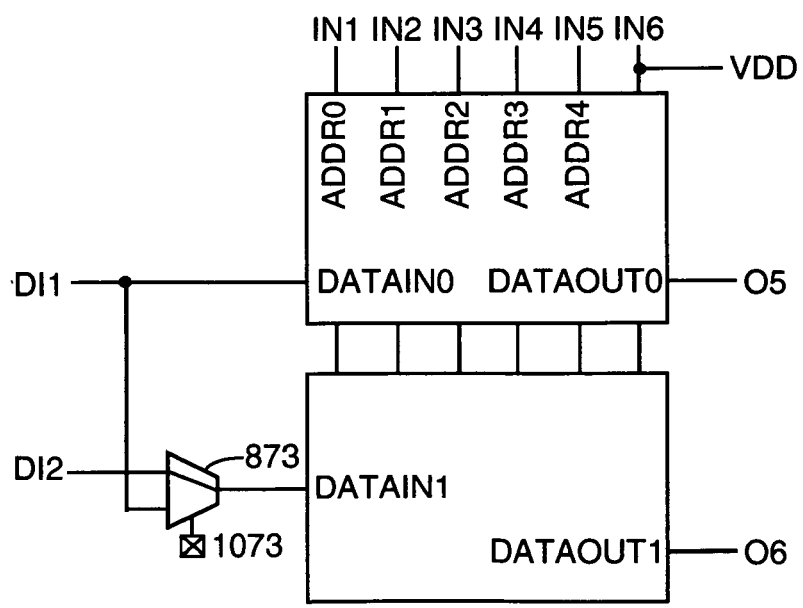
FIG. 11 (32x2 RAM)

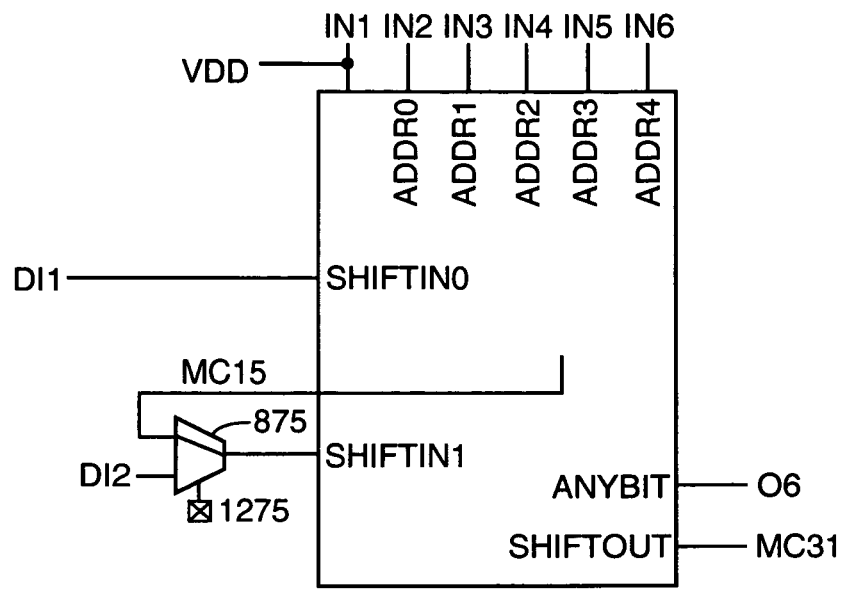
FIG. 12 (32x1 SRL)
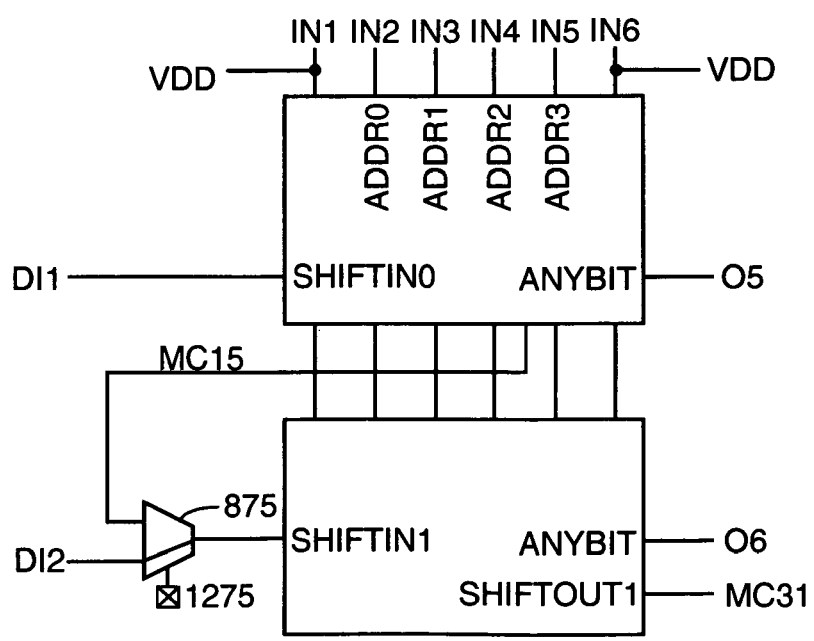
FIG. 13 (16x2 SRL)

| | | | |
|---|---|---|---|
| WL5B2/NW5B2 | WL2B2/NW2B2 | LH0/LV0 | L_D6/L_B1 |
| ER5B2/NE5B2 | ER2B2/NE2B2 | | M_C6/M_A1 |
| NL5B2/EN5B2 | NL2B2/EN2B2 | M_DY/FAN1 | M_D6/M_B1 |
| SR5B2/ES5B2 | SR2B2/ES2B2 | | L_C6/L_A1 |
| EL5B2/SE5B2 | EL2B2/SE2B2 | L_DX/M_CX | L_D4/L_B2 |
| WR5B2/SW5B2 | WR2B2/SW2B2 | | M_C4/M_A2 |
| SL5B2/WS5B2 | SL2B2/WS2B2 | M_DX/L_CX | M_D4/M_B2 |
| NR5B2/WN5B2 | NR2B2/WN2B2 | | L_C4/L_A2 |
| WL5B1/NW5B1 | WL2B1/NW2B1 | M_CY/M_WE | L_D5/L_B3 |
| ER5B1/NE5B1 | ER2B1/NE2B1 | M_SR/L_SR | M_C5/M_A3 |
| NL5B1/EN5B1 | NL2B1/EN2B1 | | M_D5/M_B3 |
| SR5B1/ES5B1 | SR2B1/ES2B1 | GFAN0/ L_CLK | L_C5/L_A3 |
| EL5B1/SE5B1 | EL2B1/SE2B1 | M_CLK/ GFAN1 | L_D3/L_B5 |
| WR5B1/SW5B1 | WR2B1/SW2B1 | M_CE/L_CE | M_C3/M_A5 |
| SL5B1/WS5B1 | SL2B1/WS2B1 | | M_D3/M_B5 |
| NR5B1/WN5B1 | NR2B1/WN2B1 | RSVD/M_BY | L_C3/L_A5 |
| WL5B0/NW5B0 | WL2B0/NW2B0 | L_BX/M_AX | L_D2/L_B4 |
| ER5B0/NE5B0 | ER2B0/NE2B0 | | M_C2/M_A4 |
| NL5B0/EN5B0 | NL2B0/EN2B0 | M_BX/L_AX | M_D2/M_B4 |
| SR5B0/ES5B0 | SR2B0/ES2B0 | | L_C2/L_A4 |
| EL5B0/SE5B0 | EL2B0/SE2B0 | FAN0/M_AY | L_D1/L_B6 |
| WR5B0/SW5B0 | WR2B0/SW2B0 | | M_C1/M_A6 |
| SL5B0/WS5B0 | SL2B0/WS2B0 | LH18/LV18 | M_D1/M_B6 |
| NR5B0/WN5B0 | NR2B0/WN2B0 | | L_C1/L_A6 |

FIG. 57

INTEGRATED CIRCUIT WITH PROGRAMMABLE ROUTING STRUCTURE INCLUDING DIAGONAL INTERCONNECT LINES

FIELD OF THE INVENTION

The invention relates to programmable integrated circuits (ICs). More particularly, the invention relates to a programmable IC that includes in the general interconnect structure "diagonal" interconnect lines, e.g., interconnect lines interconnecting programmable structures located in different rows and different columns.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. As noted above, some FPGAs also include additional logic blocks with special purposes (not shown), e.g., DLLs, block RAM, and so forth.

The design of a PLD logic block can have a strong impact on the usefulness of the PLD as a whole. The lookup tables included in some PLD logic blocks, for example, can include features enabling a wide range of important functions, such as arithmetic functions or compare functions, or can make the implementation of these functions more efficient in area or speed. Improved interconnections within a logic block can also provide significant improvements to the functionality and/or performance of user designs implemented utilizing the logic block.

Further, a PLD interconnect structure can be complex and highly flexible. For example, Young et al. describe the interconnect structure of an exemplary FPGA in U.S. Pat. No. 5,914,616, issued Jun. 22, 1999 and entitled "FPGA Repeatable Interconnect Structure with Hierarchical Interconnect Lines", which is incorporated herein by reference in its entirety. Additional flexibility is a valuable feature in a PLD interconnect structure.

Therefore, it is desirable to provide improvements to a PLD logic block and/or interconnect structure that provide added flexibility, improved efficiency, and/or improved performance.

SUMMARY OF THE INVENTION

The invention provides a routing structure for a programmable integrated circuit (IC) that includes "diagonal" interconnect lines in the general interconnect structure. The programmable IC includes rows and columns of tiles, each tile including logic blocks, segments of interconnect lines, and programmable structures (e.g., routing multiplexers driving the interconnect lines, input multiplexers driving the logic blocks, logic blocks, and/or other programmable structures). The interconnect lines can be used, for example, to interconnect two programmable structures included in tiles located in different rows and different columns. Thus, these "diagonal" interconnect lines can also have programmable access (e.g., via routing multiplexers) to other diagonal interconnect lines in the general interconnect structure.

In some embodiments, the diagonal interconnect lines include "doubles", which interconnect programmable structures in tiles diagonally adjacent to one another, and "pents", which interconnect programmable structures in tiles separated by two intervening rows (or columns) and one intervening column (or row). In some embodiments, a diagonal interconnect line coupled between first and second tiles includes an interconnection to a programmable structure in a tile at the "corner" of the diagonal interconnect line, i.e., in a tile located in the same row (or column) as the first tile, and in the same column (or row) as the second tile.

BRIEF DESCRIPTION OF THE DRAWINGS

The present invention is illustrated by way of example, and not by way of limitation, in the following figures.

FIG. 10 illustrates how the LUT of FIGS. 7-9 can be programmed to operate as a 64×1 RAM.

FIG. 11 illustrates how the LUT of FIGS. 7-9 can be programmed to operate as a 32×2 RAM.

FIG. 12 illustrates how the LUT of FIGS. 7-9 can be programmed to operate as 32×1 shift register logic.

FIG. 13 illustrates how the LUT of FIGS. 7-9 can be programmed to operate as 16×2 shift register logic.

FIG. 57 illustrates how the structures within a tile are laid out in an exemplary embodiment.

DETAILED DESCRIPTION OF THE DRAWINGS

The present invention is applicable to a variety of programmable integrated circuits (ICs). An appreciation of the present invention is presented by way of specific examples utilizing programmable logic devices (PLDs) such as field programmable gate arrays (FPGAs). However, the present invention is not limited by these examples, and can generally be applied to any IC that includes the necessary programmable resources as detailed in or required by the appended claims.

Further, in the following description numerous specific details are set forth to provide a more thorough understanding of the present invention. However, it will be apparent to one skilled in the art that the present invention can be practiced without these specific details.

Figure 2:
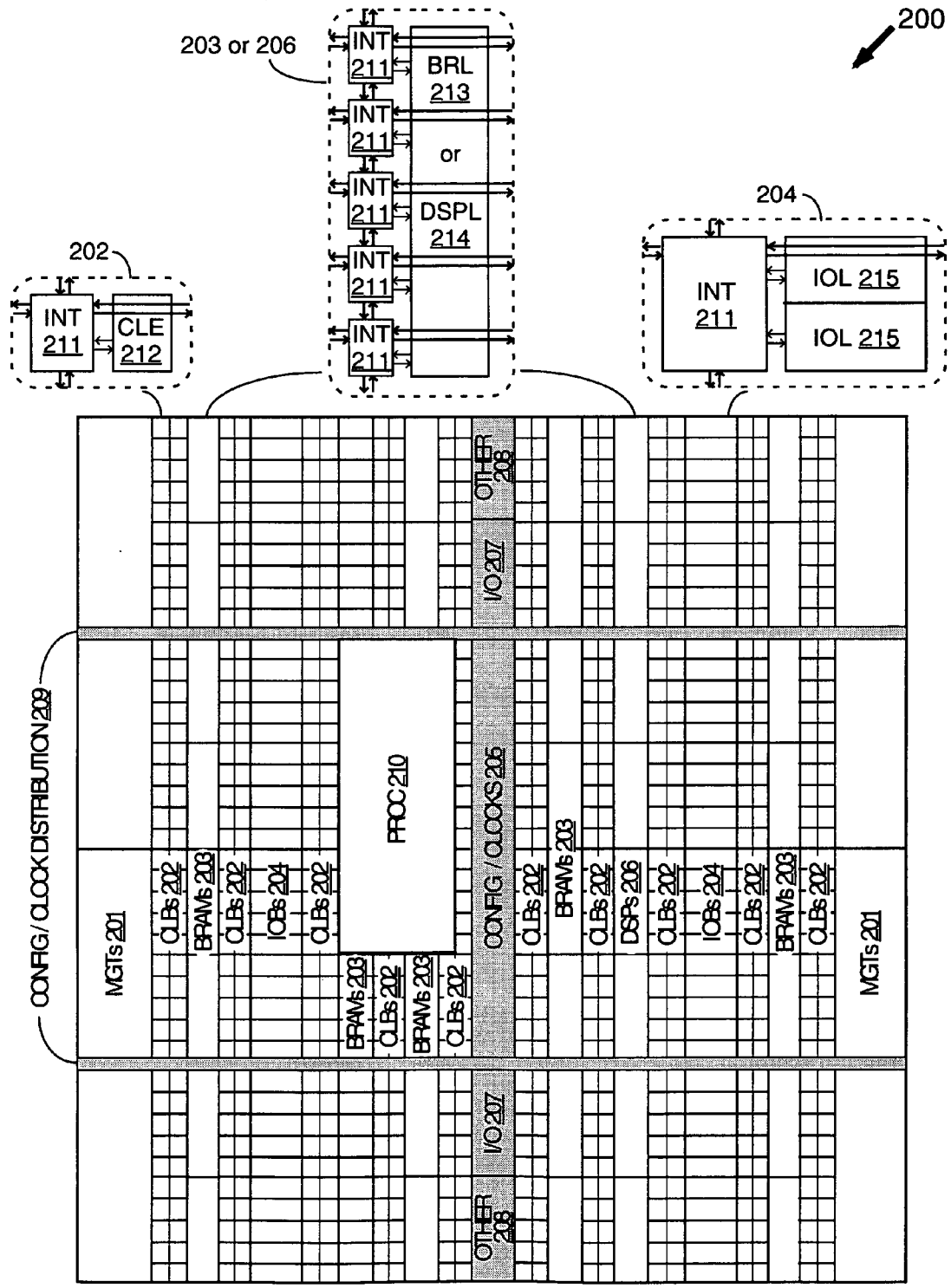
FIG. 2 illustrates an FPGA architecture that includes several different types of programmable logic blocks.

As noted above, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 3:
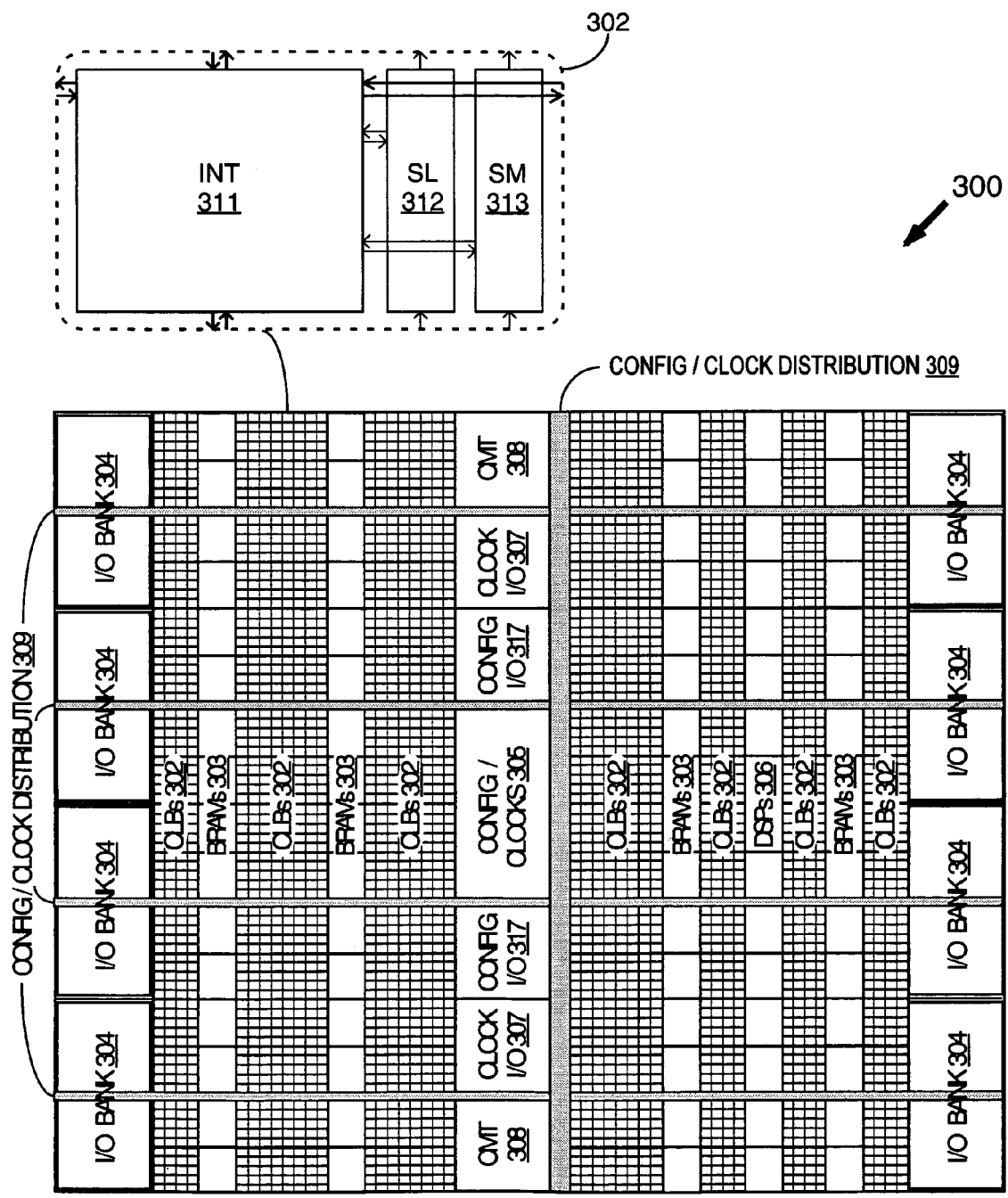
FIG. 3 illustrates another FPGA architecture that includes several different types of programmable logic blocks.

FIG. 3 illustrates an exemplary FPGA 300 utilizing the general architecture shown in FIG. 2. The FPGA includes CLBs 302, BRAMs 303, I/O blocks divided into "I/O Banks" 304 (each including 40 I/O pads and the accompanying logic), configuration and clocking logic 305, DSP blocks 306, clock I/O 307, clock management circuitry (CMT) 308, configuration I/O 317, and configuration and clock distribution areas 309.

In the FPGA of FIG. 3, an exemplary CLB 302 includes a single programmable interconnect element (INT 311) and two different "slices", slice L (SL 312) and slice M (SM 313). In some embodiments, the two slices are the same (e.g., two copies of slice L, or two copies of slice M). In other embodiments, the two slices have different capabilities, as shown in the exemplary embodiment illustrated in FIGS. 4 and 6. In some embodiments, some CLBs include two different slices and some CLBs include two similar slices. For example, in some embodiments some CLB columns include only CLBs with two different slices, while other CLB columns include only CLBs with two similar slices.

Figure 4:
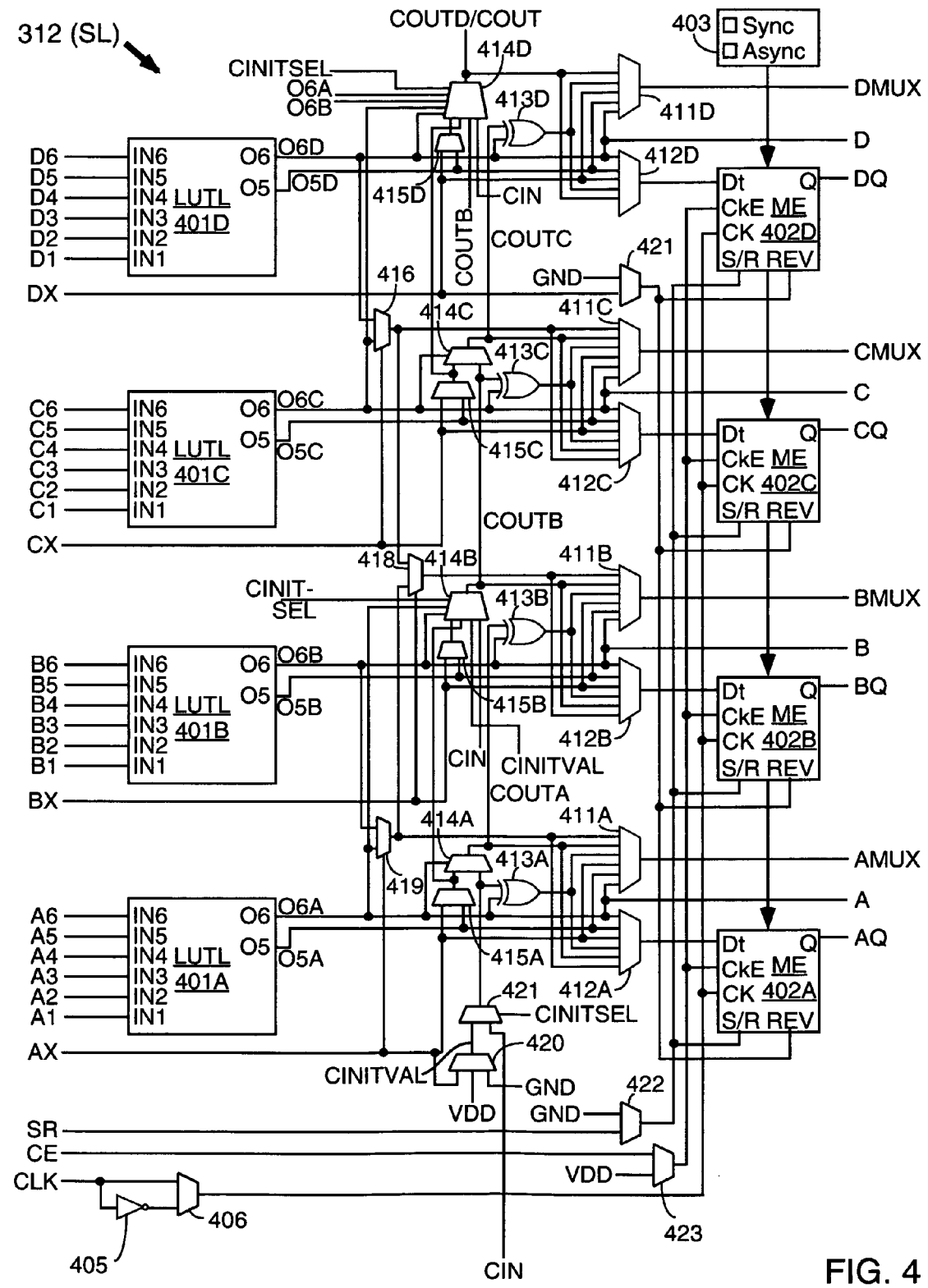
FIG. 4 illustrates a first programmable "slice" that can be included, for example, in the FPGAs of FIGS. 2 and 3.

FIG. 4 illustrates one embodiment of slice L (SL 312) that can be used, for example, in the FPGA of FIG. 3. In some embodiments, CLB 302 includes two or more copies of slice 312. In other embodiments, only one copy of slice 312 is included in each CLB. In other embodiments, the CLBs are implemented without using slices or using slices other than those shown in the figures herein.

In the embodiment of FIG. 4, slice L includes four lookup tables (LUTLs) 401A-401D, each driven by six LUT data input terminals A1-A6, B1-B6, C1-C6, and D1-D6 and each providing two LUT output signals O5 and O6. (In the present specification, the same reference characters are used to refer to terminals, signal lines, and their corresponding signals.) The O6 output terminals from LUTs 401A-401D drive slice output terminals A-D, respectively. The LUT data input signals are supplied by the FPGA interconnect structure (not shown in FIG. 4) via input multiplexers (not shown in FIG. 4), and the LUT output signals are also supplied to the interconnect structure. Slice L also includes: output select multiplexers 411A-411D driving output terminals AMUX-DMUX; multiplexers 412A-412D driving the data input terminals of memory elements 402A-402D; combinational multiplexers 416, 418, and 419; bounce multiplexer circuits 422-423; a circuit represented by inverter 405 and multiplexer 406 (which together provide an optional inversion on the input clock path); and carry logic comprising multiplexers 414A-414D, 415A-415D, 420-421 and exclusive OR gates 413A-413D. All of these elements are coupled together as shown in FIG. 4. Where select inputs are not shown for the multiplexers illustrated in FIG. 4, the select inputs are controlled by configuration memory cells. These configuration memory cells, which are well known, are omitted from FIG. 4 for clarity, as from other selected figures herein.

In the pictured embodiment, each memory element 402A-402D can be programmed to function as a synchronous or asynchronous flip-flop or latch. The selection between synchronous and asynchronous functionality is made for all four memory elements in a slice by programming Sync/Asynch selection circuit 403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 402A-402D are clocked by a clock signal CK, e.g., provided by a global clock network or by the interconnect structure. Such programmable memory elements are well known in the art of FPGA design. Each memory element 402A-402D provides a registered output signal AQ-DQ to the interconnect structure.

The bounce multiplexer circuits 422, 423 provided for the SR (set/reset) input signal and the clock enable (CE) input signals are further described below in conjunction with FIG. 27. The carry logic is further described below in conjunction with FIG. 16.

Each LUT 401A-401D provides two output signals, O5 and O6. The LUT can be configured to function as two 5-input LUTs with five shared input signals (IN1-IN5), or as one 6-input LUT having input signals IN1-IN6. Each LUT 401A-401D can be implemented, for example, as shown in FIG. 5.

Figure 5:
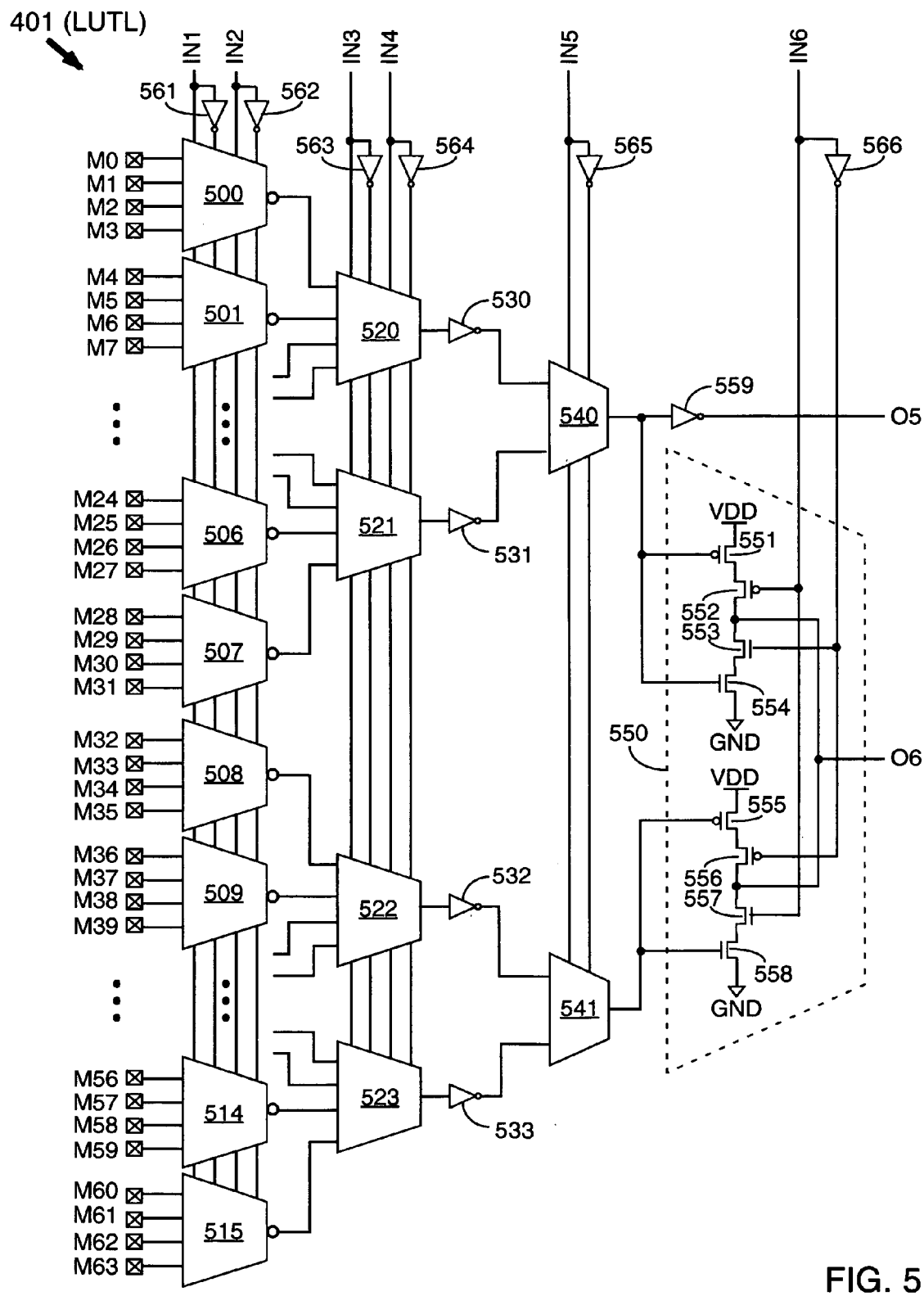
FIG. 5 illustrates an exemplary lookup table (LUT) that can be included, for example, in the slice of FIG. 4.

In the embodiment of FIG. 5, configuration memory cells M0-M63 drive 4-to-1 multiplexers 500-515, which are controlled by input signals IN1, IN2 and their inverted counterparts (provided by inverters 561, 562) to select 16 of the signals from the configuration memory cells. The selected 16 signals drive four 4-to-1 multiplexers 520-523, which are controlled by input signals IN3, IN4 and their inverted counterparts (provided by inverters 563, 564) to select four of the signals to drive inverters 530-533. Inverters 530-533 drive 2-to-1 multiplexers 540-541, which are controlled by input signal IN5 and its inverted counterpart (provided by inverter 656). The output of multiplexer 540 is inverted by inverter 559 and provides output signal O5. Thus, output signal O5 can provide any function of up to five input signals, IN1-IN5. Inverters can be inserted wherever desired in the multiplexer structure, with an additional inversion being nullified by simply storing inverted data in the configuration memory cells M0-M63. For example, the embodiment of FIG. 5 shows bubbles on the output terminals of multiplexers 500-515, which signifies an inversion (e.g., an inverter) on the output of each of these multiplexers.

Multiplexers 540 and 541 both drive data input terminals of multiplexer 550, which is controlled by input signal IN6 and its inverted counterpart (provided by inverter 566) to select either of the two signals from multiplexers 540-541 to drive output terminal O6. Thus, output signal O6 can either provide any function of up to five input signals IN1-IN5 (when multiplexer 550 selects the output of multiplexer 541, i.e., when signal IN6 is high), or any function of up to six input signals IN1-1N6.

In the pictured embodiment, multiplexer 550 is implemented as two three-state buffers, where one buffer is driving and the other buffer is disabled at all times. The first buffer includes transistors 551-554, and the second buffer includes transistors 555-558, coupled together as shown in FIG. 5.

Figure 6:
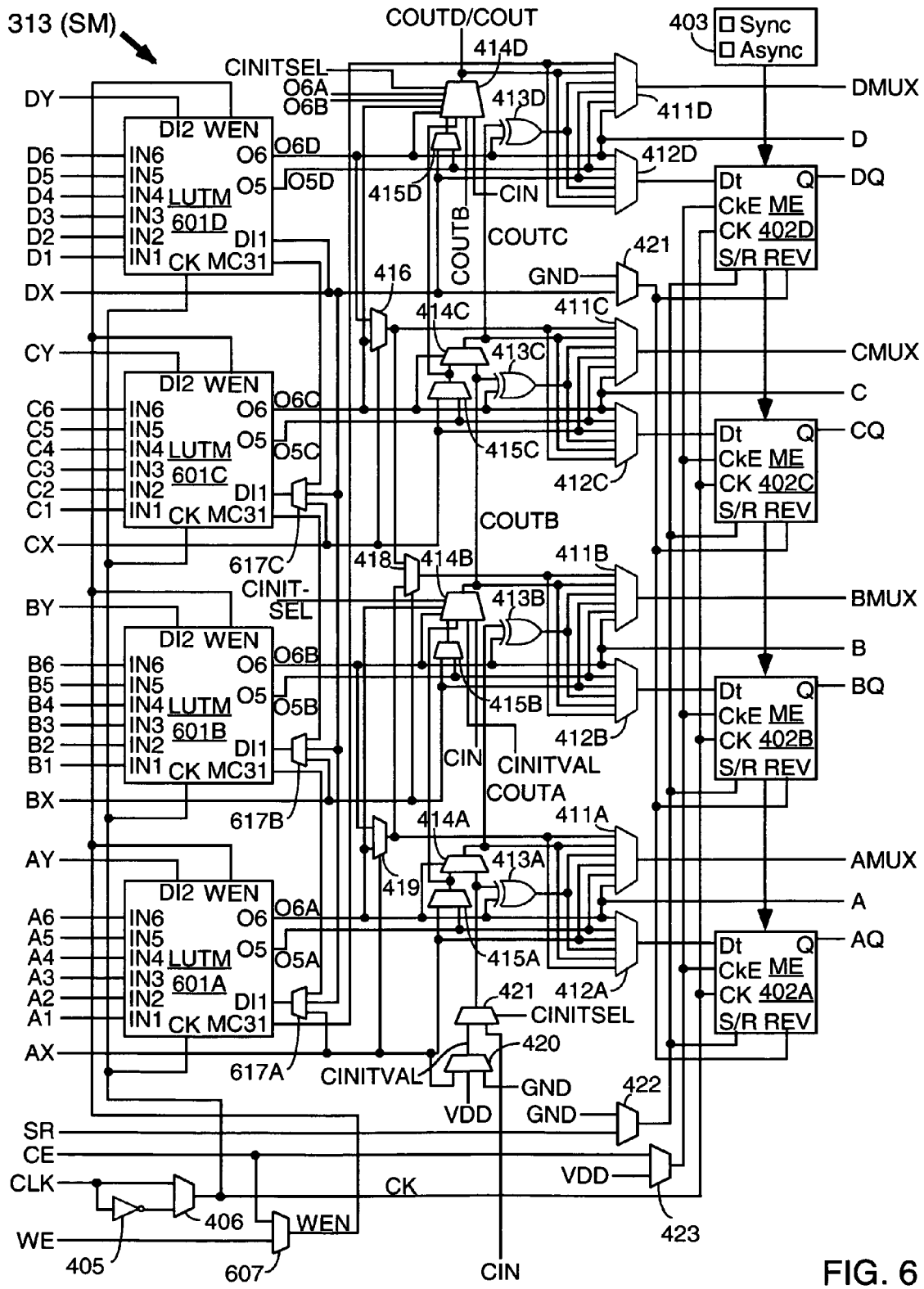
FIG. 6 illustrates a second programmable slice that can be included, for example, in the FPGAs of FIGS. 2 and 3.

FIG. 6 illustrates one embodiment of slice M (SM 313) that can be used, for example, in the FPGA of FIG. 3. In some embodiments, CLB 302 includes two or more copies of slice 313. In other embodiments, only one copy of slice 313 is included in each CLB. In other embodiments, the CLBs are implemented without using slices or using slices other than those shown in the figures herein.

Slice M is similar to slice L of FIG. 4, except for added functionality in the LUTs and additional circuitry associated with this added functionality. Similar elements are numbered in a similar manner to those in FIG. 4. In the embodiment of FIG. 6, each LUTM 601A-601D can function in any of several modes. When in lookup table mode, each LUT has six data input signals IN1-1N6 that are supplied by the FPGA interconnect structure (not shown in FIG. 6) via input multiplexers (not shown in FIG. 6). One of 64 data values is programmably selected from configuration memory cells based on the values of signals IN1-1N6, as in the embodiment of FIG. 5. When in RAM mode, each LUT functions as a single 64-bit RAM or two 32-bit RAMs with shared addressing. The RAM write data is supplied to the 64-bit RAM via input terminal DI1 (via multiplexers 617A-617C for LUTs 601A-601C), or to the two 32-bit RAMs via input terminals DI1 and DI2. RAM write operations in the LUT RAMs are controlled by clock signal CK from multiplexer 406 and by write enable signal WEN from multiplexer 607, which can selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals can be provided through the LUT output terminals, and the 32-bit shift out signal can also be provided more directly via LUT output terminal MC31. The 32-bit shift out signal MC31 of LUT 601A can also be provided to the general interconnect structure for shift register chaining, via output select multiplexer 411D and CLE output terminal DMUX.

Figure 7:
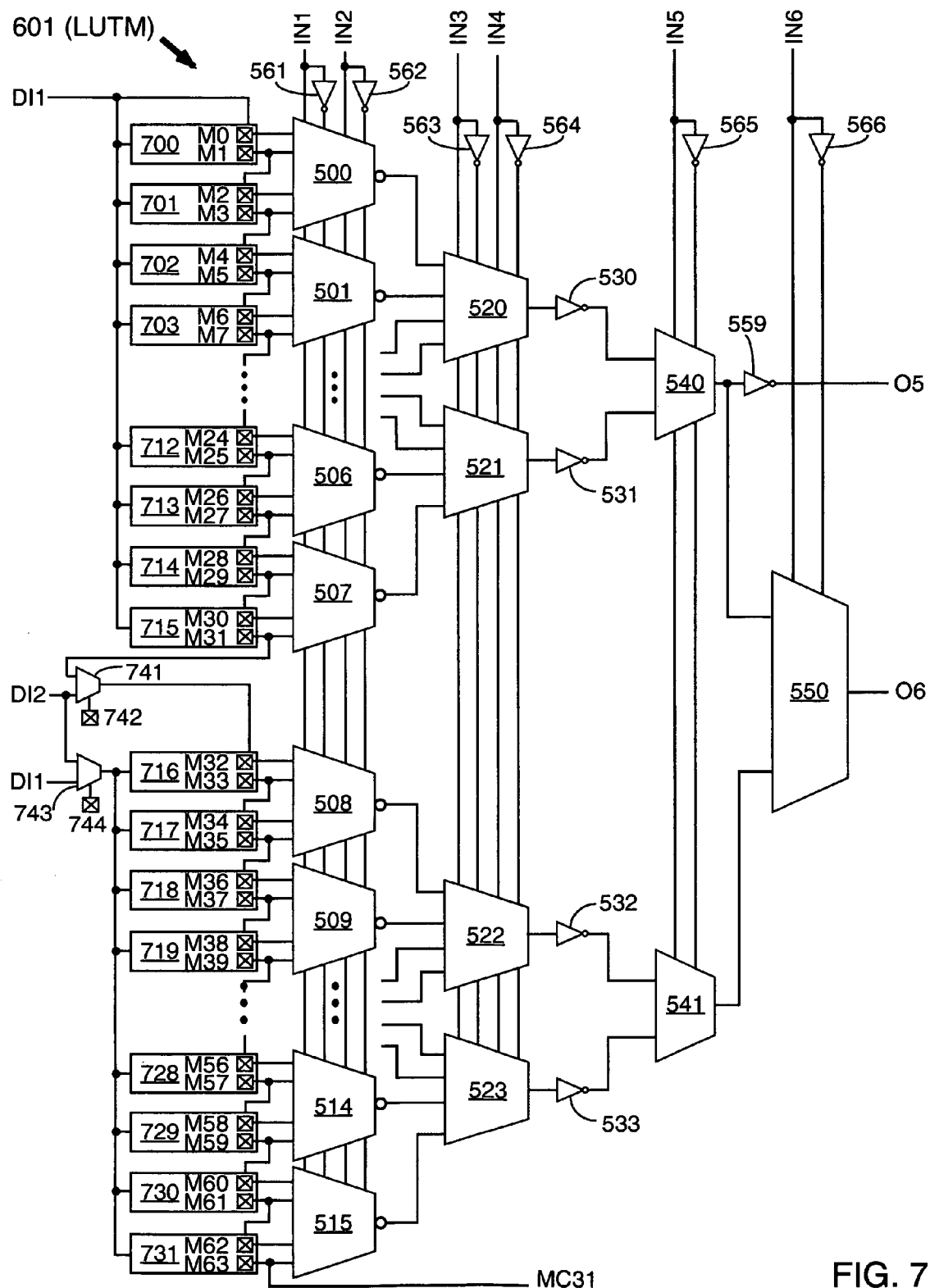
FIG. 7 illustrates an exemplary LUT that can be included, for example, in the slice of FIG. 6.

FIG. 7 illustrates one embodiment of LUTs 601A-601D. LUTs 601A-601D are similar to LUTs 401A-401D (see FIG. 5), except that instead of simply driving the multiplexer data input terminals from configuration memory cells M0-M63, additional logic circuits are added to add the optional shift register and RAM functionality. The additional logic includes memory circuits 700-731, multiplexers 741, 743, and configuration memory cells 742,744. Memory circuits 700-731 store the shift values or RAM values, while multiplexers 741, 743 are controlled by memory cells 742, 744 to select shift data and/or RAM input data, as is now described in conjunction with FIG. 8.

Figure 8:
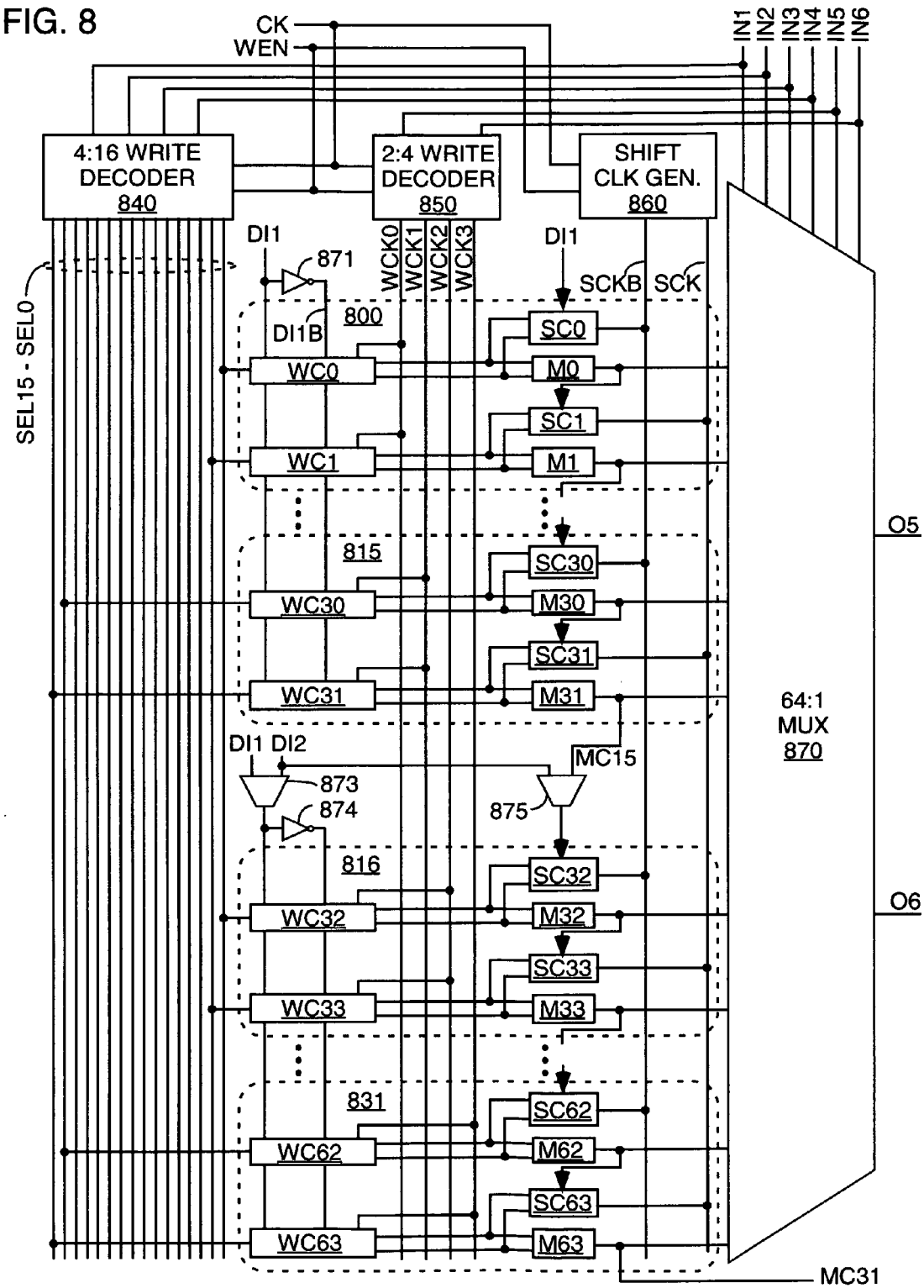
FIG. 8 illustrates further details of the exemplary LUT of FIG. 7.

FIG. 8 illustrates in more detail the additional logic added to LUTs 601A-601D. The memory cells M0-M63 are grouped into pairs, each pair being included in one of 32 logic circuits 800-831. Each logic circuit 800-831 also includes two shift circuits SC0-SC63 and two RAM write circuits WC0-WC63. For example, logic circuit 800 includes two memory cells M0 and M1, two shift circuits SC0 and SC1, and two RAM write circuits WC0-WC1. Logic circuit 800 implements either two memory cells (in LUT mode), one bit of a shift register (in shift register mode), or two bits of RAM (in RAM mode).

In RAM mode, 4:16 write decoder 840 and 2:4 write decoder 850 decode the input signals IN1-IN6 to provide signals SEL15-SEL0 and WCK0-WCK3, respectively. Decoding the six input signals in two separate groups (bits IN1-1N4 in write decoder 840, and bits IN5-1N6 in write decoder 850) consumes less area than utilizing a single large decoder. These signals in turn select a write address for the RAM data on input terminal DI1 (for bits 0-31) or on one of input terminals DI1 and DI2 (for bits 32-63), as selected by multiplexer 873. The write operation takes place under the control of clock signal CK and write enable signal WEN. In the pictured embodiment, input signals IN1-1N6 are latched at the inputs to the write decoder circuits while a write is occurring. Input signals DI1 and DI2 are also latched (not shown). Signal WEN is latched in 2:4 write decoder 850 before being used to control signals WCK0-WCK3. Note that signal WCK0 drives the first 16 RAM write circuits WC0-WC15; signal WCK1 drives the second 16 RAM write circuits WC16-WC31; and so forth. Signal SEL0 drives RAM write cells WC0, WC16, WC32, and WC48; signal SEL1 drives RAM write cells WC1, WC17, WC33, and WC49; and so forth.

In shift register mode, shift clock generator 860 is controlled by signals CK and WEN to provide shift clock signal SCKB and inverted shift clock signal SCK. Signals SCK and SCKB are non-overlapping clock signals that are only active when the LUT is in shift register mode. A shift-in signal is provided by signal DI1 (for bits 0-15) or by one of input terminal DI2 and the shift out signal MC15 from memory cell M31 (for bits 16-31), as selected by multiplexer 875. The shift bit is passed successively through the memory cells under the control of signals SCKB and SCK, until the shift out signal is passed out either through the 64:1 multiplexer 870 or via output terminal MC31. The memory cells M0-M63 provide alternate master and slave functionality, so the maximum number of bits in the shift register is one-half the number of memory cells, or 32. In the pictured embodiment, signal WEN is latched in shift clock generator 860 before being used to control signals SCKB and SCK.

Figure 9:
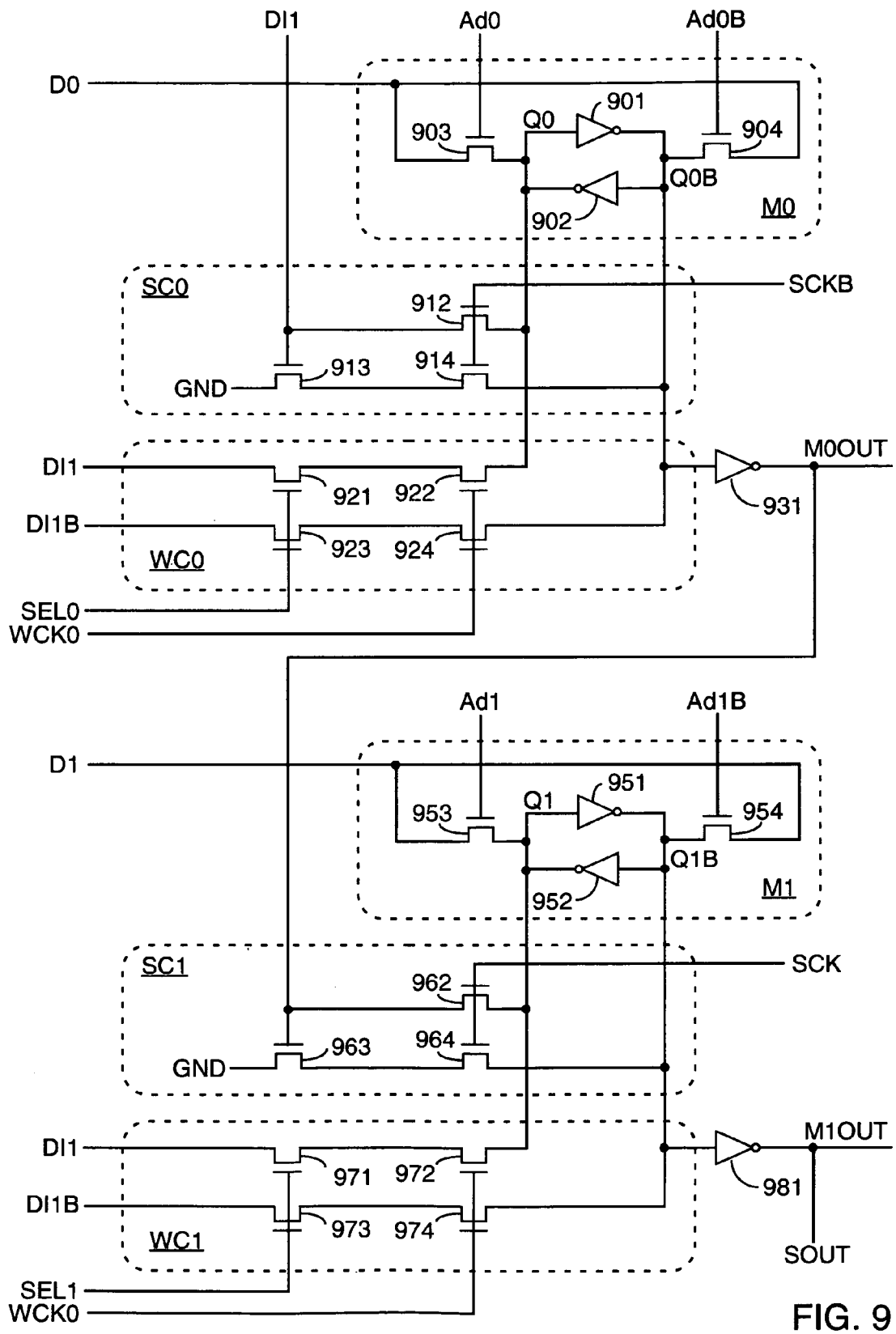
FIG. 9 provides a more detailed illustration of the memory cells, RAM write circuits, and shift circuits included in the LUT of FIG. 8.

FIG. 9 illustrates logic circuit 800 of FIG. 8 in more detail. Memory cell M0 includes two cross-coupled inverters 901 and 902. N-channel transistor 903 passes signal D0 to node Q0 (the output of inverter 902) when address signal Ad0 is high, and N-channel transistor 904 passes signal D0 to node Q0B (the output of inverter 901) when address signal Ad0B is high, as part of the configuration process for the PLD.

Shift circuit SC0 includes an N-channel transistor 912 coupled between input signal DI1 and node Q0 of memory cell M0, and gated by signal SCKB. Also included in shift circuit SC0 are two N-channel transistors 913 and 914 coupled in series between ground GND and node Q0B of memory cell M0, and gated by signals DI1 and SCKB, respectively. Thus, when signal SCKB goes high, the value on input signal DI1 is placed on node Q0, and a complementary value on node Q0B. Inverter 931 provides the value of node Q0 on signal M0OUT to the LUT multiplexer and to the slave latch via shift circuit SC1.

RAM write circuit WC0 includes two N-channel transistors 921 and 922 coupled in series between the DI1 terminal and node Q0, and gated by signals SEL0, WCK0, respectively. Also included in RAM write circuit WC0 are two N-channel transistors 923 and 924 coupled in series between the DI1B terminal and node Q0B, and gated by signals SEL0 and WCK0, respectively. Thus, whenever signals SEL0 and WCK0 are both high, the value of DI1 is stored in memory cell M0 at node Q0.

Memory cell M1 includes two cross-coupled inverters 951 and 952. N-channel transistor 953 passes signal D1 to node Q1 (the output of inverter 952) when address signal Ad1 is high, and N-channel transistor 954 passes signal D1 to node Q1B (the output of inverter 951) when address signal Ad1B is high, as part of the configuration process for the PLD.

Shift circuit SC1 includes an N-channel transistor 962 coupled between signal M0OUT and node Q1 of memory cell M1, and gated by signals Q0B from memory cell M0 and signal SCK, respectively. Also included in shift circuit SC1 are two N-channel transistors 963 and 964 coupled in series between ground GND and node Q1B of memory cell M1, and gated by signals Q0 from memory cell M0 and SCK, respectively. Thus, when signal SCK goes high, the value on signal M0OUT is placed on node Q1, and a complementary value on node Q1B. Thus, a high value on signal SCKB followed by a high value on signal SCK advances the shift value by one position in the shift register. Inverter 981 provides the value of node Q1 on signal M1OUT to the LUT multiplexer, and on a shift out output terminal SOUT to the master latch of the next bit in the shift register.

RAM write circuit WC1 includes two N-channel transistors 971 and 972 coupled in series between the DI1 terminal and node Q1, and gated by signals SEL1, WCK0, respectively. Also included in RAM write circuit WC1 are two N-channel transistors 973 and 974 coupled in series between the DI1B terminal and node Q1B, and gated by signals SEL1 and WCK0, respectively. Thus, whenever signals SEL1 and WCK0 are both high, the value of DI1 is stored in memory cell M1 at node Q1.

FIG. 10 illustrates how the LUT of FIGS. 7-9 can be programmed to operate as a 64×1 RAM. Signal DI1 provides the RAM data input DATAIN0 to the first half of the LUT. Multiplexer 873 is configured to pass the DI1 input signal to the second half of the LUT (DATAIN1), e.g., under the control of configuration memory cell 1073. Therefore, the DI1 input signal provides the RAM data input to the entire LUT. LUT data input signals IN1-IN6 provide the address signals ADDR0-ADDR5 for the 64-bit (2**6, or 2 to the 6th power) RAM array. For example, FIG. 7 shows how the RAM array is addressed by the six data input signals IN1-IN6 to select LUT output signal O6. The RAM data value addressed by signals ADDR0-ADDR5 (DATAOUT) is provided at the O6 output terminal of the LUT.

FIG. 11 illustrates how the LUT of FIGS. 7-9 can be programmed to operate as a 32×2 RAM. Signal DI1 provides the RAM data input signal DATAIN0 to the first half of the LUT. LUT data input signal IN6 is tied to power high VDD, to separate the O5 LUT output signal from the O6 LUT output signal (e.g., see FIG. 5). LUT data input signals IN1-IN5 provide the address signals ADDR0-ADDR4 for the RAM array. The RAM data value addressed by signals ADDR0-ADDR4 (DATAOUT0) is provided at the O5 output terminal of the LUT.

Multiplexer 873 is configured to pass the DI2 input signal to the second half of the LUT (DATAIN1), e.g., under the control of configuration memory cell 1073. LUT data input signals IN1-1N5 provide the address signals ADDR0-ADDR4 for the RAM array. The RAM data value addressed by signals ADDR0-ADDR4 (DATAOUT1) is provided at the O6 output terminal of the LUT.

FIG. 12 illustrates how the LUT of FIGS. 7-9 can be programmed to operate as 32×1 shift register logic (SRL). Signal DI1 provides the shift register data input signal SHIFTIN0 to the first bit in the first half of the LUT. Multiplexer 875 is configured to pass the sixteenth shift out signal MC15 from the first half of the LUT to the second half of the LUT (SHIFTIN1), e.g., under the control of configuration memory cell 1275. Therefore, the entire LUT memory array is configured as a single continuous shift register. The shift out value SHIFTOUT from the last bit of the shift register is provided at the MC31 output terminal of the LUT (e.g., see FIG. 8).

Additional functionality is also provided by the shift register logic. Any of the 32 bits stored in the shift register can be read from the array, with the selected bit ANYBIT being provided at the O6 output terminal of the LUT. Note that LUT data input signal IN1 is tied to power high VDD, because each bit in the shift register uses a pair of memory cells. Therefore, the master latch in each pair is always selected when the memory cell is addressed. LUT data input signals IN2-1N6 provide the address signals ADDR0-ADDR4 for the 32-bit shift register.

FIG. 13 illustrates how the LUT of FIGS. 7-9 can be programmed to operate as 16×2 shift register logic, i.e., two 16×1 shift register circuits implemented in a single LUT. Signal DI1 provides the shift register data input SHIFTIN0 to the first bit in the first half of the LUT. In the pictured embodiment, the last shift out value MC15 from the first half of the LUT is not directly provided to an output terminal of the LUT (see FIG. 8). However, any of the sixteen shift values ANYBIT from the first half of the LUT can be read from LUT output terminal O5 via the LUT select multiplexer, with LUT data input signals IN2-IN5 providing the address signals ADDR0-ADDR3 for the 16-bit shift register. As in the 32×1 shift register mode, the IN1 data input signal is tied to power high VDD, because each bit in the shift register uses a pair of memory cells. The IN6 data input signal is also tied to power high VDD, to separate the O5 LUT output signal from the O6 LUT output signal (e.g., see FIG. 5).

Multiplexer 875 is configured to pass input signal DI2 to the second half of the LUT (SHIFTIN1), e.g., under the control of configuration memory cell 1275. Therefore, the LUT memory array is configured as two shift register circuits. The shift out value SHIFTOUT1 from the last bit of the second shift register is provided at the MC31 output terminal of the LUT (e.g., see FIG. 8). Additionally, any of the sixteen shift values ANYBIT from the second half of the LUT can be read from LUT output terminal 06 via the LUT select multiplexer, with LUT data input signals IN2-IN5 providing the address signals ADDR0-ADDR3 for the 16-bit shift register.

In some user designs, only a single 16-bit shift register is implemented in one LUT. For these designs, the dual shift register configuration of FIG. 13 provides a power advantage. When only one of the two 16-bit shift registers is used, the LUT of FIGS. 7-9 can be configured to disable the unused bits, to prevent the unnecessary power consumption caused by toggling the unused bits. For example, when only the first shift register is used (the "top" shift register in FIG. 13), a constant value (VDD or GND) can be supplied to the DI2 input terminal. When only the second shift register is used (the "bottom" shift register in FIG. 13), a constant value (VDD or GND) can be supplied to the DI1 input terminal.

Figure 14:
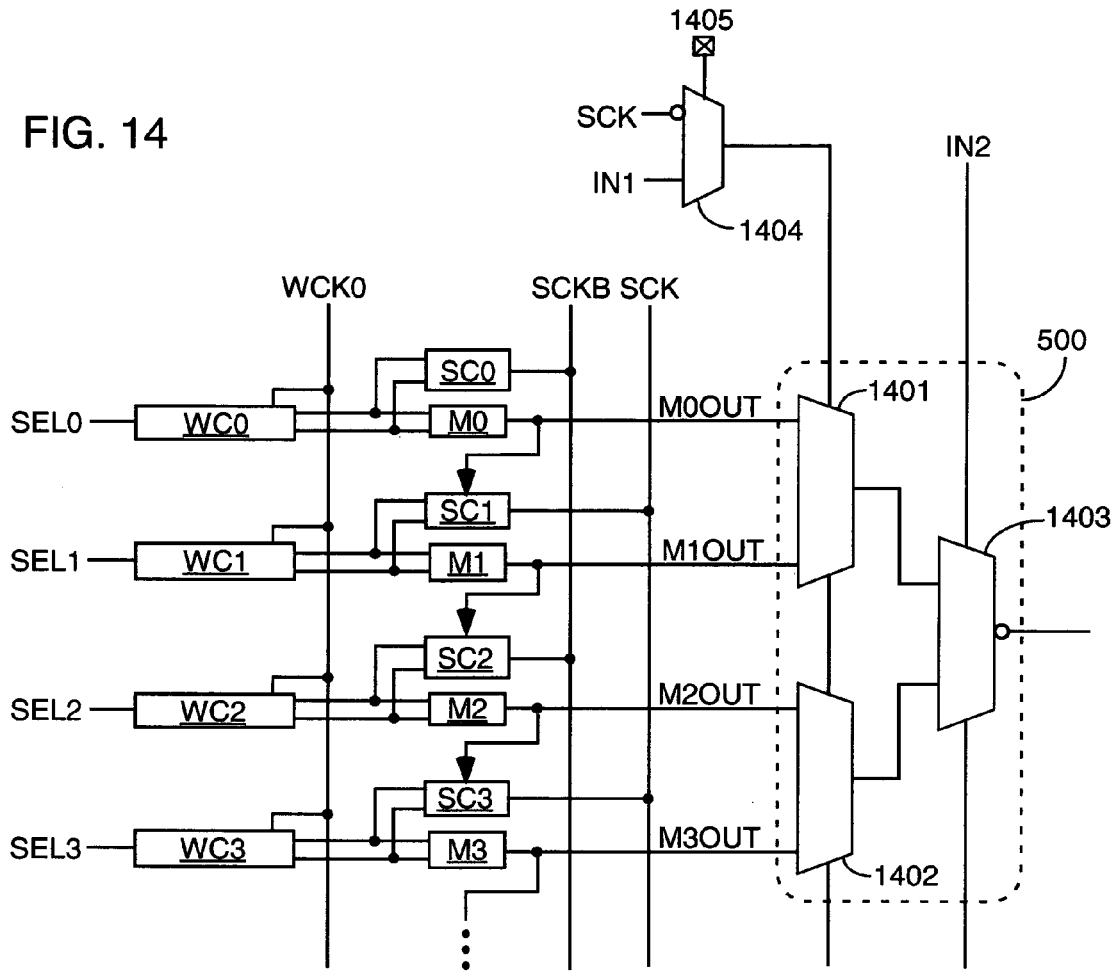
FIG. 14 illustrates how the LUT of FIGS. 7-9 can be modified to improve performance while in shift register mode.

FIG. 14 illustrates how the LUT of FIGS. 7-9 can be optionally modified to reduce output delay while in shift register logic (SRL) mode, i.e., when configured as shown in either of FIGS. 12 and 13. The advantage stems from the master-slave implementation of the shift register. Assume that the shift register output value is being read through the LUT multiplexer. When the LUT is implemented as shown in FIG. 7, a value newly written to the shift register is first loaded from the master latch to the slave latch in the final bit of the shift register, then read out through the LUT multiplexer. The total delay incurred by traversing this signal path can be undesirably long. The delay can be reduced by passing the slave latch in the final bit of the shift register, i.e., by reading the value from the master latch instead of from the slave latch. This technique can be applied when reading a value from any desired bit position in the shift register logic.

To implement this functionality, the first stage of the LUT multiplexer can be modified as shown in FIG. 14. First stage multiplexers 1401 and 1402 are controlled by a bypass select multiplexer 1404, while the second stage multiplexers (e.g., multiplexer 1403) are controlled by LUT data input signal IN2. (Note that multiplexers 1401-1403 can correspond, for example, to 4-to-1 multiplexer 500 of FIG. 5.) Bypass select multiplexer 1404 is controlled by configuration memory cell 1405 to select either LUT data input signal IN1 (in LUT mode and RAM mode) or the inverse of shift clock signal SCK (in SRL mode). In LUT mode and RAM mode, the LUT multiplexer functions as previously described in connection with the earlier figures. In SRL mode, a high value on shift clock signal SCK simultaneously shifts a value in each master latch to the corresponding slave latch, and selects a value from one of the master latches and provides the selected value as an output signal from the shift register. Note that in this embodiment, the value is present at the LUT output terminal for an entire cycle of shift clock signal SCK.

Figure 15:
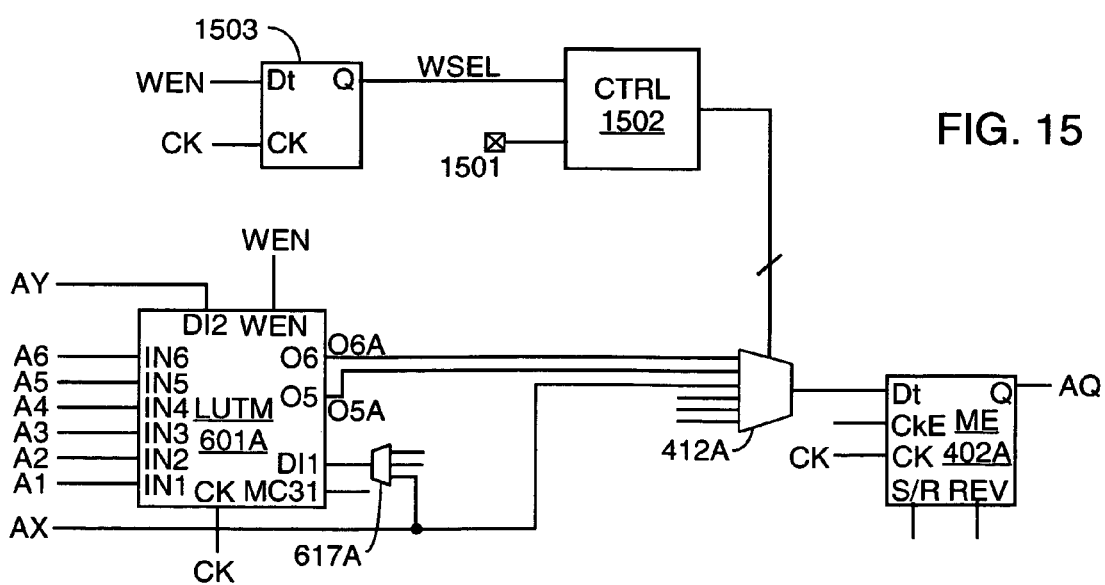
FIG. 15 illustrates how the slice of FIG. 6 can be modified to improve performance while in RAM mode.

FIG. 15 illustrates how the slice of FIG. 6 can be optionally modified to reduce output delay while in RAM mode, i.e., when configured as shown in either of FIGS. 10 and 11. The advantage is gained when writing a new value to the RAM, and simultaneously reading that value from the RAM. When the slice is implemented as shown in FIG. 6, a value newly written to the RAM is first written to the LUT memory at the address designated by the address input values (IN1-IN6 or IN1-IN5), then read out through the LUT multiplexer, and (typically) stored in the associated flip-flop. The delay on the output path can be reduced by configuring the output path to bypass the LUT memory and the LUT multiplexer, i.e., by storing the new value in the flip-flop at the same time that the new value is stored in the LUT memory.

To implement this functionality, the slice can be modified as shown in FIG. 15. Note that some elements of FIG. 15 are similar to those shown in FIG. 6, and similar elements are similarly numbered. Some or all of the bits in the slice can be modified as shown. The LUT is the same as the LUT shown in FIG. 6, and both output values (O5, O6) from the LUT are provided via multiplexer 412A to flip-flop 402A. In the embodiment of FIG. 6, multiplexer 412A is controlled by configuration memory cells to select which input value will be stored in flip-flop 402A. When in 64×1 RAM mode, LUT output signal O6A is typically selected for storage in flip-flop 402A. When in 32×2 RAM mode, one of signals O5A and O6A is typically selected for storage in flip-flop 402A, while the other signal is routed to another nearby flip-flop. In some embodiments, signal O6A is preferentially stored in flip-flop 402A, while signal O5A is routed to a flip-flop in an adjacent slice.

In the embodiment of FIG. 15, the logic controlling multiplexer 412A is modified, compared to the embodiment of FIG. 6. Control logic 1502 is controlled by configuration memory cell 1501 to either function as in previously-described embodiments, or to enter RAM mode. In some embodiments, memory cell 1501 is an existing configuration memory cell already included in LUT 601A, and controlling the mode of operation for the LUT. When in RAM mode and the RAM write enable signal goes high, signaling a write operation, signal AX is selected to be stored in flip-flop 402A. Signal AX is also the RAM write data input signal for all bits when in 64×1 RAM mode, and for the top 32 bits when in 32×2 RAM mode. Thus, the data being written to the RAM is also written directly to the flip-flop, bypassing the LUT memory and the LUT multiplexer. Note that in the pictured embodiment, the RAM write enable signal WEN is registered in flip-flop 1503 with the same clock signal CK as flip-flop 402A, to ensure a clean write to the flip-flop. In other words, the registered RAM write enable signal WSEL is synchronized with the flip-flop clock signal CK.

Figure 16:
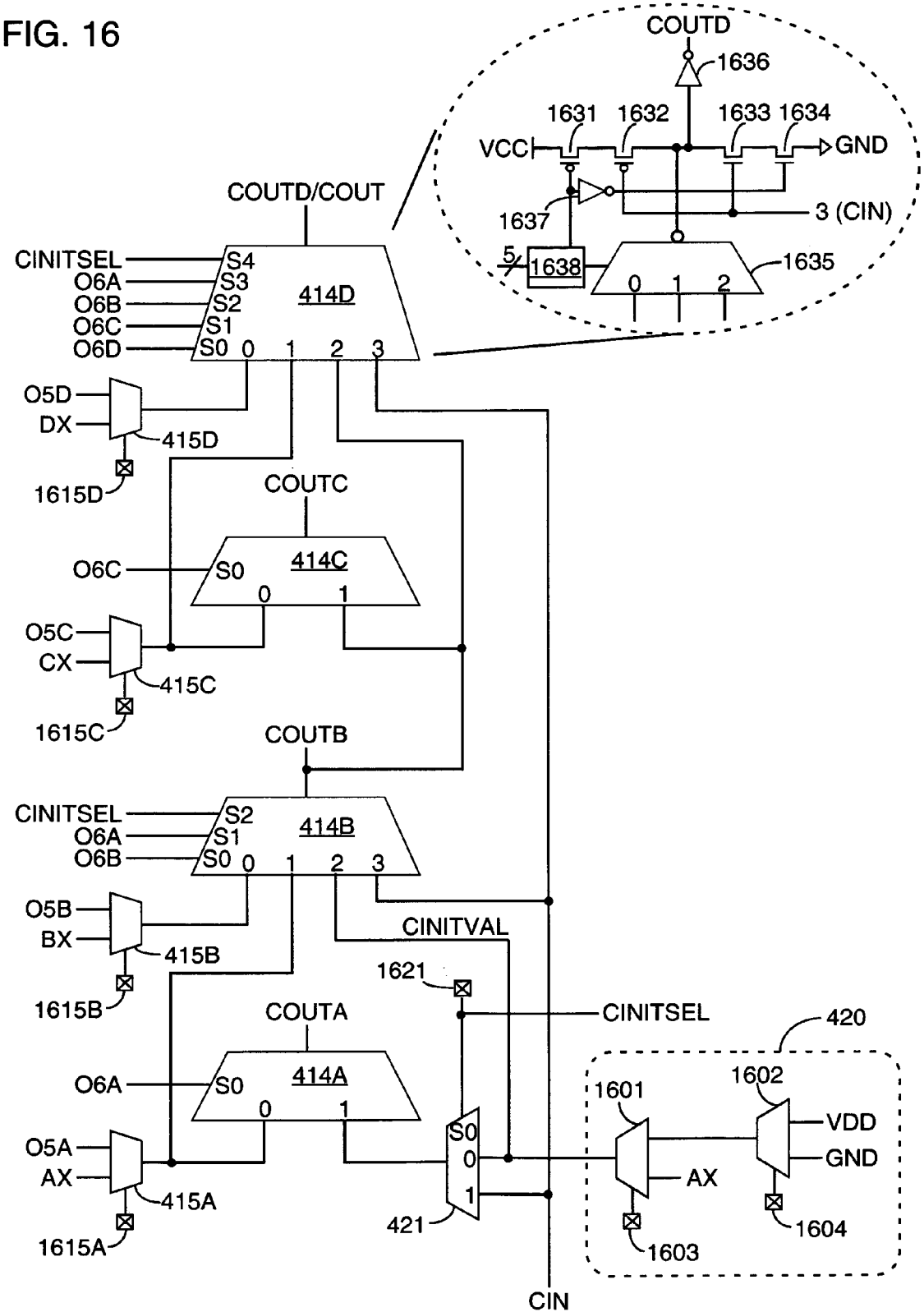
FIG. 16 illustrates in more detail a carry chain that can be included, for example, in the slices of FIGS. 4 and 6.

FIG. 16 illustrates a carry chain that can be included, for example, in the slices of FIGS. 4 and 6. Many of the elements of FIG. 16 correspond to similarly numbered elements in these figures. However, additional details of the carry chain logic are provided in FIG. 16.

Traditionally, PLD slices include a series of similar 2-to-1 multiplexers, chained together carry-out to carry-in in traditional fashion. However, carry chain performance is an important factor in many user designs, and long carry chains, e.g., carry chains of 16- or 32-bits, are common. Therefore, the slices of FIGS. 4 and 6 incorporate carry lookahead circuits to improve the speed of long carry chains.

The carry chain illustrated in FIG. 16 has four stages, one stage for each LUT/memory element pair in the slice. The fourth stage (multiplexer 414D) provides an output signal COUTD having 4-bit carry lookahead, and the second stage (multiplexer 414B) provides an output signal COUTB having 2-bit carry lookahead. In the pictured embodiment, the per-bit delay is smallest for the 4-bit grouping, and next smallest for the 2-bit grouping. Therefore, for larger carry chains (8-, 16-, or 32-bit carry chains, for example), it is advantageous to use the 4-bit lookahead, and to chain together in a serial fashion the 4-bit carry out signals from two or more adjacent slices.

As another example, for a 10-bit carry chain it is advantageous to combine two 4-bit carry chains and one 2-bit carry chain. The 2-bit lookahead structure can be located either before or after the 4-bit lookahead structures in the carry chain, i.e., the 2-bit structure can be implemented using either the first two bits or the last two bits of a 4-bit structure. However, when the last two bits of the 4-bit lookahead carry chain are used to implement a 2-bit chain, an additional bit of the carry chain is consumed in getting onto the carry chain. Therefore, it is preferable to start the carry chain at the bottom of the slice in FIG. 16, so that carry initialization circuit 420 can be used to initialize the carry chain. Carry initialization circuit 420 is described in detail below.

A first carry multiplexer 414A functions as the first carry multiplexer in a 4-bit lookahead carry chain comprising carry multiplexers 414A-414D, and also as the first carry multiplexer in a 2-bit lookahead carry chain comprising carry multiplexers 414A-414B. Carry multiplexer 414A has two input signals. The "0" input signal is a selected one of function generator output signal O5A and the bypass signal AX from the interconnect structure, as controlled by multiplexer 415A and configuration memory cell 1615A. The "1" input signal is either the carry in signal CIN or an initialization signal CINITVAL, as controlled by multiplexer 421 and configuration memory cell 1621. A high value on signal O6A (S0) selects the "1" input to the first carry multiplexer. A low value on signal O6A selects the "0" input.

A second carry multiplexer 414B functions as the second carry multiplexer in a 4-bit lookahead carry chain comprising carry multiplexers 414A-414D, and also as the second carry multiplexer in a 2-bit lookahead carry chain comprising carry multiplexers 414A-414B. Carry multiplexer 414B has four input signals. The "0" input signal is a selected one of function generator output signal O5B and the bypass signal BX from the interconnect structure, as controlled by multiplexer 415B and configuration memory cell 1615B. The "1" input signal is the same value provided to the "0" input terminal of carry multiplexer 414A. The "2" input signal is the initialization signal CINITVAL. The "3" input signal is the carry in signal CIN. The selection between these four input signals to the second carry multiplexer is made as shown in Table 1. In Table 1 and the other tables herein, an "X" denotes a "don't-care" value.

TABLE 1

| S0 (O6B) | S1 (O6A) | S2 (CINITSEL) | COUTB |
|---|---|---|---|
| 0 | X | X | Input 0 |
| 1 | 0 | X | Input 1 |
| 1 | 1 | 0 | Input 2 (CINITVAL) |
| 1 | 1 | 1 | Input 3 (CIN) |

A third carry multiplexer 414C functions as the third carry multiplexer in a 4-bit lookahead carry chain comprising carry multiplexers 414A-414D, and also as the first carry multiplexer in a 2-bit lookahead carry chain comprising carry multiplexers 414C-414D. Carry multiplexer 414C has two input signals. The "0" input signal is a selected one of function generator output signal O5C and the bypass signal CX from the interconnect structure, as controlled by multiplexer 415C and configuration memory cell 1615C. The "1" input signal is the carry out signal COUTB from the second carry multiplexer. A high value on signal O6C (S0) selects the "1" input to the third carry multiplexer. A low value on signal O6C selects the "0" input.

A fourth carry multiplexer 414D functions as the fourth carry multiplexer in a 4-bit lookahead carry chain comprising carry multiplexers 414A-414D, and also as the second carry multiplexer in a 2-bit lookahead carry chain comprising carry multiplexers 414C-414D. Carry multiplexer 414D has four input signals. The "0" input signal is a selected one of function generator output signal O5D and the bypass signal DX from the interconnect structure, as controlled by multiplexer 415D and configuration memory cell 1615D. The "1" input signal is the same value provided to the "0" input terminal of carry multiplexer 414C. The "2" input signal is the carry out signal COUTB from the second carry multiplexer. The "3" input signal is the carry in signal CIN. The selection between these four input signals to the fourth carry multiplexer is made as shown in Table 2. Note that the output signal COUTD is also the carry out signal COUT for the slice.

TABLE 2

| S0 (O6D) | S1 (O6C) | S2 (O6B) | S3 (O6A) | S4 (CINITSEL) | COUTD |
|---|---|---|---|---|---|
| 0 | X | X | X | X | Input 0 |
| 1 | 0 | X | X | X | Input 1 |
| 1 | 1 | 0 | X | X | Input 2 (COUTB) |
| 1 | 1 | 1 | 0 | X | Input 2 (COUTB) |
| 1 | 1 | 1 | 1 | 0 | Input 2 (COUTB) |
| 1 | 1 | 1 | 1 | 1 | Input 3 (CIN) |

Another feature of the carry chain structure illustrated in FIG. 16 is the initialization option. In the pictured embodiment, multiplexers 1601 (controlled by configuration memory cell 1603) and 1602 (controlled by configuration memory cell 1604) together implement carry initialization circuit 420 (see FIGS. 4 and 6). This multiplexer circuit can be used to place an initialization signal CINITVAL onto the carry chain in lieu of carry input signal CIN. In the pictured embodiment, initialization signal CINITVAL can be any of bypass signal AX from the general interconnect structure, power high VDD, or ground GND. In some embodiments, a true ground signal is placed onto the carry chain. In other embodiments, the GND signal is actually a GHIGH signal, which is low after the device is configured (thus being the same as ground GND in a configured device), and high during configuration. It will be clear to those of skill in the relevant arts that the carry initialization circuit can be implemented in various ways. For example, in one embodiment multiplexer 1602 is omitted, and the output of configuration memory cell 1604 is provided to one data input terminal of multiplexer 1601, with bypass signal AX being provided to the other data input terminal.

In known programmable logic blocks, an initialization value can be placed on the carry chain by providing a power high or ground value to one of the carry multiplexers, and using a LUT output signal to select the initialization value (power high or ground) using the carry multiplexer. However, this structure requires that a LUT be consumed simply to place the initialization value onto the carry chain. Young et al. describe such a structure in U.S. Pat. No. 5,914,616 (see FIGS. 6A and 6B). For example, as shown in FIG. 6B of U.S. Pat. No. 5,914,616, a high or low value can be placed on the "0" data input terminal of carry multiplexer CF via multiplexer 81F, and the output O of LUT F can be programmed to a constant low value and passed through multiplexer OF to select this high or low value in carry multiplexer CF.

Advantageously, the structure illustrated in FIG. 16 allows the initialization of the carry chain without utilizing a LUT that might be needed for some other purpose.

Figure 19:
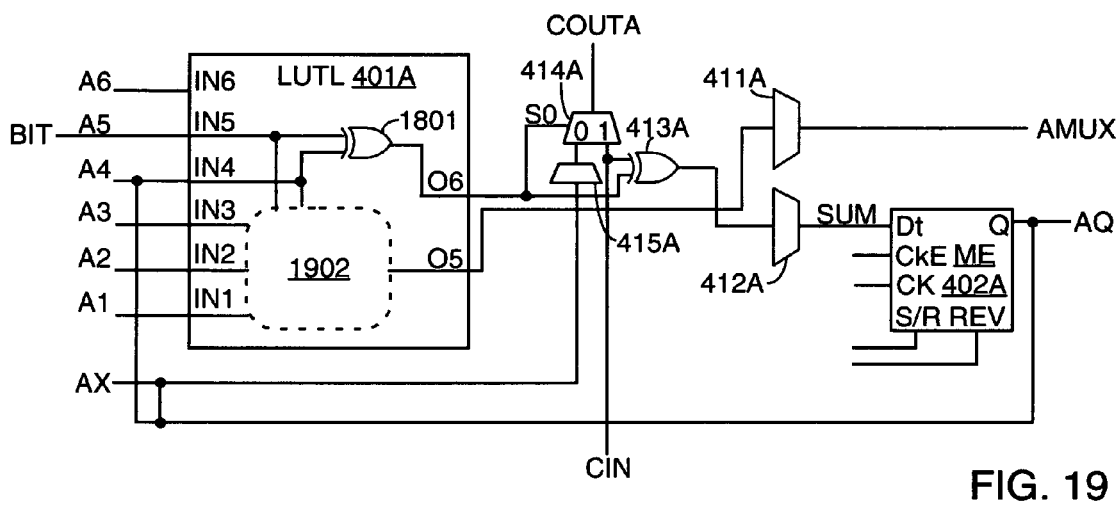

Another situation in which this feature provides an advantage is when the bypass input AX from the general interconnect is needed for some other purpose. For example, FIG. 19 (which is described in detail below) shows an adder implementation that utilizes the bypass input signal as a counter feedback signal. Thus, when the circuit of FIG. 19 is implemented using the first function generator and first carry multiplexer in the slice, for example, the AX input is not available to be used for the carry initialization signal. However, a carry initialization value of ground GND or power high VDD can still be provided using carry initialization circuit 420.

FIG. 16 also illustrates an implementation of carry multiplexer 414D designed to minimize the delay from carry in signal CIN to carry out signal COUT for the entire slice, typically the critical path for long carry chains. In the pictured embodiment, carry multiplexer 414D includes an inverting multiplexer 1635 followed by a three-state buffer (transistors 1631-1634 and inverter 1637, coupled together as shown in FIG. 16) and an inverter 1636. The three-state buffer is controlled by the carry in signal CIN (input 3 to carry multiplexer 414D) and by the select input signals of carry multiplexer 414D, as modified by control circuit 1638. When carry in input signal CIN is selected, the output of multiplexer 1635 is three-stated, and the three-state buffer drives inverter 1636 to provide signal CIN (twice inverted) as output signal COUTD. When one of the input signals other than the carry in input signal CIN is selected, the three-state buffer is three-stated (i.e., transistors 1631 and 1634 are turned off), and multiplexer 1635 drives inverter 1636 to provide output signal COUTD. The derivation of control circuit 1638 and multiplexer 1635 will be apparent to those of skill in the relevant arts.

Figure 17:
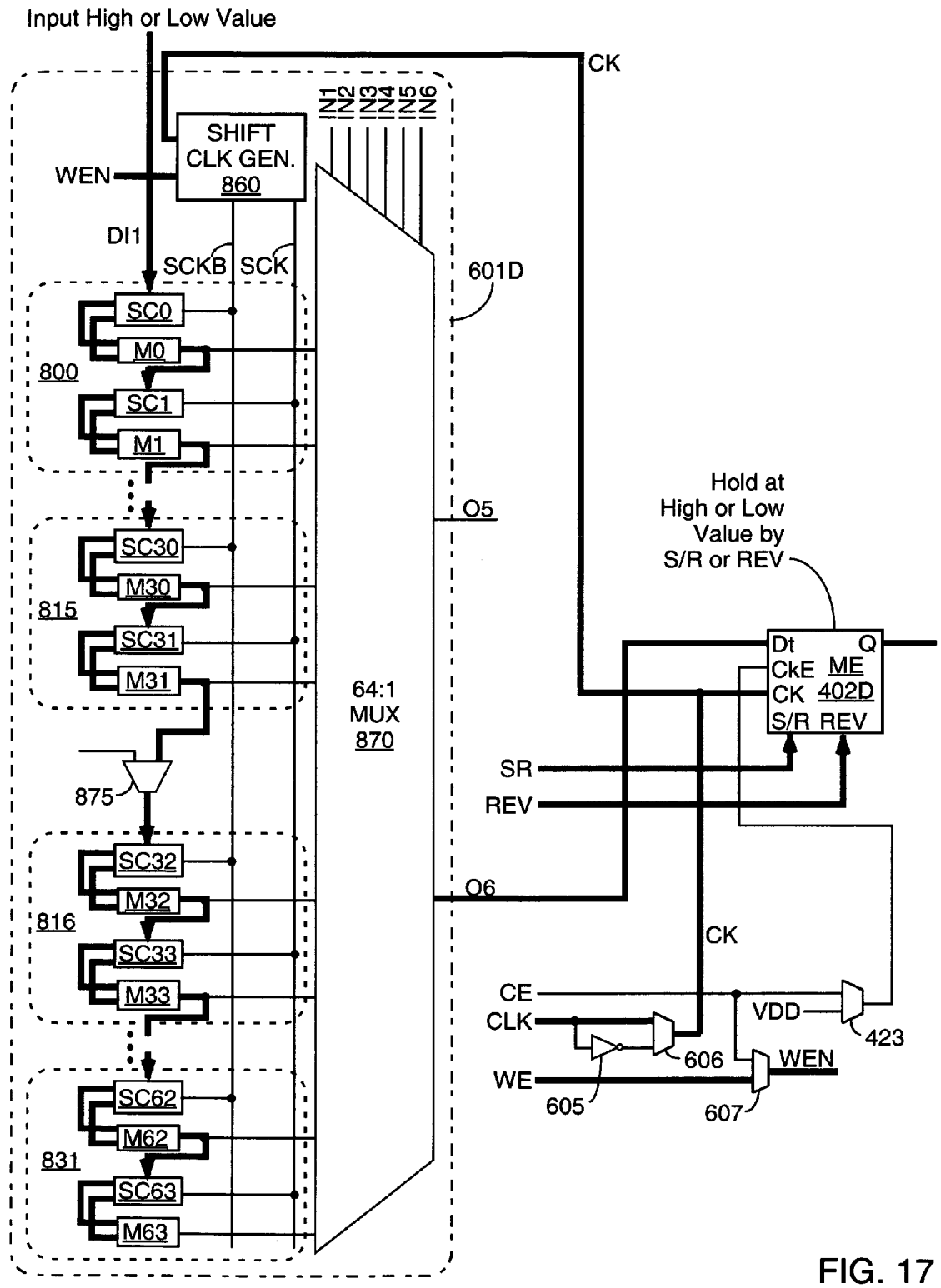
FIG. 17 illustrates how the bits of the LUT of FIG. 8 can be efficiently set or reset when the LUT is configured in shift register mode.

FIG. 17 illustrates how each bit in a LUT (e.g., the LUT of FIG. 8) can be efficiently set or reset. To utilize this method, the slice must include a write enable signal that is independent from the set/reset signal, and the LUT must be configured in shift register mode. This method can be applied, for example, when the LUT of FIG. 8 is included in the slice shown in FIG. 6.

An advantage of this method is that the result of the set or reset process appears at the shift register output terminal very quickly, relative to the speed of the shift register. Traditionally, to set or reset a shift register requires either having set/reset capability in each bit, which increases the size of each memory cell, or applying a sequence of shift clock signals shifting the set or reset value throughout the entire shift register, which can be a lengthy process. FIG. 17 shows a third method, in which a final bit of the shift register is implemented using the memory element associated with the LUT. If desired, the next-to-last bit of the LUT shift register can be provided to the LUT output terminal, so the memory element does not add a bit to the length of the shift register. Alternatively, the memory element can be used to add an additional bit to the size of the shift register. The memory element is then set or reset, and the high or low value appears immediately at the memory element output terminal. While continuing to set or reset the memory element, the high or low value is shifted through the shift register to set or reset each bit. To maintain the integrity of the shift register output value, the set or reset signal should not be removed from the memory element until the high or low value is shifted through the entire shift register.

As a first example, to reset each of memory cells M0-M63 (i.e., to store a low value at the Q node of each memory cell), the LUT is configured so the final bit of the LUT shift register drives the data input terminal of the associated memory element. In the pictured embodiment, the LUT is configured as a 32-bit shift register and the output of the shift register emerges on the O6 output terminal. In another embodiment (not shown), the LUT is configured as a 16-bit shift register and the output of the shift register emerges on the O5 output terminal. A reset signal is then applied to the memory element. For example, to reset LUT 601D of FIG. 6, a high value is applied to one of the S/R and REV input terminals of memory element 402D (whichever of the two terminals is configured to function as a reset terminal). Thus, a low value is stored in memory element 402D. A low value is also provided to the shift-in input terminal DI1 of the LUT. The high value on the reset signal is then maintained while repeatedly toggling the clock signal CK.

Because the CE and WE input terminals are separate (i.e., the CE and WE input signals do not share a common input terminal of the CLE), it is possible to assert the write enable signal WEN (e.g., via input terminal WE and multiplexer 607) to shift the low value successively through each bit of the shift register while the CE signal is not asserted on this memory element and other surrounding memory elements in a system design. Further, because the S/R and REV input terminals are separate from the WE input terminal in the exemplary embodiment, the memory element can be held set or reset throughout the shift process. This approach effectively eliminates (masks) the latency of setting or resetting the contents of the shift register in a clock enabled system design. If the CE signal is selected by multiplexer 607 instead of the WE signal, then the latency setting or resetting of the shift register is controlled by the system clock enable rate.

To set each of memory cells M0-M63 to a high value, a similar procedure is applied, but with the contents of memory element 402D set to a high value by maintaining an active set signal (e.g., S/R or REV) while repeatedly toggling the clock signal CK to write an applied high value to each bit of the LUT shift register.

Figure 18:
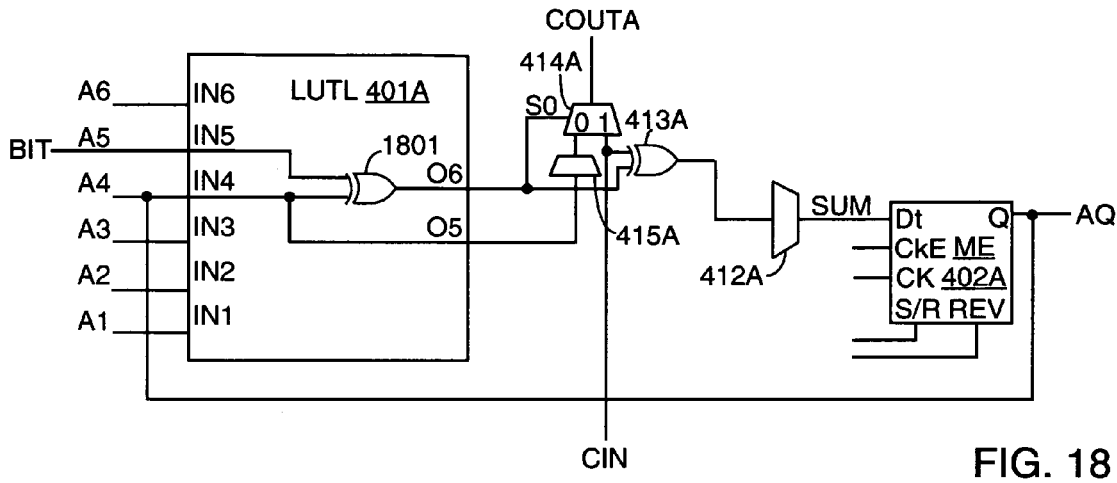
FIGS. 18 and 19 provide two examples of how the programmable circuits shown in FIGS. 4 and 6 can be utilized to efficiently implement accumulators.

FIG. 18 illustrates a first way in which the programmable circuits shown in FIGS. 4 and 6 can be utilized to efficiently implement an exemplary accumulator. Note that the elements of FIG. 18 are similar to those of FIGS. 4 and 6, for example, and similar elements are similarly numbered.

To implement a first accumulator circuit in the slice pictured in FIG. 4, for example, a function generator (e.g., LUTL 401A) is configured to implement an exclusive OR (XOR) function 1801, and to provide the XOR output signal to the O6 output terminal. The first input signal to the XOR function is the bit value (BIT) to be added, and the second input signal BO is the stored bit value (stored in the memory element 402A associated with the function generator). The function generator is further configured to pass the second input signal AQ to the O5 output terminal. Note that in the pictured embodiment the function generator is a lookup table (LUT), but in other PLDs other types of programmable function generators can be used instead of lookup tables.

Figure 24:
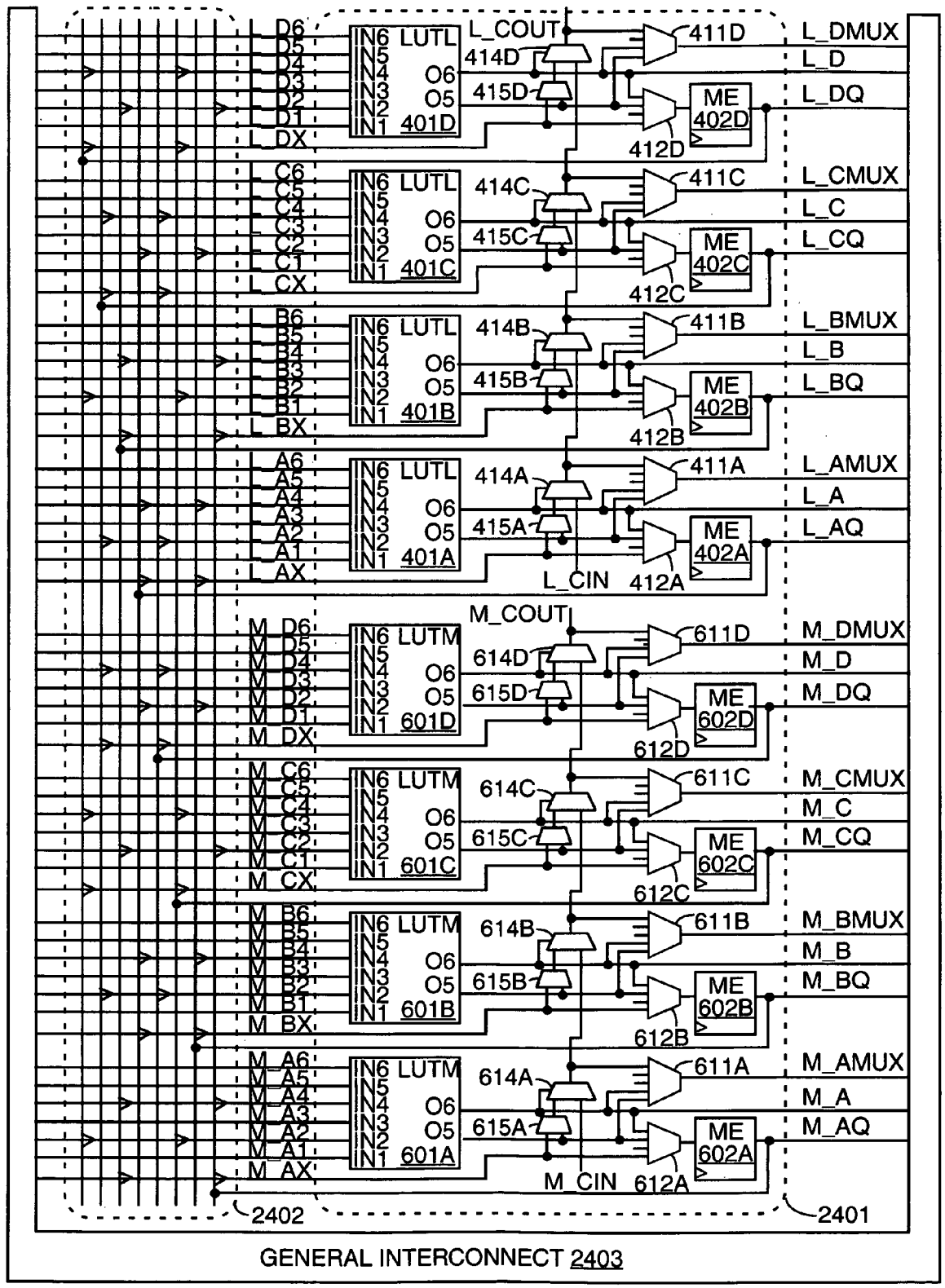
FIG. 24 illustrates a logic block including a first type of fast feedback path that can be included in the architectures of FIGS. 4 and 6, e.g., to improve the speed of arithmetic functions.

The carry out signal is generated by multiplexer 414A, which selects between the second input signal AQ from LUT output terminal O5 and a carry in signal CIN, under the control of the XOR function output signal from LUT output terminal 06. The sum signal SUM is generated by XOR gate 413A, passed through multiplexer 412A and stored in memory element 402A. The new stored value AQ from memory element 402A is passed back to the LUT. In some embodiments, the signal passes by way of a fast feedback path. This type of fast feedback path is shown in FIG. 24, and is described below in connection with that figure. The delay on this path can directly influence the speed of the arithmetic circuit, so the use of a fast feedback path can increase the overall speed of the circuit. In other embodiments, the signal path between memory element 402A and LUT 401A utilizes the general interconnect structure.

Note that in the pictured embodiment, data input terminal A6/IN6 cannot be used to provide either of the XOR function input signals to the LUT, because the IN6 data input must be tied to power high (VDD) to enable the dual-output mode of the LUT (see FIG. 5). However, any of the other data input terminals IN1-IN5 can be used. In the pictured embodiment, the signals used are the two fastest available data input signals IN5 and IN4. (See FIG. 5, which shows that the delays between these two data input terminals and the output terminals of the LUT are shorter than the corresponding delays for data input signals IN3-IN1.) The input flexibility of this structure enhances the routability of the PLD including the structure.

FIG. 19 illustrates a second way in which the programmable circuits shown in FIGS. 4 and 6 can be utilized to efficiently implement an exemplary accumulator. The circuit of FIG. 19 is similar to the circuit of FIG. 18, except that the output signal AQ from memory element 402A is not passed through the function generator 401A and the function generator output terminal O5. Instead, the output signal AQ is provided to the carry multiplexer 414A via the bypass input terminal AX, bypassing the function generator. This approach frees up the O5 output terminal of the function generator, meaning that a second function 1902 can be implemented in the function generator, if desired. The second function 1902 can be independent of the two input signals BIT and AQ, if desired, can depend on one or the other of the two input signals, or can depend on both of these input signals, optionally in conjunction with input signals from data input terminals A1/IN1, A2/IN2, and A3/IN3 of the function generator.

In some embodiments, the AQ signal passes to the bypass input terminal AX by way of a fast feedback path. This type of fast feedback path is shown in FIG. 24, and is described below in connection with that figure. In other embodiments, the signal path between memory element 402A and LUT 401A utilizes the general interconnect structure.

When a second function 1902 is included in LUT 401A, data input terminal A6/IN6 cannot be used to provide any of the input signals to the XOR function 1801 or the second function 1902, because the IN6 data input must be tied to power high (VDD) to enable the dual-output mode of the LUT (see FIG. 5). However, any of the other data input terminals can be used. In the pictured embodiment, the signals used for the XOR function 1801 are the two fastest available data input signals IN5 and IN4. When no second function is included in LUT 401A, data input terminal A6/IN6 can be used, if desired, to improve the speed of the accumulator circuit.

Circuits similar to those shown in FIGS. 18 and 19 can be used to implement other arithmetic functions. For example, a counter can be implemented as shown in either FIG. 18 or FIG. 19 by removing the BIT input and replacing XOR gate 1801 with an inverter or a pass-through, depending on the value by which the counter is incremented or decremented. Other implementations of arithmetic circuits will be apparent to those of skill in the relevant arts, based on the examples illustrated and described herein.

Figure 20:
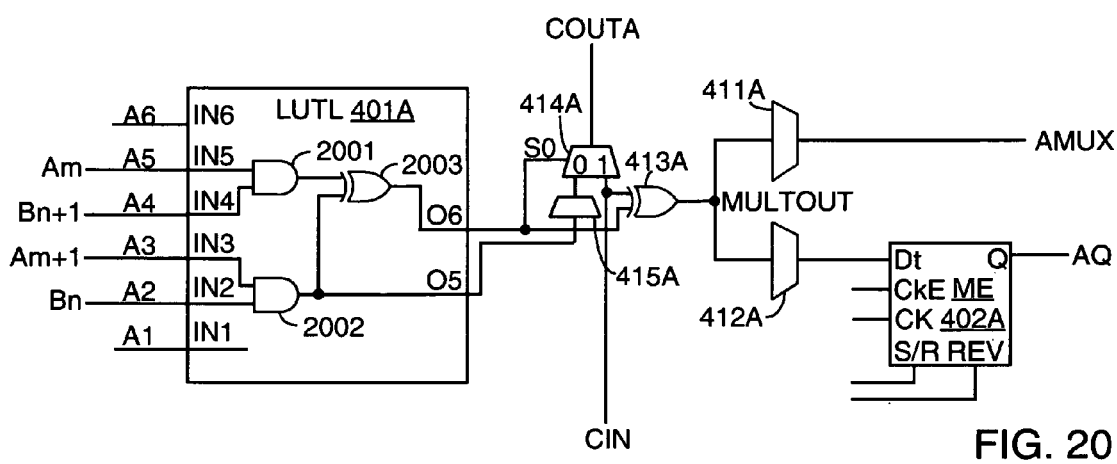
FIG. 20 provides an example of how the programmable circuits shown in FIGS. 4 and 6 can be utilized to efficiently implement a multiplier.

FIG. 20 provides an example of how the programmable circuits shown in FIGS. 4 and 6 can be utilized to efficiently implement a multiplier. Note that the elements of FIG. 20 are similar to those of FIGS. 4 and 6, for example, and similar elements are similarly numbered.

To implement a multiplier circuit in the slice pictured in FIG. 4, for example, a function generator (e.g., LUTL 401A) is configured to implement two AND functions 2001 and 2002, and an exclusive OR (XOR) function 2003, and to provide the XOR output signal to the O6 output terminal. The first AND function 2001 combines multiplier input signals Am and Bn+1, where A and B are the multiplier input values. The second AND function combines multiplier input signals Am+1 and Bn. The two AND functions drive XOR gate 2003, and the second AND function output signal is also provided to the O5 output terminal of the function generator. The AND/XOR implementation of a multiplier circuit is well known. However, known implementations require either the use of multiple function generators, or function generators with dedicated AND gates provided for the purpose of implementing multiplexer circuits A PLD providing such a dedicated AND gate is shown, for example, in FIG. 5 of an application note published by Xilinx, Inc., entitled "XAPP 215: Design Tips for HDL Implementation of Arithmetic Functions" and published Jun. 28, 2000. The multiplier circuit of FIG. 20 differs from these known circuits in that no dedicated AND gate is required to implement the multiplier circuit.

Note that in the pictured embodiment the function generator is a lookup table (LUT), but in other PLDs other types of programmable function generators can be used instead of lookup tables.

The carry out signal is generated by multiplexer 414A, which selects between the second AND function output signal from LUT output terminal O5 and a carry in signal CIN, under the control of the XOR function output signal from LUT output terminal O6. The multiplier output signal MULTOUT is generated by XOR gate 413A, and can be provided via multiplexer 411A and/or 412A to the general interconnect structure and/or to memory element 402A.

Note that in the pictured embodiment, data input terminal A6/IN6 cannot be used to provide any of the multiplier input signals to the LUT, because the IN6 data input must be tied to power high VDD to enable the dual-output mode of the LUT (see FIG. 5). However, any of the other data input terminals IN1-IN5 can be used. In the pictured embodiment, the signals used are the four fastest available data input signals IN2-IN5. The input flexibility of this structure enhances the routability of the PLD including the structure.

FIGS. 18 and 20 provide examples of how the O5 LUT output can be used in combination with the O6 output to efficiently implement exemplary arithmetic functions. However, the LUT can be configured to provide any function of the available LUT data input signals at the O5 output terminal. Therefore, the arithmetic functions that can be implemented are not limited to the exemplary circuits shown in FIGS. 18 and 20.

Figure 21:
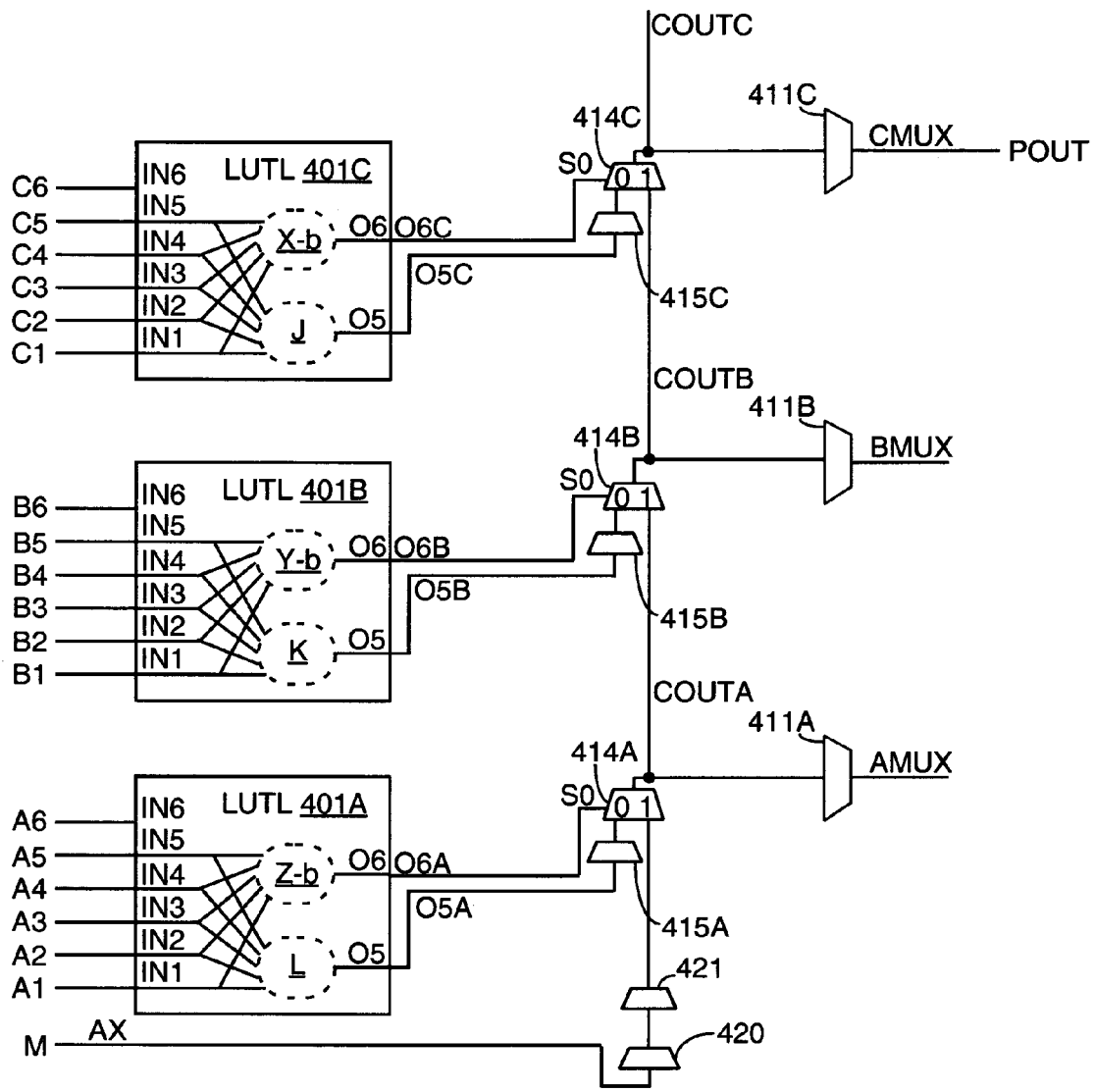
FIG. 21 provides an example of how the programmable circuits shown in FIGS. 4 and 6 can be utilized to efficiently implement a priority encoder.

FIG. 21 provides an example of how the programmable circuits shown in FIGS. 4 and 6 can be utilized to efficiently implement a priority encoder. Note that the elements of FIG. 21 are similar to those of FIGS. 4 and 6, for example, and similar elements are similarly numbered. However, in the embodiment of FIG. 21 the carry chain is implemented without the carry lookahead logic shown in FIGS. 4 and 6, to more clearly illustrate the functionality of the priority encoder. It will be clear to those of skill in the art that the implementation of FIG. 21 can be altered to include the more complicated carry chain. Note also that the exemplary circuit includes three stages. Clearly, chains of shorter or longer lengths can be implemented in a similar fashion.

The priority encoder circuit of FIG. 21 implements the following priority logic, where X, Y, Z, J, K, and L are functions of various LUT data input signals, and M is an input signal:

If X then
   POUT=J
else if Y then
   POUT=K
else if Z then
   POUT=L
else
   POUT=M In the embodiment of FIG. 21, the function X-bar ("not X", or X-b) is implemented in LUT 401C and provided to the O6 output terminal of LUT 401C. The function J is also implemented in LUT 401C, and is provided to the O5 output terminal of LUT 401C. Similarly, functions Y-bar (Y-b) and K are implemented in LUT 401B, and are provided on the O6 and O5 terminals, respectively, of LUT 401B. Functions Z-bar (Z-b) and L are implemented in LUT 401A, and are provided on the O6 and O5 terminals, respectively, of LUT 401A.

Note that in the pictured embodiment the function generator is a lookup table (LUT), but in other PLDs other types of programmable function generators can be used instead of lookup tables.

The priority output signal is carried on the carry chain, with the final priority output signal POUT in the pictured example being the carry out signal generated by multiplexer 414C. Carry multiplexer 414C selects between the O5 output signal from LUT 401C (the value of function J) and the carry output signal COUTB from the previous carry multiplexer, under the control of the O6 output signal from LUT 401C (the value of function X-bar). Thus, the final carry out output signal (the priority encoder output signal POUT) is the value of function J if X-bar is low (i.e., X is high). If X is low, then the value of signal POUT depends on the previous value on the priority chain. This pattern repeats for the remaining two stages of the priority encoder circuit.

Note that the initial value on the priority chain, M, is the default value in the code shown above. In the pictured embodiment, the default value is placed on the carry chain via bypass input AX, using carry initialization circuit 420 (see FIG. 16, for example).

The two functions included in each LUT can share all, some, or none of the LUT data input signals IN1-IN5. However, the IN6 data input terminals cannot be used to provide input signals to the functions J-L and X-Z, because the IN6 data input must be tied to power high VDD to enable the dual-output mode of the LUTs.

Figure 22:
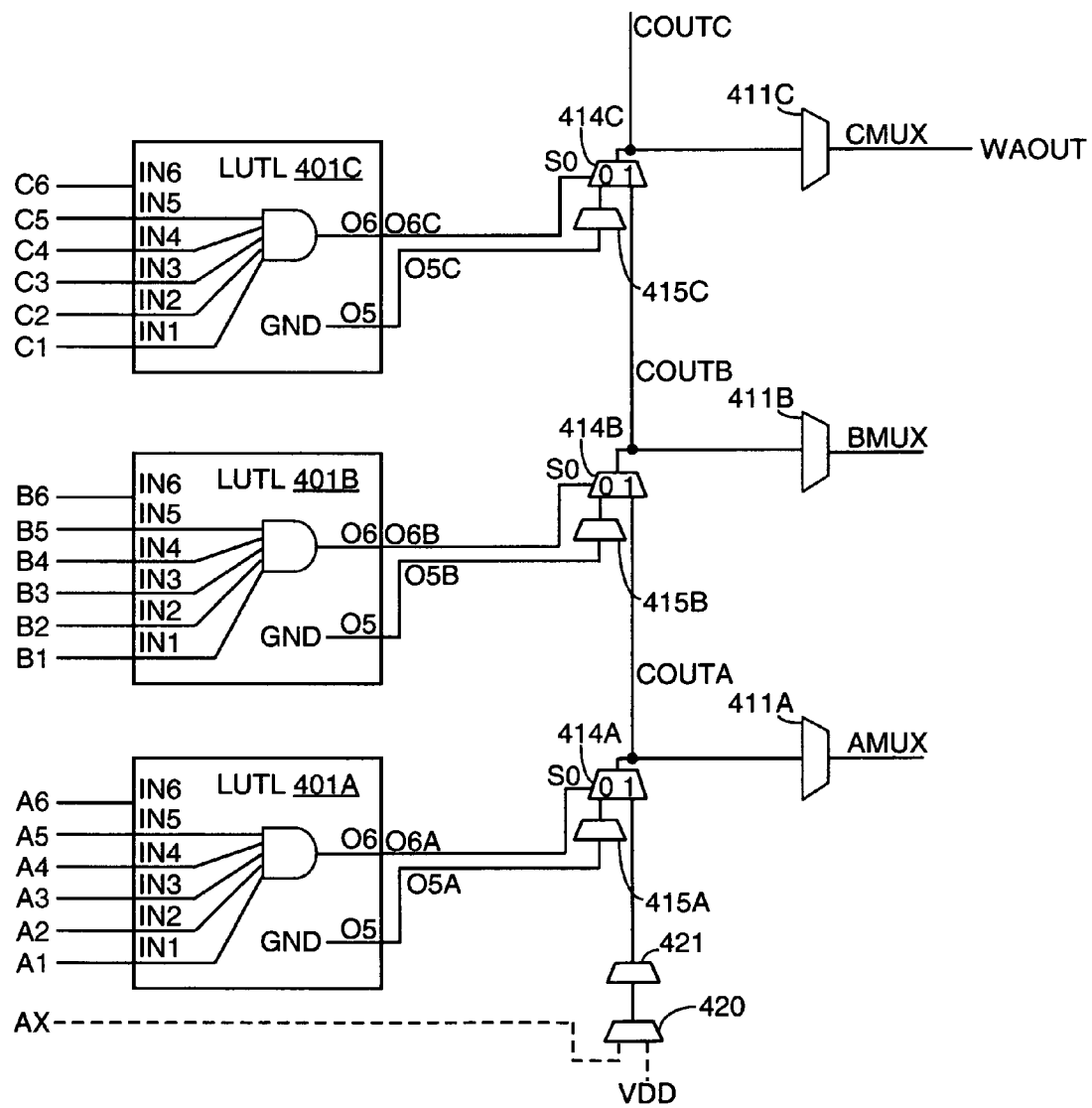
FIG. 22 provides an example of how the programmable circuits shown in FIGS. 4 and 6 can be utilized to efficiently implement a wide AND function.

FIG. 22 provides an example of how the programmable circuits shown in FIGS. 4 and 6 can be utilized to efficiently implement a wide AND function. A wide AND function is a degenerative case of a priority encoder. The priority encoder circuit of FIG. 21 can be used to implement an AND function by performing the following substitutions. Functions X, Y, and Z are replaced by NAND functions, i.e., functions X-b, Y-b, and Z-b are replaced by AND functions. Functions J, K, and L are replaced by ground GND. The default value M is replaced by power high VDD, or by some other signal AX to add another input to the wide AND function. In the pictured embodiment, carry initialization circuit 420 is used to provide the default value VDD (see FIG. 16, for example).

Figure 23:
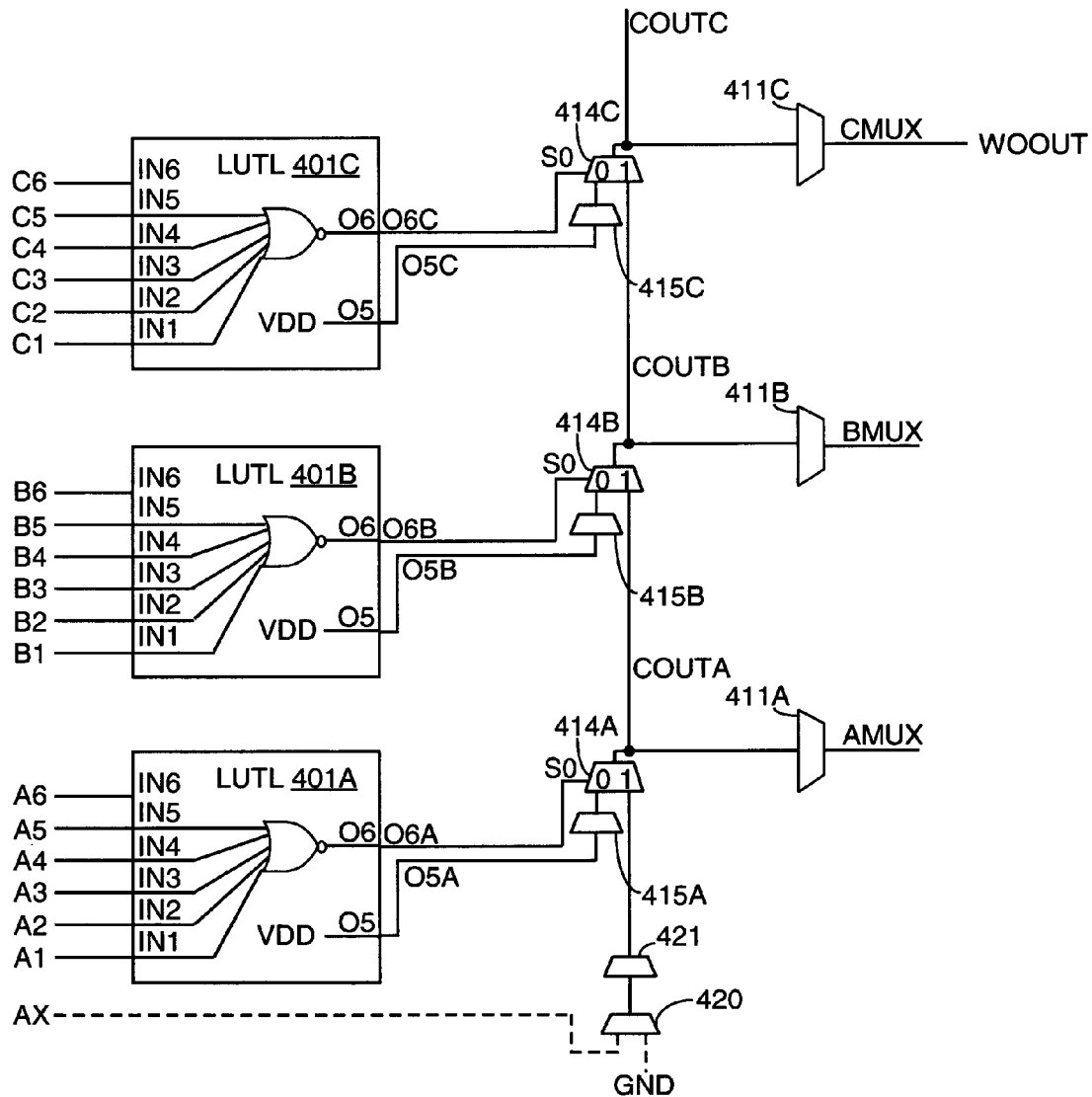
FIG. 23 provides an example of how the programmable circuits shown in FIGS. 4 and 6 can be utilized to efficiently implement a wide OR function.

FIG. 23 provides an example of how the programmable circuits shown in FIGS. 4 and 6 can be utilized to efficiently implement a wide OR function. A wide OR function is a degenerative case of a priority encoder. The priority encoder circuit of FIG. 21 can be used to implement an OR function by performing the following substitutions. Functions X, Y, and Z are replaced by OR functions, i.e., functions X-b, Y-b, and Z-b are replaced by NOR functions. Functions J, K, and L are replaced by power high VDD. The default value M is replaced by ground GND, or by some other signal AX to add another input to the wide OR function. In the pictured embodiment, carry initialization circuit 420 is used to provide the default value GND (see FIG. 16, for example).

Young et al. describe in U.S. Pat. No. 5,963,050 a logic block that includes fast feedback paths between the output terminals and input terminals of FPGA function generators (see FIG. 13 of U.S. Pat. No. 5,963,050). (U.S. Pat. No. 5,963,050, entitled "Configurable Logic Element with Fast Feedback Paths", is incorporated herein by reference.) These fast feedback paths between the output terminals and input terminals of a function generator can be useful in speeding up combinational logic, e.g., logic implemented using a series of cascaded function generators. However, this type of fast feedback path is not as helpful in speeding up the implementation of common arithmetic logic such as counters and accumulators, where the critical path typically starts at the output terminal of a flip-flop.

FIG. 24 illustrates a logic block including a different type of fast feedback path that can be included, if desired, in the architectures of FIGS. 4 and 6, e.g., to improve the speed of arithmetic functions. For example, the fast feedback paths can be used to implement the feedback paths in the circuits of FIGS. 18 and 19, as described above. The fast feedback paths are also referred to herein as "fast connects". The fast feedback paths illustrated in FIG. 24 permit an output signal from a memory element to drive the input terminals of the associated function generator (and other function generators, in the pictured embodiment) without traversing the interconnect structure. Thus, the fast connect paths provide faster feedback interconnections between the memory elements and the function generators than is achievable by traversing the interconnect structure. Note that the fast feedback paths shown in FIG. 24 also permit the output signals from the memory elements to drive some of the bypass input terminals, and therefore provide fast access from the memory elements to the carry chain.

The logic block of FIG. 24 includes two slices, one "L" slice (see FIG. 4) and one "M" slice (see FIG. 6). The logic block includes a large number of input multiplexers 2402, the slice logic 2401 from FIGS. 4 and 6 (shown in simplified form, for clarity), and a general interconnect structure 2403. The signal names from the slice logic are preceded by an "L_" for the L slice and "M_" for the M slice, to distinguish between the signals of the two slices. In slice M, elements 611A-611D, 612A-612D, 614A-614D, 615A-615D, 616, 618, and 619 are similar to elements 414A-414D, 412A-412D, 414A-414D, 415A-415D, 416, 418, and 419, respectively, but are renumbered to distinguish from similar elements in slice L.

In the pictured embodiment, a fast connect is provided between the output terminal of each memory element and one input terminal of the associated function generator. The fast connect also provides a fast feedback path to the bypass input terminals (e.g., L_AX, M_AX, and so forth), and hence both to the associated carry multiplexers and back to the data input terminal of the same memory element.

In the pictured embodiment, the fast connects also provide fast feedback paths to input terminals of other function generators in the same logic block, including some function generators in the other slice. In some embodiments (not shown), fast feedback paths are provided from each memory element to more than one data input terminal of the associated function generator. In the pictured embodiment, the fast connects provide fast feedback paths to one bypass input terminal in each slice.

Figure 25:
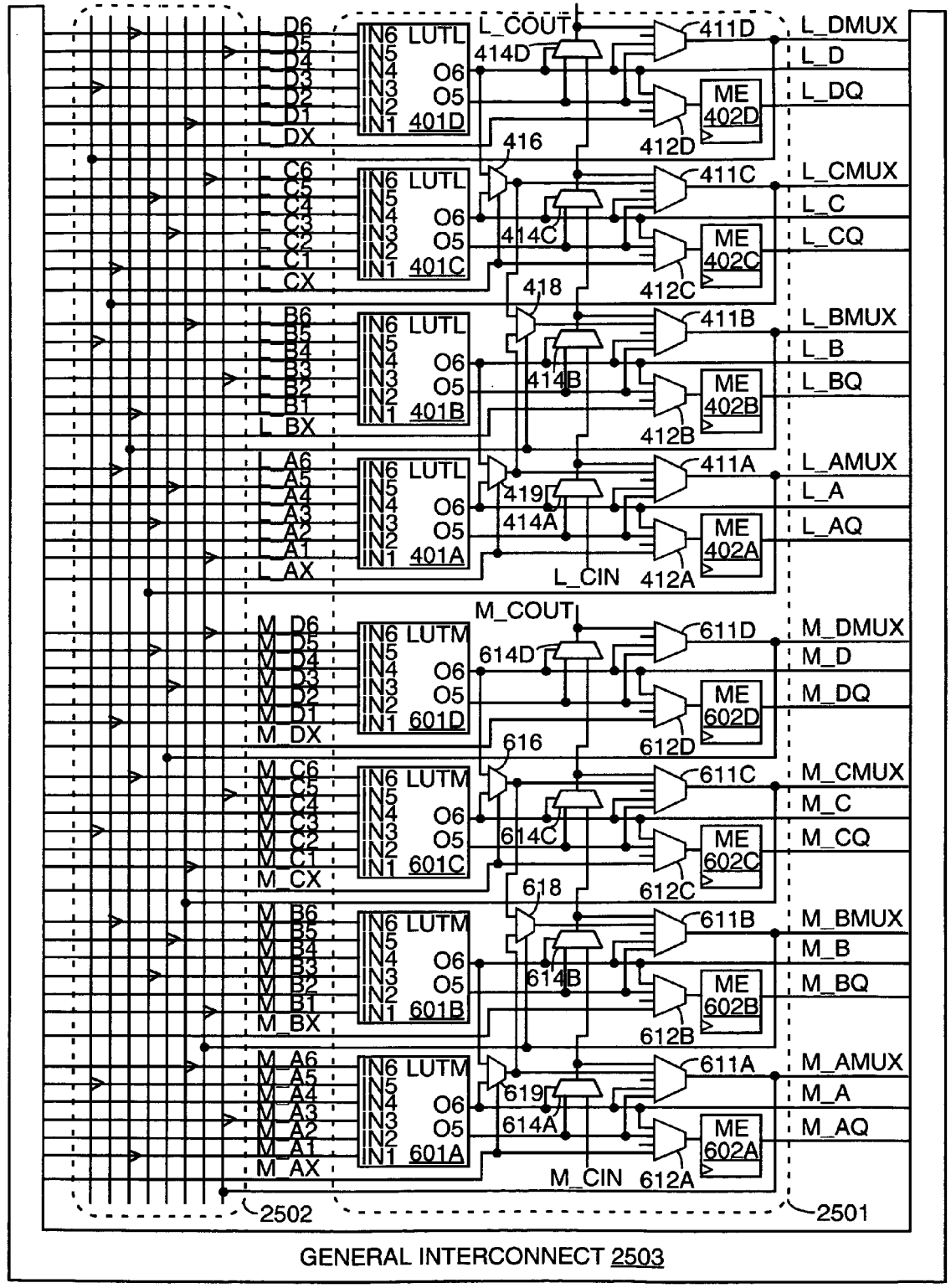
FIG. 25 illustrates a logic block including a second type of fast feedback path that can be included in the architectures of FIGS. 4 and 6, e.g., to improve the speed of wide logic functions.

FIG. 25 illustrates a logic block including another type of fast feedback path that can be included, if desired, in the architectures of FIGS. 4 and 6, e.g., to improve the speed of wide logic functions. For example, the fast feedback paths shown in FIG. 25 can be used to feed back the outputs of carry multiplexers 414A-414D and 614A-614D to the associated function generators, or to other function generators within the same logic block, in the same or the other slice. As is well known, carry chains can be used to implement wide logic functions. FIGS. 21-23 provide three examples of such functions. Chaudhary also illustrates wide logic functions in PLDs in U.S. Pat. No. 6,081,914, entitled "Method for Implementing Priority Encoders Using FPGA Carry Logic" and issued Jun. 27, 2000, which is incorporated herein by reference. However, in practice these implementations are not necessarily widely used in known PLD architectures, in part because of the delay incurred by exiting the carry chain and coupling the carry chain output signal to the input terminal of another function block via relatively slower general interconnect. Therefore, the availability of fast feedback paths between the carry multiplexers and function generators in the same and/or other slices can improve the feasibility of carry chain implementations of wide logic functions.

Additionally and alternatively, the fast feedback paths illustrated in FIG. 25 can be used to feed back the output signals from combinational multiplexers 416, 418, and 419 to the associated flip-flops, or into other flip-flops within the same CLE, in the same or the other slice. The combinational multiplexes are useful when implementing wide logic functions. For example, Young et al. describe one such circuit implementation in U.S. Pat. No. 5,920,202, entitled "Configurable Logic Element with Ability to Evaluate Five and Six Input Functions" and issued Jul. 6, 1999, which is incorporated herein by reference. Further, combinational multiplexers 416, 418, and 419 are often used in user designs to implement speed-critical circuits such as deep LUT RAM and wide multiplexers. Therefore, it is desirable to increase the speed of the circuit paths including these elements. The availability of fast feedback paths between the combinational multiplexers and the function generator input terminals provides such an improvement, and can therefore improve the feasibility of using the combinational multiplexers to implement wide logic functions.

The fast feedback paths illustrated in FIG. 25 permit an output signal from an output select multiplexer 411A-411D, 611A-611D to drive the input terminals of the associated function generator (and other function generators, in the pictured embodiment) without traversing the interconnect structure. Thus, the fast connect paths provide faster feedback interconnections between the signals driving the output select multiplexers and the function generators than is achievable by traversing the interconnect structure.

The logic block of FIG. 25 is similar to that shown in FIG. 24, except that a different set of fast feedback paths is illustrated. The logic block includes two slices, one "L" slice (see FIG. 4) and one "M" slice (see FIG. 6). The logic block includes a large number of input multiplexers 2502, the slice logic 2501 from FIGS. 4 and 6 (shown in simplified form, for clarity), and a general interconnect structure 2503. In the pictured embodiment, a fast connect is provided between the output terminal of each output select multiplexer 411A-411D, 611A-611D and one input terminal of the associated function generator (e.g., LUT) 401A-401D, 601A-601D. The fast connect also provides a fast feedback path to the input terminals of other function generators in the same logic block, including some function generators in the other slice.

Figure 26:
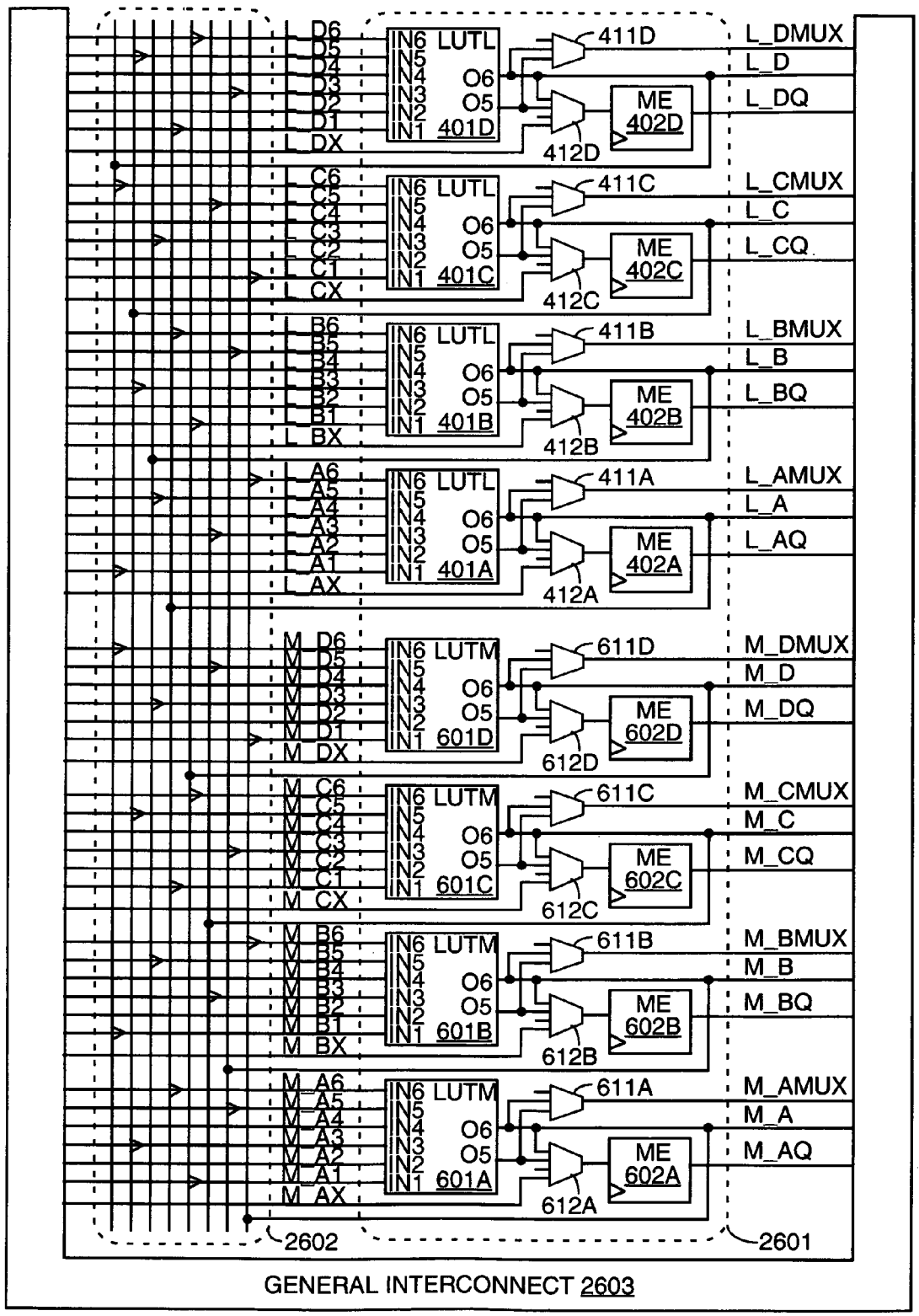
FIG. 26 illustrates a logic block including a third type of fast feedback path that can be included in the architectures of FIGS. 4 and 6.

FIG. 26 illustrates a logic block including another type of fast feedback path that can be included, if desired, in the architectures of FIGS. 4 and 6. The logic block of FIG. 26 is similar to that shown in FIG. 24, except that a different set of fast feedback paths is illustrated. The logic block includes two slices, one "L" slice (see FIG. 4) and one "M" slice (see FIG. 6). The logic block includes a large number of input multiplexers 2602, the slice logic 2601 from FIGS. 4 and 6 (shown in simplified form, for clarity), and a general interconnect structure 2603. In the pictured embodiment, a fast connect is provided between the O6 output terminal of each function generator (e.g., LUT) 401A-401D, 601A-601D and one input terminal of each of four other function generators in the CLE. No fast feedback paths are provided to the input terminals of the same function generator. The fast feedback paths illustrated in FIG. 26 can be used to feed back the outputs of function generators 401A-401D, 601A-601D to other function generators within the same CLE, in the same and/or the other slice.

The fast feedback paths illustrated in FIG. 26 permit an output signal from a function generator to drive the input terminals of other function generators in the logic block without traversing the interconnect structure. Thus, the fast connect paths provide faster feedback interconnections between the function generators than is achievable by traversing the interconnect structure.

Figure 27:
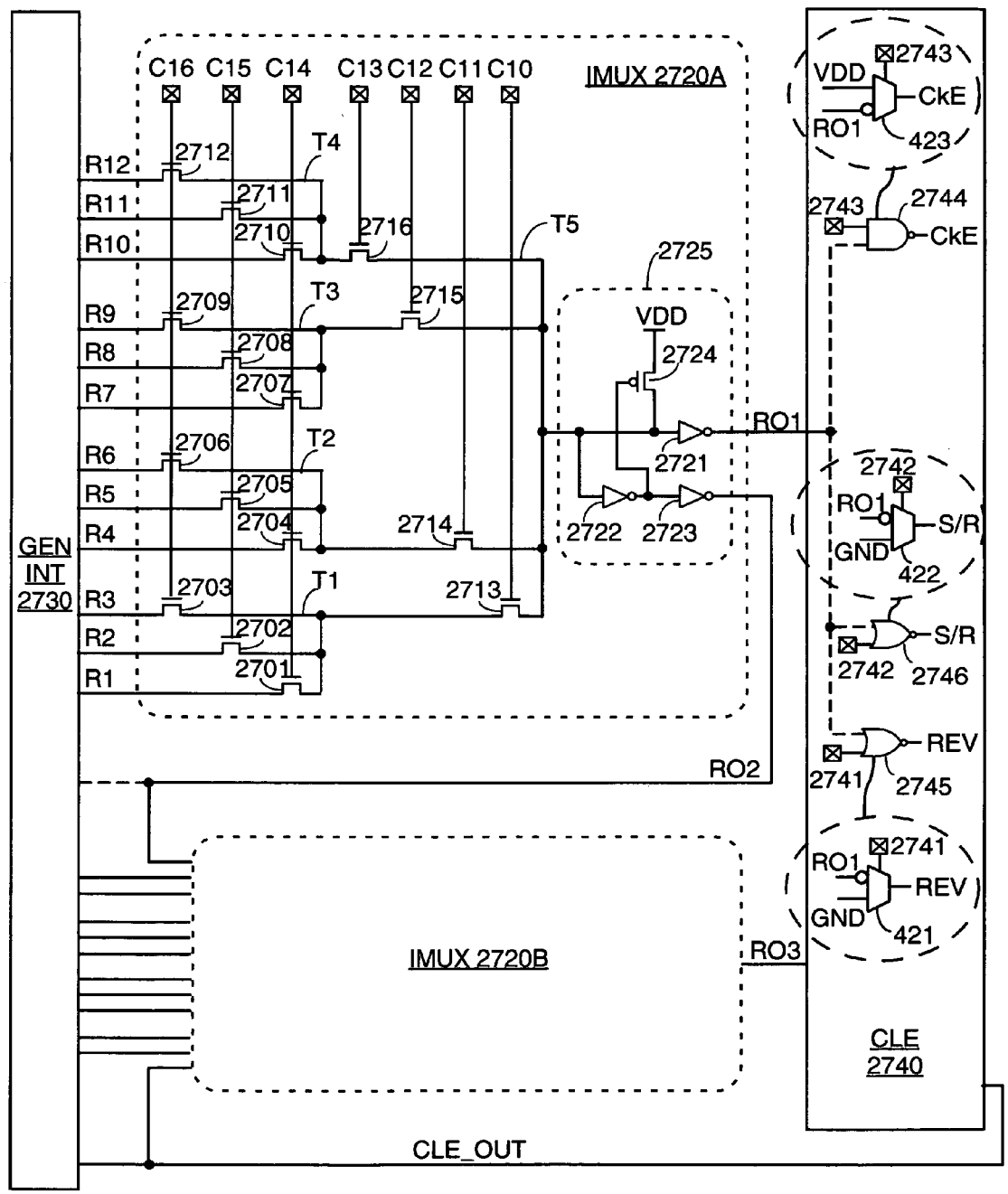
FIG. 27 illustrates how input multiplexers and bounce multiplexer circuits can be utilized to "bounce" signals from the general interconnect structure back to the general interconnect structure and/or to other input multiplexers without interfering with the functionality of the configurable logic element.

FIG. 27 illustrates how input multiplexers and bounce multiplexer circuits can be utilized to "bounce" signals from the general interconnect structure back to the general interconnect structure and/or to other input multiplexers without disabling other functions in the programmable logic block. The addition of bounce multiplexer circuits to the CLE allows input multiplexers that would otherwise be unused to do double duty as extra routing resources. Testing shows that some CLE input terminals, while very useful when they are used, are actually used in only a small percentage of CLEs in a typical user design. Without the addition of bounce multiplexer circuits, the input multiplexers associated with these CLE input terminals would consume valuable resources without contributing to the circuit implementation the majority of the time.

FIG. 27 illustrates a PLD having a general interconnect structure 2730, a configurable logic element 2740, and input multiplexers 2720A, 2720B. CLE 2740 has at least one output terminal CLE_OUT coupled to the general interconnect structure. The input terminals of CLE 2740 are also coupled to the general interconnect structure, but the input terminals are coupled via input multiplexers (IMUXes), 2720A and 2720B. Many different implementations of the input multiplexers can be used. However, in the pictured embodiment, each input multiplexer is implemented as a multiplexer having a large number of input terminals R1-R12 coupled to the general interconnect structure 2730, transistors 2701-2716, select terminals coupled to configuration memory cells C10-C16, and an output terminal T5 driving a buffer 2725, coupled together as shown in FIG. 27. The number of inputs to the input multiplexer can vary. For example, in one embodiment, each input multiplexer has 28 input signals, of which four are selected to be passed to the final stage of the multiplexer (e.g., to transistors 2713-2716).

Note that in the pictured embodiment, the input multiplexers are inverting. Input multiplexers can be inverting or non-inverting, as long as any inversion is taken into account by the downstream logic in the CLE or other destination logic. For example, the sense of function generator input signals is unimportant, because a function generator can be programmed to use either a true or complement input signal with no performance impact. In one embodiment, all input multiplexers are inverting. In another embodiment, all input multiplexers are non-inverting. In some embodiments, some input multiplexers are inverting and some are non-inverting.

Buffer 2725 includes three inverters 2721-2323 and a pull-up 2724, coupled together as shown in FIG. 27. The buffer provides two output signals, signal RO1 provided by inverter 2721, and signal RO2 provided by inverter 2723. In the pictured embodiment, signal RO2 is the inverse of signal RO1. However, in some embodiments signals RO1 and RO2 have the same sense. Pull-up 2724 can also be considered optional in some embodiments, particularly where CMOS pass gates are used in the input multiplexer. Buffer 2725 can also be implemented in some other fashion. For example, signal RO1 could be used to drive inverter 2723, while inverter 2722 is omitted from the buffer circuit.

In some embodiments, input multiplexer output signal RO2 returns to general interconnect structure 2730. In other embodiments, signal RO2 is provided to a data input terminal of another input multiplexer 2720B. In yet other embodiments, signal RO2 can both return to general interconnect structure 2730 and drive input multiplexer 2720B.

Known PLDs have provided the ability to drive one input multiplexer from another input multiplexer. However, the embodiment of FIG. 27 provides an addition that makes this technique significantly more useful. When a signal from input multiplexer 2720A is "bounced" via signal RO2, either to input multiplexer 2720B or back to the general interconnect structure, signal RO1 also changes value, and this change in value can have an undesired effect on circuitry inside CLE 2740. For example, clock enable signals, set signals, and reset signals often cannot change value without affecting the contents of the CLE. Therefore, as shown in FIG. 27, bounce multiplexer circuits have been included in CLE 2740 that can be used to programmably isolate signal RO1 from the interior of the CLE.

For example, in a pictured embodiment, a bounce multiplexer circuit 423 (see also FIG. 4) is controlled by configuration memory cell 2743 to provide either the inverse of signal RO1 or a power high VDD signal to a clock enable signal CkE in CLE 2740. In the pictured embodiment, bounce multiplexer circuit 423 is implemented as a NAND gate 2744, driven by the contents of a memory cell 2743 and signal RO1, and providing signal CkE to other circuitry inside CLE 2740. Thus, the clock enable signal CkE can either be provided by IMUX 2720A (i.e., the inverse of signal RO1) or can be held at an active high static value (VDD). Thus, when IMUX 2720A is used to bounce the selected input signal R1-R12 back to the general interconnect 2730 or to another IMUX 2720B, the CLE can still be clocked and its functionality is not impaired. Clearly, the output of NAND gate 2744 is logically equivalent to that of multiplexer 423 in this embodiment.

Another bounce multiplexer circuit 421 (see also FIG. 4) is controlled by configuration memory cell 2741 to provide either the inverse of signal RO1 or a ground GND signal to reverse set/reset signal REV in CLE 2740. In the pictured embodiment, bounce multiplexer circuit 421 is implemented as a NOR gate 2745. NOR gate 2745 is driven by configuration memory cell 2741 and signal RO1, and provides reverse set/reset signal REV to other circuitry inside CLE 2740. Clearly, the output of NOR gate 2745 is logically equivalent to that of multiplexer 421 in this embodiment. It will be clear to those of skill in the art that implementations other than NAND gates, NOR gates, and 2-input multiplexers can also be used for the bounce multiplexer circuits.

As another example, also shown in FIG. 27, a bounce multiplexer circuit 422 (see also FIG. 4) is controlled by configuration memory cell 2742 to provide either the inverse of signal RO1 or a ground signal GND to a set/reset signal S/R of the CLE. In the pictured embodiment, bounce multiplexer circuit 422 is implemented as a NOR gate 2746. NOR gate 2746 is driven by configuration memory cell 2742 and signal RO1, and provides set/reset signal S/R to other circuitry inside CLE 2740. Thus, signal S/R can be disabled instead of tying the value of signal S/R to the value of signal RO1. In the pictured embodiment, when signal S/R is programmed to act as a set signal, signal REV functions as a reset signal. Similarly, when signal S/R is programmed to act as a reset signal, signal REV functions as a set signal. Therefore, signal REV can also be disabled (using bounce multiplexer circuit 421 and configuration memory cell 2741) instead of tying the value of signal REV to the value of signal RO1. Thus, the flip-flops in CLE 2740 are not set or reset by fluctuations on a signal being bounced from IMUX 2720A back to general interconnect 2730 or to another IMUX 2720B.

FIG. 27 also illustrates an exemplary fast connect provided between CLE output signal CLE_OUT and an input terminal of input multiplexer 2720B.

Figure 28:
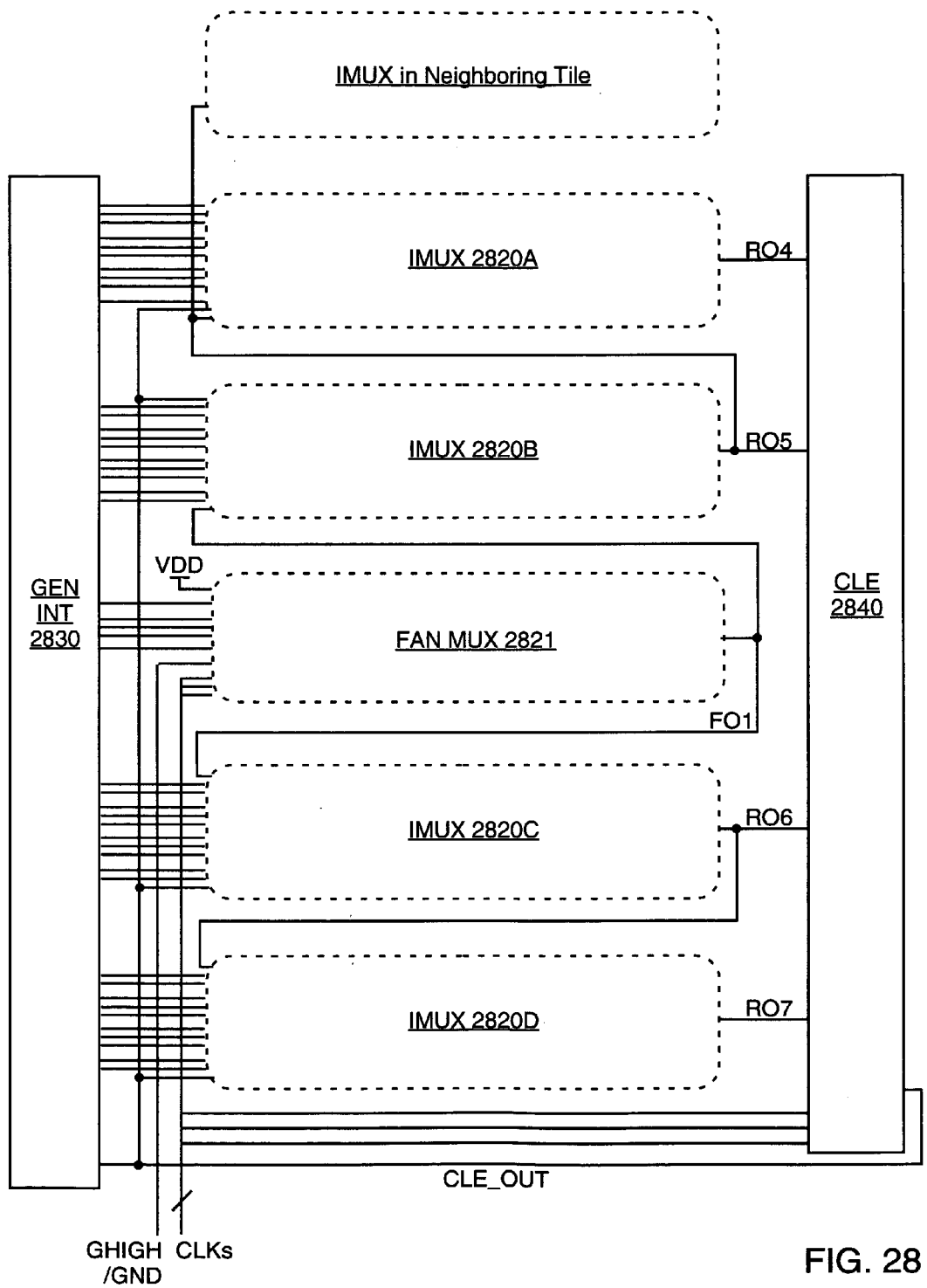
FIG. 28 illustrates how "fan" multiplexers can be utilized with input multiplexers to improve routability in a programmable logic block.

FIG. 28 illustrates how "fan" multiplexers can be utilized with input multiplexers to improve routability in a programmable logic block. FIG. 28 illustrates a PLD having a general interconnect structure 2830, a configurable logic element 2840, and a number of input multiplexers (IMUXes) 2820A-2820D. CLE 2840 has at least one output terminal CLE_OUT coupled to the general interconnect structure. The input terminals RO4-RO7 of CLE 2840 are also coupled to the general interconnect structure, but the input terminals RO4-RO7 are coupled via IMUXes 2820A-2820D, respectively. The input multiplexers can be implemented, for example, in a similar fashion to input multiplexer 2720A of FIG. 27. However, other implementations can also be used. The number of inputs to the input multiplexers can also vary. For example, in one embodiment, each input multiplexer has 24 or 28 input signals.

The PLD of FIG. 28 also includes a "fan" multiplexer 2821, i.e., a multiplexer that does not directly drive any input terminal of the CLE, but drives two or more input multiplexers (e.g., 2820B and 2820C) in the same logic block. These input multiplexers can, in turn, drive other input multiplexers (e.g., 2820A and 2820D, respectively) in the same logic block. Thus, the fan multiplexers "fan out" a selected signal to two or more input terminals of the logic block, and can significantly increase the routability of CLE input signals. Note that FIG. 28, for clarity, illustrates fan multiplexer 2821 driving only two input multiplexers, and input multiplexers 2820B and 2820C each driving only one other input multiplexer in the same logic block. However, in some embodiments these multiplexers can drive many more input multiplexer destinations. Further, some logic blocks include more than one fan multiplexer. In some embodiments, every input terminal of the CLE can be driven via a signal path that traverses a fan multiplexer followed by at least one input multiplexer. This capability simplifies the testing procedure for the logic block. In some embodiments, input multiplexers driven by the fan multiplexer can also drive one or more input multiplexers in other logic blocks (e.g., IMUX 2820B in FIG. 28).

Due to area and power considerations, a typical PLD provides only a subset (sometimes a small subset) of the available interconnect signals to each input terminal. The addition of fan multiplexers greatly increases the number of interconnect signals that can be provided to the input terminals of the CLE, by providing an optional additional stage to two or more of the input multiplexers. The fact that this stage is optional means that a wider choice of input signals can be provided to the CLE input terminals while still providing fast routing paths for critical input signals.

Note that a fan multiplexer is distinguished from a routing multiplexer by the fact that a fan multiplexer does not drive any interconnect lines in the interconnect structure. Similarly, a fan multiplexer differs from an input multiplexer by the fact that a fan multiplexer does not directly drive any of the CLE input terminals.

The fan multiplexer can also be used to provide to the CLE, input signals that are not available from any of the input multiplexers. For example, PLDs typically include a clock distribution structure, e.g., one or more clock trees. These structures are used to provide global or regional clock signals (CLKs) to each programmable logic circuit in the PLD (or region of the PLD). Thus, clock signals are typically not routed using the general interconnect structure, and hence are not available to input multiplexers. Providing clock signals to each input multiplexer would consume prohibitive amounts of area in the tile. However, providing the clock signals to the fan multiplexer provides a means for driving many CLE input terminals with the clock signals without a high cost in terms of area or loading. Additionally or alternatively, the clock distribution structure can be used to route non-clock signals, e.g., high fanout signals, and the signals will have access to the non-clock input terminals of the CLEs.

The exemplary fan multiplexer shown in FIG. 28 is also driven by power high VDD, and by a ground signal GND. In one embodiment, the GND signal is actually a GHIGH signal, which is low after the device is configured (thus being the same as ground GND in a configured device), and high during configuration. The GHIGH signal is used to force all interconnect signals to a high value during the configuration process, thereby avoiding contention on the interconnect lines. Thus, the fan multiplexer selects the GHIGH signal during configuration, forcing a high value onto the output node of the fan multiplexer, and optionally selects a different input signal after configuration, if configured to select an input signal other than ground.

FIG. 28 shows a fan multiplexer driven by a variety of available signals. In some embodiments, the fan multiplexers are driven by some but not all of these signals. In the pictured embodiment, the fan multiplexers are driven by interconnect lines in the interconnect structure (e.g., doubles), power high VDD, ground (e.g., true ground or ground in the form of a GHIGH signal), and clock signals from a clock distribution structure, but not by input multiplexers. In another embodiment (not shown), the fan multiplexers are driven by input multiplexers and by clock signals from a clock distribution structure, but cannot provide power high VDD, ground GND, or signals from the interconnect structure.

FIG. 28 also illustrates an exemplary fast connect provided between CLE output signal CLE_OUT and the input terminals of input multiplexers 2820A-2820D.

Figure 1:
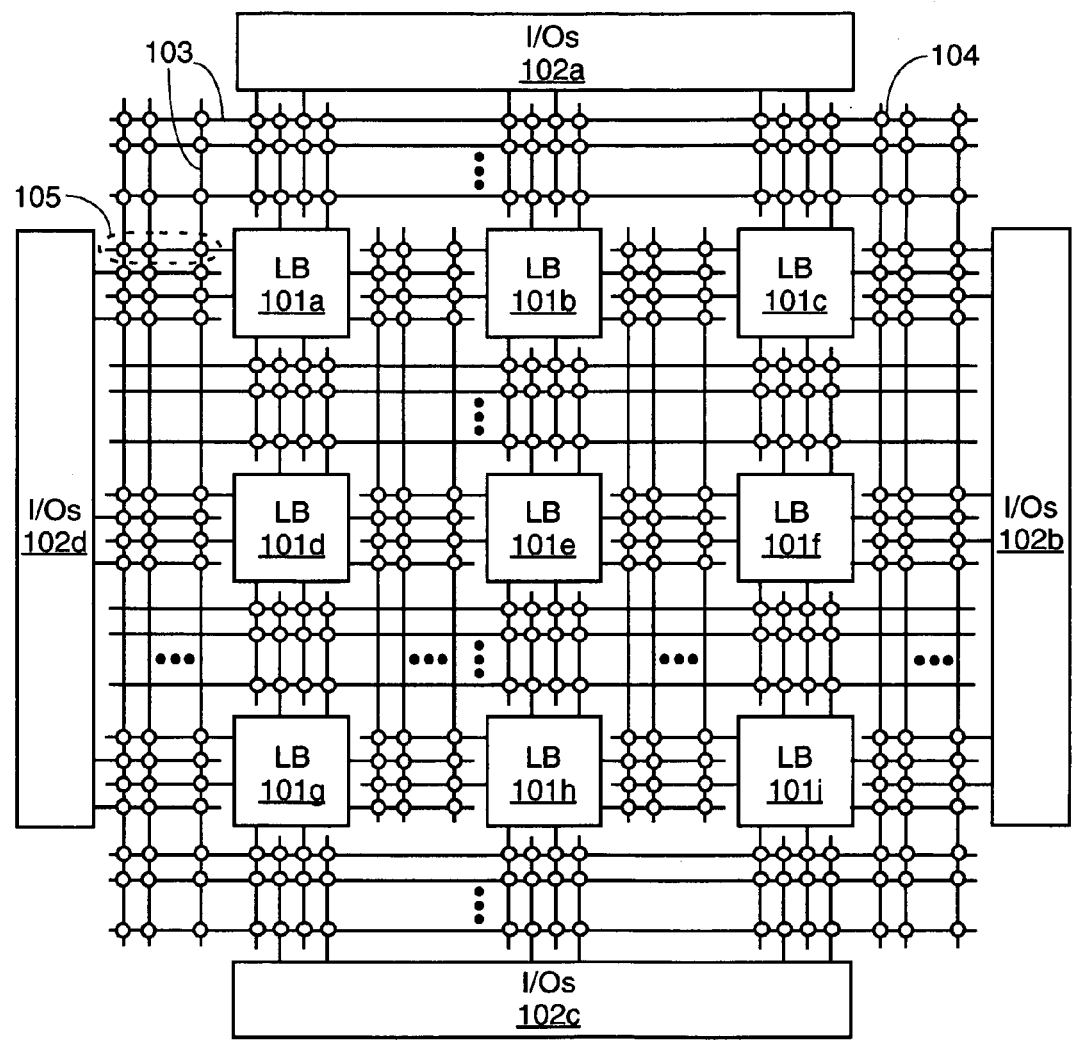
FIG. 1 is a simplified illustration of an exemplary field programmable gate array (FPGA).
Figure 29:
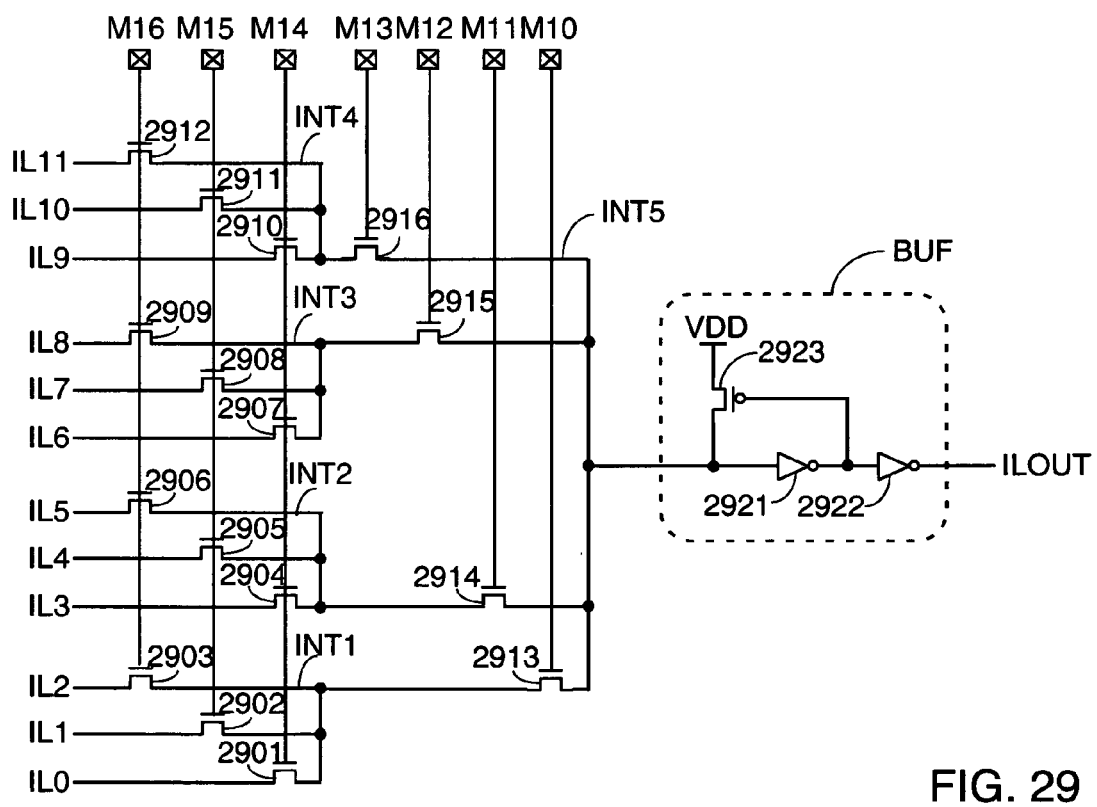
FIG. 29 illustrates a programmable routing multiplexer such as can be used to route signals within a general interconnect structure.

FIG. 29 illustrates a programmable routing multiplexer that can be used, for example, to route signals within a general interconnect structure. As described above, programmable interconnect points (PIPs) are often coupled into groups (e.g., group 105 of FIG. 1) that implement multiplexer circuits selecting one of several interconnect lines to provide a signal to a destination interconnect line. A routing multiplexer can be implemented, for example, as shown in FIG. 29. The illustrated circuit selects one of several different input signals and passes the selected signal to an output terminal. Note that FIG. 29 illustrates a routing multiplexer with twelve inputs, but PLD routing multiplexers typically have many more inputs, e.g., 20, 24, 28, 30, 36, or some other number. However, FIG. 29 illustrates a smaller circuit, for clarity.

The circuit of FIG. 29 includes twelve input terminals IL0-IL11 and sixteen pass gates 2901-2916. Pass gates 2901-2903 selectively pass one of input signals IL0-IL3, respectively, to a first internal node INT1. Each pass gate 2901-2903 has a gate terminal driven by a configuration memory cell M14-M16, respectively. Similarly, pass gates 2904-2906 selectively pass one of input signals IL3-IL5, respectively, to a second internal node INT2. Each pass gate 2904-2906 has a gate terminal driven by one of the same configuration memory cells M14-M16, respectively. From internal nodes INT1, INT2, pass gates 2913, 2914 are controlled by configuration memory cells M10, M11, respectively, to selectively pass at most one signal to another internal node INT5.

Pass gates 2907-2912 and 2915-2916 are similarly controlled by configuration memory cells M12-M16 to select one of input signals IL6-IL11 and to pass the selected input signal via one of internal nodes INT3, INT4 to internal node INT5, as shown in FIG. 29.

The signal on internal node INT5 is buffered by buffer BUF to provide output signal ILOUT. Buffer BUF includes two inverters 2921, 2922 coupled in series, and a pull-up (e.g., a P-channel transistor 2923 to power high VDD) on internal node INT5 and driven by the node between the two inverters.

Thus, values stored in configuration memory cells M10-M16 select at most one of the input signals IL0-IL11 to be passed to internal node INT5, and hence to output node ILOUT. If none of the input signals is selected, output signal ILOUT is held at its initial high value by pull-up 2923.

FIGS. 30-43 illustrate the interconnect structure of an exemplary PLD that includes in the general interconnect structure "diagonal" interconnect lines, e.g., interconnect lines interconnecting programmable structures in different rows and different columns of tiles. These diagonal interconnect lines also have programmable access (e.g., via routing multiplexers) to other programmable interconnect lines (e.g., either straight interconnect lines or other diagonal interconnect lines) in the general interconnect structure. In some embodiments, the diagonal interconnect lines include "doubles", which interconnect programmable structures in tiles diagonally adjacent to one another, and "pents", which interconnect programmable structures in tiles separated by two intervening rows (or columns) and one intervening column (or row). In some embodiments, a diagonal interconnect line coupled between programmable structures in first and second tiles includes an interconnection to a programmable structure in a tile at the "corner" of the diagonal interconnect line, i.e., in an additional tile in the same row (or column) as the first tile, and in the same column (or row) as the second tile.

While doubles and pents are used in the exemplary embodiment described herein, other interconnect line lengths can be used, either in addition to doubles and pents, or instead of doubles and pents, or in combination with doubles but not pents, or in combination with pents but not doubles. The selection of doubles and pents was made based on experimentation that utilized exemplary user designs and the configurable logic element (CLE) described herein. The use of different user designs and/or different programmable or non-programmable logic blocks might lead to the selection of different lengths for the interconnect lines. It will be apparent to one skilled in the art after reading this specification that the present invention can be practiced within these and other architectural variations.

Note that "straight" interconnect lines are not necessarily completely straight in layout. The term "straight interconnect line" as used herein denotes an interconnect line that interconnects tiles (or logic blocks) in the same row or the same column. A "straight interconnect line" as laid out in an actual integrated circuit will probably include turns within the tile, possibly many turns. Note also that "diagonal" interconnect lines are not necessarily diagonal in layout. The term "diagonal interconnect line" as used herein denotes an interconnect line that interconnects programmable structures located in different rows and different columns of tiles. A "diagonal" interconnect line might or might not include portions that traverse a tile in a physically diagonal layout. Further, "diagonal" interconnect lines can interconnect two tiles separated from each other by a number of rows different from the number of columns, or by the same number of rows as columns. Therefore, the terms "straight" and "diagonal" refer to connectivity between source and destination tiles (or logic blocks), and not to the physical layout of the interconnect lines.

Many of FIGS. 30-43 utilize the signal naming conventions set forth in Legend 1 of Appendix A. These signal naming conventions are also used in the following description of the figures and in the other appendices. Briefly, a prefix of "L_" indicates a signal in the L slice, while a prefix of "M_" indicates a signal in the M slice of the CLE. A signal of the form xy5B#, xy5M#, or xy5E# is a pent, with the letter B, M, or E indicating that the tile containing the signal is the "beginning" (entry tile), the "middle" (first exit tile), or "end" (final exit tile) of the pent. A signal of the form xy2B#, xy2M#, or xy2E# is a double, with the letter B, M, or E indicating that the tile containing the signal is the "beginning" (entry tile), the "middle" (first exit tile), or "end" (final exit tile) of the double. Signals of the form LV# are vertical long lines, and signals of the form LH# are horizontal long lines. (Long lines are described in detail below, with reference to FIGS. 40-43.) A reference to a signal "name_U" indicates the signal "name" in the tile above the present tile. A reference to a signal "name_D" indicates the signal "name" in the tile below the present tile.

Figure 30:
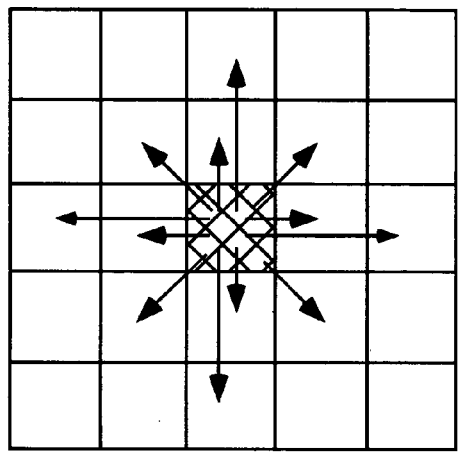
FIG. 30 illustrates the reach of "double" interconnect lines ("doubles") in an exemplary programmable logic device (PLD) general interconnect structure.

FIG. 30 illustrates the reach of "double" interconnect lines ("doubles") in an exemplary PLD general interconnect structure. FIG. 30 shows a 5×5 matrix of tiles, of which the cross-hatched tile at the center of the 5×5 matrix indicates an origination tile for the illustrated doubles. Each of the tiles that includes the head of an arrow designates a tile that can be reached from the origination tile by traversing only one double interconnect line, or part of one double interconnect line. To phrase it another way, each tile including the head of an arrow indicates that at least one double from the origination tile can access at least one structure (e.g., an IMUX or another double) in the tile. Note that in the exemplary embodiment, doubles can also drive some structures in the origination tile.

Figure 31:
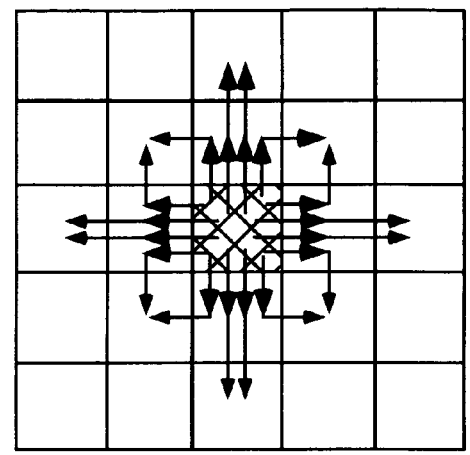
FIG. 31 illustrates the doubles included in an exemplary tile of the PLD of FIG. 30.

FIG. 31 illustrates the doubles included in an exemplary tile of the PLD of FIG. 30. The doubles included in the general interconnect structure of this PLD include both straight and diagonal doubles. Each diagonal double has an origination tile (the cross-hatched tile), and two exit tiles. In FIG. 31, the exit tiles are tiles that include the head of an arrow, the arrow corresponding to a programmable structure (e.g., a routing multiplexer driving another interconnect line, or an input multiplexer driving a logic block) that can be accessed by the interconnect line within the exit tile. The first exit tile is the "turning tile", a tile in the same row or column as the origination tile and horizontally or vertically adjacent to the origination tile. The other exit tile is at the other end of the double interconnect line, i.e., in the tile diagonally adjacent to the origination tile. Each straight double also has an origination tile and two exit tiles. The first exit tile is the first tile crossed by the double, i.e., a tile horizontally or vertically adjacent to the origination tile. The other exit tile is at the other end of the double interconnect line, i.e., in a tile in the same row or column as the origination tile and the first exit tile, horizontally or vertically adjacent to the first exit tile, and separated from the origination tile by a single tile (the first exit tile).

It will be understood that the terms "horizontal", "vertical", and "diagonal" as used herein are relative to one another and to the conventions followed in the figures and specification, and are not indicative of any particular orientation of or on the physical die. For example, two "vertically adjacent" tiles are typically not physically located one above the other (although they may be so located in some embodiments), but are shown positioned one above the other in a referenced or unreferenced figure. Similarly, the terms "above", "below", "up", "down", "right", "left", "bottom", "top", "vertical", "horizontal", "north", "south", "east", "west", and other directional terms as used herein are relative to one another and to the conventions followed in the figures and specification, and are not indicative of any particular orientation of or on the physical die. Note also that the terms "column" and "row" are used to designate direction with respect to the figures herein, and that a "column" in one embodiment can be a "row" in another embodiment.

In some embodiments, all doubles are unidirectional, i.e., having an origination tile at only one end of the interconnect line. In other embodiments, all doubles are bi-directional, i.e., having origination tiles at each end of the interconnect line. In some embodiments doubles have an origination tile other than, or in addition to, the two end tiles. In some embodiments, some doubles are unidirectional and some are bi-directional. In the pictured embodiment, straight doubles are unidirectional, but allow IMUXes to be driven in the origination tile. Therefore, a signal being passed to a straight double can drive CLE input terminals and can also continue on the straight double, within the origination tile of the straight double. However, a signal being passed to a diagonal double cannot drive IMUXes in the origination tile. It will be clear to those of skill in the art that this and similar decisions are matters of design choice.

In one embodiment, each arrow shown in FIG. 31 corresponds to three double interconnect lines. Therefore, while FIG. 31 shows an origination tile from which 16 different arrows originate, an origination tile in the exemplary embodiment can actually access 48 different doubles.

Figure 32:
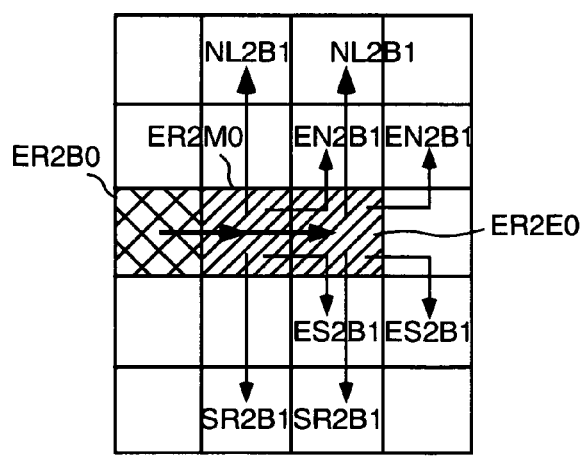
FIG. 32 illustrates how a "straight" double of FIG. 31 can be programmably coupled to other doubles in the exemplary general interconnect structure.

FIG. 32 illustrates in exemplary fashion how a straight double of FIG. 31 can be programmably coupled to other doubles in the exemplary general interconnect structure. Note that the cross-hatched origination tile in FIG. 32 is shown at the center left of the tile array, and the exemplary double is a straight double extending two tiles to the right (east) of the origination tile. The exemplary straight double provides access to eight other doubles, four from the first exit tile and four from the second exit tile.

FIG. 32 utilizes the naming conventions described above and in Legend 1 of Appendix A. For example, the illustrated double in the origination tile is labeled ER2B0, a name indicating a double interconnect line (xx2xx) beginning in the present (origination) tile (xx2Bx). The "ER" (ERxxx) indicates that the interconnect line is one of three straight interconnect lines extending for two tiles to the east. The number 0, 1, or 2 at the end of the name indicates which of the three similar doubles is referenced.

The first exit tile is referenced as ER2M0, the "M" indicating the approximate midpoint of the double. From the first exit tile, the double can programmably drive any of four other doubles, which include NL2B1 (straight north for two tiles), SR2B1 (straight south for two tiles), EN2B1 (east for one tile, then north for one tile), and ES2B1 (east for one tile, then south for one tile). Note that these doubles are labeled with the names of their beginning segments.

The second exit tile is referenced as ER2E0, the "E" indicating the endpoint of the double. From the second exit tile, the double can programmably drive any of four other doubles, which include NL2B1 (straight north for two tiles), SR2B1 (straight south for two tiles), EN2B1 (east for one tile, then north for one tile), and ES2B1 (east for one tile, then south for one tile).

Note that two different doubles in FIG. 32 can have the same label. (This is also true for the other figures herein illustrating the exemplary routing structure.) This is because the signal names are relative to the tile from which the signals are referenced. For example, when speaking from the reference point of the origination tile, the straight double is referred to as ER2B0. When speaking from the reference point of the first exit tile, the same straight double is referred to as ER2M0, and the straight double heading to the north is referred to as NL2B1. When speaking from the reference point of the second exit tile, the same straight double is referred to as ER2E0 and the straight double heading to the north from that tile is referred to as NL2B1. This interconnect line NL2B1 is not the same as the NL2B1 referenced from the first exit tile, but from the tile perspective the connection is the same.

Appendix B includes three tables relating to FIG. 32, each of which illustrates the programmable interconnections available in a single tile between the straight double of FIG. 32 and other doubles. The tables also show what structures are driving the straight double (in the origination tile only), and what CLE input multiplexers and other structures can be driven by the straight double. The tables of Appendix B use the symbology shown in Legend 2 of Appendix A. For example, the symbol "<=" indicates a structure that can drive the double, and "=>" indicates a structure that can be driven by the double. The tables relating to FIG. 32 are the tables headed "ER2B0:" (the beginning of the straight double illustrated in FIG. 32), "ER2M0:" (the middle, or first exit point, of the straight double of FIG. 32), and "ER2E0" (the end, or second exit point, of the straight double illustrated in FIG. 32).

The various structures appear in the same positions in each of the tables of Appendix B, as follows. The first three columns are straight pents, the next three columns are diagonal pents, the next three columns are straight doubles, and the next three columns are diagonal doubles. There are three columns for each of these interconnect lines, because there are three of each type of interconnect line in each tile. However, only the first column in each group of three columns corresponds to a actual driver, e.g., a routing multiplexer, because a pent or a double can only be driven at the beginning of the interconnect line. When the names of two pents appear in the same line, that means that the two pents have paired inputs, i.e., the two pents are driven by the same input signals. For example, pents WL5B2 and NW5B2 have paired inputs. Similarly, doubles appearing in the same line (e.g., WL2B2 and NW2B2) have paired inputs.

The last four columns of each table in Appendix B indicate, respectively, CLE control signal input multiplexers, LUT data input multiplexers (two columns), and CLE output terminals. Long lines and fan multiplexers are also included in the control signal column. The reserved designation (RSVD) indicates a location that currently functions as another fan multiplexer, but can used for other purposes in other embodiments, e.g., a location that can drive another CLE input terminal. Note that the control column includes four "extra" structures, GFAN0, L_CLK, M_CLK, and GFAN1. The inclusion of these extra structures on four extra lines indicates that the structures in the control column are differently sized in the vertical direction than the structures in the other columns. Therefore, structures in the control column are not exactly horizontally aligned with other structures in the same row, as are the structures in the other columns.

Note that the "structures" referred to in the tables of Appendix B might or might not correspond to circuit structures in the tiles associated with each table. For example, the origination tiles of pents and doubles (e.g., xx5Bx and xx2Bx) include drivers (buffers or routing multiplexers) driving the pent or double, while the middle tiles and end tiles do not. Therefore, these structures may be simple wires. Similarly, the tiles at either end of the long lines include drivers, while the sixth and twelfth tiles do not. As further examples, the CLE control input signals have input multiplexers, while the CLE clock input terminals do not, and the CLE output structures are simple output terminals.

Appendix B also illustrates that some interconnect lines can interconnect to structures in tiles adjacent to the actual source or destination tile. In the exemplary embodiment, such interconnections are sometimes provided for the sake of an efficient physical layout for the tile. For example, the first table relating to FIG. 32 (ER2B0:) shows that the ER2B0 straight double can be driven by two straight doubles NL2M2 and NL2E2 in the tile immediately adjacent to the north, as indicated by the symbol "←" occurring prior to the names of these doubles in the table.

In the pictured embodiment, each CLE has 24 output signals, 12 from each slice (four LUT output signals A-D, four registered output signals AQ-DQ, and four select multiplexer outputs AMUX-DMUX, see FIGS. 4 and 6). Each of these CLE output signals is represented by one line in the tables of Appendix B. As described above, four additional lines indicate smaller structures, GFAN0, L_CLK, M_CLK, and GFAN1. GFAN0 and GFAN1 are fan multiplexers. L_CLK and M_CLK are clock routing structures that select the desired clock signals for the corresponding slices. As described in more detail below in relation to FIG. 57, the locations of the structural designations in the tables of Appendix B generally correspond to the physical locations of the structures within the tile, with the exception of the last column, the CLE output signals.

Figure 33:
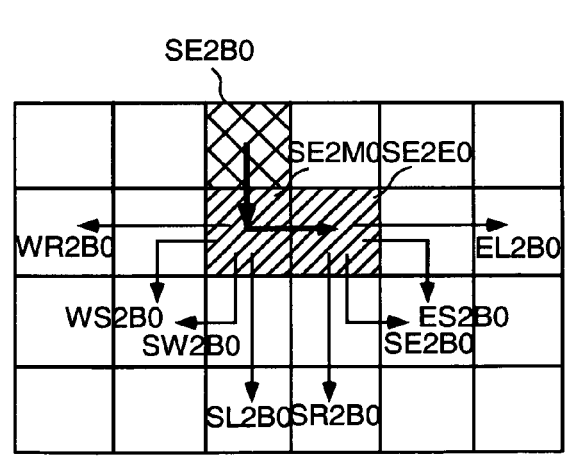
FIG. 33 illustrates how a "diagonal" double of FIG. 31 can be programmably coupled to other doubles in the exemplary general interconnect structure.

FIG. 33 illustrates in exemplary fashion how a diagonal double of FIG. 31 can be programmably coupled to other doubles in the exemplary general interconnect structure. Note that the cross-hatched origination tile in FIG. 33 is shown at the top of the tile array, and the exemplary double is a diagonal double extending one tile to the south and one tile to the east of the origination tile. The exemplary diagonal double provides access to eight other doubles, four from the first exit tile and four from the second exit tile.

FIG. 33 utilizes the naming conventions described above and in Legend 1 of Appendix A. For example, the illustrated double in the origination tile is labeled SE2B0, a name indicating a double interconnect line (xx2xx) beginning in the present (origination) tile (xx2Bx). The "SE" (SExxx) indicates that the interconnect line is one of three diagonal interconnect lines extending for one tile to the south and then one tile to the east. The number 0, 1, or 2 at the end of the name indicates which of the three similar doubles is referenced.

The first exit tile is referenced as SE2M0, the "M" indicating the approximate midpoint (the turning tile) of the double. From the first exit tile, the double can programmably drive any of four other doubles, which include WR2B0 (straight west for two tiles), SL2B0 (straight south for two tiles), WS2B0 (west for one tile, then south for one tile), and SW2B0 (south for one tile, then west for one tile).

The second exit tile is referenced as SE2E0, the "E" indicating the endpoint of the double. From the second exit tile, the double can programmably drive any of four other doubles, which include EL2B0 (straight east for two tiles), SR2B0 (straight south for two tiles), ES2B0 (east for one tile, then south for one tile), and SE2B0 (south for one tile, then east for one tile).

Appendix B includes three tables relating to FIG. 33, each of which illustrates the programmable interconnections available in a single tile between the diagonal double of FIG. 33 and other doubles. The tables also show what structures are driving the diagonal double (in the origination tile only), and what CLE input multiplexers and other structures can be driven by the diagonal double. The tables relating to FIG. 33 are the tables headed "SE2B0:" (the beginning of the diagonal double illustrated in FIG. 33), "SE2M0:" (the middle, or first exit point, of the diagonal double of FIG. 33), and "SE2E0" (the end, or second exit point, of the diagonal double illustrated in FIG. 33).

Figure 34:
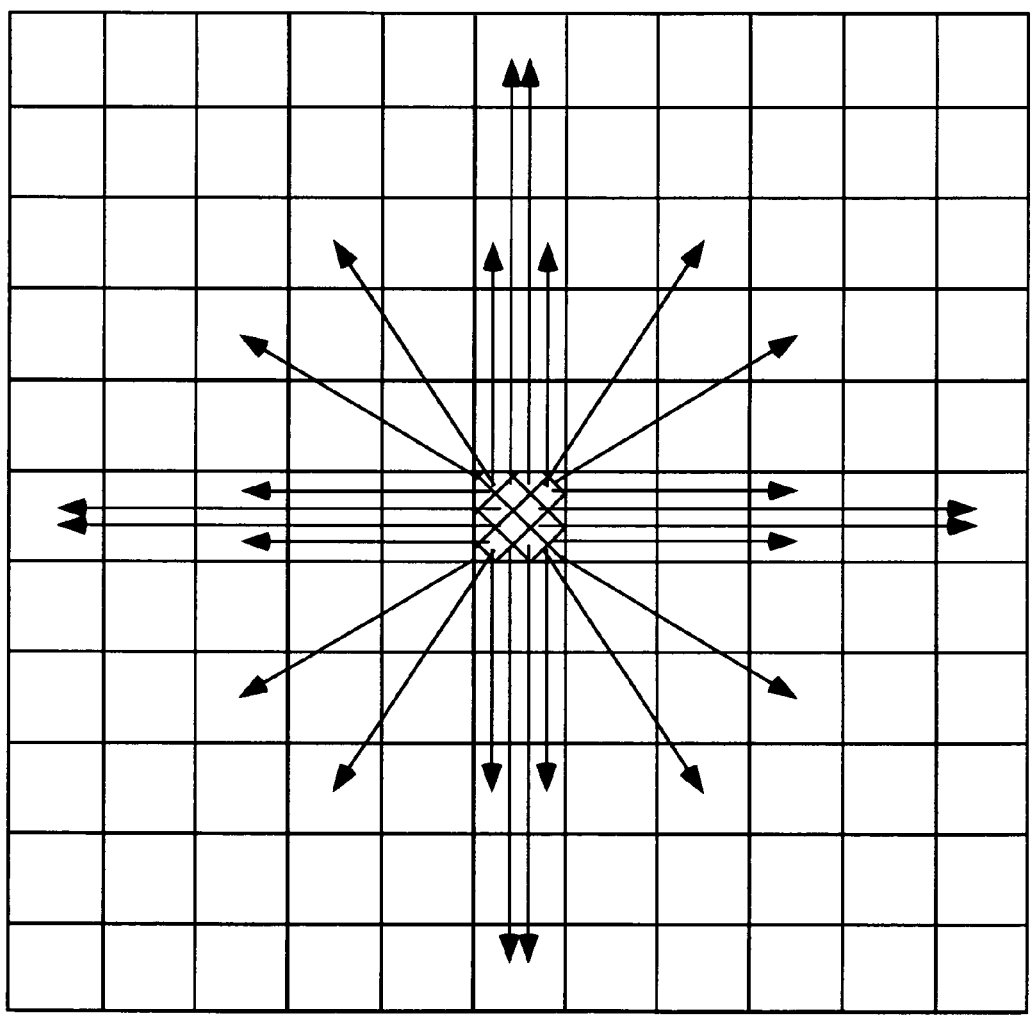
FIG. 34 illustrates the reach of "pent" interconnect lines ("pents") in the exemplary general interconnect structure.

FIG. 34 illustrates the reach of "pent" interconnect lines ("pents") in the exemplary general interconnect structure. FIG. 34 shows an 11×11 matrix of tiles, of which the cross-hatched tile at the center of the 11×11 matrix indicates an origination tile for the illustrated doubles. Each of the tiles that includes the head of an arrow designates a tile that can be reached from the origination tile by traversing only one pent interconnect line, or part of one pent interconnect line. To phrase it another way, each tile including the head of an arrow indicates that at least one pent from the origination tile can access at least one structure (e.g., a double or another pent) in the tile.

Figure 35:
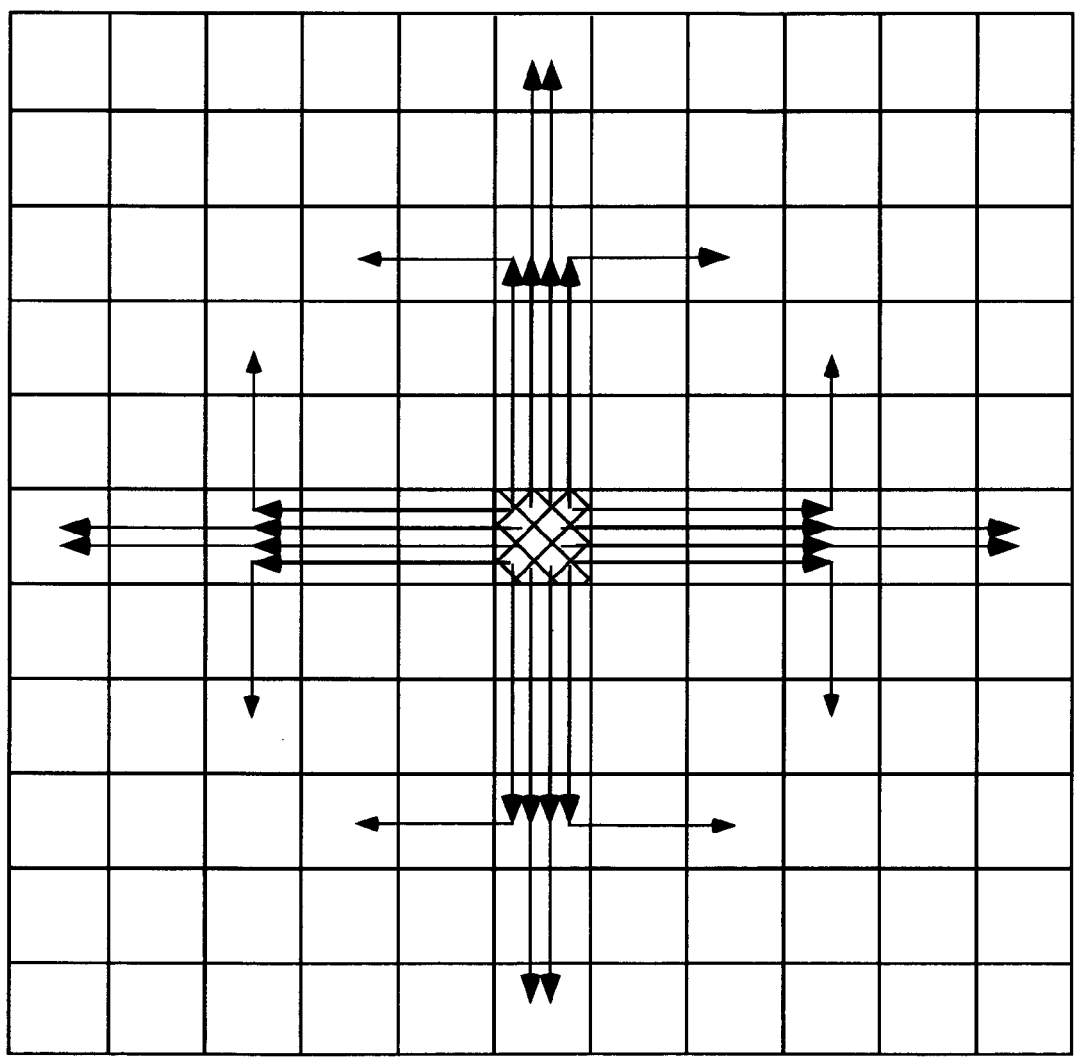
FIG. 35 illustrates the pents included in an exemplary tile of the PLD of FIG. 34.

FIG. 35 illustrates the pents included in an exemplary tile of the PLD of FIG. 34. The pents included in the general interconnect structure of this PLD include both straight and diagonal pents. Each diagonal pent has an origination tile (shown cross-hatched), and two exit tiles. In FIG. 35, the exit tiles are tiles that include the head of an arrow, the arrow corresponding to a structure (e.g., a routing multiplexer driving another interconnect line) that can be accessed by the interconnect line within the exit tile. The first exit tile is at the "turning tile", a tile in the same row or column as the origination tile and horizontally or vertically separated by two tiles from the origination tile. The other exit tile is at the other end of the pent interconnect line, i.e., in a tile separated from the turning tile by a single tile. Each straight pent also has an origination tile and two exit tiles. The first exit tile is at the third tile crossed by the pent, i.e., a tile separated by two tiles from the origination tile. The other exit tile is at the other end of the pent interconnect line, i.e., in a tile in the same row or column as the origination tile and the first exit tile, and separated from the first exit tile by a single tile. Note that in some embodiments, the first exit tile of a pent is closer to the origination tile by one or two tiles, or further from the origination tile by one tile. Further, as noted above, in some embodiments the length of these interconnect lines is other than five tiles.

In some embodiments, all pents are unidirectional, i.e., having an origination tile at only one end of the interconnect line. In other embodiments, all pents are bi-directional, i.e., having origination tiles at each end of the interconnect line. In some embodiments pents have an origination tile other than, or in addition to, the two end tiles. In some embodiments, some pents are unidirectional and some are bi-directional.

In one embodiment, each arrow shown in FIG. 35 corresponds to three pent interconnect lines. Therefore, while FIG. 35 shows an origination tile from which 16 different arrows originate, an origination tile in the exemplary embodiment can actually access 48 different pents.

Figure 36:
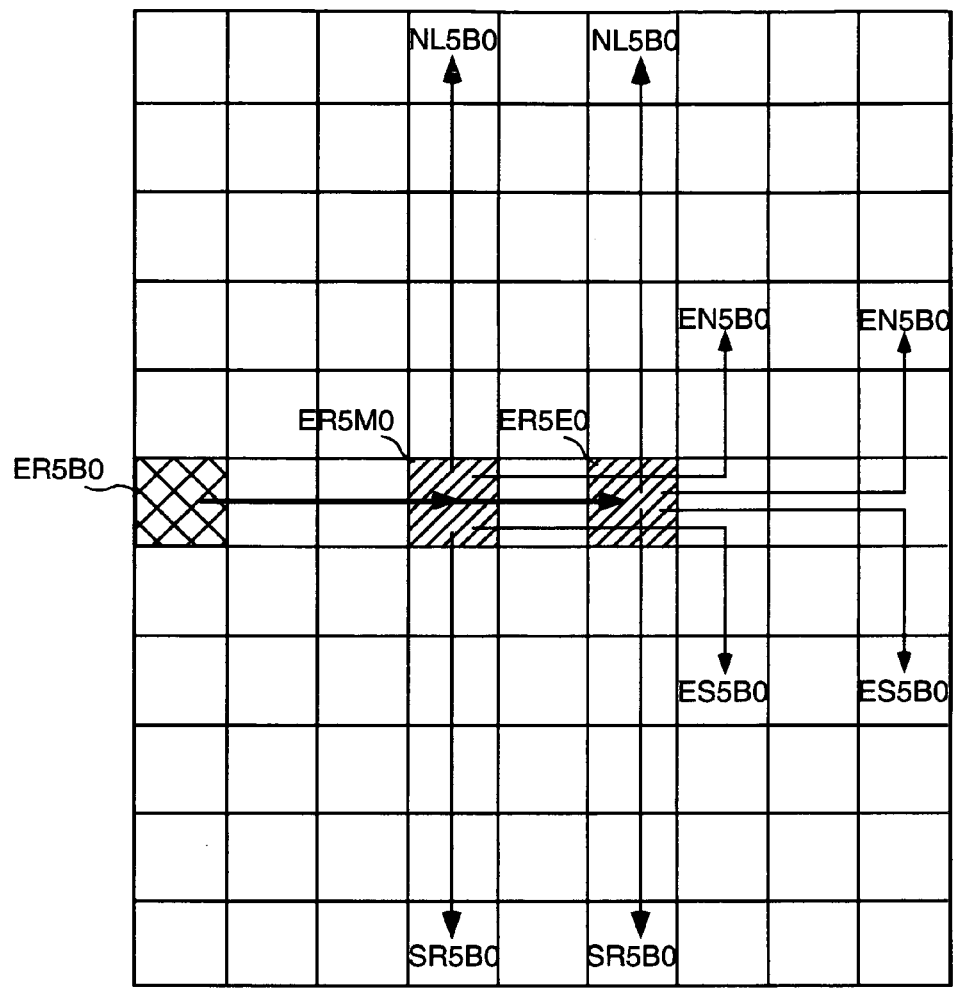
FIG. 36 illustrates how a straight pent of FIG. 35 can be programmably coupled to other pents in the exemplary general interconnect structure.

FIG. 36 illustrates in exemplary fashion how a straight pent of FIG. 35 can be programmably coupled to other pents in the exemplary general interconnect structure. Note that the cross-hatched origination tile in FIG. 36 is shown at the center left of the tile array, and the exemplary pent is a straight pent extending five tiles to the right (east) of the origination tile. The exemplary straight pent provides access to eight other pents, four from the first exit tile and four from the second exit tile.

FIG. 36 utilizes the naming conventions described above and in Legend 1 of Appendix A. For example, the illustrated pent in the origination tile is labeled ER5B0, a name indicating a pent interconnect line (xx5xx) beginning in the present (origination) tile (xx5Bx). The "ER" (ERxxx) indicates that the interconnect line is one of three straight interconnect lines extending for five tiles to the east. The number 0, 1, or 2 at the end of the name indicates which of the three similar pents is referenced.

The first exit tile is referenced as ER5M0, the "M" indicating the approximate midpoint of the pent. From the first exit tile, the pent can programmably drive any of four other pents, which include NL5B0 (straight north for five tiles), SR5B0 (straight south for five tiles), EN5B0 (east for three tiles, then north for two tiles), and ES5B0 (east for three tiles, then south for two tiles). Note that these doubles are labeled with the names of their beginning segments.

The second exit tile is referenced as ER5E0, the "E" indicating the endpoint of the pent. From the second exit tile, the pent can programmably drive any of four other pents, which include NL5B0 (straight north for five tiles), SR5B0 (straight south for five tiles), EN5B0 (east for three tiles, then north for two tiles), and ES5B0 (east for three tiles, then south for two tiles).

Figure 37:
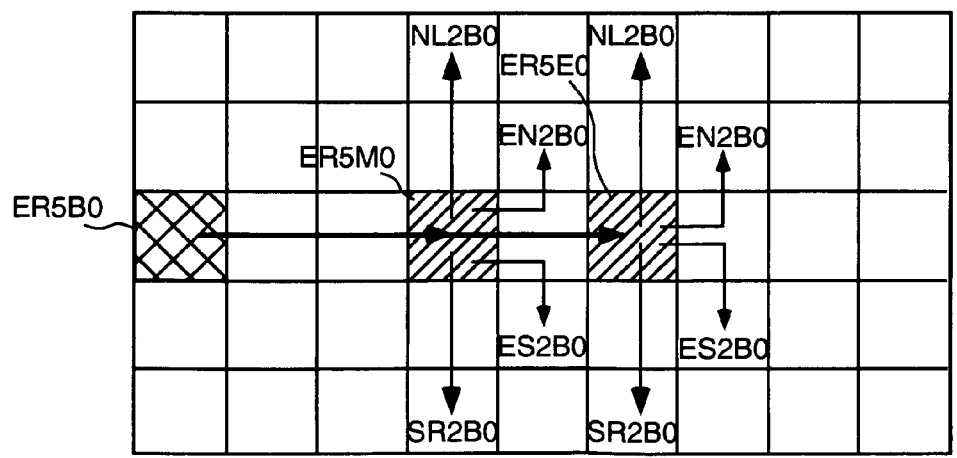
FIG. 37 illustrates how a straight pent of FIG. 35 can be programmably coupled to doubles in the exemplary general interconnect structure.

FIG. 37 illustrates in exemplary fashion how a straight pent of FIG. 35 can be programmably coupled to doubles in the exemplary general interconnect structure. Note that the cross-hatched origination tile in FIG. 37 is shown at the center left of the tile array, and the exemplary pent is a straight pent extending five tiles to the right (east) of the origination tile. The exemplary straight pent provides access to eight doubles, four from the first exit tile and four from the second exit tile.

The first exit tile is referenced as ER5M0, the "M" indicating the approximate midpoint of the pent. From the first exit tile, the pent can programmably drive any of four doubles, which include NL2B0 (straight north for two tiles), SR2B0 (straight south for two tiles), EN2B0 (east for one tile, then north for one tile), and ES2B0 (east for one tile, then south for one tile).

The second exit tile is referenced as ER5E0, the "E" indicating the endpoint of the pent. From the second exit tile, the pent can programmably drive any of four doubles, which include NL2B0 (straight north for two tiles), SR2B0 (straight south for two tiles), EN2B0 (east for one tile, then north for one tile), and ES2B0 (east for one tile, then south for one tile).

Appendix B includes three tables relating to FIGS. 36 and 37, each of which illustrates the programmable interconnections available in a single tile between the straight pent of FIGS. 36 and 37 and other pents and doubles. The tables also show what structures are driving the straight pent (in the origination tile only), and what CLE input multiplexers and other structures can be driven by the straight pent. The tables relating to FIGS. 36 and 37 are the tables headed "ER5B0:" (the beginning of the straight pent illustrated in FIGS. 36 and 37), "ER5M0:" (the middle, or first exit point, of the straight pent of FIGS. 36 and 37), and "ER5E0" (the end, or second exit point, of the straight pent illustrated in FIGS. 36 and 37).

Figure 38:
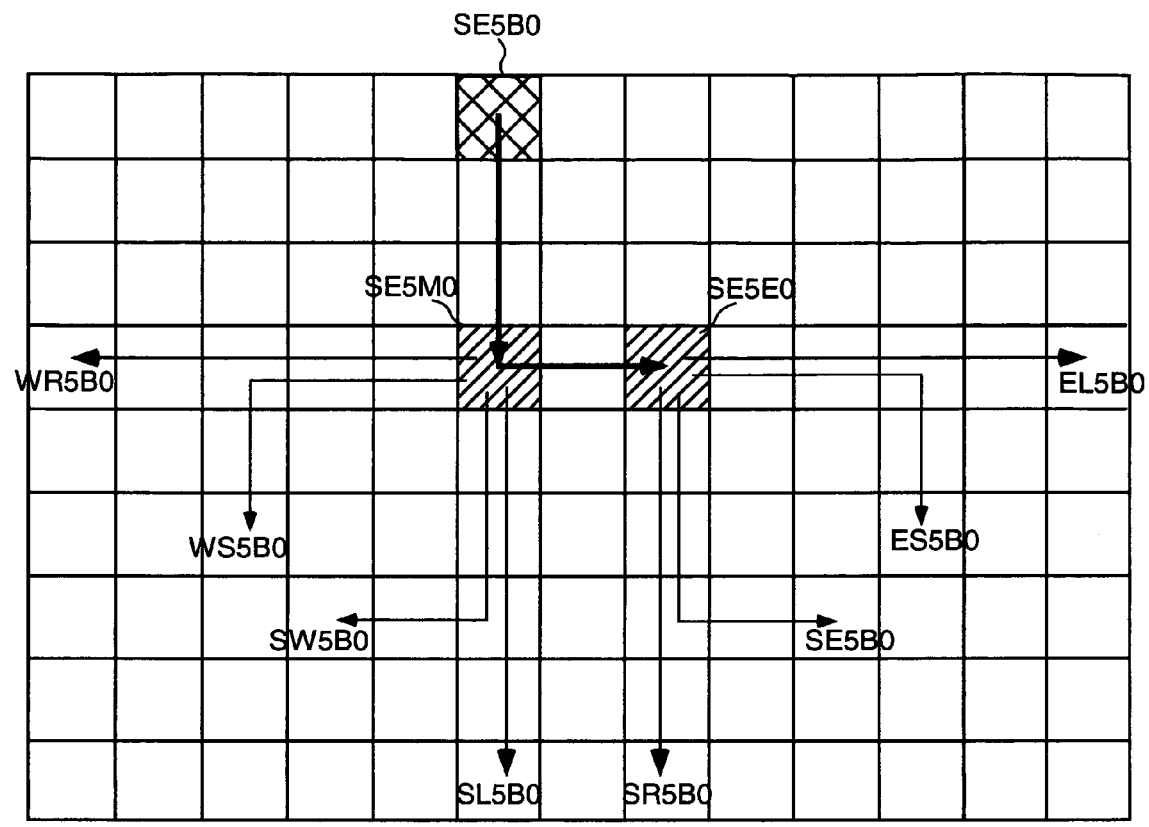
FIG. 38 illustrates how a diagonal pent of FIG. 35 can be programmably coupled to other pents in the exemplary general interconnect structure.

FIG. 38 illustrates in exemplary fashion how a diagonal pent of FIG. 35 can be programmably coupled to other pents in the exemplary general interconnect structure. Note that the cross-hatched origination tile in FIG. 38 is shown at the top edge of the tile array, and the exemplary pent is a diagonal pent extending three tiles to the south of the origination tile, and then two tiles to the east. The exemplary diagonal pent provides access to eight other pents, four from the first exit tile and four from the second exit tile.

FIG. 38 utilizes the naming conventions described above and in Legend 1 of Appendix A. For example, the illustrated pent in the origination tile is labeled SE5B0, a name indicating a pent interconnect line (xx5xx) beginning in the present (origination) tile (xx5Bx). The "SE" (SExxx) indicates that the interconnect line is one of three diagonal interconnect lines extending for three tiles to the south and then two tiles to the east. The number 0, 1, or 2 at the end of the name indicates which of the three similar pents is referenced.

The first exit tile is referenced as SE5M0, the "M" indicating the approximate midpoint (the turning tile) of the pent. From the first exit tile, the pent can programmably drive any of four other pents, which include WR5B0 (straight west for five tiles), SL5B0 (straight south for five tiles), WS5B0 (west for three tiles, then south for two tiles), and SW5B0 (south for three tiles, then west for two tiles).

The second exit tile is referenced as SE5E0, the "E" indicating the endpoint of the pent. From the second exit tile, the pent can programmably drive any of four other pents, which include EL5B0 (straight east for five tiles), SR5B0 (straight south for five tiles), SE5B0 (south for three tiles, then east for two tiles), and ES5B0 (east for three tiles, then south for two tiles).

Figure 39:
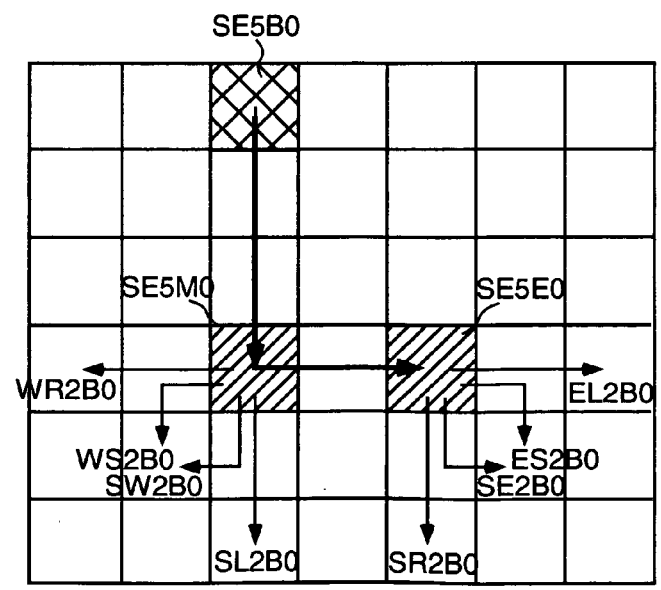
FIG. 39 illustrates how a diagonal pent of FIG. 35 can be programmably coupled to doubles in the exemplary general interconnect structure.

FIG. 39 illustrates in exemplary fashion how a diagonal pent of FIG. 35 can be programmably coupled to doubles in the exemplary general interconnect structure. Note that the cross-hatched origination tile in FIG. 39 is shown at the top edge of the tile array, and the exemplary pent is a diagonal pent extending three tiles to the south of the origination tile, and then two tiles to the east. The exemplary diagonal pent provides access to eight doubles, four from the first exit tile and four from the second exit tile.

The first exit tile is referenced as SE5M0, the "M" indicating the approximate midpoint (the turning tile) of the pent. From the first exit tile, the pent can programmably drive any of four doubles, which include WR2B0 (straight west for two tiles), SL2B0 (straight south for two tiles), WS2B0 (west for one tile, then south for one tile), and SW2B0 (south for one tile, then west for one tile).

The second exit tile is referenced as SE5E0, the "E" indicating the endpoint of the pent. From the second exit tile, the pent can programmably drive any of four doubles, which include EL2B0 (straight east for two tiles), SR2B0 (straight south for two tiles), SE2B0 (south for one tile, then east for one tile), and ES2B0 (east for one tile, then south for one tile).

Appendix B includes three tables relating to FIGS. 38 and 39, each of which illustrates the programmable interconnections available in a single tile between the diagonal pent of FIGS. 38 and 39 and other pents and doubles. The tables also show what structures are driving the diagonal pent (in the origination tile only), and what CLE input multiplexers and other structures can be driven by the diagonal pent. The tables relating to FIGS. 38 and 39 are the tables headed "SE5B0:" (the beginning of the diagonal pent illustrated in FIGS. 38 and 39), "SE5M0:" (the middle, or first exit point, of the diagonal pent of FIGS. 38 and 39), and "SE5E0" (the end, or second exit point, of the diagonal pent illustrated in FIGS. 38 and 39).

The exemplary embodiment also includes another type of interconnect line that is well known in the art of programmable logic design. This type of interconnect line is the "long line", a horizontal or vertical interconnect line spanning a relatively large number of tiles. Long lines are typically used for signals traveling a long distance across the IC, and are often used for signals with a high fanout (i.e., a large number of destinations). Thus, in the illustrated embodiment the available routing resources include: fast connects, in which the output of a logic block drives the input multiplexers of the same logic block without traversing the general interconnect structure (see FIGS. 24-26 and the accompanying text); doubles, which can drive other doubles, input multiplexers, and sometimes long lines, but not pents; pents, which drive other pents and doubles, but not long lines or input multiplexers; and long lines, which drive other long lines and pents, but not doubles or input multiplexers. Considering only those signal paths that do not traverse long lines, a typical signal path between the output terminal of a logic block and the input terminal of an input multiplexer in another tile traverses either one or more doubles, or one or more pents followed by one or more doubles. In other embodiments (not shown), other interconnection patterns are available, such as interconnection patterns in which doubles can drive pents, pents and/or long lines can drive input multiplexers, and so forth. It will be apparent to those of skill in the art that these variations are a matter of design choice. In U.S. Pat. No. 5,914,616, Young et al. describe the advantages of a hierarchical interconnect structure in which longer interconnect lines generally drive shorter interconnect lines, with the shortest interconnect lines being used to access the CLE input terminals.

Figure 40:
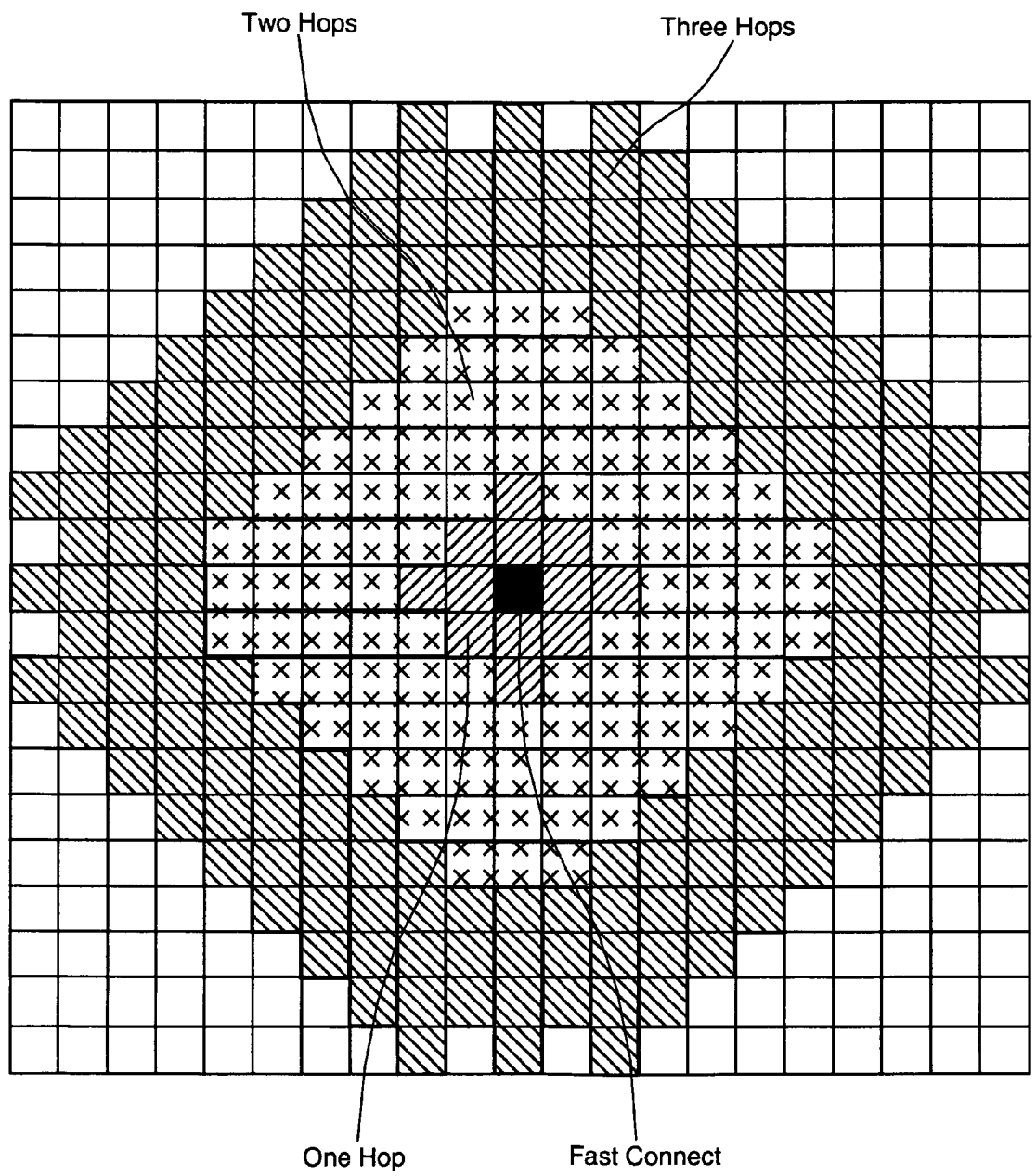
FIG. 40 illustrates the destination tiles within reach of an origination tile using only "fast connects", doubles, and/or pents, and performing one, two, or three "hops".

FIG. 40 illustrates the destination tiles having input multiplexers within reach of an origination tile using only fast connects, doubles, and/or pents, and performing one, two, or three "hops" (i.e., traversing one, two, or three interconnect lines). In FIG. 40, the origination tile for the signal path is at the center of the figure, and is filled in black. Using only fast connects, signals from the origination tile can drive input multiplexers only in the same tile (the origination tile). Using one hop (i.e., by traversing one double), input multiplexers in the tiles filled with a right diagonal pattern can be reached. Using two hops (i.e., by traversing either a pent followed by a double, or two doubles), input multiplexers in all of the tiles filled with "X" marks can be reached. Using three hops (i.e., by traversing either two pents and one double, one pent and two doubles, or three doubles), input multiplexers in all of the tiles filled with a left diagonal pattern can be reached. Note that three hops can also reach input multiplexers in at least some of the tiles reachable within two hops, two hops can also reach input multiplexers in at least some of the tiles reachable within one hop, and multiple hops can be used to implement a feedback path back to input multiplexers of the origination tile. While generally not preferred alternatives, the availability of these additional paths can allow particularly dense designs to be routed when the more optimal signal paths are not available.

Figure 41:
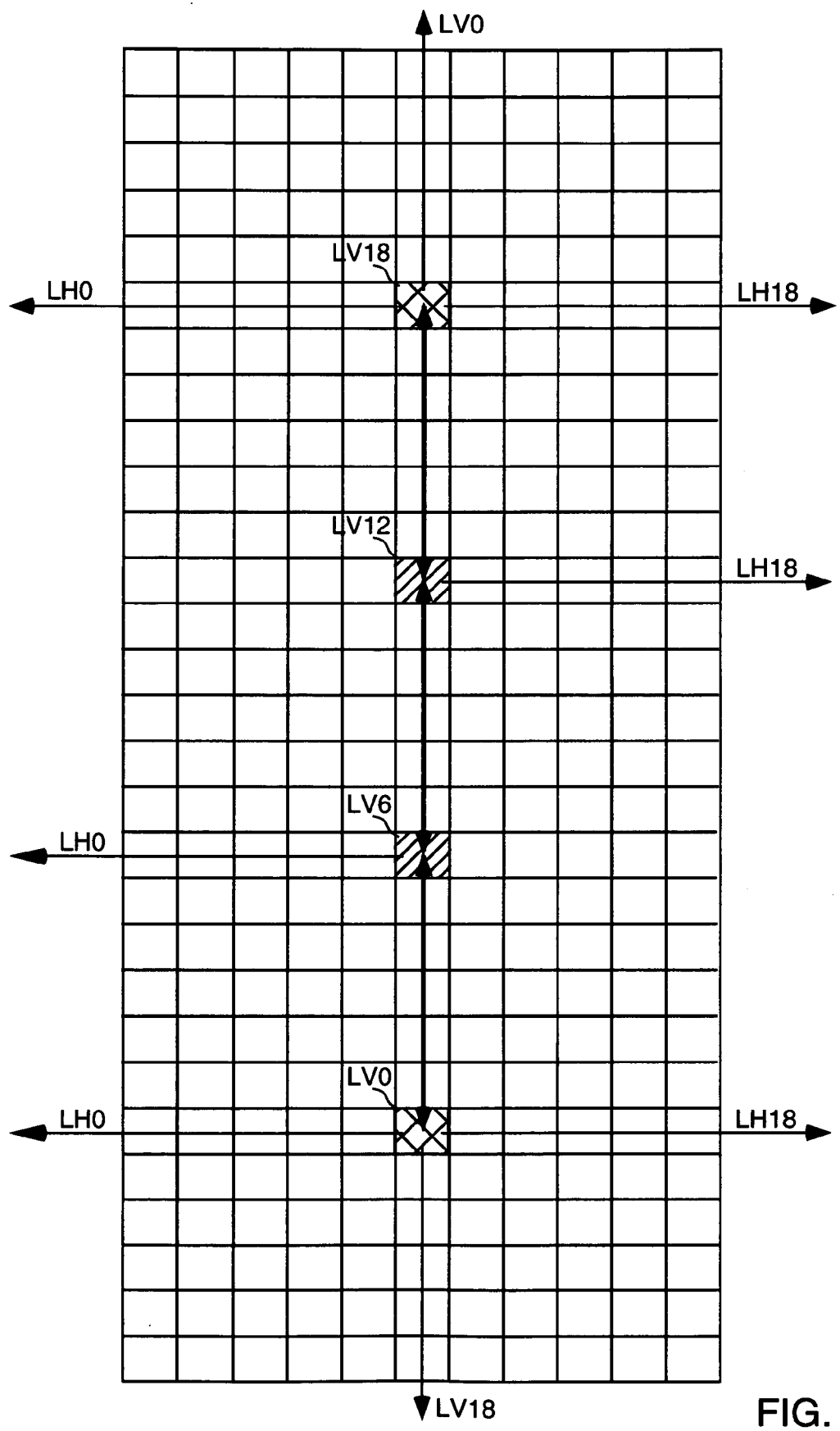
FIG. 41 illustrates a "long line" in the exemplary general interconnect structure, and how a long line can be programmably coupled to other long lines in the exemplary general interconnect structure.

FIG. 41 illustrates a long line in the exemplary general interconnect structure, and how a long line can be programmably coupled to other long lines in the exemplary general interconnect structure. In the exemplary embodiment, long lines can be used to drive only other long lines and pents, as described above in connection with FIG. 40. Further, in the exemplary embodiment all long lines are "straight" interconnect lines, i.e., there are no diagonal long lines. However, both vertical and horizontal long lines are included.

In the exemplary embodiment, all long lines are bi-directional. (In some embodiments, some or all of the long lines are unidirectional.) Therefore, the long line illustrated in FIG. 41 has two origination tiles, as shown by the two cross-hatched tiles at the top and bottom of the long line. For an exemplary signal moving from bottom to top on the illustrated long line, the origination tile is shown near the bottom of the tile array (LV0), and extends 18 tiles to the north of the origination tile. Thus, the exemplary long line provides access to eight other long lines, three from the origination tile (LV0), one from the first exit tile (LV6), one from the second exit tile (LV12), and three from the third exit tile (LV18).

FIG. 41 utilizes the naming conventions shown in Legend 1 of Appendix A. For example, as seen from the perspective of an upward-driving signal, the illustrated long line in the lower origination tile is labeled LV0, a name indicating a vertical long line (LVx) beginning in the present (origination) tile (xx0). The number 0, 6, 12, or 18 at the end of the name indicates which exit tile of the long line is referred to. The number 0 indicates the origination tile of the long line. The number 6 indicates the first exit tile (6 tiles from the origination tile), the number 12 indicates the second exit tile (12 tiles from the origination tile), and the number 18 indicates the third exit tile (18 tiles from the origination tile). For a downward-driving signal, the origination tile is tile LV18, the first exit tile is tile LV12, the second exit tile is tile LV6, and the third exit tile is tile LV0. For the vertical interconnect line shown in FIG. 41, the exit tiles are tiles that include the head of an arrow, the arrow corresponding to a programmable structure (e.g., a routing multiplexer driving another interconnect line) that can be accessed by the interconnect line within the exit tile.

Figure 42:
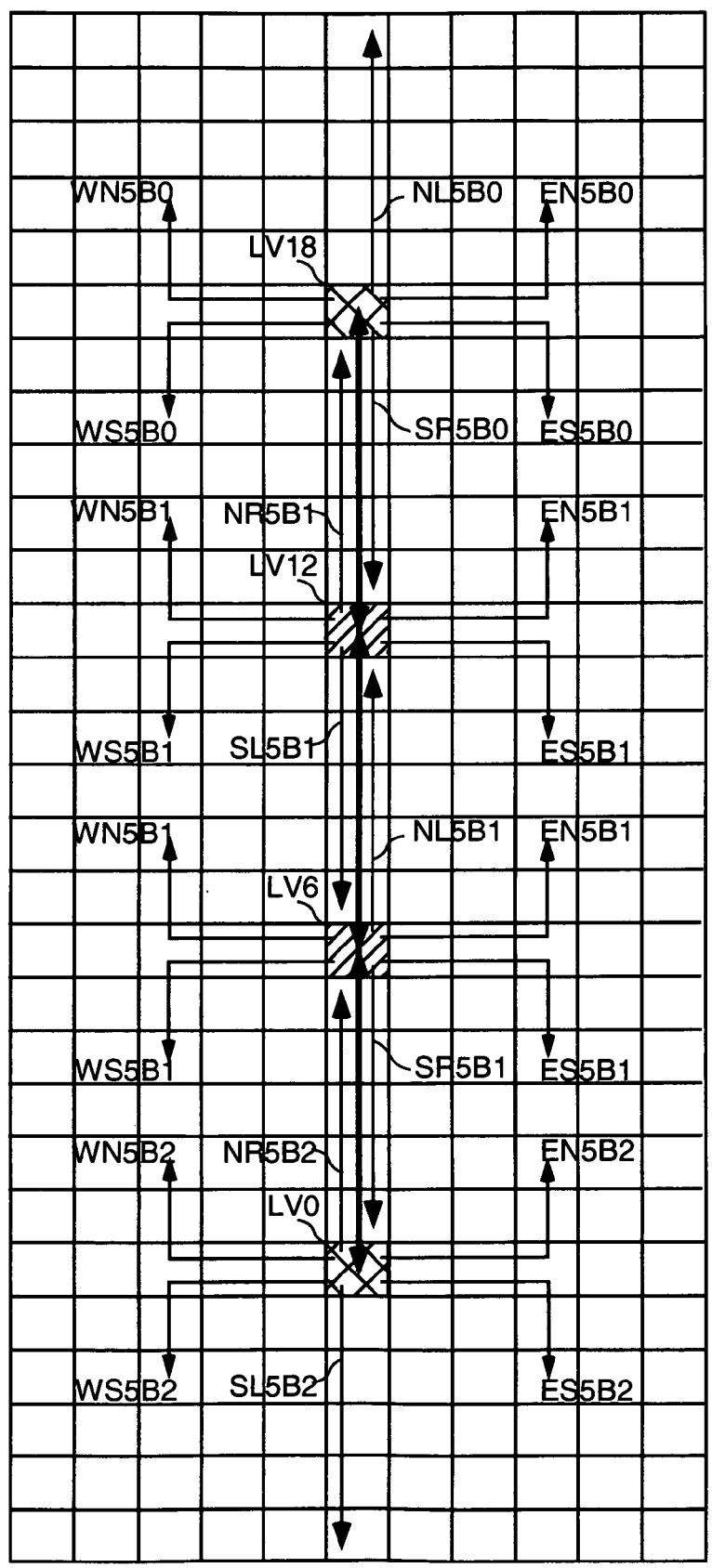
FIG. 42 illustrates how a long line can be programmably coupled to pents in a first exemplary general interconnect structure.

FIG. 42 illustrates how a long line can be programmably coupled to pents in a first exemplary general interconnect structure. FIG. 42 shows the same long line as FIG. 41. At the origination tile LV0 (which acts as the third exit tile when a signal is driving downward), the long line can drive any of six pents. From each of the first, second, and third exit tiles LV6, LV12, and LV18, the long line can drive any of six pents. This embodiment has the advantage of providing a balanced pattern of destinations for the long line.

Figure 43:
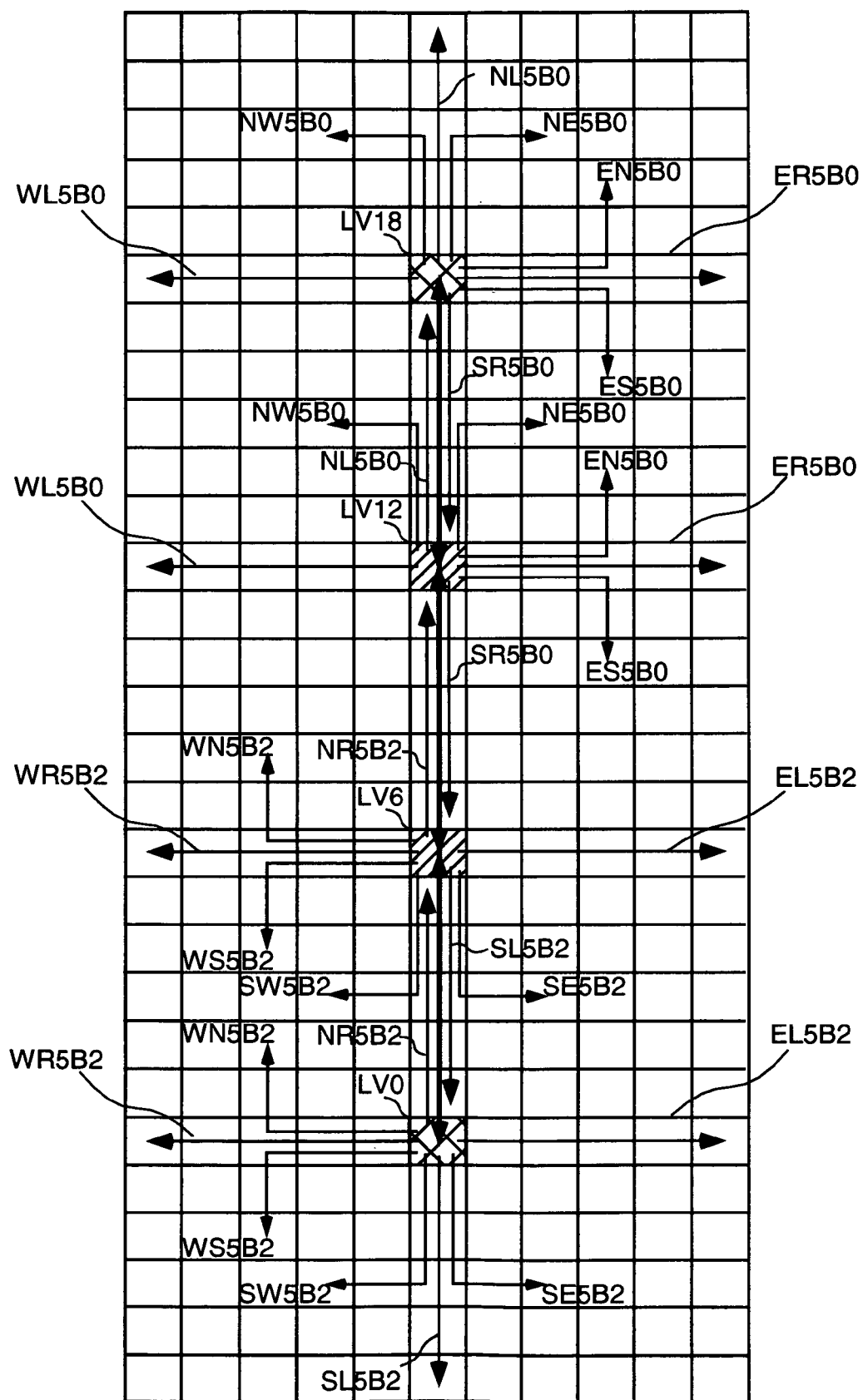
FIG. 43 illustrates how a long line can be programmably coupled to pents in a second exemplary general interconnect structure.

FIG. 43 illustrates how a long line can be programmably coupled to pents in a second exemplary general interconnect structure. FIG. 43 shows the same long line as FIG. 41. At the origination tile LV0 (which acts as the third exit tile when a signal is driving downward), the long line can drive any of eight pents. From each of the first, second, and third exit tiles LV6, LV12, and LV18, the long line can also drive any of eight pents. While this embodiment does not provide a balanced pattern of destinations for the long line, a larger number of pents can be accessed from each exit tile of the long line than in the embodiment of FIG. 42. Additionally, in one embodiment the arrangement illustrated in FIG. 43 results in a more efficient physical layout than the arrangement shown in FIG. 42.

Appendix B includes four tables relating to FIGS. 41 and 43. A first table (LV0:) shows the structures that drive the vertical long line illustrated in FIGS. 41 and 43 within the origination tile, as well as the long lines and pents driven by the long line in the origination tile (e.g., when functioning as an exit tile for a downward driving signal). Two additional tables (LV6: and LV12:) show the structures driven by the first exit tile (LV6) and the second exit tile (LV12), respectively. A fourth table (LV18:) shows the structures driven by the third exit tile (LV18), and the structures that can drive the long line from the third exit tile when functioning as an origination tile.

Appendix B also includes exemplary tables for other structures in the pictured embodiment. For example, Appendix B includes a table (L_DQ:) that illustrates the programmable interconnections available for the memory cell output signal L_DQ (see FIG. 4). This table illustrates, for example, that the CLE AQ-DQ output signals can drive both doubles and pents, but not long lines. Note that signal L_DQ can also drive four of the LUT data input terminals and two of the bypass input terminals for the same CLE, terminals C4, CX, and A2 for slice M (M_C4, M_CX, and M_A2), and terminals D4, DX, and B2 for slice L (L_D4, L_DX, and L_B2). These connections provide an example of the fast connects described above in connection with FIG. 24.

Another table in Appendix B (L_DMUX:) illustrates the programmable interconnections available for the output select multiplexer output signal L_DMUX (see FIG. 4). This table illustrates, for example, that the CLE AMUX-DMUX output signals can drive both doubles and pents, but not long lines. Note that signal L_DMUX can also drive four of the LUT data input terminals for the same CLE, terminals C3 and A5 for slice M (M_C3 and M_A5), and terminals D3 and B5 for slice L (L_D3 and L_B5). These connections provide an example of the fast connects described above in connection with FIG. 25.

Yet another table in Appendix B (L_D:) illustrates the programmable interconnections available for the LUT O6 output signal L_D (see FIG. 4). This table illustrates, for example, that the CLE A-D output signals can drive both doubles and pents, but not long lines. Note that signal L_D can also drive four of the LUT data input terminals for the same CLE, terminals D6 and B1 for slice M (M_D6 and M_B1), and terminals C6 and A1 for slice L (L_C6 and L_A1). These connections provide an example of the fast connects described above in connection with FIG. 26.

Appendix B also includes a table (FAN0:) for an exemplary input multiplexer driving a bounce multiplexer circuit, e.g., an input multiplexer similar to input multiplexer 2320A of FIG. 27. Note that the input multiplexer described in this table can be optionally driven by power high VDD or ground GND, in addition to the structures shown in the table.

Another table in Appendix B (GFAN0:) illustrates the programmable interconnections available for an exemplary fan multiplexer similar, for example, to fan multiplexer 2421 of FIG. 28. Note that fan multiplexer GFAN0 is driven by 14 clock signals from the clock distribution structure in addition to the structures shown in the table. More specifically, the exemplary fan multiplexer GFAN0 is driven by the write enable input multiplexer for the M slice (M_WE), the FAN0 input multiplexer (FAN0), ten global clock signals from the clock distribution structure, and four regional clock signals also from the clock distribution structure.

Appendix C provides a listing of the structures included in the tables of Appendix B, and details the structures/signals that can drive each of the structures. Signals of the form "RCLK#" are regional clock signals. Signals of the form "GCLK#" are global clock signals. The number in parentheses at the end of each entry indicates the number of input signals driving the structure. Thus, an entry of the form "name←(0)" denotes that structure "name" is not driven by any signals in the CLE. This format is used, for example, for clock signals, power high VDD (V1), ground (GHIGH/GND/V0), and CLE output signals. The CLE output signals are only driven by the CLE, and therefore are not driven by any of the structures/signals in the listing.

FIGS. 44-54 together address the issue of undesirable capacitive coupling between adjacent interconnect lines in an interconnect structure, and novel arrangements designed to minimize or reduce this coupling.

Figure 44:
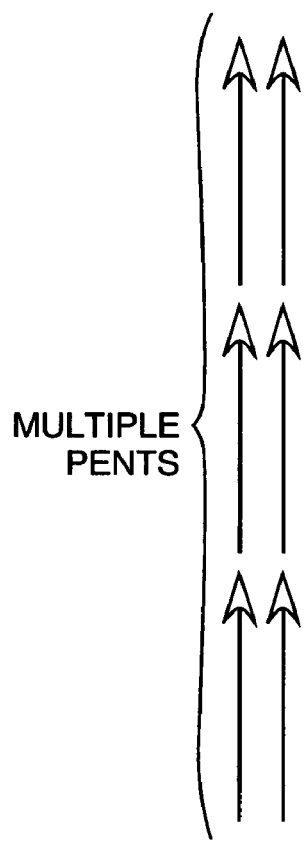
FIG. 44 illustrates coupling between adjacent pents driving in the same direction.

FIG. 44 illustrates two physically adjacent pents driving in the northward direction. Signals placed onto two pents at the same time at the bottom of the figure will propagate northward at the same rate. Therefore, the two signals will be capacitively coupled together for as long as the signals remain on the northbound pents.

Figure 45:
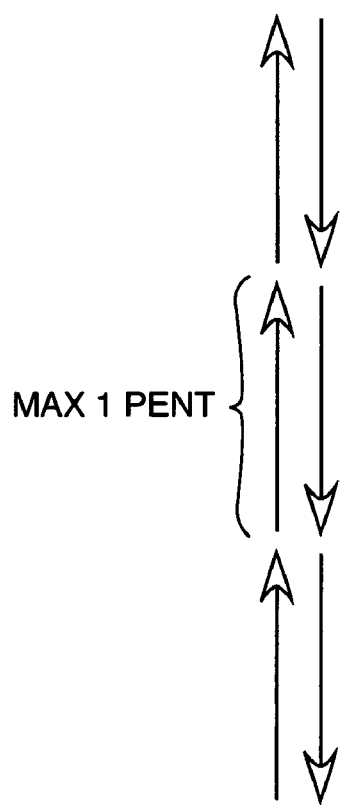
FIG. 45 illustrates coupling between adjacent pents driving in opposite directions.

FIG. 45 illustrates a first way in which coupling between physically adjacent pents can be reduced, utilizing a known technique of alternating signal directions. In this embodiment, any two adjacent signal lines drive in opposite directions, the signal on the left traveling northward and the signal on the right traveling southward. Therefore, the maximum length over which two signals will experience capacitive coupling is one pent, or five tiles.

Figure 46:
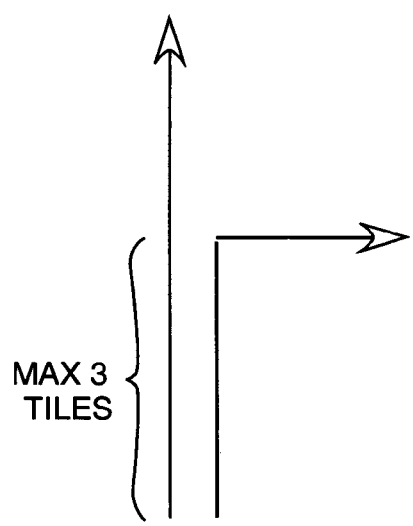
FIG. 46 illustrates coupling between adjacent straight and diagonal pents.

FIG. 46 illustrates another way in which coupling between physically adjacent interconnect lines can be reduced, by taking advantage of the presence of both straight and diagonal interconnect lines. By interleaving straight and diagonal pents, the two signals occupy physically adjacent spaces for at most three tiles, rather than five tiles as shown in FIG. 45.

Figure 47:
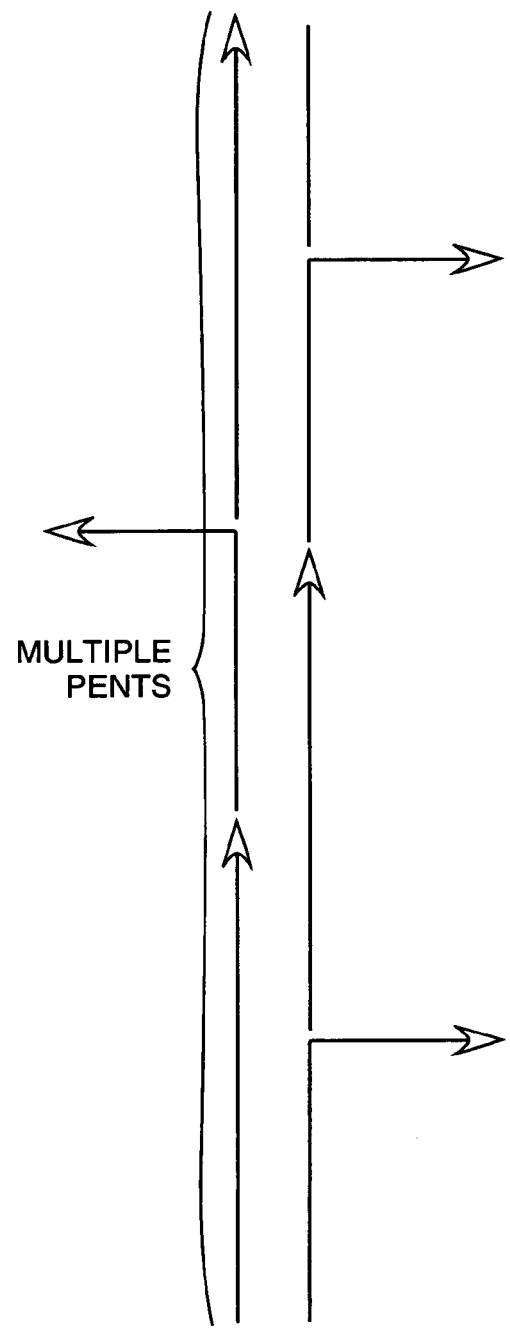
FIG. 47 illustrates coupling between adjacent straight and diagonal pents as they would likely be used in an actual PLD.

FIG. 47 illustrates a situation that can arise when the solution of FIG. 46 is applied. Experimentation with exemplary designs indicates that a signal traveling northward is likely to need to go further in the northward direction. In other words, it is desirable to provide each signal traveling northward with the option of continuing to the north. Hence, from the viewpoint of design routability, a structure such as that shown in FIG. 47 is desirable, with a diagonal northward pent driving a straight northward pent, driving a diagonal northward pent, and so forth. Clearly, in this arrangement the decrease in coupling gained by interleaving straight and diagonal pents is lost.

Figure 48:
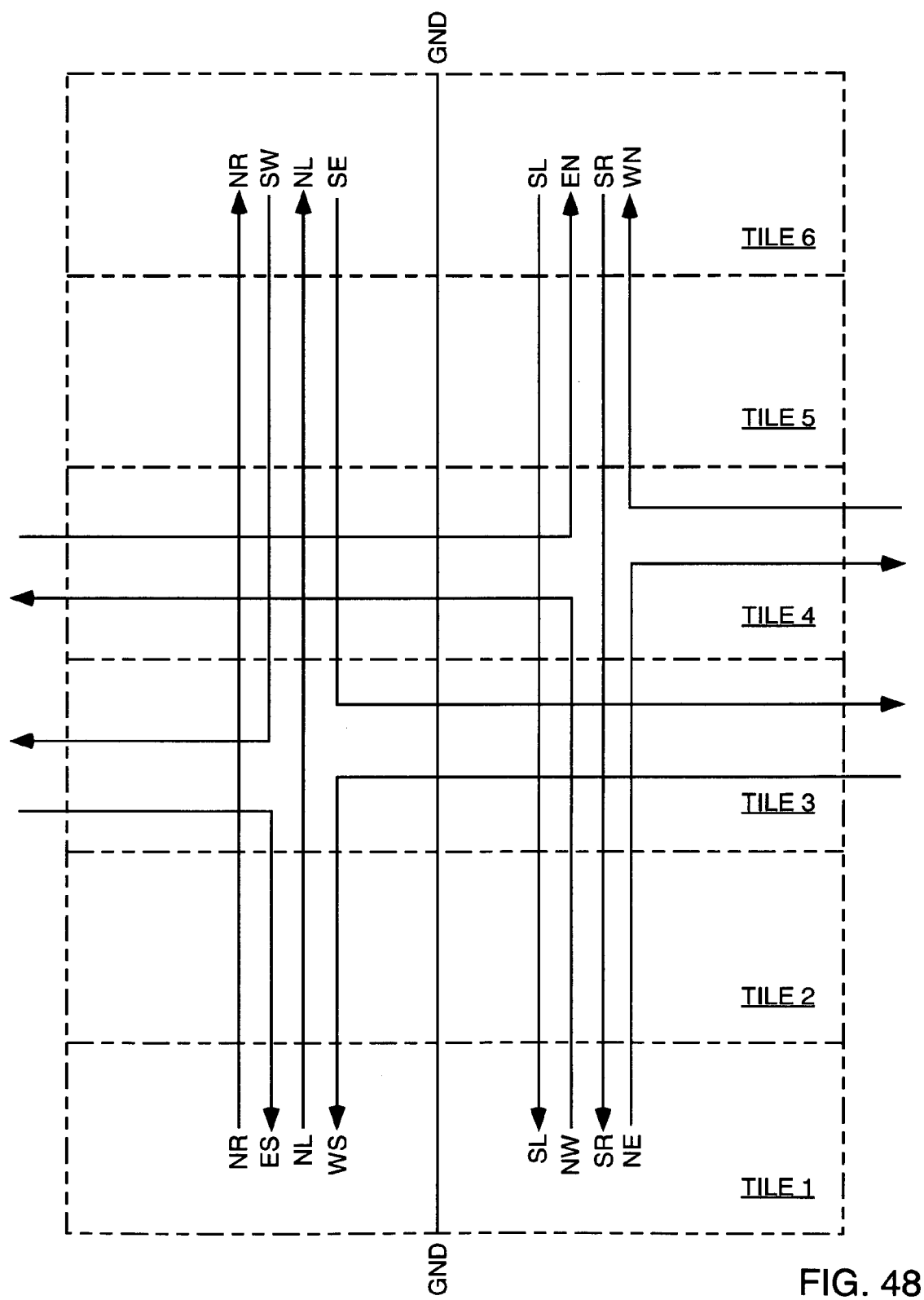
FIG. 48 illustrates an interconnect structure designed to minimize coupling between adjacent interconnect lines in the vertical direction.

FIG. 48 illustrates an exemplary interconnect structure designed to minimize coupling between physically adjacent interconnect lines by combining the techniques illustrated in FIGS. 45 and 46. Note that FIG. 48 illustrates the adjacency of the vertical interconnect lines; horizontal interconnect lines can be arranged in a similar fashion. In the interconnect structure of FIG. 48, no two physically adjacent interconnect lines drive in the same direction, no two physically adjacent interconnect lines include two straight interconnect lines, and no two physically adjacent interconnect lines include two diagonal interconnect lines. In order to accomplish this arrangement, note that an interconnect line coupled to receive a static signal has been included between some otherwise-adjacent interconnect lines, to prevent two southward driving lines from being adjacent to one another. In the pictured embodiment, the static signal is ground (GND). However, the static signal can also be power high (VDD), or a user signal that does not change state during the operation of the circuit, for example. The interposition of a grounded line prevents capacitive coupling between two wires that would otherwise be adjacent to one another. In some embodiments, capacitive coupling is reduced by using two different metal layers to implement adjacent interconnect lines driving in the same direction.

Figure 49:
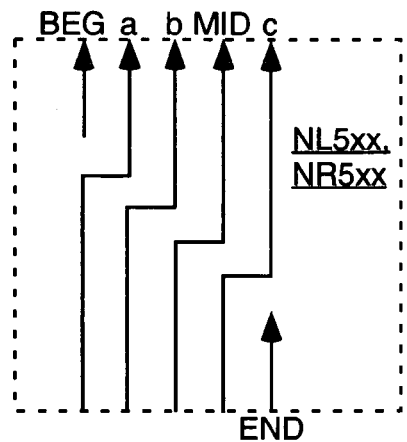
FIG. 49 illustrates the staggered segments of a straight pent within a single tile.
Figure 50:
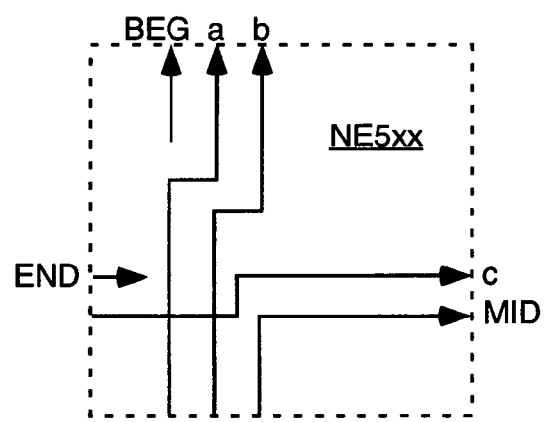
FIG. 50 illustrates the staggered segments of a first diagonal pent within a single tile.
Figure 51:
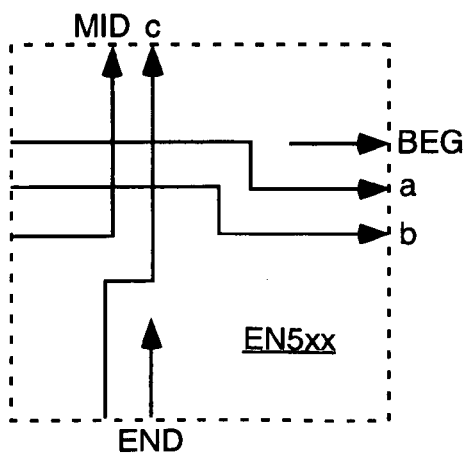
FIG. 51 illustrates the staggered segments of a second diagonal pent within a single tile.

In a tile-based integrated circuit, each tile includes several different segments of an interconnect line. For example, in the pictured embodiment, each tile includes six different segments for each pent: a first or beginning segment (BEG), a second segment (a), a third segment (b); a fourth or "middle" segment (MID) that includes a first exit point for the pent, a fifth segment (c); and a final segment (END). Each segment connects to the next segment in an adjacent tile by abutment. FIGS. 49-51 illustrate exemplary pent segments within a single tile. By studying these figures it will be apparent to those of skill in the relevant arts how the various segments can be joined by abutment to create a single pent.

FIG. 49 illustrates the staggered segments of a straight vertical pent within a single tile, e.g., NL5xx or NR5xx. In the pictured embodiment, this type of arrangement is used to implement northward and southward straight pents, i.e., NL5xx, NR5xx, SL5xx, and SR5xx.

FIG. 50 illustrates the staggered segments of a first diagonal pent within a single tile. The illustrated diagonal pent starts in a northward direction and extends to the north until the MID segment, in which the pent turns to the east. Hence, this arrangement is used to implement north-east pents, i.e., NE5xx.

FIG. 51 illustrates the staggered segments of a second diagonal pent within a single tile. The illustrated diagonal pent starts in an eastward direction and extends to the east until the MID segment, in which the pent turns to the north. Hence, this arrangement is used to implement east-north pents, i.e., EN5xx.

Figure 52:
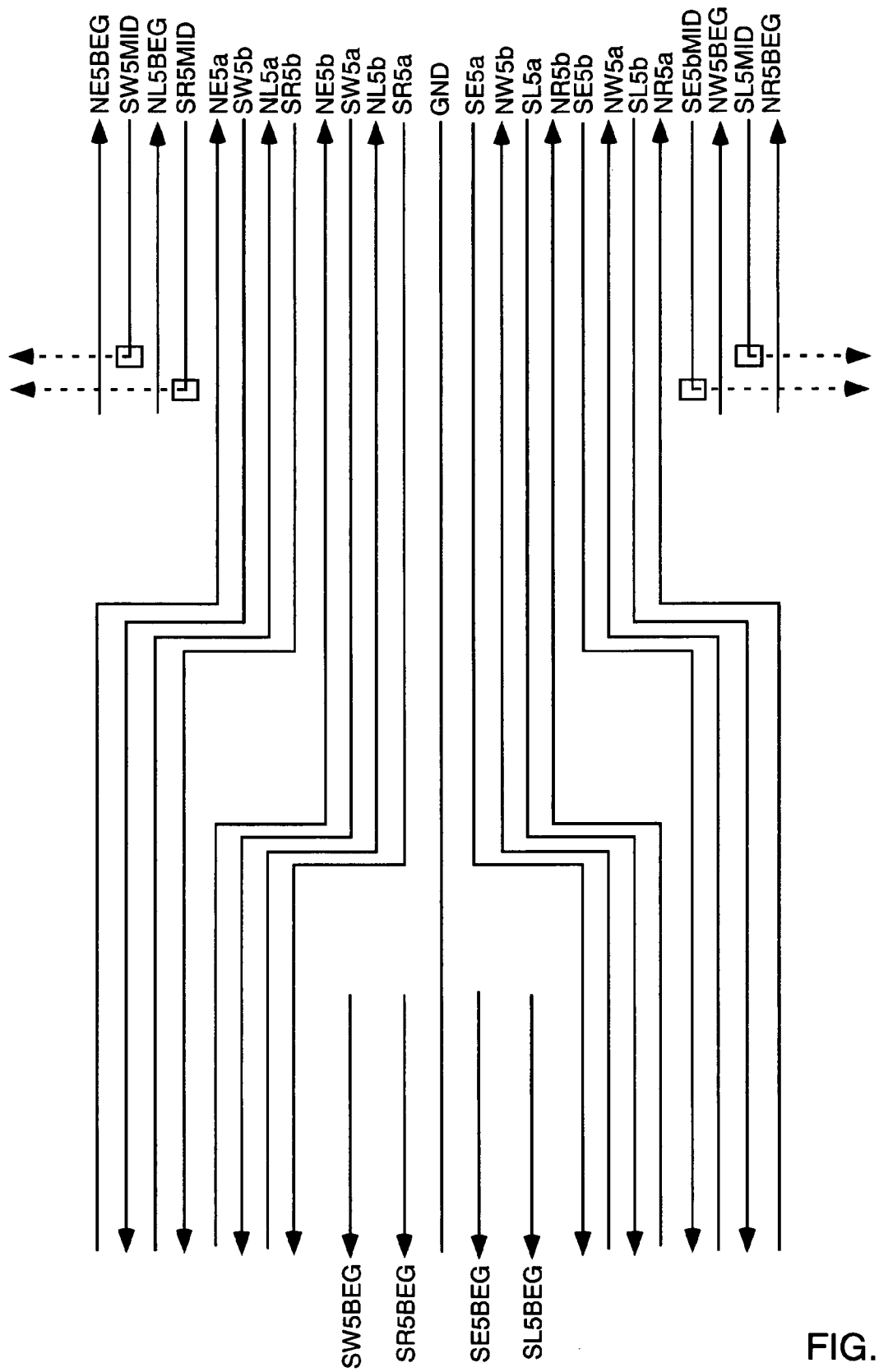
FIG. 52 illustrates a first arrangement of interconnect lines designed to reduce coupling between vertical portions of the interconnect lines.
Figure 53:
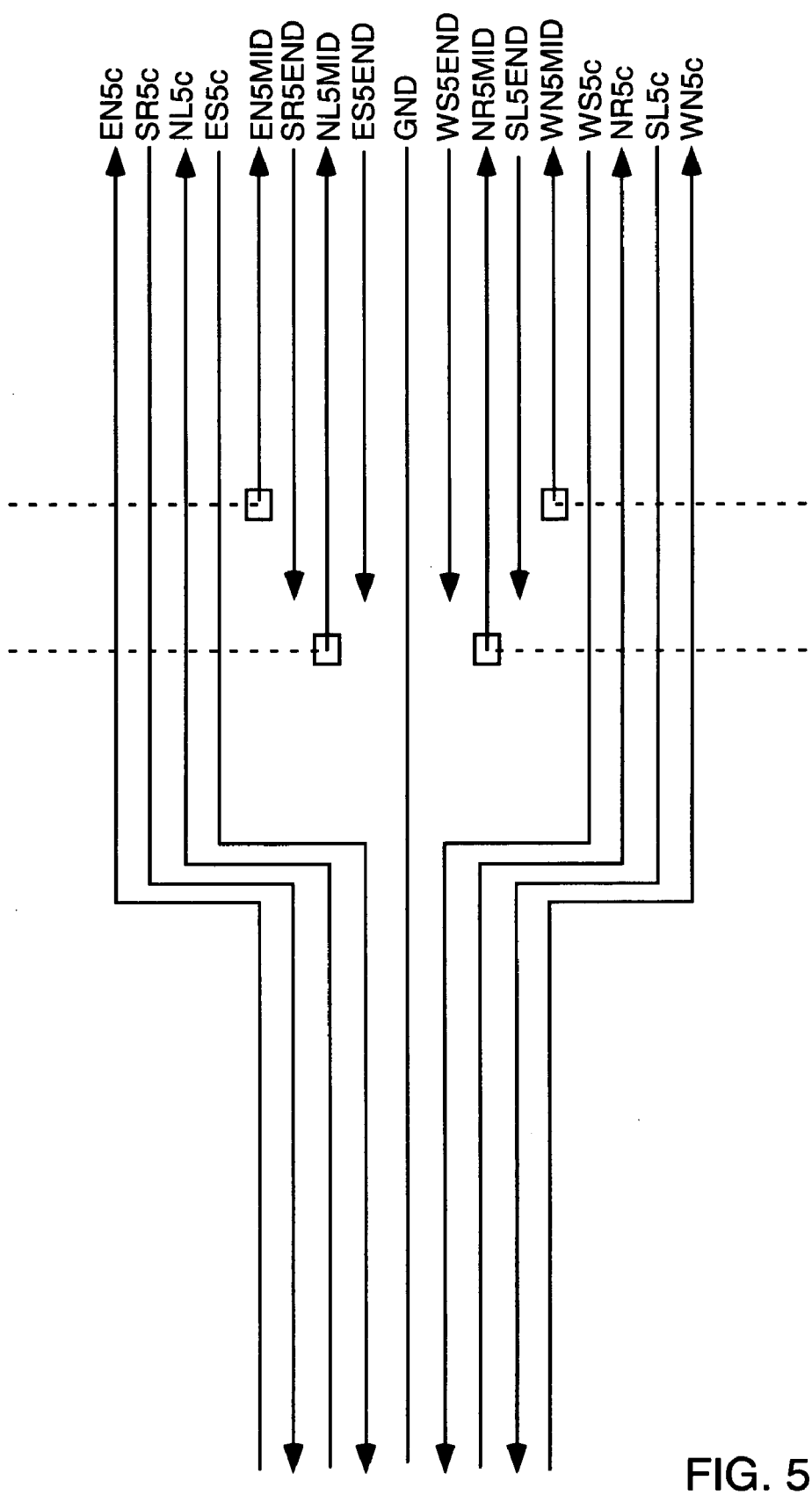
FIG. 53 illustrates a second arrangement of interconnect lines designed to reduce coupling between vertical portions of the interconnect lines.
Figure 54:
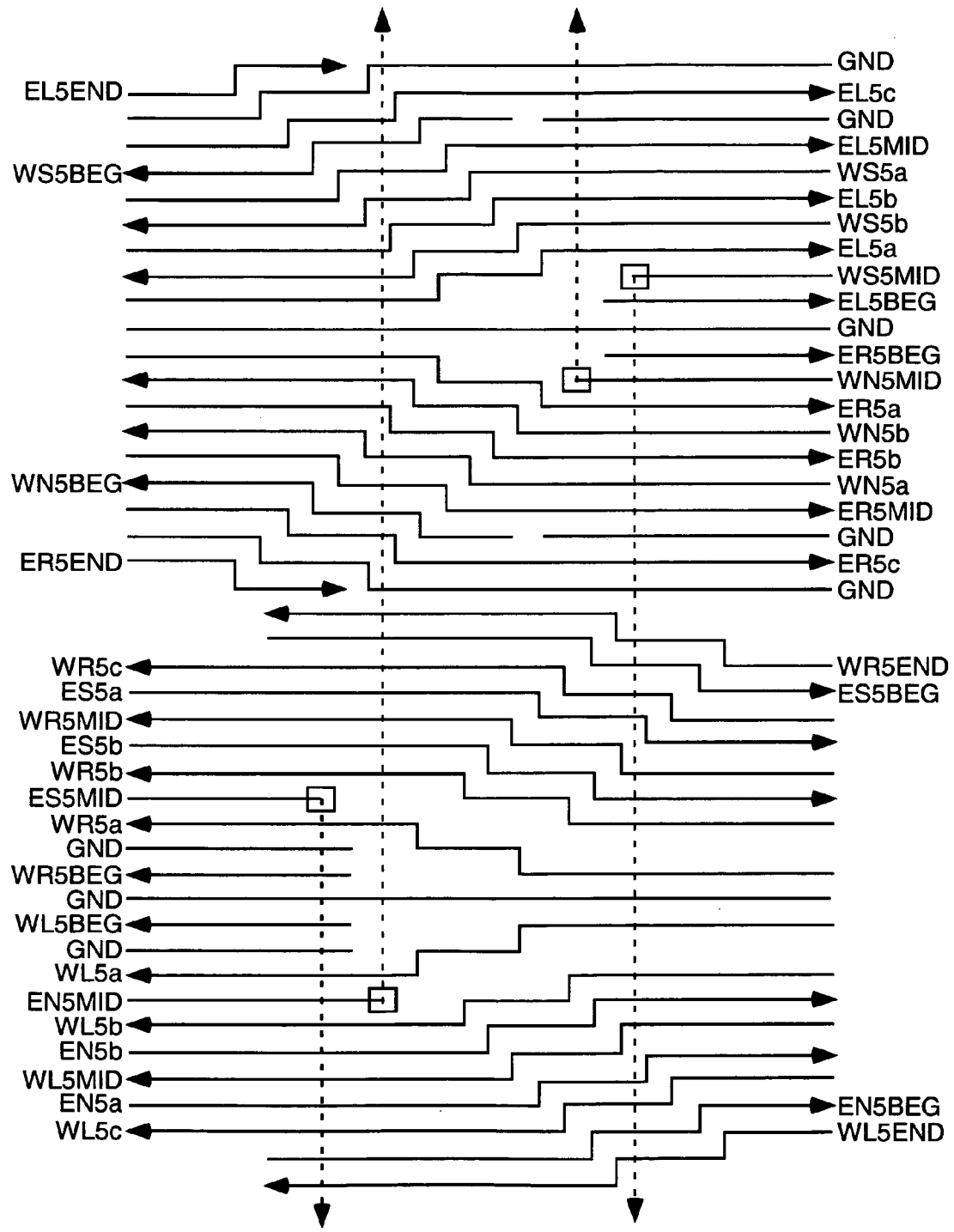
FIG. 54 illustrates an arrangement of interconnect lines designed to reduce coupling between horizontal portions of the interconnect lines.

In some embodiments, the rules regarding adjacency are somewhat relaxed from those applied in the embodiment of FIG. 48, in order to provide an improved layout for the structure. Each straight interconnect line is permitted to be adjacent to one other straight interconnect line, but not two. Similarly, each diagonal interconnect line is permitted to be adjacent to one other diagonal interconnect line, but not two. However, as in the embodiment of FIG. 48, no two interconnect lines driving in the same direction are adjacent to one another. FIGS. 52-54 illustrate one such embodiment.

In the embodiment of FIGS. 52-54, the vertical portions of the pents are implemented in either metal 9 (the BEG, a, b, and part of the MID segments, see FIG. 52) or metal 7 (the rest of the MID segment and the c and END segments of each pent, see FIG. 53). A third metal layer (metal 8, see FIG. 54) is used to interconnect metal 7 and metal 9 and to route the horizontal portions of the pents. In this embodiment, metal 7 is the seventh metal layer applied to the integrated circuit during the fabrication process, metal 8 is the eighth metal layer, and so forth.

FIG. 52 illustrates a first arrangement of interconnect lines designed to reduce coupling between vertical portions of the interconnect lines. In the embodiment of FIG. 52, solid lines indicate metal 9 and dotted lines indicate metal 8, while the open boxes indicate vias interconnecting metal 8 with metal 9. Note that the metal 9 layer is laid out in FIG. 52 such that no two physically adjacent interconnect lines drive in the same direction, no straight interconnect line is physically adjacent to more than one other straight interconnect line, and no diagonal interconnect line is physically adjacent to more than one other diagonal interconnect line.

As previously described, some embodiments include three copies of each type of interconnect line. For example, referring to FIG. 52, in some embodiments each tile includes three copies of interconnect line NE5, three copies of interconnect line SW5, and so forth. In one embodiment, the vertical lines are grouped into fours, and each group of four vertical lines is repeated three times. For example, FIG. 52 could be adapted to show one such embodiment by illustrating the line order NE5BEG<2>, SW5MID<2>, NL5BEG<2>, SRMID<2>, NE5BEG<1>, SW5MID<1>, NL5BEG<1>, SRMID<1>, NE5BEG<0>, SW5MID<0>, NL5BEG<0>, SRMID<0>, NE5a<2>, SW5b<2>, NL5a<2>, SR5b<2>, NE5a<1>, SW5b<1>, NL5a<1>, SR5b<1>, NE5a<0>, SW5b<0>, NL5a<0>, SR5b<0>, and so forth.

FIG. 53 illustrates a second arrangement of interconnect lines designed to reduce coupling between vertical portions of the interconnect lines. In the embodiment of FIG. 53, solid lines indicate metal 7 and dotted lines indicate metal 8, while the open boxes indicate vias interconnecting metal 8 with metal 7. Note that the metal 7 layer is laid out in FIG. 53 such that no two physically adjacent interconnect lines drive in the same direction, no straight interconnect line is physically adjacent to more than one other straight interconnect line, and no diagonal interconnect line is physically adjacent to more than one other diagonal interconnect line.

In an embodiment including three copies of each type of interconnect line, each tile includes three copies of interconnect line EN5, three copies of interconnect line SR5, and so forth. In one embodiment, the vertical lines are grouped into fours, and each group of four vertical lines is repeated three times. For example, FIG. 53 could be adapted to show one such embodiment by illustrating the line order EN5c<2>, SR5c<2>, NL5c<2>, ES5c<2>, EN5c<1>, SR5c<1>, NL5c<1>, ES5c<1>, EN5c<0>, SR5c<0>, NL5c<0>, ES5c<0>, EN5MID<2>, SR5END<2>, NL5MID<2>, ES5END<2>, EN5MID<1>, SR5END<1>, NL5MID<1>, ES5END<1>, EN5MID<0>, SR5END<0>, NL5MID<0>, ES5END<0>, and so forth.

FIG. 54 illustrates an arrangement of interconnect lines designed to reduce coupling between horizontal portions of the interconnect lines. In one embodiment, the horizontal portions of the pictured interconnect lines (i.e., the solid lines) are implemented in metal 8. The vertical portions of the pictured interconnect lines are implemented in metal 7 and metal 9, which are shown using dotted lines in FIG. 54. In FIG. 54, the open boxes indicate vias interconnecting metal 8 with metal 7 or metal 9. In an embodiment including three copies of each type of interconnect line, the three copies of each interconnect line are grouped and repeated in a fashion similar to that described in connection with FIGS. 52 and 53.

When designing PLDs, one factor that must be considered is the ease with which place and route software can implement a user design in the PLD. One such consideration is "routability", the ease with which signals can be routed within the design, using the routing resources available in the PLD. To provide good routability, the logic block output signals should have good access to the interconnect lines in the general interconnect structure.

In the Virtex™ Series of FPGAs from Xilinx, Inc., the routing flexibility was improved by including an output multiplexer structure coupled between the logic block output terminals and the general interconnect structure. For example, Young et al. illustrate a PLD tile in a Virtex Series FPGA having an output multiplexer structure in FIGS. 2 and 3 of U.S. Pat. No. 5,914,616. In the Virtex-II FPGA architecture, also from Xilinx, Inc., an optional connection was added that permitted the lookup table output signals to drive horizontal and vertical interconnect lines in the interconnect structure without passing through the output multiplexer structure. However, the output multiplexer structure was still considered necessary to provide the routing flexibility needed to adequately route user designs.

Note that the term "output multiplexer structure" as used herein refers to a wide multiplexer structure selecting among multiple logic block output signals and directing the selected output signals to multiple output terminals of the output multiplexer structure, wherein the various output terminals have access to different interconnect lines in the general interconnect structure. Thus, an "output multiplexer structure" has multiple outputs and directs multiple selected signals to multiple output terminals. In contrast, the term "output select multiplexer", as directed (for example) to multiplexers 411A-411D (see FIGS. 4 and 6) refers to a single-output multiplexer that selects one of several signals in the logic block to be provided to a single output terminal of the logic block. An output multiplexer structure is driven only by output signals from the logic block, and not by interconnect signals from the interconnect structure, for example.

The XC4000™ Series of FPGAs from Xilinx, Inc. did not include an output multiplexer structure between the logic block output terminals and the interconnect structure. Because each logic block output signal was provided to only one edge of the logic block, each logic block output signal could drive only horizontal interconnect lines, or only vertical interconnect lines. (See FIG. 27 on page 4-34 of the Programmable Logic Data Book 1996, published in September 1996 by Xilinx, Inc., for an illustration of how the logic block output signals were coupled to the general interconnect structure in XC4000 Series FPGAs.) This limitation proved to have a deleterious effect on the routability of the XC4000 Series FPGAs. Therefore, Xilinx, Inc., made a practice of including output multiplexer structures in later FPGA architectures, e.g., including a large output multiplexer structure in the Virtex family of FPGAs, as previously described.

With the improved routing flexibility provided by the exemplary interconnect structure, it has been found that output multiplexer structures are no longer necessary. (Note, however, that output multiplexer structures are still included in some embodiments, not shown.) The additional delay inserted on each output signal path by an output multiplexer structure can outweigh the advantage of the improved routing flexibility on the output signals of the logic block.

Instead, in the exemplary PLD architecture the output signals from all function generators, memory elements, and output select multiplexers are provided directly to the general interconnect structure. Moreover, each of these output signals can drive horizontal, vertical, and diagonal interconnect lines in the general interconnect structure. Further, each output signal can drive both east and west, horizontally, and both north and south, vertically.

Figure 55:
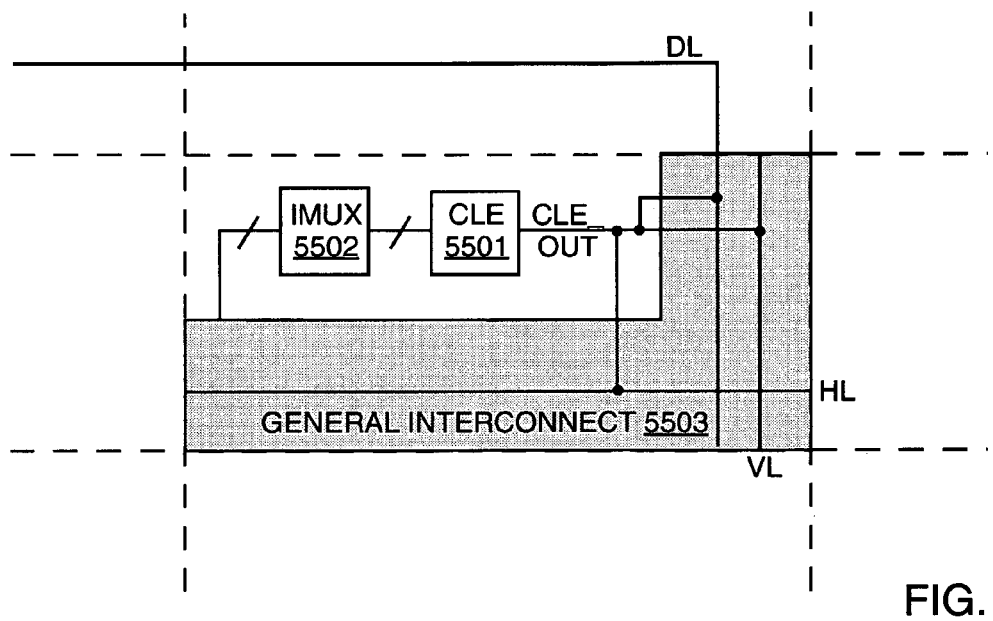
FIG. 55 illustrates how routing flexibility can be provided in a programmable logic tile without the use of an output multiplexer structure.

FIG. 55 illustrates how routing flexibility can be provided in a programmable logic tile without the use of an output multiplexer structure. The programmable tile of FIG. 55 includes an input multiplexer 5502, a logic block (e.g., a configurable logic element or CLE) 5501, and a general interconnect structure 5503. The general interconnect structure includes both horizontal interconnect lines (HL) and vertical interconnect lines (VL). In some embodiments, diagonal interconnect lines (DL) are also included. An output terminal CLE_OUT of the logic block drives both horizontal and vertical (and, optionally, diagonal) interconnect lines without incurring the additional delay of passing through an output multiplexer structure.

Figure 56:
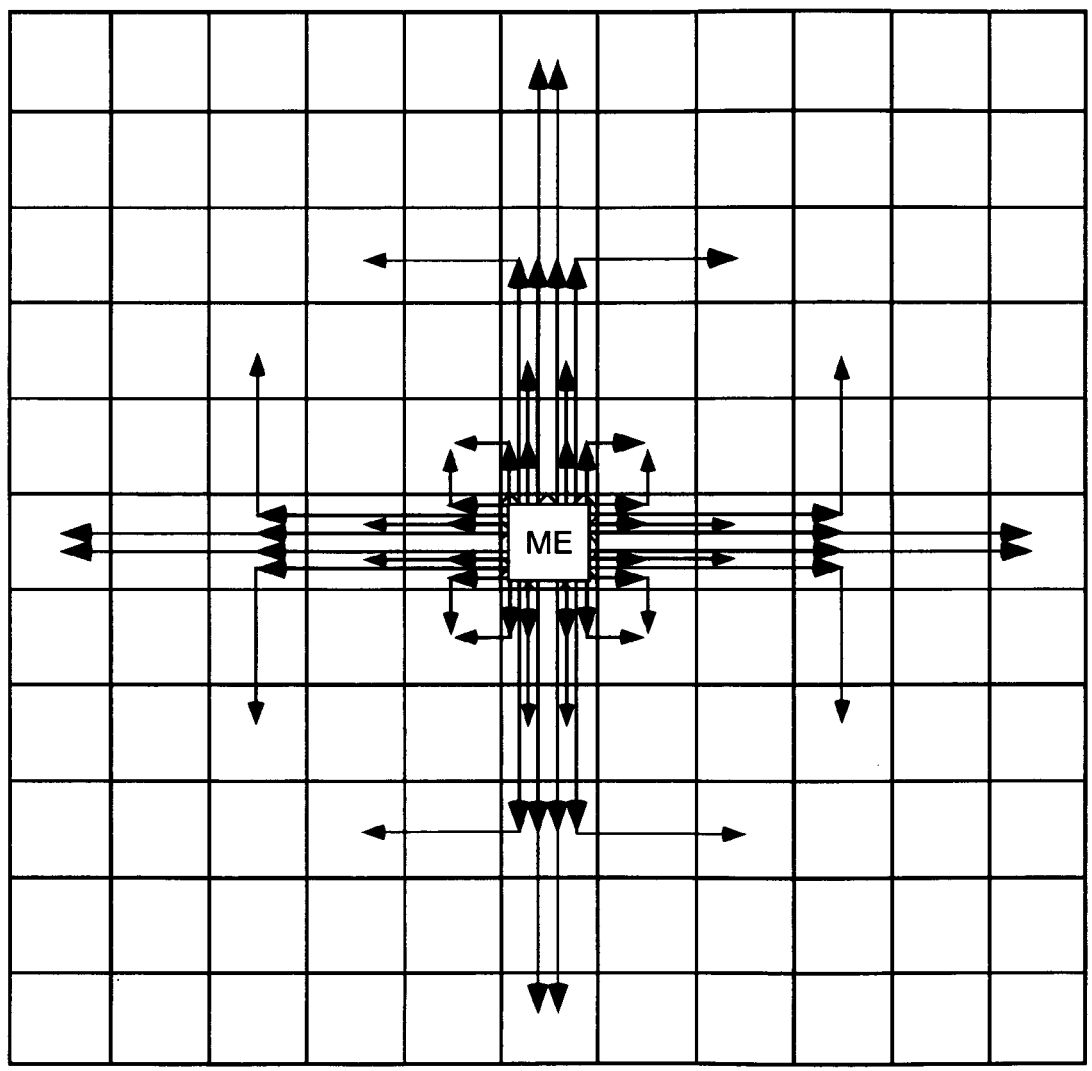
FIG. 56 illustrates how an exemplary signal (e.g., a memory element output signal) in a logic block is programmably and directly coupled to the exemplary general interconnect structure.

FIG. 56 illustrates how an exemplary signal in a logic block is programmably coupled to the exemplary general interconnect structure without passing through an output multiplexer structure. In the embodiment of FIG. 56, a registered output signal (e.g., from one of memory elements 402A-402D, see FIG. 4) is provided to horizontal and vertical straight interconnect lines, to diagonal interconnect lines, to doubles and to pents. Note that the exemplary interconnections illustrated in FIG. 56 are those provided in the exemplary interconnect structure to registered output signal L_DQ from memory element (ME) 402D (e.g., see FIG. 4). These interconnections are also detailed in table "L_DQ:" of Appendix B.

The tables in Appendix B also reveal how the exemplary routing structure provides improved routing flexibility while maintaining an efficient physical layout for the PLD tile. As previously described in the section relating to FIG. 32, the first three columns of each table are straight pents, the next three columns are diagonal pents, the next three columns are straight doubles, and the next three columns are diagonal doubles. However, only the first, fourth, seventh, and tenth columns correspond to routing multiplexers in the physical layout, because a pent or a double can only be driven at the beginning of the interconnect line. The other two columns in each group of three columns are included in the tables as sources, rather than as destinations.

As previously described, the locations of the structural designations in the tables of Appendix B generally correspond to the physical locations of the structures within the tile, as can be seen by a comparison between FIG. 57 and any of the tables of Appendix B. In the embodiment of FIG. 57, the multiplexers in each table of Appendix B are laid out in pairs, which enables an area-efficient physical layout utilizing interleaved transistors and shared gate voltages, e.g., shared inputs. This technique is well known in the art of integrated circuit layout design. The routing multiplexers in the first and fourth columns of the tables (see Appendix B) are paired together, i.e., paired in the horizontal direction within the table. Similarly, the routing multiplexers in the seventh and tenth columns of the tables are also paired together, i.e., paired in the horizontal direction within the table. The input multiplexers in the fourteenth and fifteenth columns are also paired together, i.e., paired in the horizontal direction within the table.

Therefore, as shown in FIG. 57, the interconnect portion of the physical layout of the tile includes one column of routing multiplexers driving pents, one column of routing multiplexers driving doubles, one column of CLE input multiplexers driving control signals and other input signals to the CLE, and one column of input multiplexers driving LUT data input terminals. Note that the interconnect layout illustrated in FIG. 57 does not include any physical structures corresponding to the CLE output column included in the tables of Appendix B. As previously described, the CLE output terminals are simply output terminals of the CLE, and are included in the tables of Appendix B primarily to enable the illustration of their interconnections to the other structures in the tables.

The control column (CTRL) of the tables in Appendix B includes a collection of multiplexers driving various types of structures, e.g., long lines, clock input terminals, fan multiplexers, bounce multiplexers, and so forth. These multiplexers are not all of the same size, and they are paired together in the vertical direction within the table. For example, the routing multiplexers driving long lines LH0 and LV0 are paired together, as shown in FIG. 57, as are the input multiplexers driving bypass input signals L_DX and M_CX, and so forth.

Advantageously, in the pictured embodiment the routing multiplexers and input multiplexers are also arranged in vertical order within each column to provide routing flexibility while permitting an efficient physical layout. For example, referring again to Appendix B, the table "L_D" for CLE output signal L_D shows that the CLE output signal can drive 36 destinations. As shown in the table, the 36 destinations include eight routing multiplexers driving straight pents, eight routing multiplexers driving diagonal pents, eight routing multiplexers driving straight doubles, and eight routing multiplexers driving diagonal doubles, as well as four input multiplexers driving four LUT data input terminals of the CLE. Each group of destination routing multiplexers within each column includes eight vertically adjacent routing multiplexers (or sixteen, when the pairing shown in FIG. 57 is taken into account), and each group of input multiplexers includes two vertically adjacent input multiplexers (or four, when the pairing shown in FIG. 57 is taken into account). Signal L_D does not drive any routing multiplexers or any input multiplexers that are not included in these vertically adjacent subsets of the available signal destinations. Therefore, the amount of metal needed to route signal L_D within the tile is reduced, compared to known physical layouts.

In summary, in the pictured embodiment every signal driving every routing multiplexer in the pents column, every signal driving every routing multiplexer in the doubles column, and every signal driving every input multiplexer in the LUT data input column drives only destinations located within a vertically adjacent subset of the destinations in the column. Therefore, the usage of vertical metal tracks is reduced, compared to known layout schemes.

Further, note that in the pictured embodiment the grouped destinations in the table are located in horizontal alignment with one another. For example, the 32 routing multiplexers driven by signal L_D are all located in only eight rows within the table, and the four input multiplexers driven by signal L_D are located in two of the same eight rows. This arrangement also reduces the amount of metal needed to route signal L_D within the tile. In some embodiments, at least some of the vertical metal tracks can be used to route multiple signals, because each signal consumes only a relatively short portion of the vertical metal track. (Note that the phrase "in horizontal alignment with one another", as used herein, denotes that the designated structures are largely in alignment, e.g., a horizontal line can be drawn that intersects each of the designated structures. The phrase does not necessarily imply that each structure has a top edge and a bottom edge that are exactly aligned, for example, although in some embodiments the structures are exactly aligned.)

Yet further, each group of eight destination routing multiplexers within a column includes interconnect lines driving in at least four different directions. The straight interconnect lines drive to the north, south, east, and west, with two routing multiplexers driving in each direction. The diagonal interconnect lines drive north then west (e.g., NW5B2), north then east (e.g., NE5B2), east then north (e.g., EN5B2), east then south (e.g., ES5B2), south then east (e.g., SE5B2), south then west (e.g., SW5B2), west then south (e.g., WS5B2), and west then north (e.g., WN5B2). Therefore, the eight diagonal interconnect lines in the group include interconnect lines traveling in all eight directions represented in the available diagonal routing.

As another example, the table "ER5E0:" for the end of straight pent ER5x0 shows that the pent can drive eight destinations. (FIGS. 36 and 37 provide another view of this pent, and the destinations that can be driven by the end of the pent ER5E0.) As shown in the table, the eight destinations include two routing multiplexers driving straight pents, two routing multiplexers driving diagonal pents, two routing multiplexers driving straight doubles, and two routing multiplexers driving diagonal doubles. Each group of routing multiplexers within each column includes two vertically adjacent routing multiplexers. Pent ER5E0 does not drive any routing multiplexers that are not included in these vertically adjacent subsets of the available signal destinations. Therefore, the amount of metal needed to route the pent within the tile is reduced, compared to known physical layouts.

Further, note that in the pictured embodiment the grouped destinations in the table are located in horizontal alignment with one another. For example, the eight routing multiplexers driven by pent ER5E0 are all located in only two rows within the table. This arrangement also minimizes the amount of metal needed to route the pent within the tile. Further, the routing multiplexers can advantageously be laid out in pairs, so that driving both routing multiplexers in the pair further adds to the layout efficiency of this embodiment.

Yet further, each group of two destination routing multiplexers within a column includes interconnect lines driving in at least two different directions. The straight interconnect lines drive to the north and south. The diagonal interconnect lines drive east then north (e.g., EN5B0) and east then south (e.g., ES5B0). This holds true for both the destination pents (see also FIG. 36) and the destination doubles (see also FIG. 37).

Each interconnect line in the pictured embodiment has at least two exit points, and each exit point drives at least one group of vertically adjacent routing multiplexers. For example, referring again to Appendix B, the exemplary straight double has two exit points (see tables ER2M0: and ER2E0:). At each of these exit points, the straight double drives a group of vertically adjacent routing multiplexers driving other double interconnect lines. In other embodiments, each interconnect line has at least one exit point, or at least three exit points (not shown), or a larger number of exit points (not shown). However, regardless of the number of exit points, every exit point from the interconnect line drives only vertically adjacent routing multiplexers within the column of routing multiplexers. Therefore, the usage of vertical metal tracks is reduced, compared to known layout schemes.

Those having skill in the relevant arts of the invention will now perceive various modifications and additions that can be made as a result of the disclosure herein. For example, the above text describes the circuits of the invention in the context of programmable logic devices (PLDs) such as FPGAs and CPLDs. However, the circuits of the invention can also be implemented in other programmable integrated circuits.

Further, CLEs, slices, LUTs, input multiplexers, general interconnect structures, interconnect lines, pents, doubles, logic blocks, input/output blocks, memory elements, flip-flops, multiplexers, OR gates, exclusive OR gates, NOR gates, exclusive NOR gates, AND gates, NAND gates, inverters, buffers, three-state buffers, transistors, pull-ups, carry multiplexers, carry logic, memory cells, configuration memory cells, decoders, clock generator circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

APPENDIX A

```
Legend 1 (Applied Throughout):  Interconnect Signal Naming Conventions
L_n       Signal "n" in slice L
M_n       Signal "n" in slice M
xy5B#     "Pent" interconnect line, "Beginning" or entering point.
          If "y" is North, South, East, or West, denotes 1 of 3 "diagonal" interconnect lines
          extending 3 tiles in "x" direction then turning in "y" direction for 2 tiles. If "y" is L
          or R, denotes 1 of 3 "straight" interconnect lines extending 5 tiles in "x" direction.
xy5M#     "Pent" interconnect line, "Middle" exiting point at turning tile
xy5E#     "Pent" interconnect line, "End" exiting point
xy2B#     "Double" interconnect line, "Beginning" or entering point.
          If "y" is North, South, East, or West, denotes 1 of 3 "diagonal" interconnect lines
          extending 1 tile in "x" direction then turning in "y" direction for 1 tile. If "y" is L
          or R, denotes 1 of 3 "straight" interconnect lines extending 2 tiles in "x" direction.
xy2M#     "Double" interconnect line, "Middle" exiting point at turning tile
xy2E#     "Double" interconnect line, "End" exiting point
LV0       Vertical long line, extends 18 tiles vertically, driving in upward direction.
LV18      Same vertical long line as LV0, driving in downward direction
LH0       Horizontal long line, extends 18 tiles horizontally, driving in leftward direction
LH18      Same horizontal long line as LH0, driving in rightward direction.
name_U    Signal "name" in tile above present tile
name_D    Signal "name" in tile below present tile
```

Note: The terms "above", "below", "north", "south", "east", "west", "vertical", "horizontal", "upward", "downward", "leftward" and "rightward" as used herein are relative to one another and to the conventions followed in the figures and specification, and are not indicative of any particular orientation of or on the physical die.

Legend 2 (Applies to Appendix B Only):

| | |
|---|---|
| * | Indicates name of signal for which table shows available interconnections |
| => | Drives signal in same interconnect block |
| <= | Is driven by signal in same interconnect block |
| -> | Drives signal in interconnect block located above present interconnect block |
| <- | Is driven by signal in interconnect block located above present interconnect block |
| +> | Drives signal in interconnect block located below present interconnect block |
| <+ | Is driven by signal in interconnect block located below present interconnect block |
| <> | Both drives and is driven by signal in same interconnect block |

APPENDIX B

ER2B0: TO=12 FROM=24 (Beginning of Straight Double, input and output to/from Double)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | <-NL2M2 | <-NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GPAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | <=M_DMUX |
| NR5B1 | <=NR5M1 | <=NR5E1 | WN5B1 | WN5M1 | WN5E1 | NR2B1 | <=NR2M1 | <=NR2E1 | WN2B1 | WN2M1 | WN2E1 | M_BY | L_C3 | L_A5 | <=L_B |
| WL5B0 | WL5M0 | WL5E0 | NW5B0 | <=NW5M0 | NW5E0 | WL2B0 | WL2M0 | WL2E0 | NW2B0 | <=NW2M0 | NW2E0 | =>L_BX | =>L_D2 | =>L_B4 | <=L_BQ |
| ER5B0 | ER5M0 | ER5E0 | NE5B0 | NE5M0 | NE5E0 | *ER2B0 | ER2M0 | ER2E0 | NE2B0 | NE2M0 | <=NE2E0 | =>M_AX | =>M_C2 | =>M_A4 | <=M_AQ |
| NL5B0 | <=NL5M0 | <=NL5E0 | EN5B0 | EN5M0 | <=EN5E0 | NL2B0 | NL2M0 | NL2E0 | EN2B0 | EN2M0 | <=EN2E0 | =>M_BX | =>M_D2 | =>M_B4 | <=M_BQ |
| SR5B0 | SR5M0 | SR5E0 | ES5B0 | <=ES5M0 | ES5E0 | SR2B0 | SR2M0 | SR2E0 | ES2B0 | <=ES2M0 | ES2E0 | =>L_AX | =>L_C2 | =>L_A4 | <=L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | <=L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | <=M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

```
ER2M0:  TO=16  FROM=0  (Middle of Straight Double, output only from Double)
    STRAIGHT PENTS      DIAGONAL PENTS      STRAIGHT DOUBLES    DIAGONAL DOUBLES      CTRL      LUT INS      CLE
   /              \    /              \    /              \    /              \     /    \    /      \    /      \
  WL5B2  WL5M2  WL5E2  NW5B2  NW5M2  NW5E2  WL2B2  WL2M2  WL2E2  NW2B2  NW2M2  NW2E2  LH0     L_D6   L_B1   L_BMUX
  ER5B2  ER5M2  ER5E2  NE5B2  NE5M2  NE5E2  ER2B2  ER2M2  ER2E2  NE2B2  NE2M2  NE2E2  LV0     M_C6   M_A1   M_D
  NL5B2  NL5M2  NL5E2  EN5B2  EN5M2  EN5E2  NL2B2  NL2M2  NL2E2  EN2B2  EN2M2  EN2E2  M_DY    M_D6   M_B1   M_BMUX
  SR5B2  SR5M2  SR5E2  ES5B2  ES5M2  ES5E2  SR2B2  SR2M2  SR2E2  ES2B2  ES2M2  ES2E2  FAN1    L_C6   L_A1   L_D
  EL5B2  EL5M2  EL5E2  SE5B2  SE5M2  SE5E2  EL2B2  EL2M2  EL2E2  SE2B2  SE2M2  SE2E2  L_DX    L_D4   L_B2   L_DQ
  WR5B2  WR5M2  WR5E2  SW5B2  SW5M2  SW5E2  WR2B2  WR2M2  WR2E2  SW2B2  SW2M2  SW2E2  M_CX    M_C4   M_A2   M_CQ
  SL5B2  SL5M2  SL5E2  WS5B2  WS5M2  WS5E2  SL2B2  SL2M2  SL2E2  WS2B2  WS2M2  WS2E2  M_DX    M_D4   M_B2   M_DQ
  NR5B2  NR5M2  NR5E2  WN5B2  WN5M2  WN5E2  NR2B2  NR2M2  NR2E2  WN2B2  WN2M2  WN2E2  L_CX    L_C4   L_A2   L_CQ
  WL5B1  WL5M1  WL5E1  NW5B1  NW5M1  NW5E1  WL2B1  WL2M1  WL2E1  NW2B1  NW2M1  NW2E1  =>M_CY  =>L_D5 =>L_B3 L_C
  ER5B1  ER5M1  ER5E1  NE5B1  NE5M1  NE5E1  ER2B1  ER2M1  ER2E1  NE2B1  NE2M1  NE2E1  =>M_WE  =>M_C5 =>M_A3 M_AMUX
  NL5B1  NL5M1  NL5E1  EN5B1  EN5M1  EN5E1 =>NL2B1 NL2M1  NL2E1 =>EN2B1 EN2M1  EN2E1  =>M_SR  =>M_D5 =>M_B3 M_C
  SR5B1  SR5M1  SR5E1  ES5B1  ES5M1  ES5E1 =>SR2B1 SR2M1  SR2E1 =>ES2B1 ES2M1  ES2E1  =>L_SR  =>L_C5 =>L_A3 L_AMUX
                                                                                      GFAN0
                                                                                      L_CLK
                                                                                      M_CLK
                                                                                      GFAN1
  EL5B1  EL5M1  EL5E1  SE5B1  SE5M1  SE5E1  EL2B1  EL2M1  EL2E1  SE2B1  SE2M1  SE2E1  M_CE    L_D3   L_B5   L_DMUX
  WR5B1  WR5M1  WR5E1  SW5B1  SW5M1  SW5E1  WR2B1  WR2M1  WR2E1  SW2B1  SW2M1  SW2E1  L_CE    M_C3   M_A5   M_B
  SL5B1  SL5M1  SL5E1  WS5B1  WS5M1  WS5E1  SL2B1  SL2M1  SL2E1  WS2B1  WS2M1  WS2E1  RSVD    M_D3   M_B5   M_DMUX
  NR5B1  NR5M1  NR5E1  WN5B1  WN5M1  WN5E1  NR2B1  NR2M1  NR2E1  WN2B1  WN2M1  WN2E1  M_BY    L_C3   L_A5   L_B
  WL5B0  WL5M0  WL5E0  NW5B0  NW5M0  NW5E0  WL2B0  WL2M0  WL2E0  NW2B0  NW2M0  NW2E0  L_BX    L_D2   L_B4   L_BQ
  ER5B0  ER5M0  ER5E0  NE5B0  NE5M0  NE5E0  ER2B0 *ER2M0  ER2E0  NE2B0  NE2M0  NE2E0  M_AX    M_C2   M_A4   M_AQ
  NL5B0  NL5M0  NL5E0  EN5B0  EN5M0  EN5E0  NL2B0  NL2M0  NL2E0  EN2B0  EN2M0  EN2E0  M_BX    M_D2   M_B4   M_BQ
  SR5B0  SR5M0  SR5E0  ES5B0  ES5M0  ES5E0  SR2B0  SR2M0  SR2E0  ES2B0  ES2M0  ES2E0  L_AX    L_C2   L_A4   L_AQ
  EL5B0  EL5M0  EL5E0  SE5B0  SE5M0  SE5E0  EL2B0  EL2M0  EL2E0  SE2B0  SE2M0  SE2E0  FAN0    L_D1   L_B6   L_A
  WR5B0  WR5M0  WR5E0  SW5B0  SW5M0  SW5E0  WR2B0  WR2M0  WR2E0  SW2B0  SW2M0  SW2E0  M_AY    M_C1   M_A6   M_CMUX
  SL5B0  SL5M0  SL5E0  WS5B0  WS5M0  WS5E0  SL2B0  SL2M0  SL2E0  WS2B0  WS2M0  WS2E0  LH18    M_D1   M_B6   M_A
  NR5B0  NR5M0  NR5E0  WN5B0  WN5M0  WN5E0  NR2B0  NR2M0  NR2E0  WN2B0  WN2M0  WN2E0  LV18    L_C1   L_A6   L_CMUX
```

ER2E0:  TO=16  FROM=0  (End of Straight Double, output only from Double)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 =>M_CY | =>L_D5 | =>L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 =>M_WE | =>M_C5 | =>M_A3 | M_AMUX |
| NL5B1 | NL5M1 | NL5E1 | EN5B1 | EN5M1 | EN5E1 =>NL2B1 | NL2M1 | NL2E1 =>EN2B1 | EN2M1 | EN2E1 =>M_SR | =>M_D5 | =>M_B3 | M_C | | |
| SR5B1 | SR5M1 | SR5E1 | ES5B1 | ES5M1 | ES5E1 =>SR2B1 | SR2M1 | SR2E1 =>ES2B1 | ES2M1 | ES2E1 =>L_SR | =>L_C5 | =>L_A3 | L_AMUX | | |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | *ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

```
SE2B0:  TO=0  FROM=24   (Beginning of Diagonal Double, input only to Double)
     STRAIGHT PENTS         DIAGONAL PENTS        STRAIGHT DOUBLES        DIAGONAL DOUBLES     CTRL    LUT INS    CLE
   /                \    /                \     /                \      /                \     / \    /     \    / \
  WL5B2   WL5M2   WL5E2  NW5B2   NW5M2   NW5E2  WL2B2   WL2M2   WL2E2  NW2B2   NW2M2   NW2E2  LH0    L_D6   L_B1   <-L_BMUX
  ER5B2   ER5M2   ER5E2  NE5B2   NE5M2   NE5E2  ER2B2   ER2M2   ER2E2  NE2B2   NE2M2   NE2E2  LV0    M_C6   M_A1   <-M_D
  NL5B2   NL5M2   NL5E2  EN5B2   EN5M2   EN5E2  NL2B2   NL2M2   NL2E2  EN2B2   EN2M2   EN2E2  M_DY   M_D6   M_B1   M_BMUX
  SR5B2   SR5M2   SR5E2  ES5B2   ES5M2   ES5E2  SR2B2   SR2M2   SR2E2  ES2B2   ES2M2   ES2E2  FAN1   L_C6   L_A1   L_D
  EL5B2   EL5M2   EL5E2  SE5B2   SE5M2   SE5E2  EL2B2   EL2M2   EL2E2  SE2B2   SE2M2   SE2E2  L_DX   L_D4   L_B2   L_DQ
  WR5B2   WR5M2   WR5E2  SW5B2   SW5M2   SW5E2  WR2B2   WR2M2   WR2E2  SW2B2   SW2M2   SW2E2  M_CX   M_C4   M_A2   M_CQ
  SL5B2   SL5M2   SL5E2  WS5B2   WS5M2   WS5E2  SL2B2   SL2M2   SL2E2  WS2B2   WS2M2   WS2E2  M_DX   M_D4   M_B2   M_DQ
  NR5B2   NR5M2   NR5E2  WN5B2   WN5M2   WN5E2  NR2B2   NR2M2   NR2E2  WN2B2   WN2M2   WN2E2  L_CX   L_C4   L_A2   L_CQ
  WL5B1   WL5M1   WL5E1  NW5B1   NW5M1   NW5E1  WL2B1   WL2M1   WL2E1  NW2B1   NW2M1   NW2E1  M_CY   L_D5   L_B3   L_C
  ER5B1   ER5M1   ER5E1  NE5B1   NE5M1   NE5E1  ER2B1   ER2M1   ER2E1  NE2B1   NE2M1   NE2E1  M_WE   M_C5   M_A3   M_AMUX
  NL5B1   NL5M1   NL5E1  EN5B1   EN5M1   EN5E1  NL2B1   NL2M1   NL2E1  EN2B1   EN2M1   EN2E1  M_SR   M_D5   M_B3   M_C
  SR5B1   SR5M1   SR5E1  ES5B1   ES5M1   ES5E1  SR2B1   SR2M1   SR2E1  ES2B1   ES2M1   ES2E1  L_SR   L_C5   L_A3   L_AMUX
                                                                                              GFAN0
                                                                                              L_CLK
                                                                                              M_CLK
                                                                                              GFAN1
  EL5B1   EL5M1   EL5E1  SE5B1   SE5M1   SE5E1  EL2B1   EL2M1   EL2E1  SE2B1   SE2M1   SE2E1  M_CE   L_D3   L_B5   L_DMUX
  WR5B1   WR5M1   WR5E1  SW5B1   SW5M1   SW5E1  WR2B1   WR2M1   WR2E1  SW2B1   SW2M1   SW2E1  L_CE   M_C3   M_A5   M_B
  SL5B1   SL5M1   SL5E1  WS5B1   WS5M1   WS5E1  SL2B1 <=SL2M1 <=SL2E1  WS2B1   WS2M1   WS2E1  RSVD   M_D3   M_B5   M_DMUX
  NR5B1   NR5M1   NR5E1  WN5B1   WN5M1   WN5E1  NR2B1   NR2M1   NR2E1  WN2B1   WN2M1   WN2E1  M_BY   L_C3   L_A5   L_B
  WL5B0   WL5M0   WL5E0  NW5B0   NW5M0   NW5E0  WL2B0   WL2M0   WL2E0  NW2B0   NW2M0   NW2E0  L_BX   L_D2   L_B4   L_BQ
  ER5B0   ER5M0   ER5E0  NE5B0   NE5M0   NE5E0  ER2B0   ER2M0   ER2E0  NE2B0   NE2M0   NE2E0  M_AX   M_C2   M_A4   M_AQ
  NL5B0   NL5M0   NL5E0  EN5B0 <=EN5M0   EN5E0  NL2B0   NL2M0   NL2E0  EN2B0 <=EN2M0   EN2E0  M_BX   M_D2   M_B4   <=M_BQ
  SR5B0 <=SR5M0 <=SR5E0  ES5B0   ES5M0 <=ES5E0  SR2B0 <=SR2M0 <=SR2E0  ES2B0   ES2M0 <=ES2E0  L_AX   L_C2   L_A4   <=L_AQ
  EL5B0   EL5M0   EL5E0  SE5B0   SE5M0 <=SE5E0  EL2B0   EL2M0   EL2E0  *SE2B0  SE2M0 <=SE2E0  FAN0   L_D1   L_B6   <=L_A
  WR5B0   WR5M0   WR5E0  SW5B0 <=SW5M0   SW5E0  WR2B0   WR2M0   WR2E0  SW2B0 <=SW2M0   SW2E0  M_AY   M_C1   M_A6   <=M_CMUX
  SL5B0 <=SL5M0 <=SL5E0  WS5B0   WS5M0   WS5E0  SL2B0   SL2M0   SL2E0  WS2B0   WS2M0   WS2E0  LH18   M_D1   M_B6   <=M_A
  NR5B0   NR5M0   NR5E0  WN5B0   WN5M0   WN5E0  NR2B0   NR2M0   NR2E0  WN2B0   WN2M0   WN2E0  LV18   L_C1   L_A6   <=L_CMUX
```

SE2M0:  TO=16  FROM=0  (Middle of Diagonal Double, output only from Double)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | *SE2M0 | SE2E0 | =>FAN0 | =>L_D1 | =>L_B6 | L_A |
| WR5B0 | WR5M0 | WR5E0 | SW5B0 | SW5M0 | SW5E0 | =>WR2B0 | WR2M0 | WR2E0 | =>SW2B0 | SW2M0 | SW2E0 | =>M_AY | =>M_C1 | =>M_A6 | M_CMUX |
| SL5B0 | SL5M0 | SL5E0 | WS5B0 | WS5M0 | WS5E0 | =>SL2B0 | SL2M0 | SL2E0 | =>WS2B0 | WS2M0 | WS2E0 | =>LH18 | =>M_D1 | =>M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | =>LV18 | =>L_C1 | =>L_A6 | L_CMUX |

```
SE2E0:  TO=16  FROM=0   (End of Diagonal Double, input and output to/from Double)
    STRAIGHT PENTS         DIAGONAL PENTS        STRAIGHT DOUBLES       DIAGONAL DOUBLES      CTRL      LUT INS       CLE
   /_____\     /_____\    /_____\       /_____\      /   \     /      \     /      \
  WL5B2   WL5M2   WL5E2   NW5B2   NW5M2   NW5E2   WL2B2   WL2M2   WL2E2   NW2B2   NW2M2   NW2E2   LH0     L_D6   L_B1    L_BMUX
  ER5B2   ER5M2   ER5E2   NE5B2   NE5M2   NE5E2   ER2B2   ER2M2   ER2E2   NE2B2   NE2M2   NE2E2   LV0     M_C6   M_A1    M_D
  NL5B2   NL5M2   NL5E2   EN5B2   EN5M2   EN5E2   NL2B2   NL2M2   NL2E2   EN2B2   EN2M2   EN2E2   M_DY    M_D6   M_B1    M_BMUX
  SR5B2   SR5M2   SR5E2   ES5B2   ES5M2   ES5E2   SR2B2   SR2M2   SR2E2   ES2B2   ES2M2   ES2E2   FAN1    L_C6   L_A1    L_D
  EL5B2   EL5M2   EL5E2   SE5B2   SE5M2   SE5E2   EL2B2   EL2M2   EL2E2   SE2B2   SE2M2   SE2E2   L_DX    L_D4   L_B2    L_DQ
  WR5B2   WR5M2   WR5E2   SW5B2   SW5M2   SW5E2   WR2B2   WR2M2   WR2E2   SW2B2   SW2M2   SW2E2   M_CX    M_C4   M_A2    M_CQ
  SL5B2   SL5M2   SL5E2   WS5B2   WS5M2   WS5E2   SL2B2   SL2M2   SL2E2   WS2B2   WS2M2   WS2E2   M_DX    M_D4   M_B2    M_DQ
  NR5B2   NR5M2   NR5E2   WN5B2   WN5M2   WN5E2   NR2B2   NR2M2   NR2E2   WN2B2   WN2M2   WN2E2   L_CX    L_C4   L_A2    L_CQ
  WL5B1   WL5M1   WL5E1   NW5B1   NW5M1   NW5E1   WL2B1   WL2M1   WL2E1   NW2B1   NW2M1   NW2E1   M_CY    L_D5   L_B3    L_C
  ER5B1   ER5M1   ER5E1   NE5B1   NE5M1   NE5E1   ER2B1   ER2M1   ER2E1   NE2B1   NE2M1   NE2E1   M_WE    M_C5   M_A3    M_AMUX
  NL5B1   NL5M1   NL5E1   EN5B1   EN5M1   EN5E1   NL2B1   NL2M1   NL2E1   EN2B1   EN2M1   EN2E1   M_SR    M_D5   M_B3    M_C
  SR5B1   SR5M1   SR5E1   ES5B1   ES5M1   ES5E1   SR2B1   SR2M1   SR2E1   ES2B1   ES2M1   ES2E1   L_SR    L_C5   L_A3    L_AMUX
                                                                                                  GFAN0
                                                                                                  L_CLK
                                                                                                  M_CLK
                                                                                                  GFAN1
  EL5B1   EL5M1   EL5E1   SE5B1   SE5M1   SE5E1   EL2B1   EL2M1   EL2E1   SE2B1   SE2M1   SE2E1   M_CE    L_D3   L_B5    L_DMUX
  WR5B1   WR5M1   WR5E1   SW5B1   SW5M1   SW5E1   WR2B1   WR2M1   WR2E1   SW2B1   SW2M1   SW2E1   L_CE    M_C3   M_A5    M_B
  SL5B1   SL5M1   SL5E1   WS5B1   WS5M1   WS5E1   SL2B1   SL2M1   SL2E1   WS2B1   WS2M1   WS2E1   RSVD    M_D3   M_B5    M_DMUX
  NR5B1   NR5M1   NR5E1   WN5B1   WN5M1   WN5E1   NR2B1   NR2M1   NR2E1   WN2B1   WN2M1   WN2E1   M_BY    L_C3   L_A5    L_B
  WL5B0   WL5M0   WL5E0   NW5B0   NW5M0   NW5E0   WL2B0   WL2M0   WL2E0   NW2B0   NW2M0   NW2E0   =>L_BX  =>L_D2 =>L_B4  L_BQ
  ER5B0   ER5M0   ER5E0   NE5B0   NE5M0   NE5E0   ER2B0   ER2M0   ER2E0   NE2B0   NE2M0   NE2E0   =>M_AX  =>M_C2 =>M_A4  M_AQ
  NL5B0   NL5M0   NL5E0   EN5B0   EN5M0   EN5E0   NL2B0   NL2M0   NL2E0   EN2B0   EN2M0   EN2E0   =>M_BX  =>M_D2 =>M_B4  M_BQ
  SR5B0   SR5M0   SR5E0   ES5B0   ES5M0   ES5E0 =>SR2B0   SR2M0 =>SR2E0   ES2B0   ES2M0   ES2E0   =>L_AX  =>L_C2 =>L_A4  L_AQ
  EL5B0   EL5M0   EL5E0   SE5B0   SE5M0   SE5E0 =>EL2B0   EL2M0   EL2E0 =>SE2B0   SE2M0   *SE2E0  FAN0    L_D1   L_B6    L_A
  WR5B0   WR5M0   WR5E0   SW5B0   SW5M0   SW5E0   WR2B0   WR2M0   WR2E0   SW2B0   SW2M0   SW2E0   M_AY    M_C1   M_A6    M_CMUX
  SL5B0   SL5M0   SL5E0   WS5B0   WS5M0   WS5E0   SL2B0   SL2M0   SL2E0   WS2B0   WS2M0   WS2E0   LH18    M_D1   M_B6    M_A
  NR5B0   NR5M0   NR5E0   WN5B0   WN5M0   WN5E0   NR2B0   NR2M0   NR2E0   WN2B0   WN2M0   WN2E0   LV18    L_C1   L_A6    L_CMUX
```

ER5B0:  TO=0  FROM=15   (Beginning of Straight Pent, input only to Pent)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | <=NR5M1 | <=NR5E1 | WN5B1 | WN5M1 | WN5E1 | NR2B1 | NR2M1 | NR2E1 | WN2B1 | WN2M1 | WN2E1 | M_BY | L_C3 | L_A5 | <=L_B |
| WL5B0 | WL5M0 | WL5E0 | NW5B0 | <=NW5M0 | NW5E0 | WL2B0 | WL2M0 | WL2E0 | NW2B0 | NW2M0 | NW2E0 | L_BX | L_D2 | L_B4 | <=L_BQ |
| *ER5B0 | ER5M0 | ER5E0 | NE5B0 | NE5M0 | <=NE5E0 | ER2B0 | ER2M0 | ER2E0 | NE2B0 | NE2M0 | NE2E0 | M_AX | M_C2 | M_A4 | <=M_AQ |
| NL5B0 | <=NL5M0 | <=NL5E0 | EN5B0 | EN5M0 | <=EN5E0 | NL2B0 | NL2M0 | NL2E0 | EN2B0 | EN2M0 | EN2E0 | M_BX | M_D2 | M_B4 | <=M_BQ |
| SR5B0 | SR5M0 | SR5E0 | ES5B0 | <=ES5M0 | ES5E0 | SR2B0 | SR2M0 | SR2E0 | ES2B0 | ES2M0 | ES2E0 | L_AX | L_C2 | L_A4 | <=L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | <=L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | <=LV18 | L_C1 | L_A6 | L_CMUX |

ER5M0:   TO=8   FROM=0   (Middle of Straight Pent, output only from Pent)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | L_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | M_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | *ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| =>NL5B0 | NL5M0 | NL5E0 | =>EN5B0 | EN5M0 | EN5E0 | =>NL2B0 | NL2M0 | NL2E0 | =>EN2B0 | EN2M0 | EN2E0 | M_BX | M_D2 | M_B4 | M_BQ |
| =>SR5B0 | SR5M0 | SR5E0 | =>ES5B0 | ES5M0 | ES5E0 | =>SR2B0 | SR2M0 | SR2E0 | =>ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

ER5E0: TO=8 FROM=0 (End of Straight Pent, output only from Pent)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | M_AX | M_C2 | M_A4 | M_AQ |
| ER5B0 | ER5M0 | *ER5E0 | NE5B0 | NE5M0 | NE5E0 | ER2B0 | ER2M0 | ER2E0 | NE2B0 | NE2M0 | NE2E0 | M_BX | M_D2 | M_B4 | M_BQ |
| =>NL5B0 | NL5M0 | NL5E0 | =>EN5B0 | EN5M0 | EN5E0 | =>NL2B0 | NL2M0 | NL2E0 | =>EN2B0 | EN2M0 | EN2E0 | L_AX | L_C2 | L_A4 | L_AQ |
| =>SR5B0 | SR5M0 | SR5E0 | =>ES5B0 | ES5M0 | ES5E0 | =>SR2B0 | SR2M0 | SR2E0 | =>ES2B0 | ES2M0 | ES2E0 | FAN0 | L_D1 | L_B6 | L_A |
| EL5B0 | EL5M0 | EL5E0 | SE5B0 | SE5M0 | SE5E0 | EL2B0 | EL2M0 | EL2E0 | SE2B0 | SE2M0 | SE2E0 | M_AY | M_C1 | M_A6 | M_CMUX |
| WR5B0 | WR5M0 | WR5E0 | SW5B0 | SW5M0 | SW5E0 | WR2B0 | WR2M0 | WR2E0 | SW2B0 | SW2M0 | SW2E0 | LH18 | M_D1 | M_B6 | M_A |
| SL5B0 | SL5M0 | SL5E0 | WS5B0 | WS5M0 | WS5E0 | SL2B0 | SL2M0 | SL2E0 | WS2B0 | WS2M0 | WS2E0 | LV18 | L_C1 | L_A6 | L_CMUX |
| NR5B0 | NR5M0 | NR5E0 | WN5B0 | WN5M0 | WN5E0 | NR2B0 | NR2M0 | NR2E0 | WN2B0 | WN2M0 | WN2E0 | | | | |

```
SE5B0:  TO=0  FROM=16   (Beginning of Diagonal Pent, input only to Pent)
        STRAIGHT PENTS          DIAGONAL PENTS          STRAIGHT DOUBLES         DIAGONAL DOUBLES         CTRL      LUT INS      CLE
       /                \      /                \      /                \      /                \       /     \   /      \    /        \
  WL5B2   WL5M2   WL5E2   NW5B2   NW5M2   NW5E2   WL2B2   WL2M2   WL2E2   NW2B2   NW2M2   NW2E2   LH0     L_D6    L_B1    <-L_BMUX
  ER5B2   ER5M2   ER5E2   NE5B2   NE5M2   NE5E2   ER2B2   ER2M2   ER2E2   NE2B2   NE2M2   NE2E2   LV0     M_C6    M_A1    <-M_D
  NL5B2   NL5M2   NL5E2   EN5B2   EN5M2   EN5E2   NL2B2   NL2M2   NL2E2   EN2B2   EN2M2   EN2E2   M_DY    M_D6    M_B1    M_BMUX
  SR5B2   SR5M2   SR5E2   ES5B2   ES5M2   ES5E2   SR2B2   SR2M2   SR2E2   ES2B2   ES2M2   ES2E2   FAN1    L_C6    L_A1    L_D
  EL5B2   EL5M2   EL5E2   SE5B2   SE5M2   SE5E2   EL2B2   EL2M2   EL2E2   SE2B2   SE2M2   SE2E2   L_DX    L_D4    L_B2    L_DQ
  WR5B2   WR5M2   WR5E2   SW5B2   SW5M2   SW5E2   WR2B2   WR2M2   WR2E2   SW2B2   SW2M2   SW2E2   M_CX    M_C4    M_A2    M_CQ
  SL5B2   SL5M2   SL5E2   WS5B2   WS5M2   WS5E2   SL2B2   SL2M2   SL2E2   WS2B2   WS2M2   WS2E2   M_DX    M_D4    M_B2    M_DQ
  NR5B2   NR5M2   NR5E2   WN5B2   WN5M2   WN5E2   NR2B2   NR2M2   NR2E2   WN2B2   WN2M2   WN2E2   L_CX    L_C4    L_A2    L_CQ
  WL5B1   WL5M1   WL5E1   NW5B1   NW5M1   NW5E1   WL2B1   WL2M1   WL2E1   NW2B1   NW2M1   NW2E1   M_CY    M_C5    M_A3    L_C
  ER5B1   ER5M1   ER5E1   NE5B1   NE5M1   NE5E1   ER2B1   ER2M1   ER2E1   NE2B1   NE2M1   NE2E1   M_WE    M_C5    M_A3    M_AMUX
  NL5B1   NL5M1   NL5E1   EN5B1   EN5M1   EN5E1   NL2B1   NL2M1   NL2E1   EN2B1   EN2M1   EN2E1   M_SR    M_D5    M_B3    M_C
  SR5B1   SR5M1   SR5E1   ES5B1   ES5M1   ES5E1   SR2B1   SR2M1   SR2E1   ES2B1   ES2M1   ES2E1   L_SR    L_C5    L_A3    L_AMUX
                                                                                                  GFAN0
                                                                                                  L_CLK
                                                                                                  M_CLK
                                                                                                  GFAN1
  EL5B1   EL5M1   EL5E1   SE5B1   SE5M1   SE5E1   EL2B1   EL2M1   EL2E1   SE2B1   SE2M1   SE2E1   M_CE    L_D3    L_B5    L_DMUX
  WR5B1   WR5M1   WR5E1   SW5B1   SW5M1   SW5E1   WR2B1   WR2M1   WR2E1   SW2B1   SW2M1   SW2E1   L_CE    M_C3    M_A5    M_B
  SL5B1   SL5M1   SL5E1   WS5B1   WS5M1   WS5E1   SL2B1   SL2M1   SL2E1   WS2B1   WS2M1   WS2E1   RSVD    M_D3    M_B5    M_DMUX
  NR5B1   NR5M1   NR5E1   WN5B1   WN5M1   WN5E1   NR2B1   NR2M1   NR2E1   WN2B1   WN2M1   WN2E1   M_BY    L_C3    L_A5    L_B
  WL5B0   WL5M0   WL5E0   NW5B0   NW5M0   NW5E0   WL2B0   WL2M0   WL2E0   NW2B0   NW2M0   NW2E0   L_BX    L_D2    L_B4    L_BQ
  ER5B0   ER5M0   ER5E0   NE5B0   NE5M0   NE5E0   ER2B0   ER2M0   ER2E0   NE2B0   NE2M0   NE2E0   M_AX    M_C2    M_A4    M_AQ
  NL5B0   NL5M0   NL5E0   EN5B0 <=EN5M0   EN5E0   NL2B0   NL2M0   NL2E0   EN2B0   EN2M0   EN2E0   M_BX    M_D2    M_B4    <=M_BQ
  SR5B0 <=SR5M0 <=SR5E0   ES5B0   ES5M0 <=ES5E0   SR2B0   SR2M0   SR2E0   ES2B0   ES2M0   ES2E0   L_AX    L_C2    L_A4    <=L_AQ
  EL5B0   EL5M0   EL5E0  *SE5B0   SE5M0 <=SE5E0   EL2B0   EL2M0   EL2E0   SE2B0   SE2M0   SE2E0   FAN0    L_D1    L_B6    <=L_A
  WR5B0   WR5M0   WR5E0   SW5B0 <=SW5M0   SW5E0   WR2B0   WR2M0   WR2E0   SW2B0   SW2M0   SW2E0   M_AY    M_C1    M_A6    <=M_CMUX
  SL5B0 <=SL5M0 <=SL5E0   WS5B0   WS5M0   WS5E0   SL2B0   SL2M0   SL2E0   WS2B0   WS2M0   WS2E0 <=LH18    M_D1    M_B6    <=M_A
  NR5B0   NR5M0   NR5E0   WN5B0   WN5M0   WN5E0   NR2B0   NR2M0   NR2E0   WN2B0   WN2M0   WN2E0   LV18    L_C1    L_A6    L_CMUX
```

```
SE5M0:  TO=8  FROM=0   (Middle of Diagonal Pent, output only from Pent)
       STRAIGHT PENTS        DIAGONAL PENTS       STRAIGHT DOUBLES      DIAGONAL DOUBLES      CTRL    LUT INS      CLE
      /                \    /              \    /               \    /               \       /  \    /    \     /    \
    WL5B2   WL5M2  WL5E2   NW5B2  NW5M2  NW5E2  WL2B2  WL2M2  WL2E2  NW2B2  NW2M2  NW2E2    LH0    L_D6   L_B1    L_BMUX
    ER5B2   ER5M2  ER5E2   NE5B2  NE5M2  NE5E2  ER2B2  ER2M2  ER2E2  NE2B2  NE2M2  NE2E2    LV0    M_C6   M_A1    M_D
    NL5B2   NL5M2  NL5E2   EN5B2  EN5M2  EN5E2  NL2B2  NL2M2  NL2E2  EN2B2  EN2M2  EN2E2    M_DY   L_D6   M_B1    M_BMUX
    SR5B2   SR5M2  SR5E2   ES5B2  ES5M2  ES5E2  SR2B2  SR2M2  SR2E2  ES2B2  ES2M2  ES2E2    FAN1   L_C6   L_A1    L_D
    EL5B2   EL5M2  EL5E2   SE5B2  SE5M2  SE5E2  EL2B2  EL2M2  EL2E2  SE2B2  SE2M2  SE2E2    L_DX   M_C4   M_A2    L_DQ
    WR5B2   WR5M2  WR5E2   SW5B2  SW5M2  SW5E2  WR2B2  WR2M2  WR2E2  SW2B2  SW2M2  SW2E2    M_CX   M_C4   M_A2    M_CQ
    SL5B2   SL5M2  SL5E2   WS5B2  WS5M2  WS5E2  SL2B2  SL2M2  SL2E2  WS2B2  WS2M2  WS2E2    M_DX   M_D4   M_B2    M_DQ
    NR5B2   NR5M2  NR5E2   WN5B2  WN5M2  WN5E2  NR2B2  NR2M2  NR2E2  WN2B2  WN2M2  WN2E2    L_CX   L_C4   L_A2    L_CQ
    WL5B1   WL5M1  WL5E1   NW5B1  NW5M1  NW5E1  WL2B1  WL2M1  WL2E1  NW2B1  NW2M1  NW2E1    M_CY   L_D5   L_B3    L_C
    ER5B1   ER5M1  ER5E1   NE5B1  NE5M1  NE5E1  ER2B1  ER2M1  ER2E1  NE2B1  NE2M1  NE2E1    M_WE   M_C5   M_A3    M_AMUX
    NL5B1   NL5M1  NL5E1   EN5B1  EN5M1  EN5E1  NL2B1  NL2M1  NL2E1  EN2B1  EN2M1  EN2E1    M_SR   M_D5   M_B3    M_C
    SR5B1   SR5M1  SR5E1   ES5B1  ES5M1  ES5E1  SR2B1  SR2M1  SR2E1  ES2B1  ES2M1  ES2E1    L_SR   L_C5   L_A3    L_AMUX
                                                                                            GFAN0
                                                                                            L_CLK
                                                                                            M_CLK
                                                                                            GFAN1
    EL5B1   EL5M1  EL5E1   SE5B1  SE5M1  SE5E1  EL2B1  EL2M1  EL2E1  SE2B1  SE2M1  SE2E1    M_CE   L_D3   L_B5    L_DMUX
    WR5B1   WR5M1  WR5E1   SW5B1  SW5M1  SW5E1  WR2B1  WR2M1  WR2E1  SW2B1  SW2M1  SW2E1    L_CE   M_C3   M_A5    M_B
    SL5B1   SL5M1  SL5E1   WS5B1  WS5M1  WS5E1  SL2B1  SL2M1  SL2E1  WS2B1  WS2M1  WS2E1    RSVD   M_D3   M_B5    M_DMUX
    NR5B1   NR5M1  NR5E1   WN5B1  WN5M1  WN5E1  NR2B1  NR2M1  NR2E1  WN2B1  WN2M1  WN2E1    M_BY   L_C3   L_A5    L_B
    WL5B0   WL5M0  WL5E0   NW5B0  NW5M0  NW5E0  WL2B0  WL2M0  WL2E0  NW2B0  NW2M0  NW2E0    L_BX   L_D2   L_B4    L_BQ
    ER5B0   ER5M0  ER5E0   NE5B0  NE5M0  NE5E0  ER2B0  ER2M0  ER2E0  NE2B0  NE2M0  NE2E0    M_AX   M_C2   M_A4    M_AQ
    NL5B0   NL5M0  NL5E0   EN5B0  EN5M0  EN5E0  NL2B0  NL2M0  NL2E0  EN2B0  EN2M0  EN2E0    M_BX   M_D2   M_B4    M_BQ
    SR5B0   SR5M0  SR5E0   ES5B0  ES5M0  ES5E0  SR2B0  SR2M0  SR2E0  ES2B0  ES2M0  ES2E0    L_AX   L_C2   L_A4    L_AQ
    EL5B0   EL5M0  EL5E0   SE5B0  *SE5M0 SE5E0  EL2B0  EL2M0  EL2E0  SE2B0  SE2M0  SE2E0    FAN0   L_D1   L_B6    L_A
    =>WR5B0 WR5M0  WR5E0 =>SW5B0  SW5M0  SW5E0  WR2B0  WR2M0  WR2E0 =>SW2B0 SW2M0  SW2E0    M_AY   M_C1   M_A6    M_CMUX
    =>SL5B0 SL5M0  SL5E0 =>WS5B0  WS5M0  WS5E0 =>SL2B0 SL2M0  SL2E0 =>WS2B0 WS2M0  WS2E0    LH18   M_D1   M_B6    M_A
    NR5B0   NR5M0  NR5E0   WN5B0  WN5M0  WN5E0  NR2B0  NR2M0  NR2E0  WN2B0  WN2M0  WN2E0    LV18   L_C1   L_A6    L_CMUX
```

SE5E0:  TO=8  FROM=0  (End of Diagonal Pent, output only from Pent)

```
   STRAIGHT PENTS        DIAGONAL PENTS        STRAIGHT DOUBLES       DIAGONAL DOUBLES     CTRL     LUT INS      CLE
  /              \      /              \      /              \      /              \      / \      /      \    /    \
  WL5B2  WL5M2  WL5E2   NW5B2  NW5M2  NW5E2   WL2B2  WL2M2  WL2E2   NW2B2  NW2M2  NW2E2    LH0     L_D6   L_B1    L_BMUX
  ER5B2  ER5M2  ER5E2   NE5B2  NE5M2  NE5E2   ER2B2  ER2M2  ER2E2   NE2B2  NE2M2  NE2E2    LV0     M_C6   M_A1    M_D
  NL5B2  NL5M2  NL5E2   EN5B2  EN5M2  EN5E2   NL2B2  NL2M2  NL2E2   EN2B2  EN2M2  EN2E2    M_DY    M_D6   M_B1    M_BMUX
  SR5B2  SR5M2  SR5E2   ES5B2  ES5M2  ES5E2   SR2B2  SR2M2  SR2E2   ES2B2  ES2M2  ES2E2    FAN1    L_C6   L_A1    L_D
  EL5B2  EL5M2  EL5E2   SE5B2  SE5M2  SE5E2   EL2B2  EL2M2  EL2E2   SE2B2  SE2M2  SE2E2    L_DX    L_D4   L_B2    L_DQ
  WR5B2  WR5M2  WR5E2   SW5B2  SW5M2  SW5E2   WR2B2  WR2M2  WR2E2   SW2B2  SW2M2  SW2E2    M_CX    M_C4   M_A2    M_CQ
  SL5B2  SL5M2  SL5E2   WS5B2  WS5M2  WS5E2   SL2B2  SL2M2  SL2E2   WS2B2  WS2M2  WS2E2    M_DX    M_D4   M_B2    M_DQ
  NR5B2  NR5M2  NR5E2   WN5B2  WN5M2  WN5E2   NR2B2  NR2M2  NR2E2   WN2B2  WN2M2  WN2E2    L_CX    L_C4   L_A2    L_CQ
  WL5B1  WL5M1  WL5E1   NW5B1  NW5M1  NW5E1   WL2B1  WL2M1  WL2E1   NW2B1  NW2M1  NW2E1    M_CY    L_D5   L_B3    L_C
  ER5B1  ER5M1  ER5E1   NE5B1  NE5M1  NE5E1   ER2B1  ER2M1  ER2E1   NE2B1  NE2M1  NE2E1    M_WE    M_C5   M_A3    M_AMUX
  NL5B1  NL5M1  NL5E1   EN5B1  EN5M1  EN5E1   NL2B1  NL2M1  NL2E1   EN2B1  EN2M1  EN2E1    M_SR    M_D5   M_B3    M_C
  SR5B1  SR5M1  SR5E1   ES5B1  ES5M1  ES5E1   SR2B1  SR2M1  SR2E1   ES2B1  ES2M1  ES2E1    L_SR    L_C5   L_A3    L_AMUX
                                                                                           GFAN0
                                                                                           L_CLK
                                                                                           M_CLK
                                                                                           GFAN1
  EL5B1  EL5M1  EL5E1   SE5B1  SE5M1  SE5E1   EL2B1  EL2M1  EL2E1   SE2B1  SE2M1  SE2E1    M_CE    L_D3   L_B5    L_DMUX
  WR5B1  WR5M1  WR5E1   SW5B1  SW5M1  SW5E1   WR2B1  WR2M1  WR2E1   SW2B1  SW2M1  SW2E1    L_CE    M_C3   M_A5    M_B
  SL5B1  SL5M1  SL5E1   WS5B1  WS5M1  WS5E1   SL2B1  SL2M1  SL2E1   WS2B1  WS2M1  WS2E1    RSVD    M_D3   M_B5    M_DMUX
  NR5B1  NR5M1  NR5E1   WN5B1  WN5M1  WN5E1   NR2B1  NR2M1  NR2E1   WN2B1  WN2M1  WN2E1    M_BY    L_C3   L_A5    L_B
  WL5B0  WL5M0  WL5E0   NW5B0  NW5M0  NW5E0   WL2B0  WL2M0  WL2E0   NW2B0  NW2M0  NW2E0    L_BX    L_D2   L_B4    L_BQ
  ER5B0  ER5M0  ER5E0   NE5B0  NE5M0  NE5E0   ER2B0  ER2M0  ER2E0   NE2B0  NE2M0  NE2E0    M_AX    M_C2   M_A4    M_AQ
  NL5B0  NL5M0  NL5E0   EN5B0  EN5M0  EN5E0   NL2B0  NL2M0  NL2E0   EN2B0  EN2M0  EN2E0    M_BX    M_D2   M_B4    M_BQ
=>SR5B0  SR5M0  SR5E0 =>ES5B0  ES5M0  ES5E0 =>SR2B0  SR2M0  SR2E0 =>ES2B0  ES2M0  ES2E0    L_AX    L_C2   L_A4    L_AQ
=>EL5B0  EL5M0  EL5E0 =>SE5B0  SE5M0 *SE5E0 =>EL2B0  EL2M0  EL2E0 =>SE2B0  SE2M0  SE2E0    FAN0    L_D1   L_B6    L_A
  WR5B0  WR5M0  WR5E0   SW5B0  SW5M0  SW5E0   WR2B0  WR2M0  WR2E0   SW2B0  SW2M0  SW2E0    M_AY    M_C1   M_A6    M_CMUX
  SL5B0  SL5M0  SL5E0   WS5B0  WS5M0  WS5E0   SL2B0  SL2M0  SL2E0   WS2B0  WS2M0  WS2E0    LH18    M_D1   M_B6    M_A
  NR5B0  NR5M0  NR5E0   WN5B0  WN5M0  WN5E0   NR2B0  NR2M0  NR2E0   WN2B0  WN2M0  WN2E0    LV18    L_C1   L_A6    L_CMUX
```

LV0: TO=8 FROM=19   (Beginning of Vertical Long Line, both input and output of Long line)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | <=NW2M2 | NW2E2 | <>LH0 | L_D6 | L_B1 | L_BMUX |
| ER5B2 | ER5M2 | ER5E2 | NE5B2 | NE5M2 | NE5E2 | <=ER2B2 | ER2M2 | ER2E2 | NE2B2 | NE2M2 | <=NE2E2 | *LV0 | M_C6 | M_A1 | M_D |
| NL5B2 | NL5M2 | NL5E2 | EN5B2 | EN5M2 | EN5E2 | <=NL2B2 | NL2M2 | NL2E2 | EN2B2 | EN2M2 | <=EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | <=ES2M2 | ES2E2 | FAN1 | L_C6 | L_A1 | L_D |
| =>EL5B2 | EL5M2 | EL5E2 | =>SE5B2 | SE5M2 | SE5E2 | <=EL2B2 | EL2M2 | <=EL2E2 | SE2B2 | SE2M2 | <=SE2E2 | L_DX | L_D4 | L_B2 | L_DQ |
| =>WR5B2 | WR5M2 | WR5E2 | =>SW5B2 | SW5M2 | SW5E2 | WR2B2 | WR2M2 | WR2E2 | SW2B2 | <=SW2M2 | SW2E2 | M_CX | M_C4 | M_A2 | M_CQ |
| =>SL5B2 | SL5M2 | SL5E2 | =>WS5B2 | WS5M2 | WS5E2 | SL2B2 | SL2M2 | SL2E2 | WS2B2 | WS2M2 | WS2E2 | M_DX | M_D4 | M_B2 | M_DQ |
| =>NR5B2 | NR5M2 | NR5E2 | =>WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | <=ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | <=NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | <=WS2M0 | WS2E0 | <>LH18 | M_D1 | M_B6 | M_A |
| NR5B0 | NR5M0 | NR5E0 | WN5B0 | WN5M0 | WN5E0 | <+NR2B0 | NR2M0 | <+NR2E0 | WN2B0 | WN2M0 | <+WN2E0 | <>LV18 | L_C1 | L_A6 | L_CMUX |

LV6: TO=9  FROM=0  (First output point of Vertical Long Line, one-third point)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | <>LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| =>EL5B2 | EL5M2 | EL5E2 | =>SE5B2 | SE5M2 | SE5E2 | EL2B2 | EL2M2 | EL2E2 | SE2B2 | SE2M2 | SE2E2 | L_DX | L_D4 | L_B2 | L_DQ |
| =>WR5B2 | WR5M2 | WR5E2 | =>SW5B2 | SW5M2 | SW5E2 | WR2B2 | WR2M2 | WR2E2 | SW2B2 | SW2M2 | SW2E2 | M_CX | M_C4 | M_A2 | M_CQ |
| =>SL5B2 | SL5M2 | SL5E2 | =>WS5B2 | WS5M2 | WS5E2 | SL2B2 | SL2M2 | SL2E2 | WS2B2 | WS2M2 | WS2E2 | M_DX | M_D4 | M_B2 | M_DQ |
| =>NR5B2 | NR5M2 | NR5E2 | =>WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

LV12: TO=9 FROM=0 (Second output point of Vertical Long Line, two-thirds point)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| WL5B2 | WL5M2 | WL5E2 | NW5B2 | NW5M2 | NW5E2 | WL2B2 | WL2M2 | WL2E2 | NW2B2 | NW2M2 | NW2E2 | LH0 | L_D6 | L_B1 | L_BMUX |
| ER5B2 | ER5M2 | ER5E2 | NE5B2 | NE5M2 | NE5E2 | ER2B2 | ER2M2 | ER2E2 | NE2B2 | NE2M2 | NE2E2 | LV0 | M_C6 | M_A1 | M_D |
| NL5B2 | NL5M2 | NL5E2 | EN5B2 | EN5M2 | EN5E2 | NL2B2 | NL2M2 | NL2E2 | EN2B2 | EN2M2 | EN2E2 | M_DY | M_D6 | M_B1 | M_BMUX |
| SR5B2 | SR5M2 | SR5E2 | ES5B2 | ES5M2 | ES5E2 | SR2B2 | SR2M2 | SR2E2 | ES2B2 | ES2M2 | ES2E2 | FAN1 | L_C6 | L_A1 | L_D |
| EL5B2 | EL5M2 | EL5E2 | SE5B2 | SE5M2 | SE5E2 | EL2B2 | EL2M2 | EL2E2 | SE2B2 | SE2M2 | SE2E2 | L_DX | L_D4 | L_B2 | L_DQ |
| WR5B2 | WR5M2 | WR5E2 | SW5B2 | SW5M2 | SW5E2 | WR2B2 | WR2M2 | WR2E2 | SW2B2 | SW2M2 | SW2E2 | M_CX | M_C4 | M_A2 | M_CQ |
| SL5B2 | SL5M2 | SL5E2 | WS5B2 | WS5M2 | WS5E2 | SL2B2 | SL2M2 | SL2E2 | WS2B2 | WS2M2 | WS2E2 | M_DX | M_D4 | M_B2 | M_DQ |
| NR5B2 | NR5M2 | NR5E2 | WN5B2 | WN5M2 | WN5E2 | NR2B2 | NR2M2 | NR2E2 | WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| =>WL5B0 | WL5M0 | WL5E0 | =>NW5B0 | NW5M0 | NW5E0 | WL2B0 | WL2M0 | WL2E0 | NW2B0 | NW2M0 | NW2E0 | L_BX | L_D2 | L_B4 | L_BQ |
| =>ER5B0 | ER5M0 | ER5E0 | =>NE5B0 | NE5M0 | NE5E0 | ER2B0 | ER2M0 | ER2E0 | NE2B0 | NE2M0 | NE2E0 | M_AX | M_C2 | M_A4 | M_AQ |
| =>NL5B0 | NL5M0 | NL5E0 | =>EN5B0 | EN5M0 | EN5E0 | NL2B0 | NL2M0 | NL2E0 | EN2B0 | EN2M0 | EN2E0 | M_BX | M_D2 | M_B4 | M_BQ |
| =>SR5B0 | SR5M0 | SR5E0 | =>ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | <>LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

```
LV18:   TO=8   FROM=19 (End of Vertical Long Line, both input and output of Long line)
      STRAIGHT PENTS         DIAGONAL PENTS         STRAIGHT DOUBLES        DIAGONAL DOUBLES     CTRL    LUT INS      CLE
    /              \       /              \       /              \       /              \       / \     /     \     / \
 WL5B2  WL5M2  WL5E2    NW5B2  NW5M2  NW5E2 <-WL2B2  WL2M2 <-WL2E2    NW2B2  NW2M2 <-NW2E2  <>LH0    L_D6   L_B1    L_BMUX
 ER5B2  ER5M2  ER5E2    NE5B2  NE5M2  NE5E2    ER2B2  ER2M2  ER2E2    NE2B2 <-NE2M2  NE2E2  <>LV0    M_C6   M_A1    M_D
 NL5B2  NL5M2  NL5E2    EN5B2  EN5M2  EN5E2    NL2B2  NL2M2  NL2E2    EN2B2  EN2M2  EN2E2  M_DY     M_D6   M_B1    M_BMUX
 SR5B2  SR5M2  SR5E2    ES5B2  ES5M2  ES5E2    SR2B2  SR2M2  SR2E2    ES2B2  ES2M2  ES2E2  FAN1     L_C6   L_A1    L_D
 EL5B2  EL5M2  EL5E2    SE5B2  SE5M2  SE5E2    EL2B2  EL2M2  EL2E2    SE2B2  SE2M2  SE2E2  L_DX     L_D4   L_B2    L_DQ
 WR5B2  WR5M2  WR5E2    SW5B2  SW5M2  SW5E2    WR2B2  WR2M2  WR2E2    SW2B2  SW2M2  SW2E2  M_CX     M_C4   M_A2    M_CQ
 SL5B2  SL5M2  SL5E2    WS5B2  WS5M2  WS5E2    SL2B2  SL2M2  SL2E2    WS2B2  WS2M2  WS2E2  M_DX     M_D4   M_B2    M_DQ
 NR5B2  NR5M2  NR5E2    WN5B2  WN5M2  WN5E2    NR2B2  NR2M2  NR2E2    WN2B2  WN2M2  WN2E2  L_CX     L_C4   L_A2    L_CQ
 WL5B1  WL5M1  WL5E1    NW5B1  NW5M1  NW5E1    WL2B1  WL2M1  WL2E1    NW2B1  NW2M1  NW2E1  M_CY     L_D5   L_B3    L_C
 ER5B1  ER5M1  ER5E1    NE5B1  NE5M1  NE5E1    ER2B1  ER2M1  ER2E1    NE2B1  NE2M1  NE2E1  M_WE     M_C5   M_A3    M_AMUX
 NL5B1  NL5M1  NL5E1    EN5B1  EN5M1  EN5E1    NL2B1  NL2M1  NL2E1    EN2B1  EN2M1  EN2E1  M_SR     M_D5   M_B3    M_C
 SR5B1  SR5M1  SR5E1    ES5B1  ES5M1  ES5E1    SR2B1  SR2M1  SR2E1    ES2B1  ES2M1  ES2E1  L_SR     L_C5   L_A3    L_AMUX
                                                                                            GFAN0
                                                                                            L_CLK
                                                                                            M_CLK
                                                                                            GFAN1
 EL5B1  EL5M1  EL5E1    SE5B1  SE5M1  SE5E1    EL2B1  EL2M1  EL2E1    SE2B1  SE2M1  SE2E1  M_CE     L_D3   L_B5    L_DMUX
 WR5B1  WR5M1  WR5E1    SW5B1  SW5M1  SW5E1    WR2B1  WR2M1 <=WR2E1   SW2B1  SW2M1  SW2E1  L_CE     M_C3   M_A5    M_B
 SL5B1  SL5M1  SL5E1    WS5B1  WS5M1  WS5E1    SL2B1  SL2M1 <=SL2E1   WS2B1  WS2M1  WS2E1  RSVD     M_D3   M_B5    M_DMUX
 NR5B1  NR5M1  NR5E1    WN5B1  WN5M1  WN5E1    NR2B1  NR2M1  NR2E1    WN2B1  WN2M1  WN2E1  M_BY     L_D2   L_B4    L_B
=>WL5B0  WL5M0  WL5E0 =>NW5B0  NW5M0  NW5E0    WL2B0  WL2M0  WL2E0    NW2B0  NW2M0  NW2E0  L_BX     L_D2   L_B4    L_BQ
=>ER5B0  ER5M0  ER5E0 =>NE5B0  NE5M0  NE5E0    ER2B0  ER2M0  ER2E0    NE2B0  NE2M0  NE2E0  M_AX     M_C2   M_A4    M_AQ
=>NL5B0  NL5M0  NL5E0 =>EN5B0  EN5M0  EN5E0    NL2B0  NL2M0  NL2E0    EN2B0 <=EN2M0  EN2E0  M_BX     M_D2   M_B4    M_BQ
=>SR5B0  SR5M0  SR5E0 =>ES5B0  ES5M0  ES5E0 <=SR2B0  SR2M0 <=SR2E0    ES2B0  ES2M0 <=ES2E0 L_AX     L_C2   L_A4    L_AQ
 EL5B0  EL5M0  EL5E0    SE5B0  SE5M0  SE5E0    EL2B0  EL2M0  EL2E0    SE2B0 <=SE2M0  SE2E0  FAN0     L_D1   L_B6    L_A
 WR5B0  WR5M0  WR5E0    SW5B0  SW5M0  SW5E0 <=WR2B0  WR2M0  WR2E0    SW2B0  SW2M0 <=SW2E0 M_AY     M_C1   M_A6    M_CMUX
 SL5B0  SL5M0  SL5E0    WS5B0  WS5M0  WS5E0 <=SL2B0  SL2M0  SL2E0    WS2B0  WS2M0 <=WS2E0 <>LH18   M_D1   M_B6    M_A
 NR5B0  NR5M0  NR5E0    WN5B0  WN5M0  WN5E0    NR2B0  NR2M0  NR2E0    WN2B0 <=WN2M0  WN2E0  *LV18    L_C1   L_A6    L_CMUX
```

L_DQ:  TO=38  FROM=0   (CLE memory cell output signal only drivable by CLE)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| =>WL5B2 | WL5M2 | WL5E2 | =>NW5B2 | NW5M2 | NW5E2 | =>WL2B2 | WL2M2 | WL2E2 | =>NW2B2 | NW2M2 | NW2E2 | LH0 | L_D6 | L_B1 | L_BMUX |
| =>ER5B2 | ER5M2 | ER5E2 | =>NE5B2 | NE5M2 | NE5E2 | =>ER2B2 | ER2M2 | ER2E2 | =>NE2B2 | NE2M2 | NE2E2 | LV0 | M_C6 | M_A1 | M_D |
| =>NL5B2 | NL5M2 | NL5E2 | =>EN5B2 | EN5M2 | EN5E2 | =>NL2B2 | NL2M2 | NL2E2 | =>EN2B2 | EN2M2 | EN2E2 | M_DY | M_D6 | M_B1 | M_BMUX |
| =>SR5B2 | SR5M2 | SR5E2 | =>ES5B2 | ES5M2 | ES5E2 | =>SR2B2 | SR2M2 | SR2E2 | =>ES2B2 | ES2M2 | ES2E2 | FAN1 | L_C6 | L_A1 | L_D |
| =>EL5B2 | EL5M2 | EL5E2 | =>SE5B2 | SE5M2 | SE5E2 | =>EL2B2 | EL2M2 | EL2E2 | =>SE2B2 | SE2M2 | SE2E2 | =>L_DX | =>L_D4 | =>L_B2 | *L_DQ |
| =>WR5B2 | WR5M2 | WR5E2 | =>SW5B2 | SW5M2 | SW5E2 | =>WR2B2 | WR2M2 | WR2E2 | =>SW2B2 | SW2M2 | SW2E2 | =>M_CX | =>M_C4 | =>M_A2 | M_CQ |
| =>SL5B2 | SL5M2 | SL5E2 | =>WS5B2 | WS5M2 | WS5E2 | =>SL2B2 | SL2M2 | SL2E2 | =>WS2B2 | WS2M2 | WS2E2 | M_DX | M_D4 | M_B2 | M_DQ |
| =>NR5B2 | NR5M2 | NR5E2 | =>WN5B2 | WN5M2 | WN5E2 | =>NR2B2 | NR2M2 | NR2E2 | =>WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

```
L_DMUX:  TO=28  FROM=0  (CLE output multiplexer output signal only drivable by CLE)
        ___STRAIGHT PENTS___   ___DIAGONAL PENTS___   ___STRAIGHT DOUBLES___   ___DIAGONAL DOUBLES___   CTRL      LUT INS       CLE
        /                 \    /                 \    /                   \    /                   \    / \      /       \     / \
        WL5B2   WL5M2   WL5E2  NW5B2   NW5M2   NW5E2  WL2B2   WL2M2   WL2E2   NW2B2   NW2M2   NW2E2    LH0       L_D6   L_B1   L_BMUX
        ER5B2   ER5M2   ER5E2  NE5B2   NE5M2   NE5E2  ER2B2   ER2M2   ER2E2   NE2B2   NE2M2   NE2E2    LV0       M_C6   M_A1   M_D
        NL5B2   NL5M2   NL5E2  EN5B2   EN5M2   EN5E2  NL2B2   NL2M2   NL2E2   EN2B2   EN2M2   EN2E2    M_DY      M_D6   M_B1   M_BMUX
        SR5B2   SR5M2   SR5E2  ES5B2   ES5M2   ES5E2  SR2B2   SR2M2   SR2E2   ES2B2   ES2M2   ES2E2    FAN1      L_C6   L_A1   L_D
        EL5B2   EL5M2   EL5E2  SE5B2   SE5M2   SE5E2  EL2B2   EL2M2   EL2E2   SE2B2   SE2M2   SE2E2    L_DX      L_D4   L_B2   L_DQ
        WR5B2   WR5M2   WR5E2  SW5B2   SW5M2   SW5E2  WR2B2   WR2M2   WR2E2   SW2B2   SW2M2   SW2E2    M_CX      M_C4   M_A2   M_CQ
        SL5B2   SL5M2   SL5E2  WS5B2   WS5M2   WS5E2  SL2B2   SL2M2   SL2E2   WS2B2   WS2M2   WS2E2    M_DX      M_D4   M_B2   M_DQ
        NR5B2   NR5M2   NR5E2  WN5B2   WN5M2   WN5E2  NR2B2   NR2M2   NR2E2   WN2B2   WN2M2   WN2E2    L_CX      L_C4   L_A2   L_CQ
        =>WL5B1 WL5M1   WL5E1  =>NW5B1 NW5M1   NW5E1  =>WL2B1 WL2M1   WL2E1   =>NW2B1 NW2M1   NW2E1    M_CY      L_D5   L_B3   L_C
        =>ER5B1 ER5M1   ER5E1  =>NE5B1 NE5M1   NE5E1  =>ER2B1 ER2M1   ER2E1   =>NE2B1 NE2M1   NE2E1    M_WE      M_C5   M_A3   M_AMUX
        =>NL5B1 NL5M1   NL5E1  =>EN5B1 EN5M1   EN5E1  =>NL2B1 NL2M1   NL2E1   =>EN2B1 EN2M1   EN2E1    M_SR      M_D5   M_B3   M_C
        =>SR5B1 SR5M1   SR5E1  =>ES5B1 ES5M1   ES5E1  =>SR2B1 SR2M1   SR2E1   =>ES2B1 ES2M1   ES2E1    L_SR      L_C5   L_A3   L_AMUX
                                                                                                       GFAN0
                                                                                                       L_CLK
                                                                                                       M_CLK
                                                                                                       GFAN1
        EL5B1   EL5M1   EL5E1  SE5B1   SE5M1   SE5E1  =>EL2B1 EL2M1   EL2E1   =>SE2B1 SE2M1   SE2E1    M_CE  =>L_D3  =>L_B5   *L_DMUX
        WR5B1   WR5M1   WR5E1  SW5B1   SW5M1   SW5E1  =>WR2B1 WR2M1   WR2E1   =>SW2B1 SW2M1   SW2E1    L_CE  =>M_C3  =>M_A5   M_B
        SL5B1   SL5M1   SL5E1  WS5B1   WS5M1   WS5E1  =>SL2B1 SL2M1   SL2E1   =>WS2B1 WS2M1   WS2E1    RSVD      M_D3   M_B5   M_DMUX
        NR5B1   NR5M1   NR5E1  WN5B1   WN5M1   WN5E1  =>NR2B1 NR2M1   NR2E1   =>WN2B1 WN2M1   WN2E1    M_BY      L_C3   L_A5   L_B
        WL5B0   WL5M0   WL5E0  NW5B0   NW5M0   NW5E0  WL2B0   WL2M0   WL2E0   NW2B0   NW2M0   NW2E0    L_BX      L_D2   L_B4   L_BQ
        ER5B0   ER5M0   ER5E0  NE5B0   NE5M0   NE5E0  ER2B0   ER2M0   ER2E0   NE2B0   NE2M0   NE2E0    M_AX      M_C2   M_A4   M_AQ
        NL5B0   NL5M0   NL5E0  EN5B0   EN5M0   EN5E0  NL2B0   NL2M0   NL2E0   EN2B0   EN2M0   EN2E0    M_BX      M_D2   M_B4   M_BQ
        SR5B0   SR5M0   SR5E0  ES5B0   ES5M0   ES5E0  SR2B0   SR2M0   SR2E0   ES2B0   ES2M0   ES2E0    L_AX      L_C2   L_A4   L_AQ
        EL5B0   EL5M0   EL5E0  SE5B0   SE5M0   SE5E0  EL2B0   EL2M0   EL2E0   SE2B0   SE2M0   SE2E0    FAN0      L_D1   L_B6   L_A
        WR5B0   WR5M0   WR5E0  SW5B0   SW5M0   SW5E0  WR2B0   WR2M0   WR2E0   SW2B0   SW2M0   SW2E0    M_AY      M_C1   M_A6   M_CMUX
        SL5B0   SL5M0   SL5E0  WS5B0   WS5M0   WS5E0  SL2B0   SL2M0   SL2E0   WS2B0   WS2M0   WS2E0    LH18      M_D1   M_B6   M_A
        NR5B0   NR5M0   NR5E0  WN5B0   WN5M0   WN5E0  NR2B0   NR2M0   NR2E0   WN2B0   WN2M0   WN2E0    LV18      L_C1   L_A6   L_CMUX
```

L_D: TO=36 FROM=0  (LUT O6 output signal only drivable by CLE)

| STRAIGHT PENTS | | | DIAGONAL PENTS | | | STRAIGHT DOUBLES | | | DIAGONAL DOUBLES | | | CTRL | LUT INS | | CLE |
|---|---|---|---|---|---|---|---|---|---|---|---|---|---|---|---|
| =>WL5B2 | WL5M2 | WL5E2 | =>NW5B2 | NW5M2 | NW5E2 | =>WL2B2 | WL2M2 | WL2E2 | =>NW2B2 | NW2M2 | NW2E2 | LH0 | L_D6 | L_B1 | L_BMUX |
| =>ER5B2 | ER5M2 | ER5E2 | =>NE5B2 | NE5M2 | NE5E2 | =>ER2B2 | ER2M2 | ER2E2 | =>NE2B2 | NE2M2 | NE2E2 | LV0 | M_C6 | M_A1 | M_D |
| =>NL5B2 | NL5M2 | NL5E2 | =>EN5B2 | EN5M2 | EN5E2 | =>NL2B2 | NL2M2 | NL2E2 | =>EN2B2 | EN2M2 | EN2E2 | M_DY | =>M_D6 | =>M_B1 | M_BMUX |
| =>SR5B2 | SR5M2 | SR5E2 | =>ES5B2 | ES5M2 | ES5E2 | =>SR2B2 | SR2M2 | SR2E2 | =>ES2B2 | ES2M2 | ES2E2 | FAN1 | =>L_C6 | =>L_A1 | *L_D |
| =>EL5B2 | EL5M2 | EL5E2 | =>SE5B2 | SE5M2 | SE5E2 | =>EL2B2 | EL2M2 | EL2E2 | =>SE2B2 | SE2M2 | SE2E2 | L_DX | L_D4 | L_B2 | L_DQ |
| =>WR5B2 | WR5M2 | WR5E2 | =>SW5B2 | SW5M2 | SW5E2 | =>WR2B2 | WR2M2 | WR2E2 | =>SW2B2 | SW2M2 | SW2E2 | M_CX | M_C4 | M_A2 | M_CQ |
| =>SL5B2 | SL5M2 | SL5E2 | =>WS5B2 | WS5M2 | WS5E2 | =>SL2B2 | SL2M2 | SL2E2 | =>WS2B2 | WS2M2 | WS2E2 | M_DX | M_D4 | M_B2 | M_DQ |
| =>NR5B2 | NR5M2 | NR5E2 | =>WN5B2 | WN5M2 | WN5E2 | =>NR2B2 | NR2M2 | NR2E2 | =>WN2B2 | WN2M2 | WN2E2 | L_CX | L_C4 | L_A2 | L_CQ |
| WL5B1 | WL5M1 | WL5E1 | NW5B1 | NW5M1 | NW5E1 | WL2B1 | WL2M1 | WL2E1 | NW2B1 | NW2M1 | NW2E1 | M_CY | L_D5 | L_B3 | L_C |
| ER5B1 | ER5M1 | ER5E1 | NE5B1 | NE5M1 | NE5E1 | ER2B1 | ER2M1 | ER2E1 | NE2B1 | NE2M1 | NE2E1 | M_WE | M_C5 | M_A3 | M_AMUX |
| NL5B1 | NL5M1 | NL5E1 | EN5B1 | EN5M1 | EN5E1 | NL2B1 | NL2M1 | NL2E1 | EN2B1 | EN2M1 | EN2E1 | M_SR | M_D5 | M_B3 | M_C |
| SR5B1 | SR5M1 | SR5E1 | ES5B1 | ES5M1 | ES5E1 | SR2B1 | SR2M1 | SR2E1 | ES2B1 | ES2M1 | ES2E1 | L_SR | L_C5 | L_A3 | L_AMUX |
| | | | | | | | | | | | | GFAN0 | | | |
| | | | | | | | | | | | | L_CLK | | | |
| | | | | | | | | | | | | M_CLK | | | |
| | | | | | | | | | | | | GFAN1 | | | |
| EL5B1 | EL5M1 | EL5E1 | SE5B1 | SE5M1 | SE5E1 | EL2B1 | EL2M1 | EL2E1 | SE2B1 | SE2M1 | SE2E1 | M_CE | L_D3 | L_B5 | L_DMUX |
| WR5B1 | WR5M1 | WR5E1 | SW5B1 | SW5M1 | SW5E1 | WR2B1 | WR2M1 | WR2E1 | SW2B1 | SW2M1 | SW2E1 | L_CE | M_C3 | M_A5 | M_B |
| SL5B1 | SL5M1 | SL5E1 | WS5B1 | WS5M1 | WS5E1 | SL2B1 | SL2M1 | SL2E1 | WS2B1 | WS2M1 | WS2E1 | RSVD | M_D3 | M_B5 | M_DMUX |
| NR5B1 | NR5M1 | NR5E1 | WN5B1 | WN5M1 | WN5E1 | NR2B1 | NR2M1 | NR2E1 | WN2B1 | WN2M1 | WN2E1 | M_BY | L_C3 | L_A5 | L_B |
| WL5B0 | WL5M0 | WL5E0 | NW5B0 | NW5M0 | NW5E0 | WL2B0 | WL2M0 | WL2E0 | NW2B0 | NW2M0 | NW2E0 | L_BX | L_D2 | L_B4 | L_BQ |
| ER5B0 | ER5M0 | ER5E0 | NE5B0 | NE5M0 | NE5E0 | ER2B0 | ER2M0 | ER2E0 | NE2B0 | NE2M0 | NE2E0 | M_AX | M_C2 | M_A4 | M_AQ |
| NL5B0 | NL5M0 | NL5E0 | EN5B0 | EN5M0 | EN5E0 | NL2B0 | NL2M0 | NL2E0 | EN2B0 | EN2M0 | EN2E0 | M_BX | M_D2 | M_B4 | M_BQ |
| SR5B0 | SR5M0 | SR5E0 | ES5B0 | ES5M0 | ES5E0 | SR2B0 | SR2M0 | SR2E0 | ES2B0 | ES2M0 | ES2E0 | L_AX | L_C2 | L_A4 | L_AQ |
| EL5B0 | EL5M0 | EL5E0 | SE5B0 | SE5M0 | SE5E0 | EL2B0 | EL2M0 | EL2E0 | SE2B0 | SE2M0 | SE2E0 | FAN0 | L_D1 | L_B6 | L_A |
| WR5B0 | WR5M0 | WR5E0 | SW5B0 | SW5M0 | SW5E0 | WR2B0 | WR2M0 | WR2E0 | SW2B0 | SW2M0 | SW2E0 | M_AY | M_C1 | M_A6 | M_CMUX |
| SL5B0 | SL5M0 | SL5E0 | WS5B0 | WS5M0 | WS5E0 | SL2B0 | SL2M0 | SL2E0 | WS2B0 | WS2M0 | WS2E0 | LH18 | M_D1 | M_B6 | M_A |
| NR5B0 | NR5M0 | NR5E0 | WN5B0 | WN5M0 | WN5E0 | NR2B0 | NR2M0 | NR2E0 | WN2B0 | WN2M0 | WN2E0 | LV18 | L_C1 | L_A6 | L_CMUX |

```
FAN0:  TO=20  FROM=24 (incl. GHIGH/GND/V0 & VDD/V1, not shown)    (Input MUX driving bounce MUX)
      STRAIGHT PENTS          DIAGONAL PENTS         STRAIGHT DOUBLES        DIAGONAL DOUBLES       CTRL      LUT INS       CLE
     /              \        /              \       /              \        /              \       /    \    /      \     /      \
   WL5B2   WL5M2   WL5E2   NW5B2   NW5M2   NW5E2 <-WL2B2 <-WL2M2 <-WL2E2   NW2B2   NW2M2 <-NW2E2   LH0    L_D6   L_B1    L_BMUX
   ER5B2   ER5M2   ER5E2   NE5B2   NE5M2   NE5E2   ER2B2   ER2M2   ER2E2   NE2B2 <-NE2M2   NE2E2   LV0    M_C6   M_A1    M_D
   NL5B2   NL5M2   NL5E2   EN5B2   EN5M2   EN5E2   NL2B2   NL2M2   NL2E2   EN2B2   EN2M2   EN2E2   M_DY   M_D6   M_B1    M_BMUX
   SR5B2   SR5M2   SR5E2   ES5B2   ES5M2   ES5E2   SR2B2   SR2M2   SR2E2   ES2B2   ES2M2   ES2E2   FAN1   L_C6   L_A1    L_D
   EL5B2   EL5M2   EL5E2   SE5B2   SE5M2   SE5E2   EL2B2   EL2M2   EL2E2   SE2B2   SE2M2   SE2E2   L_DX   L_D4   L_B2    L_DQ
   WR5B2   WR5M2   WR5E2   SW5B2   SW5M2   SW5E2   WR2B2   WR2M2   WR2E2   SW2B2   SW2M2   SW2E2   M_CX   M_C4   M_A2    M_CQ
   SL5B2   SL5M2   SL5E2   WS5B2   WS5M2   WS5E2   SL2B2   SL2M2   SL2E2   WS2B2   WS2M2   WS2E2   M_DX   M_D4   M_B2    M_DQ
   NR5B2   NR5M2   NR5E2   WN5B2   WN5M2   WN5E2   NR2B2   NR2M2   NR2E2   WN2B2   WN2M2   WN2E2   L_CX   L_C4   L_A2    L_CQ
   WL5B1   WL5M1   WL5E1   NW5B1   NW5M1   NW5E1   WL2B1   WL2M1   WL2E1   NW2B1   NW2M1   NW2E1   M_CY  =>L_D5 =>L_B3   L_C
   ER5B1   ER5M1   ER5E1   NE5B1   NE5M1   NE5E1   ER2B1   ER2M1   ER2E1   NE2B1   NE2M1   NE2E1   M_WE  =>M_C5 =>M_A3   M_AMUX
   NL5B1   NL5M1   NL5E1   EN5B1   EN5M1   EN5E1   NL2B1   NL2M1   NL2E1   EN2B1   EN2M1   EN2E1   M_SR  =>M_D5 =>M_B3   M_C
   SR5B1   SR5M1   SR5E1   ES5B1   ES5M1   ES5E1   SR2B1   SR2M1   SR2E1   ES2B1   ES2M1   ES2E1   L_SR  =>L_C5 =>L_A3   L_AMUX
                                                                                                   <>GFAN0
                                                                                                   =>L_CLK
                                                                                                   M_CLK
                                                                                                   <=GFAN1
   EL5B1   EL5M1   EL5E1   SE5B1   SE5M1   SE5E1   EL2B1   EL2M1   EL2E1   SE2B1   SE2M1   SE2E1 =>M_CE =>L_D3 =>L_B5   L_DMUX
   WR5B1   WR5M1   WR5E1   SW5B1   SW5M1   SW5E1   WR2B1 <=WR2M1 <=WR2E1   SW2B1   SW2M1   SW2E1 =>L_CE =>M_C3 =>M_A5   M_B
   SL5B1   SL5M1   SL5E1   WS5B1   WS5M1   WS5E1   SL2B1 <=SL2M1 <=SL2E1   WS2B1   WS2M1   WS2E1   RSVD =>M_D3 =>M_B5   M_DMUX
   NR5B1   NR5M1   NR5E1   WN5B1   WN5M1   WN5E1   NR2B1   NR2M1   NR2E1   WN2B1   WN2M1   WN2E1   M_BY =>L_C3 =>L_A5   L_B
   WL5B0   WL5M0   WL5E0   NW5B0   NW5M0   NW5E0   WL2B0   WL2M0   WL2E0   NW2B0   NW2M0   NW2E0   L_BX   L_D2   L_B4    L_BQ
   ER5B0   ER5M0   ER5E0   NE5B0   NE5M0   NE5E0   ER2B0   ER2M0   ER2E0   NE2B0   NE2M0   NE2E0   M_AX   M_C2   M_A4    M_AQ
   NL5B0   NL5M0   NL5E0   EN5B0   EN5M0   EN5E0   NL2B0   NL2M0   NL2E0   EN2B0 <=EN2M0   EN2E0   M_BX   M_D2   M_B4    M_BQ
   SR5B0   SR5M0   SR5E0   ES5B0   ES5M0   ES5E0 <=SR2B0 <=SR2M0 <=SR2E0   ES2B0   ES2M0 <=ES2E0   L_AX   L_C2   L_A4    L_AQ
   EL5B0   EL5M0   EL5E0   SE5B0   SE5M0   SE5E0   EL2B0   EL2M0   EL2E0   SE2B0 <=SE2M0   SE2E0  *FAN0   L_D1   L_B6    L_A
   WR5B0   WR5M0   WR5E0   SW5B0   SW5M0   SW5E0 <=WR2B0   WR2M0   WR2E0   SW2B0   SW2M0 <=SW2E0   M_AY   M_C1   M_A6    M_CMUX
   SL5B0   SL5M0   SL5E0   WS5B0   WS5M0   WS5E0 <=SL2B0   SL2M0   SL2E0   WS2B0   WS2M0 <=WS2E0   LH18   M_D1   M_B6    M_A
   NR5B0   NR5M0   NR5E0   WN5B0   WN5M0   WN5E0   NR2B0   NR2M0   NR2E0   WN2B0 <=WN2M0   WN2E0   LV18   L_C1   L_A6    L_CMUX
```

```
GFAN0: TO=10 FROM=16 (incl. 10 global & 4 regional clock signals, not shown)   (Fan MUX)
      STRAIGHT PENTS        DIAGONAL PENTS       STRAIGHT DOUBLES      DIAGONAL DOUBLES    CTRL    LUT INS     CLE
      /              \      /              \     /              \      /              \    /   \   /     \    /    \
     WL5B2   WL5M2   WL5E2  NW5B2   NW5M2   NW5E2  WL2B2   WL2M2   WL2E2  NW2B2   NW2M2   NW2E2   LH0    L_D6  L_B1   L_BMUX
     ER5B2   ER5M2   ER5E2  NE5B2   NE5M2   NE5E2  ER2B2   ER2M2   ER2E2  NE2B2   NE2M2   NE2E2   LV0    M_C6  M_A1   M_D
     NL5B2   NL5M2   NL5E2  EN5B2   EN5M2   EN5E2  NL2B2   NL2M2   NL2E2  EN2B2   EN2M2   EN2E2   =>M_DY M_D6  M_B1   M_BMUX
     SR5B2   SR5M2   SR5E2  ES5B2   ES5M2   ES5E2  SR2B2   SR2M2   SR2E2  ES2B2   ES2M2   ES2E2   =>FAN1 L_C6  L_A1   L_D
     EL5B2   EL5M2   EL5E2  SE5B2   SE5M2   SE5E2  EL2B2   EL2M2   EL2E2  SE2B2   SE2M2   SE2E2   L_DX   L_D4  L_B2   L_DQ
     WR5B2   WR5M2   WR5E2  SW5B2   SW5M2   SW5E2  WR2B2   WR2M2   WR2E2  SW2B2   SW2M2   SW2E2   M_CX   M_C4  M_A2   M_CQ
     SL5B2   SL5M2   SL5E2  WS5B2   WS5M2   WS5E2  SL2B2   SL2M2   SL2E2  WS2B2   WS2M2   WS2E2   M_DX   M_D4  M_B2   M_DQ
     NR5B2   NR5M2   NR5E2  WN5B2   WN5M2   WN5E2  NR2B2   NR2M2   NR2E2  WN2B2   WN2M2   WN2E2   L_CX   L_C4  L_A2   L_CQ
     WL5B1   WL5M1   WL5E1  NW5B1   NW5M1   NW5E1  WL2B1   WL2M1   WL2E1  NW2B1   NW2M1   NW2E1   =>M_CY L_D5  L_B3   L_C
     ER5B1   ER5M1   ER5E1  NE5B1   NE5M1   NE5E1  ER2B1   ER2M1   ER2E1  NE2B1   NE2M1   NE2E1   <=M_WE M_C5  M_A3   M_AMUX
     NL5B1   NL5M1   NL5E1  EN5B1   EN5M1   EN5E1  NL2B1   NL2M1   NL2E1  EN2B1   EN2M1   EN2E1   =>M_SR M_D5  M_B3   M_C
     SR5B1   SR5M1   SR5E1  ES5B1   ES5M1   ES5E1  SR2B1   SR2M1   SR2E1  ES2B1   ES2M1   ES2E1   =>L_SR L_C5  L_A3   L_AMUX
                                                                                                  *GPAN0
                                                                                                  L_CLK
                                                                                                  M_CLK
                                                                                                  GFAN1
     EL5B1   EL5M1   EL5E1  SE5B1   SE5M1   SE5E1  EL2B1   EL2M1   EL2E1  SE2B1   SE2M1   SE2E1   =>M_CE L_D3  L_B5   L_DMUX
     WR5B1   WR5M1   WR5E1  SW5B1   SW5M1   SW5E1  WR2B1   WR2M1   WR2E1  SW2B1   SW2M1   SW2E1   =>L_CE M_C3  M_A5   M_B
     SL5B1   SL5M1   SL5E1  WS5B1   WS5M1   WS5E1  SL2B1   SL2M1   SL2E1  WS2B1   WS2M1   WS2E1   =>RSVD M_D3  M_B5   M_DMUX
     NR5B1   NR5M1   NR5E1  WN5B1   WN5M1   WN5E1  NR2B1   NR2M1   NR2E1  WN2B1   WN2M1   WN2E1   =>M_BY L_C3  L_A5   L_B
     WL5B0   WL5M0   WL5E0  NW5B0   NW5M0   NW5E0  WL2B0   WL2M0   WL2E0  NW2B0   NW2M0   NW2E0   L_BX   L_D2  L_B4   L_BQ
     ER5B0   ER5M0   ER5E0  NE5B0   NE5M0   NE5E0  ER2B0   ER2M0   ER2E0  NE2B0   NE2M0   NE2E0   M_AX   M_C2  M_A4   M_AQ
     NL5B0   NL5M0   NL5E0  EN5B0   EN5M0   EN5E0  NL2B0   NL2M0   NL2E0  EN2B0   EN2M0   EN2E0   M_BX   M_D2  M_B4   M_BQ
     SR5B0   SR5M0   SR5E0  ES5B0   ES5M0   ES5E0  SR2B0   SR2M0   SR2E0  ES2B0   ES2M0   ES2E0   L_AX   L_C2  L_A4   L_AQ
     EL5B0   EL5M0   EL5E0  SE5B0   SE5M0   SE5E0  EL2B0   EL2M0   EL2E0  SE2B0   SE2M0   SE2E0   <=FAN0 L_D1  L_B6   L_A
     WR5B0   WR5M0   WR5E0  SW5B0   SW5M0   SW5E0  WR2B0   WR2M0   WR2E0  SW2B0   SW2M0   SW2E0   =>M_AY M_C1  M_A6   M_CMUX
     SL5B0   SL5M0   SL5E0  WS5B0   WS5M0   WS5E0  SL2B0   SL2M0   SL2E0  WS2B0   WS2M0   WS2E0   LH18   M_D1  M_B6   M_A
     NR5B0   NR5M0   NR5E0  WN5B0   WN5M0   WN5E0  NR2B0   NR2M0   NR2E0  WN2B0   WN2M0   WN2E0   LV18   L_C1  L_A6   L_CMUX
```

APPENDIX C

EACH STRUCTURE CAN BE PROGRAMMABLY DRIVEN BY THE FOLLOWING STRUCTURES/SIGNALS:

```
M_SR  <- NL2M0 NL2E0 ER2M0 ER2E0 SW2M1 SE2E1 EL2B1 EL2M1 EL2E1 ES2M1 EN2E1 NL2B1 NE2E1 ER2B1 NW2M1 WN2E2 NR2B2 NR2M2 NR2E2
         WS2M2 GFAN1 GFAN0 RSVD FAN1 (24)
L_SR  <- NL2M0 NL2E0 ER2M0 ER2E0 SW2M1 SE2E1 EL2B1 EL2M1 EL2E1 ES2M1 EN2E1 NL2B1 NE2E1 ER2B1 NW2M1 WN2E2 NR2B2 NR2M2 NR2E2
         WS2M2 GFAN1 GFAN0 RSVD FAN1 (24)
M_CE  <- NE2M0 NW2E0 WL2B0 WL2M0 WL2E0 WN2M1 WS2E1 SL2B1 SW2E1 WR2B1 SE2M1 ES2E1 SR2B1 SR2M1 SR2E1 EN2M1 SL2M2 SL2E2 WR2M2
         WR2E2 GFAN1 GFAN0 M_WE FAN0 (24)
L_CE  <- NE2M0 NW2E0 WL2B0 WL2M0 WL2E0 WN2M1 WS2E1 SL2B1 SW2E1 WR2B1 SE2M1 ES2E1 SR2B1 SR2M1 SR2E1 EN2M1 SL2M2 SL2E2 WR2M2
         WR2B2 GFAN1 GFAN0 M_WE FAN0 (24)
GFAN1 <- RCLK3 RCLK2 RCLK1 RCLK0 GCLK9 GCLK8 GCLK7 GCLK6 GCLK5 GCLK4 GCLK3 GCLK2 GCLK1 GCLK0 RSVD FAN1 (16)
M_CLK <- RCLK3 RCLK2 RCLK1 RCLK0 GCLK9 GCLK8 GCLK7 GCLK6 GCLK5 GCLK4 GCLK3 GCLK2 GCLK1 GCLK0 M_WE FAN0 (16)
L_CLK <- RCLK3 RCLK2 RCLK1 RCLK0 GCLK9 GCLK8 GCLK7 GCLK6 GCLK5 GCLK4 GCLK3 GCLK2 GCLK1 GCLK0 M_WE FAN0 (16)
GFAN0 <- RCLK3 RCLK2 RCLK1 RCLK0 GCLK9 GCLK8 GCLK7 GCLK6 GCLK5 GCLK4 GCLK3 GCLK2 GCLK1 GCLK0 M_WE FAN0 (16)
M_DY  <- WN2E0_U NR2B0_U NR2M0_U NR2E0_U WS2M0_U NL2M1 NL2E1 ER2M1 ER2E1 SW2M2 SE2E2 EL2B2 EL2M2 EL2E2 ES2M2 EN2E2 NL2B2
         NE2E2 ER2B2 NW2M2 V0 V1 GFAN1 GFAN0 (24)
FAN1  <- WN2E0_U NR2B0_U NR2M0_U NR2E0_U WS2M0_U NL2M1 NL2E1 ER2M1 ER2E1 SW2M2 SE2E2 EL2B2 EL2M2 EL2E2 ES2M2 EN2E2 NL2B2
         NE2E2 ER2B2 NW2M2 V0 V1 GFAN1 GFAN0 (24)
M_CY  <- NL2M0 NL2E0 ER2M0 ER2E0 SW2M1 SE2E1 EL2B1 EL2M1 EL2E1 ES2M1 EN2E1 NL2B1 NE2E1 ER2B1 NW2M1 WN2E2 NR2B2 NR2M2 NR2E2
         WS2M2 V0 V1 GFAN1 GFAN0 (24)
M_WE  <- NL2M0 NL2E0 ER2M0 ER2E0 SW2M1 SE2E1 EL2B1 EL2M1 EL2E1 ES2M1 EN2E1 NL2B1 NE2E1 ER2B1 NW2M1 WN2E2 NR2B2 NR2M2 NR2E2
         WS2M2 V0 V1 GFAN1 GFAN0 (24)
RSVD  <- NE2M0 NW2E0 WL2B0 WL2M0 WL2E0 WN2M1 WS2E1 SL2B1 SW2E1 WR2B1 SE2M1 ES2E1 SR2B1 SR2M1 SR2E1 EN2M1 SL2M2 SL2E2 WR2M2
         WR2E2 V0 V1 GFAN1 GFAN0 (24)
M_BY  <- NE2M0 NW2E0 WL2B0 WL2M0 WL2E0 WN2M1 WS2E1 SL2B1 SW2E1 WR2B1 SE2M1 ES2E1 SR2B1 SR2M1 SR2E1 EN2M1 SL2M2 SL2E2 WR2M2
         WR2E2 V0 V1 GFAN1 GFAN0 (24)
FAN0  <- WN2M0 WS2E0 SL2B0 SW2E0 WR2B0 SE2M0 ES2E0 SR2B0 SR2M0 SR2E0 EN2M0 SL2M1 SL2E1 WR2M1 WR2E1 NE2M2_D NW2E2_D WL2B2_D
         WL2M2_D WL2E2_D V0 V1 GFAN1 GFAN0 (24)
M_AY  <- WN2M0 WS2E0 SL2B0 SW2E0 WR2B0 SE2M0 ES2E0 SR2B0 SR2M0 SR2E0 EN2M0 SL2M1 SL2E1 WR2M1 WR2E1 NE2M2_D NW2E2_D WL2B2_D
         WL2M2_D WL2E2_D V0 V1 GFAN1 GFAN0 (24)
```

```
LH0  <-  WN2E0_U NR2B0_U NR2E0_U WS2M0_U NL2E1 ER2E1 SW2M2 SE2E2 EL2B2 EL2E2 ES2M2 EN2E2 NL2B2 NE2E2 ER2B2 NW2M2 LV6 LV0
         LH18 LV18 (20)
LV0  <-  WN2E0_U NR2B0_U NR2E0_U WS2M0_U NL2E1 ER2E1 SW2M2 SE2E2 EL2B2 EL2E2 ES2M2 EN2E2 NL2B2 NE2E2 ER2B2 NW2M2 LH0 LH12
         LH18 LV18 (20)
LH18 <-  WN2M0 WS2E0 SL2B0 SW2E0 WR2B0 SE2M0 ES2E0 SR2B0 SR2E0 EN2M0 SL2E1 WR2E1 NE2M2_D NW2E2_D WL2B2_D WL2E2_D LH0 LV0
         LV12 LV18 (20)
LV18 <-  WN2M0 WS2E0 SL2B0 SW2E0 WR2B0 SE2M0 ES2E0 SR2B0 SR2E0 EN2M0 SL2E1 WR2E1 NE2M2_D NW2E2_D WL2B2_D WL2E2_D LH6 LH0
         LV0 LH18 (20)
L_DX <-  SL2M0_U SL2E0_U WR2M0_U WR2E0_U NE2M1 NW2E1 WL2B1 WL2M1 WL2E1 WN2M2 WS2E2 SL2B2 SW2E2 WR2B2 SE2M2 ES2E2 SR2B2
         SR2M2 SR2E2 EN2M2 M_CY M_AY_U M_CQ L_DQ (24)
M_CX <-  SL2M0_U SL2E0_U WR2M0_U WR2E0_U NE2M1 NW2E1 WL2B1 WL2M1 WL2E1 WN2M2 WS2E2 SL2B2 SW2E2 WR2B2 SE2M2 ES2E2 SR2B2
         SR2M2 SR2E2 EN2M2 M_CY M_AY_U M_CQ L_DQ (24)
M_DX <-  SL2M0_U SL2E0_U WR2M0_U WR2E0_U NE2M1 NW2E1 WL2B1 WL2M1 WL2E1 WN2M2 WS2E2 SL2B2 SW2E2 WR2B2 SE2M2 ES2E2 SR2B2
         SR2M2 SR2E2 EN2M2 M_CY M_AY_U L_CQ M_DQ (24)
L_CX <-  SL2M0_U SL2E0_U WR2M0_U WR2E0_U NE2M1 NW2E1 WL2B1 WL2M1 WL2E1 WN2M2 WS2E2 SL2B2 SW2E2 WR2B2 SE2M2 ES2E2 SR2B2
         SR2M2 SR2E2 EN2M2 M_CY M_AY_U L_CQ M_DQ (24)
L_BX <-  SW2M0 SE2B0 EL2B0 EL2M0 EL2E0 ES2M0 EN2E0 NL2B0 NE2E0 ER2B0 NW2M0 WN2E1 NR2B1 NR2M1 NR2E1 WS2M1 NL2M2_D NL2E2_D
         ER2M2_D ER2E2_D M_BY M_DY_D L_BQ M_AQ (24)
M_AX <-  SW2M0 SE2B0 EL2B0 EL2M0 EL2E0 ES2M0 EN2E0 NL2B0 NE2E0 ER2B0 NW2M0 WN2E1 NR2B1 NR2M1 NR2E1 WS2M1 NL2M2_D NL2E2_D
         ER2M2_D ER2E2_D M_BY M_DY_D L_BQ M_AQ (24)
M_BX <-  SW2M0 SE2B0 EL2B0 EL2M0 EL2E0 ES2M0 EN2E0 NL2B0 NE2E0 ER2B0 NW2M0 WN2E1 NR2B1 NR2M1 NR2E1 WS2M1 NL2M2_D NL2E2_D
         ER2M2_D ER2E2_D M_BY M_DY_D M_BQ L_AQ (24)
L_AX <-  SW2M0 SE2B0 EL2B0 EL2M0 EL2E0 ES2M0 EN2E0 NL2B0 NE2E0 ER2B0 NW2M0 WN2E1 NR2B1 NR2M1 NR2E1 WS2M1 NL2M2_D NL2E2_D
         ER2M2_D ER2E2_D M_BY M_DY_D M_BQ L_AQ (24)
V0   <-  (0)
V1   <-  (0)
RCLK3 <- (0)
RCLK2 <- (0)
RCLK1 <- (0)
RCLK0 <- (0)
GCLK9 <- (0)
GCLK8 <- (0)
GCLK7 <- (0)
GCLK6 <- (0)
```

```
GCLK5 <- (0)
GCLK4 <- (0)
GCLK3 <- (0)
GCLK2 <- (0)
GCLK1 <- (0)
GCLK0 <- (0)
L_BMUX <- (0)
M_D <- (0)
M_BMUX <- (0)
L_D <- (0)
L_DQ <- (0)
M_CQ <- (0)
M_DQ <- (0)
L_CQ <- (0)
L_C <- (0)
M_AMUX <- (0)
M_C <- (0)
L_AMUX <- (0)
L_DMUX <- (0)
M_B <- (0)
M_DMUX <- (0)
L_B <- (0)
L_BQ <- (0)
M_AQ <- (0)
M_BQ <- (0)
L_AQ <- (0)
L_A <- (0)
M_CMUX <- (0)
M_A <- (0)
L_CMUX <- (0)
L_D6 <- M_CE L_BX M_CX M_BX_U M_CY M_AY_U L_BMUX M_D NW2M2 ER2B2 NE2E2 NL2B2 EN2E2 ES2M2 EL2E2 EL2M2 EL2B2 SE2E2 SW2M2
        ER2E1 ER2M1 NL2E1 NL2M1 WS2M0_U NR2E0_U NR2M0_U NR2B0_U WN2E0_U (28)
L_B1 <- M_CE L_BX M_CX M_BX_U M_CY M_AY_U L_BMUX M_D NW2M2 ER2B2 NE2E2 NL2B2 EN2E2 ES2M2 EL2E2 EL2M2 EL2B2 SE2E2 SW2M2
        ER2E1 ER2M1 NL2E1 NL2M1 WS2M0_U NR2E0_U NR2M0_U NR2B0_U WN2E0_U (28)
```

```
M_C6 <-  M_CE L_BX M_CX M_BX_U M_CY M_AY_U L_BMUX M_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
M_A1 <-  M_CE L_BX M_CX M_BX_U M_CY M_AY_U L_BMUX M_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
M_D6 <-  M_CE L_BX M_CX M_BX_U M_CY M_AY_U M_BMUX L_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
M_B1 <-  M_CE L_BX M_CX M_BX_U M_CY M_AY_U M_BMUX L_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
L_C6 <-  M_CE L_BX M_CX M_BX_U M_CY M_AY_U M_BMUX L_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
L_A1 <-  M_CE L_BX M_CX M_BX_U M_CY M_AY_U M_BMUX L_D NW2M2 ER2B2 NE2E2 NL2B2 EN2E2 ES2M2 EL2E2 EL2M2 EL2B2 SE2E2 SW2M2
         ER2E1 ER2M1 NL2E1 NL2M1 WS2M0_U NR2E0_U NR2M0_U NR2B0_U WN2E0_U (28)
L_D4 <-  L_CE_U L_BX L_AX_U RSVD M_CY M_AY_U L_DQ M_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
L_B2 <-  L_CE_U L_BX L_AX_U RSVD M_CY M_AY_U L_DQ M_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
M_C4 <-  L_CE_U L_BX L_AX_U RSVD M_CY M_AY_U L_DQ M_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
M_A2 <-  L_CE_U L_BX L_AX_U RSVD M_CY M_AY_U L_DQ M_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
M_D4 <-  L_CE_U L_BX L_AX_U RSVD M_CY M_AY_U M_DQ L_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
M_B2 <-  L_CE_U L_BX L_AX_U RSVD M_CY M_AY_U M_DQ L_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
L_C4 <-  L_CE_U L_BX L_AX_U RSVD M_CY M_AY_U M_DQ L_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
L_A2 <-  L_CE_U L_BX L_AX_U RSVD M_CY M_AY_U M_DQ L_CQ EN2M2 SR2E2 SR2M2 SR2B2 ES2E2 SE2M2 WR2B2 SW2E2 SL2B2 WS2E2 WN2M2
         WL2E1 WL2M1 WL2B1 NW2E1 NE2M1 WR2E0_U WR2M0_U SL2E0_U SL2M0_U (28)
L_D5 <-  M_DX M_AX L_AX_U RSVD FAN1 FAN0 L_C M_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
L_B3 <-  M_DX M_AX L_AX_U RSVD FAN1 FAN0 L_C M_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
M_C5 <-  M_DX M_AX L_AX_U RSVD FAN1 FAN0 L_C M_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
```

```
M_A3 <-  M_DX M_AX L_AX_U RSVD FAN1 FAN0 L_C M_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
M_D5 <-  M_DX M_AX L_AX_U RSVD FAN1 FAN0 M_C L_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
M_B3 <-  M_DX M_AX L_AX_U RSVD FAN1 FAN0 M_C L_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
L_C5 <-  M_DX M_AX L_AX_U RSVD FAN1 FAN0 M_C L_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
L_A3 <-  M_DX M_AX L_AX_U RSVD FAN1 FAN0 M_C L_AMUX WS2M2 NR2E2 NR2M2 NR2B2 WN2E2 NW2M1 ER2B1 NE2E1 NL2B1 EN2E1 ES2M1 EL2E1
         EL2M1 EL2B1 SE2E1 SW2M1 ER2E0 ER2M0 NL2E0 NL2M0 (28)
L_D3 <-  M_DX M_AX L_DX_D M_WE FAN1 FAN0 L_DMUX M_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
L_B5 <-  M_DX M_AX L_DX_D M_WE FAN1 FAN0 L_DMUX M_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
M_C3 <-  M_DX M_AX L_DX_D M_WE FAN1 FAN0 L_DMUX M_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
M_A5 <-  M_DX M_AX L_DX_D M_WE FAN1 FAN0 L_DMUX M_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
M_D3 <-  M_DX M_AX L_DX_D M_WE FAN1 FAN0 M_DMUX L_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
M_B5 <-  M_DX M_AX L_DX_D M_WE FAN1 FAN0 M_DMUX L_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
L_C3 <-  M_DX M_AX L_DX_D M_WE FAN1 FAN0 M_DMUX L_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
L_A5 <-  M_DX M_AX L_DX_D M_WE FAN1 FAN0 M_DMUX L_B WR2E2 WR2M2 SL2E2 SL2M2 EN2M1 SR2E1 SR2M1 SR2B1 ES2E1 SE2M1 WR2B1 SW2E1
         SL2B1 WS2E1 WN2M1 WL2E0 WL2M0 WL2B0 NW2E0 NE2M0 (28)
L_D2 <-  M_SR_D L_CX L_DX_D M_WE M_BY M_DY_D L_BQ M_AQ ER2E2_D ER2M2_D NL2E2_D NL2M2_D WS2M1 NR2E1 NR2M1 NR2B1 WN2E1 NW2M0
         ER2B0 NE2E0 NL2B0 EN2E0 ES2M0 EL2E0 EL2M0 EL2B0 SE2E0 SW2M0 (28)
L_B4 <-  M_SR_D L_CX L_DX_D M_WE M_BY M_DY_D L_BQ M_AQ ER2E2_D ER2M2_D NL2E2_D NL2M2_D WS2M1 NR2E1 NR2M1 NR2B1 WN2E1 NW2M0
         ER2B0 NE2E0 NL2B0 EN2E0 ES2M0 EL2E0 EL2M0 EL2B0 SE2E0 SW2M0 (28)
M_C2 <-  M_SR_D L_CX L_DX_D M_WE M_BY M_DY_D L_BQ M_AQ ER2E2_D ER2M2_D NL2E2_D NL2M2_D WS2M1 NR2E1 NR2M1 NR2B1 WN2E1 NW2M0
         ER2B0 NE2E0 NL2B0 EN2E0 ES2M0 EL2E0 EL2M0 EL2B0 SE2E0 SW2M0 (28)
M_A4 <-  M_SR_D L_CX L_DX_D M_WE M_BY M_DY_D L_BQ M_AQ ER2E2_D ER2M2_D NL2E2_D NL2M2_D WS2M1 NR2E1 NR2M1 NR2B1 WN2E1 NW2M0
         ER2B0 NE2E0 NL2B0 EN2E0 ES2M0 EL2E0 EL2M0 EL2B0 SE2E0 SW2M0 (28)
```

```
M_D2 <- M_SR_D L_CX L_DX_D M_WE M_BY M_DY_D M_BQ L_AQ ER2E2_D ER2M2_D NL2E2_D NL2M2_D WS2M1 NR2E1 NR2M1 NR2B1 WN2E1 NW2M0
        ER2B0 NE2E0 NL2B0 EN2E0 ES2M0 EL2E0 EL2M0 EL2B0 SE2E0 SW2M0 (28)
M_B4 <- M_SR_D L_CX L_DX_D M_WE M_BY M_DY_D M_BQ L_AQ ER2E2_D ER2M2_D NL2E2_D NL2M2_D WS2M1 NR2E1 NR2M1 NR2B1 WN2E1 NW2M0
        ER2B0 NE2E0 NL2B0 EN2E0 ES2M0 EL2E0 EL2M0 EL2B0 SE2E0 SW2M0 (28)
L_C2 <- M_SR_D L_CX L_DX_D M_WE M_BY M_DY_D M_BQ L_AQ ER2E2_D ER2M2_D NL2E2_D NL2M2_D WS2M1 NR2E1 NR2M1 NR2B1 WN2E1 NW2M0
        ER2B0 NE2E0 NL2B0 EN2E0 ES2M0 EL2E0 EL2M0 EL2B0 SE2E0 SW2M0 (28)
L_A4 <- M_SR_D L_CX L_DX_D M_WE M_BY M_DY_D M_BQ L_AQ ER2E2_D ER2M2_D NL2E2_D NL2M2_D WS2M1 NR2E1 NR2M1 NR2B1 WN2E1 NW2M0
        ER2B0 NE2E0 NL2B0 EN2E0 ES2M0 EL2E0 EL2M0 EL2B0 SE2E0 SW2M0 (28)
L_D1 <- L_SR L_CX M_CX_D M_BX M_BY M_DY_D L_A M_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
L_B6 <- L_SR L_CX M_CX_D M_BX M_BY M_DY_D L_A M_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
M_C1 <- L_SR L_CX M_CX_D M_BX M_BY M_DY_D L_A M_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
M_A6 <- L_SR L_CX M_CX_D M_BX M_BY M_DY_D L_A M_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
M_D1 <- L_SR L_CX M_CX_D M_BX M_BY M_DY_D M_A L_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
M_B6 <- L_SR L_CX M_CX_D M_BX M_BY M_DY_D M_A L_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
L_C1 <- L_SR L_CX M_CX_D M_BX M_BY M_DY_D M_A L_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
L_A6 <- L_SR L_CX M_CX_D M_BX M_BY M_DY_D M_A L_CMUX WL2E2_D WL2M2_D WL2B2_D NW2E2_D NE2M2_D WR2E1 WR2M1 SL2E1 SL2M1 EN2M0
        SR2E0 SR2M0 SR2B0 ES2E0 SE2M0 WR2B0 SW2E0 SL2B0 WS2E0 WN2M0 (28)
WL5B2 <- LH0 M_D M_BMUX L_D L_DQ M_CQ M_A_U L_CMUX NW5E2 NE5M2 NL5E2 NL5M2 WS5M0_U NR5E0_U NR5M0_U WN5E0_U (16)
NW5B2 <- LH0 M_D M_BMUX L_D L_DQ M_CQ M_A_U L_CMUX NW5E2 NE5M2 NL5E2 NL5M2 WS5M0_U NR5E0_U NR5M0_U WN5E0_U (16)
ER5B2 <- LH0 M_D M_BMUX L_D L_DQ M_CQ M_A_U L_CMUX_U NW5M2 NE5E2 NL5E2 NL5M2 EN5E2 ES5M2 NR5E0_U NR5M0_U (16)
NE5B2 <- LH0 M_D M_BMUX L_D L_DQ M_CQ M_A_U L_CMUX_U NW5M2 NE5E2 NL5E2 NL5M2 EN5E2 ES5M2 NR5E0_U NR5M0_U (16)
NL5B2 <- LH0 M_D M_BMUX L_D L_DQ M_CQ M_A_U L_CMUX_U NW5M2 ER5E2 ER5M2 NE5E2 EN5E2 ES5M2 EL5E2 EL5M2 (16)
EN5B2 <- LH0 M_D M_BMUX L_D L_DQ M_CQ M_A_U L_CMUX_U NW5M2 ER5E2 ER5M2 NE5E2 EN5E2 ES5M2 EL5E2 EL5M2 (16)
SR5B2 <- LH0 M_D M_BMUX L_D L_DQ M_CQ M_A_U L_CMUX_U ER5E2 ER5M2 EN5M2 ES5E2 EL5E2 EL5M2 SE5E2 SW5M2 (16)
ES5B2 <- LH0 M_D M_BMUX L_D L_DQ M_CQ M_A_U L_CMUX_U ER5E2 ER5M2 EN5M2 ES5E2 EL5E2 EL5M2 SE5E2 SW5M2 (16)
EL5B2 <- LV6 LV0 L_D L_DQ M_CQ M_DQ L_CQ L_C EN5M2 SR5E2 SR5M2 ES5E2 SE5E2 SW5M2 SL5E2 SL5M2 (16)
SE5B2 <- LV6 LV0 L_D L_DQ M_CQ M_DQ L_CQ L_C EN5M2 SR5E2 SR5M2 ES5E2 SE5E2 SW5M2 SL5E2 SL5M2 (16)
```

```
WR5B2 <- LV6 LV0 L_D L_DQ M_CQ M_DQ L_CQ L_C SR5E2 SR5M2 SE5M2 SW5E2 SL5E2 SL5M2 WS5E2 WN5M2 (16)
SW5B2 <- LV6 LV0 L_D L_DQ M_CQ M_DQ L_CQ L_C SR5E2 SR5M2 SE5M2 SW5E2 SL5E2 SL5M2 WS5E2 WN5M2 (16)
SL5B2 <- LV6 LV0 L_D L_DQ M_CQ M_DQ L_CQ L_C SE5M2 WR5E2 WR5M2 SW5E2 WS5E2 WN5M2 WL5E1 WL5M1 (16)
WS5B2 <- LV6 LV0 L_D L_DQ M_CQ M_DQ L_CQ L_C SE5M2 WR5E2 WR5M2 SW5E2 WS5E2 WN5M2 WL5E1 WL5M1 (16)
NR5B2 <- LV6 LV0 L_D L_DQ M_CQ M_DQ L_CQ L_C WR5E2 WR5M2 WS5M2 WN5E2 WL5E1 WL5M1 NW5E1 NE5M1 (16)
WN5B2 <- LV6 LV0 L_D L_DQ M_CQ M_DQ L_CQ L_C WR5E2 WR5M2 WS5M2 WN5E2 WL5E1 WL5M1 NW5E1 NE5M1 (16)
WL5B1 <- LH6 M_DQ L_CQ L_C M_AMUX M_C L_DMUX M_B WS5M2 NR5E2 NR5M2 WN5E2 NW5E1 NE5M1 NL5E1 NL5M1 (16)
NW5B1 <- LH6 M_DQ L_CQ L_C M_AMUX M_C L_DMUX M_B WS5M2 NR5E2 NR5M2 WN5E2 NW5E1 NE5M1 NL5E1 NL5M1 (16)
ER5B1 <- LH6 M_DQ L_CQ L_C M_AMUX M_C L_DMUX M_B NR5E2 NR5M2 NW5M1 NE5E1 NL5E1 NL5M1 EN5E1 ES5M1 (16)
NE5B1 <- LH6 M_DQ L_CQ L_C M_AMUX M_C L_DMUX M_B NR5E2 NR5M2 NW5M1 NE5E1 NL5E1 NL5M1 EN5E1 ES5M1 (16)
NL5B1 <- LH6 M_DQ L_CQ L_C M_AMUX M_C L_DMUX M_B NW5M1 ER5E1 ER5M1 NE5E1 EN5E1 ES5M1 EL5E1 EL5M1 (16)
EN5B1 <- LH6 M_DQ L_CQ L_C M_AMUX M_C L_DMUX M_B NW5M1 ER5E1 ER5M1 NE5E1 EN5E1 ES5M1 EL5E1 EL5M1 (16)
SR5B1 <- LH6 M_DQ L_CQ L_C M_AMUX M_C L_DMUX M_B ER5E1 ER5M1 EN5M1 ES5E1 EL5E1 EL5M1 SE5E1 SW5M1 (16)
ES5B1 <- LH6 M_DQ L_CQ L_C M_AMUX M_C L_DMUX M_B ER5E1 ER5M1 EN5M1 ES5E1 EL5E1 EL5M1 SE5E1 SW5M1 (16)
EL5B1 <- LH12 M_C L_AMUX M_B M_DMUX L_B L_BQ M_AQ EN5M1 SR5E1 SR5M1 ES5E1 SE5E1 SW5M1 SL5E1 SL5M1 (16)
SE5B1 <- LH12 M_C L_AMUX M_B M_DMUX L_B L_BQ M_AQ EN5M1 SR5E1 SR5M1 ES5E1 SE5E1 SW5M1 SL5E1 SL5M1 (16)
WR5B1 <- LH12 M_C L_AMUX M_B M_DMUX L_B L_BQ M_AQ SR5E1 SR5M1 SE5M1 SW5E1 SL5E1 SL5M1 WS5E1 WN5M1 (16)
SW5B1 <- LH12 M_C L_AMUX M_B M_DMUX L_B L_BQ M_AQ SR5E1 SR5M1 SE5M1 SW5E1 SL5E1 SL5M1 WS5E1 WN5M1 (16)
SL5B1 <- LH12 M_C L_AMUX M_B M_DMUX L_B L_BQ M_AQ SE5M1 WR5E1 WR5M1 SW5E1 WS5E1 WN5M1 WL5E0 WL5M0 (16)
WS5B1 <- LH12 M_C L_AMUX M_B M_DMUX L_B L_BQ M_AQ SE5M1 WR5E1 WR5M1 SW5E1 WS5E1 WN5M1 WL5E0 WL5M0 (16)
NR5B1 <- LH12 M_C L_AMUX M_B M_DMUX L_B L_BQ M_AQ WR5E1 WR5M1 WS5M1 WN5E1 WL5E0 WL5M0 NW5E0 NE5M0 (16)
WN5B1 <- LH12 M_C L_AMUX M_B M_DMUX L_B L_BQ M_AQ WR5E1 WR5M1 WS5M1 WN5E1 WL5E0 WL5M0 NW5E0 NE5M0 (16)
WL5B0 <- LV12 LV18 L_B L_BQ M_AQ M_BQ L_AQ L_A WS5M1 NR5E1 NR5M1 WN5E1 NW5E0 NE5M0 NL5E0 NL5M0 (16)
NW5B0 <- LV12 LV18 L_B L_BQ M_AQ M_BQ L_AQ L_A WS5M1 NR5E1 NR5M1 WN5E1 NW5E0 NE5M0 NL5E0 NL5M0 (16)
ER5B0 <- LV12 LV18 L_B L_BQ M_AQ M_BQ L_AQ L_A NR5E1 NR5M1 NW5M0 NE5E0 NL5E0 NL5M0 EN5E0 ES5M0 (16)
NE5B0 <- LV12 LV18 L_B L_BQ M_AQ M_BQ L_AQ L_A NR5E1 NR5M1 NW5M0 NE5E0 NL5E0 NL5M0 EN5E0 ES5M0 (16)
NL5B0 <- LV12 LV18 L_B L_BQ M_AQ M_BQ L_AQ L_A NW5M0 ER5E0 ER5M0 NE5E0 EN5E0 ES5M0 EL5E0 EL5M0 (16)
EN5B0 <- LV12 LV18 L_B L_BQ M_AQ M_BQ L_AQ L_A NW5M0 ER5E0 ER5M0 NE5E0 EN5E0 ES5M0 EL5E0 EL5M0 (16)
SR5B0 <- LV12 LV18 L_B L_BQ M_AQ M_BQ L_AQ L_A ER5E0 ER5M0 EN5M0 ES5E0 EL5E0 EL5M0 SE5E0 SW5M0 (16)
ES5B0 <- LV12 LV18 L_B L_BQ M_AQ M_BQ L_AQ L_A ER5E0 ER5M0 EN5M0 ES5E0 EL5E0 EL5M0 SE5E0 SW5M0 (16)
EL5B0 <- LH18 L_BMUX_D M_D_D M_BQ L_AQ L_A M_CMUX M_A EN5M0 SR5E0 SR5M0 ES5E0 SE5E0 SW5M0 SL5E0 SL5M0 (16)
SE5B0 <- LH18 L_BMUX_D M_D_D M_BQ L_AQ L_A M_CMUX M_A EN5M0 SR5E0 SR5M0 ES5E0 SE5E0 SW5M0 SL5E0 SL5M0 (16)
WR5B0 <- LH18 L_BMUX_D M_D_D M_BQ L_AQ L_A M_CMUX M_A SR5E0 SR5M0 SE5M0 SW5E0 SL5E0 SL5M0 WS5E0 WN5M0 (16)
SW5B0 <- LH18 L_BMUX_D M_D_D M_BQ L_AQ L_A M_CMUX M_A SR5E0 SR5M0 SE5M0 SW5E0 SL5E0 SL5M0 WS5E0 WN5M0 (16)
```

```
SL5B0 <-  LH18 L_BMUX_D M_D_D M_BQ L_AQ L_A M_CMUX M_A WL5E2_D WL5M2_D SE5M0 WR5E0 WR5M0 SW5E0 WS5E0 WN5M0 (16)
WS5B0 <-  LH18 L_BMUX_D M_D_D M_BQ L_AQ L_A M_CMUX M_A WL5E2_D WL5M2_D SE5M0 WR5E0 WR5M0 SW5E0 WS5E0 WN5M0 (16)
NR5B0 <-  LH18 L_BMUX_D M_D_D M_BQ L_AQ L_A M_CMUX M_A WL5E2_D WL5M2_D NW5E2_D NE5M2_D WR5E0 WR5M0 WS5M0 WN5E0 (16)
WN5B0 <-  LH18 L_BMUX_D M_D_D M_BQ L_AQ L_A M_CMUX M_A WL5E2_D WL5M2_D NW5E2_D NE5M2_D WR5E0 WR5M0 WS5M0 WN5E0 (16)
WL2B2 <-  L_BMUX M_D M_BMUX L_D L_DQ M_CQ M_A_U L_CMUX_U NW5E2 NE5M2 NL5E2 NL5M2 WS5M0_U NR5E0_U NR5M0_U WN5E0_U NW2E2
          NE2M2 NL2E1 NL2M1 WS2M0_U NR2E0_U NR2M0_U WN2E0_U (24)
NW2B2 <-  L_BMUX M_D M_BMUX L_D L_DQ M_CQ M_A_U L_CMUX_U NW5E2 NE5M2 NL5E2 NL5M2 WS5M0_U NR5E0_U NR5M0_U WN5E0_U NW2E2
          NE2M2 NL2E1 NL2M1 WS2M0_U NR2E0_U NR2M0_U WN2E0_U (24)
ER2B2 <-  L_BMUX M_D M_BMUX L_D L_DQ M_CQ M_A_U L_CMUX_U NW5M2 NE5E2 NL5E2 NL5M2 EN5E2 ES5M2 NR5E0_U NR5M0_U NW2M2 NE2E2
          EN2E2 ES2M2 NL2E1 NL2M1 NR2E0_U NR2M0_U (24)
NE2B2 <-  L_BMUX M_D M_BMUX L_D L_DQ M_CQ M_A_U L_CMUX_U NW5M2 NE5E2 NL5E2 NL5M2 EN5E2 ES5M2 NR5E0_U NR5M0_U NW2M2 NE2E2
          EN2E2 ES2M2 NL2E1 NL2M1 NR2E0_U NR2M0_U (24)
NL2B2 <-  L_BMUX M_D M_BMUX L_D L_DQ M_CQ M_A_U L_CMUX_U NW5M2 ER5E2 ER5M2 NE5E2 EN5E2 ES5M2 EL5E2 EL5M2 NW2M2 NE2E2 EN2E2
          ES2M2 EL2E2 EL2M2 ER2E1 ER2M1 (24)
EN2B2 <-  L_BMUX M_D M_BMUX L_D L_DQ M_CQ M_A_U L_CMUX_U NW5M2 ER5E2 ER5M2 NE5E2 EN5E2 ES5M2 EL5E2 EL5M2 NW2M2 NE2E2 EN2E2
          ES2M2 EL2E2 EL2M2 ER2E1 ER2M1 (24)
SR2B2 <-  L_BMUX M_D M_BMUX L_D L_DQ M_CQ M_A_U L_CMUX_U ER5E2 ER5M2 EN5M2 ES5E2 EL5E2 EL5M2 SE5E2 SW5M2 EN2M2 ES2E2 EL2E2
          EL2M2 SE2E2 SW2M2 ER2E1 ER2M1 (24)
ES2B2 <-  L_BMUX M_D M_BMUX L_D L_DQ M_CQ M_A_U L_CMUX_U ER5E2 ER5M2 EN5M2 ES5E2 EL5E2 EL5M2 SE5E2 SW5M2 EN2M2 ES2E2 EL2E2
          EL2M2 SE2E2 SW2M2 ER2E1 ER2M1 (24)
EL2B2 <-  M_BMUX L_D L_DQ M_CQ M_DQ L_CQ L_C M_AMUX EN5M2 SR5E2 SR5M2 ES5E2 SE5E2 SW5M2 SL5E2 SL5M2 EN2M2 SR2E2 SR2M2 ES2E2
          SE2E2 SW2M2 SL2E0_U SL2M0_U (24)
SE2B2 <-  M_BMUX L_D L_DQ M_CQ M_DQ L_CQ L_C M_AMUX EN5M2 SR5E2 SR5M2 ES5E2 SE5E2 SW5M2 SL5E2 SL5M2 EN2M2 SR2E2 SR2M2 ES2E2
          SE2E2 SW2M2 SL2E0_U SL2M0_U (24)
WR2B2 <-  M_BMUX L_D L_DQ M_CQ M_DQ L_CQ L_C M_AMUX SR5E2 SR5M2 SE5M2 SW5E2 SL5E2 SL5M2 WS5E2 WN5M2 SR2E2 SR2M2 SE2M2 SW2E2
          WS2E2 WN2M2 SL2E0_U SL2M0_U (24)
SW2B2 <-  M_BMUX L_D L_DQ M_CQ M_DQ L_CQ L_C M_AMUX SR5E2 SR5M2 SE5M2 SW5E2 SL5E2 SL5M2 WS5E2 WN5M2 SR2E2 SR2M2 SE2M2 SW2E2
          WS2E2 WN2M2 SL2E0_U SL2M0_U (24)
SL2B2 <-  M_BMUX L_D L_DQ M_CQ M_DQ L_CQ L_C M_AMUX SE5M2 WR5E2 WR5M2 SW5E2 WS5E2 WN5M2 WL5E1 WL5M1 SE2M2 SW2E2 WS2E2 WN2M2
          WL2E1 WL2M1 WR2E0_U WR2M0_U (24)
WS2B2 <-  M_BMUX L_D L_DQ M_CQ M_DQ L_CQ L_C M_AMUX SE5M2 WR5E2 WR5M2 SW5E2 WS5E2 WN5M2 WL5E1 WL5M1 SE2M2 SW2E2 WS2E2 WN2M2
          WL2E1 WL2M1 WR2E0_U WR2M0_U (24)
NR2B2 <-  M_BMUX L_D L_DQ M_CQ M_DQ L_CQ L_C M_AMUX WR5E2 WR5M2 WS5M2 WN5E2 WL5E1 WL5M1 NW5E1 NE5M1 WS2M2 WN2E2 WL2E1 WL2M1
          NW2E1 NE2M1 WR2E0_U WR2M0_U (24)
```

```
WN2B2 <- M_BMUX L_D L_DQ M_CQ M_DQ L_CQ L_C M_AMUX WR5E2 WR5M2 WS5M2 WN5E2 WL5E1 WL5M1 NW5E1 NE5M1 WS2M2 WN2E2 WL2E1 WL2M1
         NW2E1 NE2M1 WR2E0_U WR2M0_U (24)
WL2B1 <- M_DQ L_CQ L_C M_AMUX M_C L_AMUX L_DMUX M_B WS5M2 NR5E2 NR5M2 WN5E2 NW5E1 NE5M1 NL5E1 NL5M1 WS2M2 NR2E2 NR2M2
         WN2E2 NW2E1 NE2M1 NL2E0 NL2M0 (24)
NW2B1 <- M_DQ L_CQ L_C M_AMUX M_C L_AMUX L_DMUX M_B WS5M2 NR5E2 NR5M2 WN5E2 NW5E1 NE5M1 NL5E1 NL5M1 WS2M2 NR2E2 NR2M2
         WN2E2 NW2E1 NE2M1 NL2E0 NL2M0 (24)
ER2B1 <- M_DQ L_CQ L_C M_AMUX M_C L_AMUX L_DMUX M_B NR5E2 NR5M2 NW5M1 NE5E1 NL5E1 NL5M1 EN5E1 ES5M1 NR2E2 NR2M2 NW2M1
         NE2E1 EN2E1 ES2M1 NL2E0 NL2M0 (24)
NE2B1 <- M_DQ L_CQ L_C M_AMUX M_C L_AMUX L_DMUX M_B NR5E2 NR5M2 NW5M1 NE5E1 NL5E1 NL5M1 EN5E1 ES5M1 NR2E2 NR2M2 NW2M1
         NE2E1 EN2E1 ES2M1 NL2E0 NL2M0 (24)
NL2B1 <- M_DQ L_CQ L_C M_AMUX M_C L_AMUX L_DMUX M_B NW5M1 ER5E1 ER5M1 NE5E1 EN5E1 ES5M1 EL5E1 EL5M1 NW2M1 NE2E1 EN2E1
         ES2M1 EL2E1 EL2M1 ER2E0 ER2M0 (24)
EN2B1 <- M_DQ L_CQ L_C M_AMUX M_C L_AMUX L_DMUX M_B NW5M1 ER5E1 ER5M1 NE5E1 EN5E1 ES5M1 EL5E1 EL5M1 NW2M1 NE2E1 EN2E1
         ES2M1 EL2E1 EL2M1 ER2E0 ER2M0 (24)
SR2B1 <- M_DQ L_CQ L_C M_AMUX M_C L_AMUX L_DMUX M_B ER5E1 ER5M1 EN5M1 ES5E1 EL5E1 EL5M1 SE5E1 SW5M1 EN2M1 ES2E1 EL2E1
         EL2M1 SE2E1 SW2M1 ER2E0 ER2M0 (24)
ES2B1 <- M_DQ L_CQ L_C M_AMUX M_C L_AMUX L_DMUX M_B ER5E1 ER5M1 EN5M1 ES5E1 EL5E1 EL5M1 SE5E1 SW5M1 EN2M1 ES2E1 EL2E1
         EL2M1 SE2E1 SW2M1 ER2E0 ER2M0 (24)
EL2B1 <- M_C L_AMUX L_DMUX M_B M_DMUX L_B L_BQ M_AQ EN5M1 SR5E1 SR5M1 ES5E1 SE5E1 SW5M1 SL5E1 SL5M1 SL2E2 SL2M2 EN2M1
         SR2E1 SR2M1 ES2E1 SE2E1 SW2M1 (24)
SE2B1 <- M_C L_AMUX L_DMUX M_B M_DMUX L_B L_BQ M_AQ EN5M1 SR5E1 SR5M1 ES5E1 SE5E1 SW5M1 SL5E1 SL5M1 SL2E2 SL2M2 EN2M1
         SR2E1 SR2M1 ES2E1 SE2E1 SW2M1 (24)
WR2B1 <- M_C L_AMUX L_DMUX M_B M_DMUX L_B L_BQ M_AQ SR5E1 SR5M1 SE5M1 SW5E1 SL5E1 SL5M1 WS5E1 WN5M1 SL2E2 SL2M2 SR2E1
         SR2M1 SE2M1 SW2E1 WS2E1 WN2M1 (24)
SW2B1 <- M_C L_AMUX L_DMUX M_B M_DMUX L_B L_BQ M_AQ SR5E1 SR5M1 SE5M1 SW5E1 SL5E1 SL5M1 WS5E1 WN5M1 SL2E2 SL2M2 SR2E1
         SR2M1 SE2M1 SW2E1 WS2E1 WN2M1 (24)
SL2B1 <- M_C L_AMUX L_DMUX M_B M_DMUX L_B L_BQ M_AQ SE5M1 WR5E1 WR5M1 SW5E1 WS5E1 WN5M1 WL5E0 WL5M0 WR2E2 WR2M2 SE2M1
         SW2E1 WS2E1 WN2M1 WL2E0 WL2M0 (24)
WS2B1 <- M_C L_AMUX L_DMUX M_B M_DMUX L_B L_BQ M_AQ SE5M1 WR5E1 WR5M1 SW5E1 WS5E1 WN5M1 WL5E0 WL5M0 WR2E2 WR2M2 SE2M1
         SW2E1 WS2E1 WN2M1 WL2E0 WL2M0 (24)
NR2B1 <- M_C L_AMUX L_DMUX M_B M_DMUX L_B L_BQ M_AQ WR5E1 WR5M1 WS5M1 WN5E1 WL5E0 WL5M0 NW5E0 NE5M0 WR2E2 WR2M2 WS2M1
         WN2E1 WL2E0 WL2M0 NW2E0 NE2M0 (24)
WN2B1 <- M_C L_AMUX L_DMUX M_B M_DMUX L_B L_BQ M_AQ WR5E1 WR5M1 WS5M1 WN5E1 WL5E0 WL5M0 NW5E0 NE5M0 WR2E2 WR2M2 WS2M1
         WN2E1 WL2E0 WL2M0 NW2E0 NE2M0 (24)
```

```
WL2B0 <- M_DMUX L_B L_BQ M_AQ M_BQ L_AQ L_A M_CMUX WS5M1 NR5E1 NR5M1 WN5E1 NW5E0 NE5M0 NL5E0 NL5M0 NL2E2_D NL2M2_D WS2M1
         NR2E1 NR2M1 WN2E1 NW2E0 NE2M0 (24)
NW2B0 <- M_DMUX L_B L_BQ M_AQ M_BQ L_AQ L_A M_CMUX WS5M1 NR5E1 NR5M1 WN5E1 NW5E0 NE5M0 NL5E0 NL5M0 NL2E2_D NL2M2_D WS2M1
         NR2E1 NR2M1 WN2E1 NW2E0 NE2M0 (24)
ER2B0 <- M_DMUX L_B L_BQ M_AQ M_BQ L_AQ L_A M_CMUX NR5E1 NR5M1 NW5M0 NE5E0 NL5E0 NL5M0 EN5E0 ES5M0 NL2E2_D NL2M2_D NR2E1
         NR2M1 NW2M0 NE2E0 EN2E0 ES2M0 (24)
NE2B0 <- M_DMUX L_B L_BQ M_AQ M_BQ L_AQ L_A M_CMUX NR5E1 NR5M1 NW5M0 NE5E0 NL5E0 NL5M0 EN5E0 ES5M0 NL2E2_D NL2M2_D NR2E1
         NR2M1 NW2M0 NE2E0 EN2E0 ES2M0 (24)
NL2B0 <- M_DMUX L_B L_BQ M_AQ M_BQ L_AQ L_A M_CMUX NW5M0 ER5E0 ER5M0 NE5E0 EN5E0 ES5M0 EL5E0 EL5M0 ER2E2_D ER2M2_D NW2M0
         NE2E0 EN2E0 ES2M0 EL2E0 EL2M0 (24)
EN2B0 <- M_DMUX L_B L_BQ M_AQ M_BQ L_AQ L_A M_CMUX NW5M0 ER5E0 ER5M0 NE5E0 EN5E0 ES5M0 EL5E0 EL5M0 ER2E2_D ER2M2_D NW2M0
         NE2E0 EN2E0 ES2M0 EL2E0 EL2M0 (24)
SR2B0 <- M_DMUX L_B L_BQ M_AQ M_BQ L_AQ L_A M_CMUX ER5E0 ER5M0 EN5M0 ES5E0 EL5E0 EL5M0 SE5E0 SW5M0 ER2E2_D ER2M2_D EN2M0
         ES2E0 EL2E0 EL2M0 SE2E0 SW2M0 (24)
ES2B0 <- M_DMUX L_B L_BQ M_AQ M_BQ L_AQ L_A M_CMUX ER5E0 ER5M0 EN5M0 ES5E0 EL5E0 EL5M0 SE5E0 SW5M0 ER2E2_D ER2M2_D EN2M0
         ES2E0 EL2E0 EL2M0 SE2E0 SW2M0 (24)
EL2B0 <- L_BMUX_D M_D_D M_BQ L_AQ L_A M_CMUX M_A L_CMUX EN5M0 SR5E0 SR5M0 ES5E0 SE5E0 SW5M0 SL5E0 SL5M0 SL2E1 SL2M1 EN2M0
         SR2E0 SR2M0 ES2E0 SE2E0 SW2M0 (24)
SE2B0 <- L_BMUX_D M_D_D M_BQ L_AQ L_A M_CMUX M_A L_CMUX EN5M0 SR5E0 SR5M0 ES5E0 SE5E0 SW5M0 SL5E0 SL5M0 SL2E1 SL2M1 EN2M0
         SR2E0 SR2M0 ES2E0 SE2E0 SW2M0 (24)
WR2B0 <- L_BMUX_D M_D_D M_BQ L_AQ L_A M_CMUX M_A L_CMUX SR5E0 SR5M0 SE5M0 SW5E0 SL5E0 SL5M0 WS5E0 WN5M0 SL2E1 SL2M1 SR2E0
         SR2M0 SE2M0 SW2E0 WS2E0 WN2M0 (24)
SW2B0 <- L_BMUX_D M_D_D M_BQ L_AQ L_A M_CMUX M_A L_CMUX SR5E0 SR5M0 SE5M0 SW5E0 SL5E0 SL5M0 WS5E0 WN5M0 SL2E1 SL2M1 SR2E0
         SR2M0 SE2M0 SW2E0 WS2E0 WN2M0 (24)
SL2B0 <- L_BMUX_D M_D_D M_BQ L_AQ L_A M_CMUX M_A L_CMUX WL5E2_D WL5M2_D SE5M0 WR5E0 WR5M0 SW5E0 WS5E0 WN5M0 WL2E2_D
         WL2M2_D WR2E1 WR2M1 SE2M0 SW2E0 WS2E0 WN2M0 (24)
WS2B0 <- L_BMUX_D M_D_D M_BQ L_AQ L_A M_CMUX M_A L_CMUX WL5E2_D WL5M2_D SE5M0 WR5E0 WR5M0 SW5E0 WS5E0 WN5M0 WL2E2_D
         WL2M2_D WR2E1 WR2M1 SE2M0 SW2E0 WS2E0 WN2M0 (24)
NR2B0 <- L_BMUX_D M_D_D M_BQ L_AQ L_A M_CMUX M_A L_CMUX WL5E2_D WL5M2_D NW5E2_D NE5M2_D WR5E0 WR5M0 WS5M0 WN5E0 WL2E2_D
         WL2M2_D NW2E2_D NE2M2_D WR2E1 WR2M1 WS2M0 WN2E0 (24)
WN2B0 <- L_BMUX_D M_D_D M_BQ L_AQ L_A M_CMUX M_A L_CMUX WL5E2_D WL5M2_D NW5E2_D NE5M2_D WR5E0 WR5M0 WS5M0 WN5E0 WL2E2_D
         WL2M2_D NW2E2_D NE2M2_D WR2E1 WR2M1 WS2M0 WN2E0 (24)
```

What is claimed is:

1. An integrated circuit, comprising:
a plurality of substantially similar programmable tiles, each tile comprising a logic block, segments of a plurality of interconnect lines interconnecting the programmable tiles one to another, and a plurality of programmable structures directly coupled to the segments of the interconnect lines, at least a subset of the programmable structures being further directly coupled to the logic block in each tile, the tiles being arranged in rows and columns, wherein:
each of a first plurality of the interconnect lines is directly coupled to a first two of the programmable structures included in two tiles located in different columns and in different rows, each of the first two of the programmable structures further being directly coupled to at least one other interconnect line included in the first plurality of interconnect lines, and
the first plurality of interconnect lines includes at least two interconnect lines directly coupled to two of the programmable structures included in two of the tiles that are separated from one another by J intervening rows and K intervening columns, wherein J and K are positive integers.

2. The integrated circuit of claim 1, wherein:
the first plurality of interconnect lines includes a second plurality of interconnect lines directly coupled to two of the programmable structures included in two diagonally adjacent ones of the tiles.

3. The integrated circuit of claim 2, wherein:
each of the second plurality of interconnect lines is further directly coupled to one of the programmable structures located in an additional tile adjacent to each of the two diagonally adjacent tiles.

4. The integrated circuit of claim 2, wherein:
each of the second plurality of interconnect lines is further directly coupled to one of the programmable structures included in an additional tile in the same row as the first tile, and in the same column as the second tile.

5. The integrated circuit of claim 1, wherein J and K are not equal.

6. The integrated circuit of claim 5, wherein one of J and K is two, and the other of J and K is one.

7. The integrated circuit of claim 1, wherein:
each of a second plurality of the interconnect lines is directly coupled to at least two of the programmable structures included in two tiles located in a first row.

8. The integrated circuit of claim 7, wherein each of the first plurality of interconnect lines is further directly coupled to a corresponding one of the programmable structures that is further directly coupled to at least one of the second plurality of interconnect lines.

9. The integrated circuit of claim 1, wherein:
each of a second plurality of the interconnect lines is directly coupled to at least two of the programmable structures included in two tiles located in a first column.

10. The integrated circuit of claim 9, wherein each of the first plurality of interconnect lines is further directly coupled to a corresponding one of the programmable structures that is further directly coupled to at least one of the second plurality of interconnect lines.

11. The integrated circuit of claim 1, wherein in each tile the programmable structures comprise a plurality of routing multiplexers each directly driving one of the interconnect lines, and a plurality of input multiplexers each directly driving one of the logic blocks.

12. An integrated circuit, comprising:
a plurality of substantially similar logic blocks, the logic blocks being arranged in rows and columns;
a first plurality of interconnect lines, each of the first plurality of interconnect lines being programmably coupled between two of the logic blocks included in different columns and in different rows, the two of the logic blocks being separated from one another by at least one intervening row and at least one intervening column; and
means for programmably coupling each of the first plurality of interconnect lines to at least one other interconnect line included in the first plurality of interconnect lines by traversing only one programmable structure.

13. The integrated circuit of claim 12, further comprising:
means for programmably coupling at least one of the first plurality of interconnect lines to two diagonally adjacent ones of the logic blocks by traversing only one programmable structure.

14. The integrated circuit of claim 12, further comprising:
means for programmably coupling the at least one of the first plurality of interconnect lines to an additional logic block adjacent to each of the two diagonally adjacent logic blocks by traversing only one programmable structure.

15. The integrated circuit of claim 12, further comprising:
a second plurality of interconnect lines, the second plurality of interconnect lines being longer than the first plurality of interconnect lines; and
means for programmably coupling at least one of the first plurality of interconnect lines to at least one of the second plurality of interconnect lines by traversing only one programmable structure.

16. The integrated circuit of claim 12, further comprising:
a second plurality of interconnect lines; and
means for programmably coupling each of the second plurality of interconnect lines to at least two of the logic blocks included in a first row by traversing only one programmable structure.

17. The integrated circuit of claim 16, further comprising:
means for programmably coupling each of the first plurality of interconnect lines to at least one interconnect line included in the second plurality of interconnect lines by traversing only one programmable structure.

18. The integrated circuit of claim 12, further comprising:
a second plurality of interconnect lines; and
means for programmably coupling each of the second plurality of interconnect lines to at least two of the logic blocks included in a first column by traversing only one programmable structure.

19. The integrated circuit of claim 18, further comprising:
means for programmably coupling each of the first plurality of interconnect lines to at least one interconnect line included in the second plurality of interconnect lines by traversing only one programmable structure.

* * * * *